United States Patent
Bell et al.

(10) Patent No.: US 6,658,580 B1
(45) Date of Patent: Dec. 2, 2003

(54) REDUNDANT, SYNCHRONOUS CENTRAL TIMING SYSTEMS WITH CONSTANT MASTER VOLTAGE CONTROLS AND VARIABLE SLAVE VOLTAGE CONTROLS

(75) Inventors: Colin Bell, Acton, MA (US); Mike A. Sluyski, Maynard, MA (US)

(73) Assignee: Equipe Communications Corporation, Acton, MA (US)

( * ) Notice: Subject to any disclaimer, the term of this patent is extended or adjusted under 35 U.S.C. 154(b) by 600 days.

(21) Appl. No.: 09/613,988

(22) Filed: Jul. 11, 2000

Related U.S. Application Data

(63) Continuation-in-part of application No. 09/596,055, filed on Jun. 16, 2000, which is a continuation-in-part of application No. 09/593,034, filed on Jun. 13, 2000, which is a continuation-in-part of application No. 09/574,440, filed on May 20, 2000, which is a continuation-in-part of application No. 09/591,193, filed on Jun. 9, 2000, which is a continuation-in-part of application No. 09/588,398, filed on Jun. 6, 2000, which is a continuation-in-part of application No. 09/574,341, filed on May 20, 2000, and a continuation-in-part of application No. 09/574,343, filed on May 20, 2000.

(51) Int. Cl.[7] .................................................. G06F 1/12
(52) U.S. Cl. ........................ 713/400; 713/500; 331/2
(58) Field of Search ........................ 714/10; 713/400, 713/500; 331/2

(56) References Cited

U.S. PATENT DOCUMENTS

| | | | | |
|---|---|---|---|---|
| 4,245,307 A | * | 1/1981 | Kapeghian et al. | 710/107 |
| 4,750,136 A | | 6/1988 | Arpin et al. | 364/514 |
| 4,942,540 A | | 7/1990 | Black et al. | 364/514 |
| 5,515,403 A | | 5/1996 | Sloan et al. | 375/371 |
| 5,638,410 A | | 6/1997 | Kuddes | 375/357 |
| 5,726,607 A | | 3/1998 | Brede et al. | 331/2 |
| 5,850,399 A | | 12/1998 | Ganmukhi et al. | 370/412 |
| 5,901,136 A | | 5/1999 | Lovelace et al. | |
| 5,903,564 A | | 5/1999 | Ganmukhi et al. | 370/399 |
| 5,905,730 A | | 5/1999 | Yang et al. | 370/429 |
| 5,926,463 A | | 7/1999 | Ahearn et al. | 370/254 |
| 5,953,314 A | | 9/1999 | Ganmukhi et al. | 370/220 |
| 5,991,163 A | | 11/1999 | Marconi et al. | 361/788 |
| 5,991,297 A | | 11/1999 | Palnati et al. | 370/389 |
| 5,995,511 A | | 11/1999 | Zhou et al. | 370/412 |
| 6,008,805 A | | 12/1999 | Land et al. | 345/335 |
| 6,008,995 A | | 12/1999 | Pusateri et al. | 361/796 |
| 6,015,300 A | | 1/2000 | Schmidt, Jr. et al. | 439/61 |
| 6,021,116 A | | 2/2000 | Chiussi et al. | 370/236 |
| 6,021,263 A | | 2/2000 | Kujoory et al. | 395/200.62 |
| 6,033,259 A | | 3/2000 | Daoud | 439/573 |
| 6,041,307 A | | 3/2000 | Ahuja et al. | 705/8 |
| 6,044,540 A | | 4/2000 | Fontana | 29/505 |
| 6,078,595 A | | 6/2000 | Jones et al. | 370/503 |
| 6,194,969 B1 | * | 2/2001 | Doblar | 331/2 |
| 6,247,138 B1 | * | 6/2001 | Tamura et al. | 713/600 |
| 6,516,422 B1 | * | 2/2003 | Doblar et al. | 713/503 |

FOREIGN PATENT DOCUMENTS

| | | | | | |
|---|---|---|---|---|---|
| JP | 58002904 A | * | 1/1983 | | G05B/19/02 |
| JP | 58219627 A | * | 12/1983 | | G06F/3/00 |
| JP | 11275126 A | * | 10/1999 | | H04L/12/42 |

OTHER PUBLICATIONS

IBM, Multibus Synchronization for Raid–3 Data Distribution, Oct. 1, 1992, vol. 35 Issue 5 pp. 21–24.*

* cited by examiner

*Primary Examiner*—Thomas Lee
(74) *Attorney, Agent, or Firm*—Thomas J. Engellenner; Reza Mollaaghababa; Nutter, McClennen & Fish LLP

(57) ABSTRACT

The present invention provides a network device including redundant, synchronous central timing subsystems (CTSs) each having a voltage controlled timing circuit for receiving a constant master voltage signal and variable slave voltage signal. Each CTS also includes a control logic circuit for selecting the constant master voltage signal for use by the voltage controlled timing circuit when the CTS is master and for selecting the variable slave voltage signal when the CTS is slave. Using a constant master voltage signal eliminates the need for a separate master oscillator in each CTS. Oscillators are typically expensive, consume significant space on the printed circuit board and have location restrictions on where they may be placed on the printed circuit board.

30 Claims, 63 Drawing Sheets

CARD TABLE 47

| PID | CWD TYPE | VERSION NO. | SLOT NO. | ... |
|---|---|---|---|---|
| 500 | 0XF002 | 3 | 1 | |
| 501 | 0XF002 | 4 | 2 | |
| ⋮ | ⋮ | ⋮ | ⋮ | ⋮ |
| 505 | 0X6002 | 1 | 5 | |
| ⋮ | ⋮ | ⋮ | ⋮ | ⋮ |
| 513 | 0XF002 | 1 | 12 | |
| ⋮ | ⋮ | ⋮ | ⋮ | ⋮ |

PORT TABLE 49

| | PID | PORT TYPE | VERSION NO. | SLOT NO. | ... |
|---|---|---|---|---|---|
| 44a | 1500 | 00620 | 1 | 1 | |
| 44b | 1501 | 00620 | 1 | 1 | |
| 44c | 1502 | 00620 | 1 | 1 | |
| 44d | 1503 | 00620 | 1 | 1 | |
| 44a | 1504 | 00820 | | | |
| 46a | ⋮ | ⋮ | ⋮ | ⋮ | ⋮ |
| | 1600 | OO620 | 1 | 8 | |
| | ⋮ | ⋮ | ⋮ | ⋮ | ⋮ |

FIG. 7

SERVICE ENDPOINT TABLE 76

| | SERVICE ENDPOINT # | PORT PID |
|---|---|---|
| 78 | 1 | 1500 |
| 80 | 2 | 1501 |
| 82 | 3 | 1501 |
| 84 | 4 | 1501 |
| 86 | 5 | 1502 |
| 88 | 6 | 1502 |
| 90 | 7 | 1503 |
| 92 | 8 | 1503 |
| 94 | 9 | 1503 |
| 168 | 10 | 1502 |
| | ⋮ | ⋮ |

FIG. 10

LOGICAL TO PHYSICAL CARD TABLE 100

| | LID (98) | PRIMARY PID (102) | BACK-UP PID (104) |
|---|---|---|---|
| 106 | 30 | 500 | 513 |
| 109 | 31 | 501 | 513 |
| | ⋮ | ⋮ | ⋮ |

FIG. 11A

LOGICAL TO PHYSICAL PORT TABLE 101

| | LID (98) | PRIMARY PID (102) | BACK-UP PID (104) |
|---|---|---|---|
| 107 | 40 | 1500 | 1600 |
| | ⋮ | ⋮ | ⋮ |

FIG. 11B

ATM GROUP TABLE 108

| GROUP # | CARD LID | ... |
|---|---|---|
| 1 | 30 | |
| 2 | 30 | |
| 3 | 30 | |
| 4 | 30 | |

FIG. 12

ATM INTERFACE TABLE 114

| ATM IF | ATM GROUP | SE | ... |
|---|---|---|---|
| 1 | 1 | 1 | |
| 2 | 1 | 1 | |
| 3 | 1 | 1 | |
| 4 | 2 | 2 | |
| 5 | 2 | 3 | |
| 6 | 2 | 4 | |
| ⋮ | ⋮ | ⋮ | ⋮ |
| 12 | 3 | 10 | |
| ⋮ | ⋮ | ⋮ | ⋮ |

FIG. 13

SOFTWARE LOAD RECORD 128a

| CONTROL SHIM | LID |
|---|---|
| atm-cntl.exe | 30 |

FIG. 14

GROUP TABLE 108'

| GROUP # | PRIMARY CARD LID (447) | BACKUP CARD LID (449) | ... |
|---|---|---|---|
| 1 | 30 | 31 | |
| 2 | 30 | 31 | |
| 3 | 30 | 31 | |
| 4 | 30 | 31 | |
| 5 | 31 | 32 | |
| 6 | 31 | 32 | |
| 7 | 31 | 32 | |
| 8 | 31 | 32 | |
| 9 | 32 | 30 | |
| 10 | 32 | 30 | |
| 11 | 32 | 30 | |
| 12 | 32 | 30 | |
| ⋮ | ⋮ | ⋮ | ⋮ |

FIG. 30

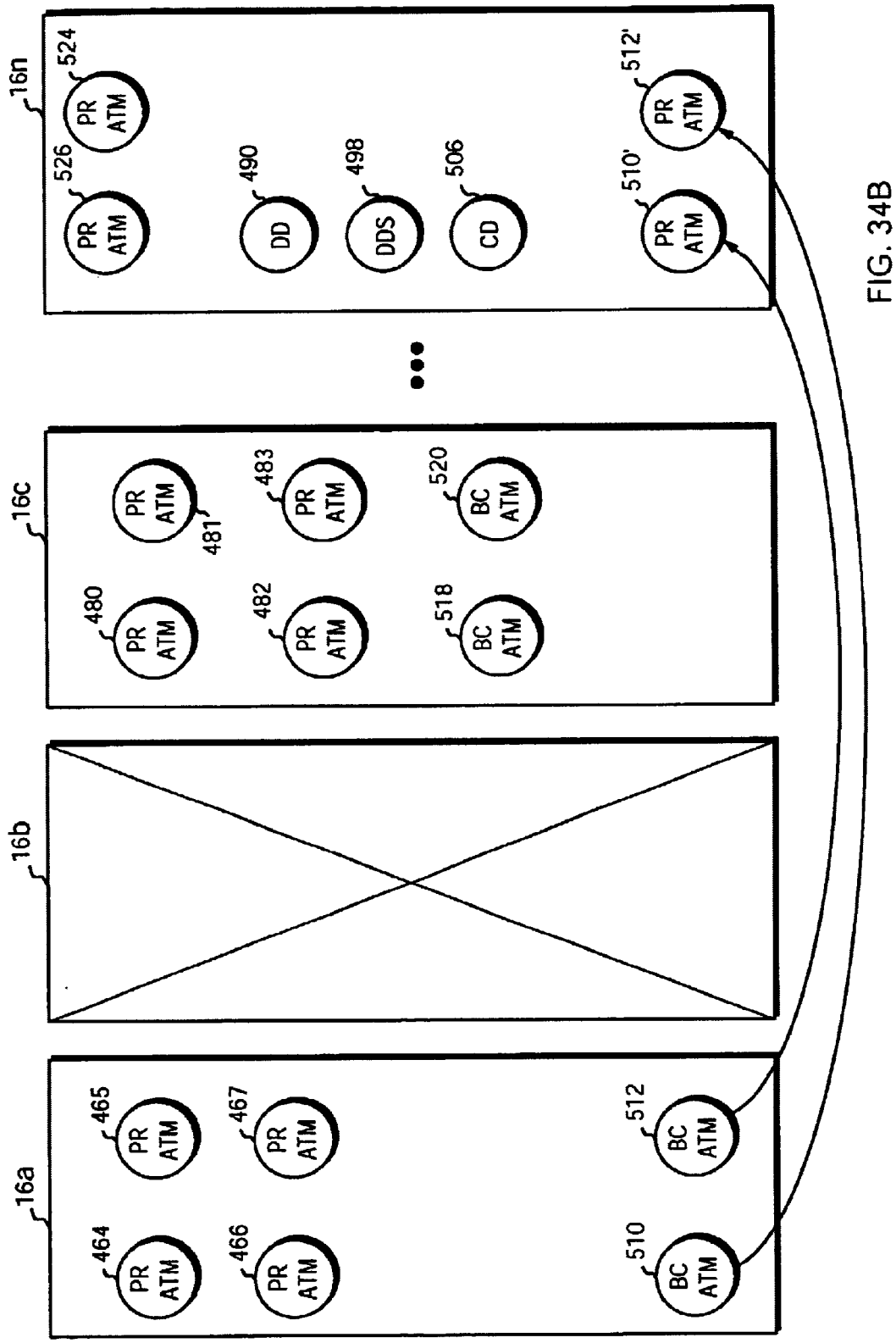

PATH TABLE 600

| PATH LID | UP PORT LID | TIME SLOT | # OF TIME SLOTS | ... |
|---|---|---|---|---|
| 1666 | 1231 | 4 | 3 | |
| ⋮ | ⋮ | ⋮ | ⋮ | ⋮ |

602 points to the row containing 1666.

FIG. 38

SERVICE END POINT TABLE 76'

| | SE # | Q # | FC LID (606) | FC SLICE (608) | FC TIME SLOT | PATH PID (610) | ... |
|---|---|---|---|---|---|---|---|
| 604 → | 878 | 1 | | | | 1666 | |
| | ⋮ | ⋮ | ⋮ | ⋮ | ⋮ | ⋮ | ⋮ |

FIG. 39

REDUNDANT, SYNCHRONOUS CENTRAL TIMING SYSTEMS WITH CONSTANT MASTER VOLTAGE CONTROLS AND VARIABLE SLAVE VOLTAGE CONTROLS

RELATED APPLICATION

This application is a continuation-in-part of application Ser. No. 09/596,055 filed Jun. 16, 2000 which is a C-I-P of Ser. No. 09/593,034 filed Jun. 13, 2000 which is a C-I-P of Ser. No. 09/574,440 filed May 20, 2000; and Ser. No. 09/591,193 filed Jun. 9, 2000 which is a C-I-P of Ser. No. 09/588,398 filed Jun. 6, 2000 which is a C-I-P of Ser. No. 09/574,341 filed May 20, 2000; and Ser. No. 09/574,343 filed May 20, 2000.

This is application is a continuation-in-part of U.S. Ser. No. 09/596,055, filed Jun. 16, 2000, entitled "A Multi-Layer Network Device in One Telecommunications Rack", still pending.

BACKGROUND

The major function of a telecommunications ("telco") network device such as a switch, router or hybrid switch/router is to transfer network data or packets between various physical interfaces or ports on the network device. The ports are connected to external network attachments, for example, optical fibers, coaxial cables and twisted pair cables. Typically, a network device includes multiple forwarding cards (i.e., printed circuit boards or modules) coupled with the external network attachments through the physical interfaces. Network packets are transferred between forwarding cards through a switch fabric.

Typically, network devices transfer network data with other network devices over the external network attachments in accordance with the same clock signal (i.e., synchronously). The clock signal may be a Building Integrated Supply (BITS) Line supplied to both network devices or one network device may use a timing signal provided by the other network device over a network attachment. Regardless of which clock signal is used, a central timing subsystem with the network device is generally used to distribute timing reference signals to all cards and components involved in synchronous data transfer, for example, all port cards. It is crucial that components and cards within the network device transfer data according to the same synchronized timing signals, as transferring data at different times, even slightly different times, may lead to data corruption, the wrong data being sent and/or a network device crash. Distributing clock signals, therefore, must be done carefully to insure that the clock signal received by each component is not skewed with respect to the clock signals received by other components.

Since timing distribution is critical to network device operation, network devices often include redundant central timing subsystems. Redundancy, further complicates the distribution of timing reference signals and increases the potential for skew. In addition, if a failure of the primary central timing subsystem is detected such that a switch over to the secondary central timing subsystem is initiated, it is important that the components receiving the timing reference signals do not experience sudden phase shifts in the timing reference signals from the two central timing subsystems, as phase shifts and other noise on clock signals may also lead to data corruption or a network device crash.

Many network devices also use an independent clock signal to transfer data through the internal switch fabric, and again, a switch fabric central timing system is often used to distribute the timing reference signals to components and/or cards involved with data transfer through the switch fabric. In addition, in network devices with multiple processors, processor timing reference signals are often sent from a processor central timing system to each processor to allow the processors to synchronize their processes. Distributing multiple timing reference signals consumes considerable routing resources in the network device and again increases the likelihood of skew between clock signals.

SUMMARY

The present invention provides a network device including redundant, synchronous central timing subsystems (CTSs) each having a voltage controlled timing circuit for receiving a constant master voltage signal and variable slave voltage signal. Each CTS also includes a control logic circuit for selecting the constant master voltage signal for use by the voltage controlled timing circuit when the CTS is master and for selecting the variable slave voltage signal when the CTS is slave. Using a constant master voltage signal eliminates the need for a separate master oscillator in each CTS. Oscillators are typically expensive, consume significant space on the printed circuit board and have location restrictions on where they may be placed on the printed circuit board.

In one aspect, the present invention provides a network device including a first central timing subsystem providing at least one first timing reference signal and at least one first master control signal, a second central timing subsystem providing at least one second timing reference signal and at least one second master control signal, where the first central timing subsystem receives the second timing reference signal and the second master control signal and the second central timing subsystem receives the first timing reference signal and the first master control signal and where the first central timing subsystem synchronizes the first timing reference signal to the second timing reference signal in accordance with the second master control signal and the second central timing subsystem synchronizes the second timing reference signal to the first timing reference signal in accordance with the first master control signal, and where the first central timing subsystem includes a voltage controlled timing circuit for generating the first timing reference signal, a constant master voltage signal connected to the voltage controlled timing circuit, a variable slave voltage signal connected to the voltage controlled timing circuit, and a control logic circuit connected to the voltage controlled timing circuit and the first and second master control signals, wherein the control logic circuit selects the constant master voltage signal for use by the voltage controlled timing circuit and generates a master state on the first master control signal when a slave state is detected on the second master control signal and wherein the control logic circuit selects the variable slave voltage signal for use by the voltage controlled timing circuit and generates the slave state on the first master control signal when the master state is detected on the second master control signal. The master state may be a logic one and the slave state may be a logic zero, or the master state may be a logic zero and the slave state may be a logic one. The voltage controlled timing circuit may be a first voltage controlled timing circuit, the constant master voltage signal may be a first constant master voltage signal, the variable slave voltage signal may be a first variable slave voltage signal and the control logic circuit may be a first control logic circuit and the second central timing subsystem may include a second voltage controlled timing circuit for generating the second timing reference signal, a second constant master voltage signal connected to the second voltage controlled timing circuit, a second variable slave voltage signal connected to the second voltage controlled timing circuit, and a second control logic circuit connected to the second voltage controlled timing circuit and the first and second master control signals, where the second control logic circuit selects the second constant master voltage signal for use by the second voltage controlled timing circuit and generates the master state on the second master control signal when the slave state is detected on the first master control signal and where the second control logic circuit selects the second variable slave voltage signal for use by the second voltage controlled timing circuit and generates the slave state on the second master control signal when the master state is detected on the first master control signal.

The first central timing subsystem may further receive a slot identification signal and the control logic circuit may cause the voltage controlled timing circuit to use one of the master and the slave voltage signals in accordance with the second master control signal and the slot identification signal. The voltage controlled timing circuit may include a voltage controlled crystal oscillator and may further include a multiplexor. The first central timing subsystem may also include a constant voltage circuit for providing the constant master voltage signal and may also include a phase locked loop circuit coupled to the first and second timing reference signals for providing the variable slave voltage signal. The first central timing subsystem may include a status detector for receiving the second timing reference signal and for providing a signal to the control logic circuit indicating a status of the second timing reference signal and the control logic circuit may cause the voltage controlled timing circuit to use the constant master voltage signal and the control logic circuit may provide the master state on the first master control signal when the signal indicates an invalid status for the second timing reference signal. The status detector may include an activity detector for providing an activity signal. The control logic circuit may cause the voltage controlled timing circuit to use the constant master voltage signal without software interaction.

The first central timing subsystem may also include a status detector for receiving the first timing reference signal and for providing a signal to the control logic circuit indicating a status of the first timing reference signal and the control logic circuit may cause the voltage controlled timing circuit to use the variable slave voltage signal and the control logic circuit may provide the slave state on the first master control signal when the signal indicates an invalid status for the first timing reference signal. The status detector may include an activity detector for providing an activity signal, and the control logic circuit may cause the voltage controlled timing circuit to use the variable slave voltage signal without software interaction. The phase locked loop circuit may provide an out of lock signal to the control logic circuit and the control logic circuit may cause the voltage controlled timing circuit to use the variable slave voltage signal and the control logic circuit may provide the slave state on the first master control signal when the out of lock signal indicates that the first and second timing reference signals are out of lock. The control logic may be coupled with a processor and the processor may be capable of controlling the control logic circuit to cause the control logic circuit to cause the voltage controlled timing circuit to use the constant master voltage signal and provide the master state on the first master control signal, and cause the voltage controlled timing circuit to use the variable slave voltage signal and provide the master state on the first master control signal.

In another aspect, the invention provides a method of operating a network device including providing a first timing reference signal from a first voltage controlled timing circuit connected to a first constant master voltage signal and a first variable slave voltage signal within a first central timing subsystem, providing a first master control signal from a first control logic circuit connected to the first voltage controlled timing circuit within the first central timing subsystem, providing a second timing reference signal from a second voltage controlled timing circuit connected to a second constant master voltage signal and a second variable slave voltage signal within a second central timing subsystem, providing a second master control signal from a second control logic circuit connected to the second voltage controlled timing circuit within the second central timing subsystem, synchronizing the second timing reference signal to the first timing reference signal in accordance with the first master control signal, and synchronizing the first timing reference signal to the second timing reference signal in accordance with the second master control signal. The method may also include detecting a slave status on the second master control signal, selecting the second variable slave voltage signal for use by the second voltage controlled timing circuit, selecting the first constant master voltage signal for use by first voltage controlled timing circuit, and generating a master status on the first master control signal. The method may also include detecting a master status on the second master control signal, selecting the second constant master voltage signal for use by the second voltage controlled timing circuit, selecting the first variable slave voltage signal for use by first voltage controlled timing circuit, and generating a slave status on the first master control signal.

Synchronizing the first timing reference signal to the second timing reference signal in accordance with the second master control signal may include detecting a value on the second master control signal indicating that the second central timing subsystem is performing as a slave central timing subsystem and selecting the first constant master voltage signal as an input to first voltage controlled timing circuit. The method may also include selecting the second variable slave voltage signal as an input to the second voltage controlled timing circuit. Synchronizing the first timing reference signal to the second timing reference signal includes detecting a value on the second master control signal indicating that the second central timing subsystem is performing as a master central timing subsystem and selecting the variable slave voltage signal as an input to the first voltage controlled timing circuit. The method may include selecting the second constant master voltage signal as an input to second voltage controlled timing circuit, and the method may include providing a first slot identifier, providing a second slot identifier, where synchronizing the second timing reference signal to the first timing reference signal is further in accordance with the second slot value and where synchronizing the first timing reference signal to the second timing reference signal is further in accordance with the first slot value. The method may include monitoring a status of the first timing reference signal and synchronizing the first timing reference signal to the second timing reference signal when the status indicates invalidity. In addition, the method may include providing a constant logic state on the first timing reference signal when the status indicates invalidity. The method may include removing the first central timing subsystem from the network device, detecting inactivity on the first timing reference signal, and providing the second constant master voltage signal to the second voltage controlled timing circuit, and the method may also include replacing the first central timing subsystem within the network device, detecting activity on the first timing reference signal and continuing to provide the second constant master voltage signal to the second voltage controlled timing circuit. The method may also include replacing the first central timing subsystem within the network device, detecting activity on the first timing reference signal, providing the first constant master voltage signal to the first voltage controlled timing circuit, and providing the second variable slave voltage signal to the second voltage controlled timing circuit.

BRIEF DESCRIPTION OF THE DRAWINGS

FIGS. 6, 7, 10, 11a, 11b, 12, 13 and 14 are tables representing data in a configuration database;

FIG. 30 is a table representing data in a configuration database;

FIGS. 31a–31c, 32a–32c, 33a–33d and 34a–34b are block and flow diagrams of a computer system incorporating a distributed redundancy architecture and illustrating methods for accomplishing distributed redundancy and recovery after a failure;

FIGS. 38 and 39 are tables representing data in a configuration database;

FIGS. 41a–41c are front, back and side block diagrams, respectively, of components and modules within the network device of FIG. 40;

DETAILED DESCRIPTION

Figure 1:
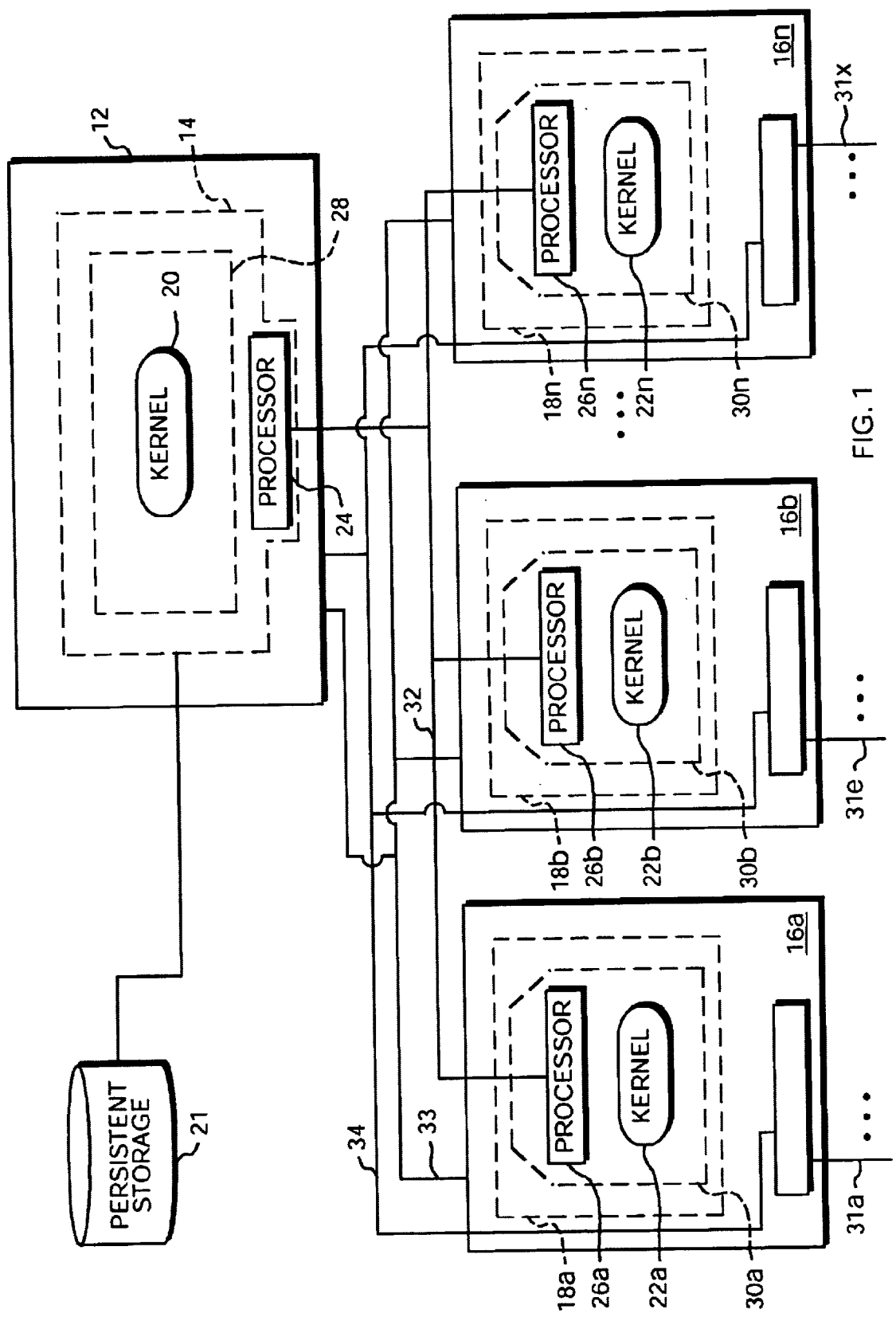
FIG. 1 is a block diagram of a computer system with a distributed processing system.

A modular software architecture solves some of the more common scenarios seen in existing architectures when software is upgraded or new features are deployed. Software modularity involves functionally dividing a software system into individual modules or processes, which are then designed and implemented independently. Inter-process communication (IPC) between the modules is carried out through message passing in accordance with well-defined application programming interfaces (APIs). A protected memory feature also helps enforce the separation of modules. Modules are compiled and linked as separate programs, and each program runs in its own protected memory space. In addition, each program is addressed with an abstract communication handle, or logical name. The logical name is location-independent; it can live on any card in the system. The logical name is resolved to a physical card/process during communication. If, for example, a backup process takes over for a failed primary process, it assumes ownership of the logical name and registers its name to allow other processes to re-resolve the logical name to the new physical card/process. Once complete, the processes continue to communicate with the same logical name, unaware of the fact that a switchover just occurred.

Like certain existing architectures, the modular software architecture dynamically loads applications as needed. Beyond prior architectures, however, the modular software architecture removes significant application dependent data from the kernel and minimizes the link between software and hardware. Instead, under the modular software architecture, the applications themselves gather necessary information (i.e., metadata) from a variety of sources, for example, text files, JAVA class files and database views. Metadata facilitates customization of the execution behavior of software processes without modifying the operating system software image. A modular software architecture makes writing applications—especially distributed applications— more difficult, but metadata provides seamless extensibility allowing new software processes to be added and existing software processes to be upgraded or downgraded while the operating system is running. In one embodiment, the kernel includes operating system software, standard system services software and modular system services software. Even portions of the kernel may be hot upgraded under certain circumstances. Examples of metadata include, customization text files used by software device drivers; JAVA class files that are dynamically instantiated using reflection; registration and deregistration protocols that enable the addition and deletion of software services without system disruption; and database view definitions that provide many varied views of the logical system model. Each of these and other examples are described below.

The embodiment described below includes a network computer system with a loosely coupled distributed processing system. It should be understood, however, that the computer system could also be a central processing system or a combination of distributed and central processing and either loosely or tightly coupled. In addition, the computer system described below is a network switch for use in, for example, the Internet, wide area networks (WAN) or local area networks (LAN). It should be understood, however, that the modular software architecture can be implemented on any network device (including routers) or other types of computer systems and is not restricted to a network device.

A distributed processing system is a collection of independent computers that appear to the user of the system as a single computer. Referring to FIG. 1, computer system 10 includes a centralized processor 12 with a control processor subsystem 14 that executes an instance of the kernel 20 including master control programs and server programs to actively control system operation by performing a major portion of the control functions (e.g., booting and system management) for the system. In addition, computer system 10 includes multiple line cards 16a–16n. Each line card includes a control processor subsystem 18a–18n, which runs an instance of the kernel 22a–22n including slave and client programs as well as line card specific software applications. Each control processor subsystem 14, 18a–18n operates in an autonomous fashion but the software presents computer system 10 to the user as a single computer.

Each control processor subsystem includes a processor integrated circuit (chip) 24, 26a–26n, for example, a Motorola 8260 or an Intel Pentium processor. The control processor subsystem also includes a memory subsystem 28, 30a–30n including a combination of non-volatile or persistent (e.g., PROM and flash memory) and volatile (e.g., SRAM and DRAM) memory components. Computer system 10 also includes an internal communication bus 32 connected to each processor 24, 26a–26n. In one embodiment, the communication bus is a switched Fast Ethernet providing 100 Mb of dedicated bandwidth to each processor allowing the distributed processors to exchange control information at high frequencies. A backup or redundant Ethernet switch may also be connected to each board such that if the primary Ethernet switch fails, the boards can fail-over to the backup Ethernet switch.

In this example, Ethernet 32 provides an out-of-band control path, meaning that control information passes over Ethernet 32 but the network data being switched by computer system 10 passes to and from external network connections 31a–31xx over a separate data path 34. External network control data is passed from the line cards to the central processor over Ethernet 32. This external network control data is also assigned the highest priority when passed over the Ethernet to ensure that it is not dropped during periods of heavy traffic on the Ethernet.

In addition, another bus 33 is provided for low level system service operations, including, for example, the detection of newly installed (or removed) hardware, reset and interrupt control and real time clock (RTC) synchronization across the system, In one embodiment, this is an Inter-IC communications ($I^2C$) bus.

Alternatively, the control and data may be passed over one common path (in-band).

Figure 2:
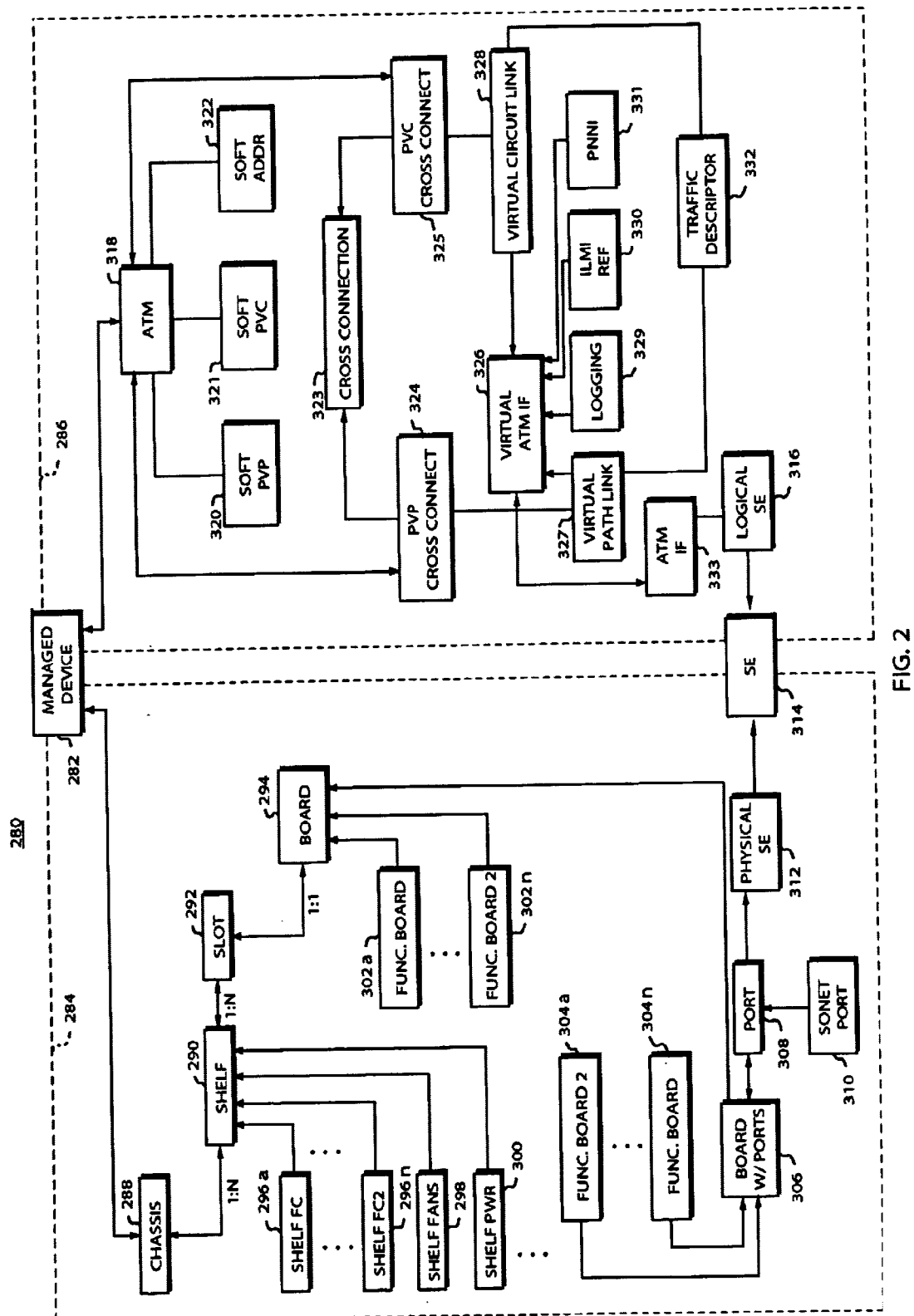
FIG. 2 is a block diagram of a logical system model.

Logical System Model:

Referring to FIG. 2, a logical system model 280 is created using the Unified Modeling Language (UML). A managed device 282 represents the top level system connected to models representing both hardware 284 and software applications 286. Hardware model 284 includes models representing specific pieces of hardware, for example, chassis 288, shelf 290, slot 292 and printed circuit board 294. The logical model is capable of showing containment, that is, typically, there are many shelves per chassis (1:N), many slots per shelf (1:N) and one board per slot (1:1). Shelf 290 is a parent class having multiple shelf models, including various functional shelves 296a–296n as well as one or more system shelves, for example, for fans 298 and power 300. Board 294 is also a parent class having multiple board models, including various functional boards without ports 302a–302n (e.g., central processor 12, FIG. 1) and various functional boards with ports 304a–304n (e.g., line cards 16a–16n, FIG. 1). Hardware model 284 also includes a model for boards with ports 306 coupled to the models for functional boards with ports and a port model 308. Port model 308 is coupled to one or more specific port models, for example, synchronous optical network (SONET) protocol port 310, and a physical service endpoint model 312.

Hardware model 284 includes models for all hardware that may be available on computer system 10 (FIG. 1). All shelves and slots may not be populated. In addition, there may be multiple chasses. It should be understood that SONET port 310 is an example of one type of port that may be supported by computer system 10. A model is created for each type of port available on computer system 10, including, for example, Ethernet, Dense Wavelength Division Multiplexing (DWDM) or Digital Signal, Level 3 (DS3). The Network Management Software (NMS, described below) uses the hardware model to display a graphical picture of computer system 10 to a user.

Service endpoint model 314 spans the software and hardware models within logical model 280. It is a parent class including a physical service endpoint model 312 and a logical service endpoint model 316.

Software model 286 includes models for each of the software processes (e.g., applications, device drivers, system services) available on computer system 10. All applications and device drivers may not be used on computer system 10. As one example, ATM model 318 is shown. It should be understood that software model 286 may also include models for other applications, for example, Internet Protocol (IP) applications and Multi-Protocol Label Switching (MPLS) applications. Models of other processes (e.g., device drivers and system services) are not shown for convenience. For each process, models of configurable objects managed by those processes are also created. For example, models of ATM configurable objects are coupled to ATM model 318, including models for a soft permanent virtual path 320, a soft permanent virtual circuit 321, a switch address 322, a cross-connection 323, a permanent virtual path cross-connection 324, a permanent virtual circuit cross-connection 325, a virtual ATM interface 326, a virtual path link 327, a virtual circuit link 328, logging 329, an ILMI reference 330, PNNI 331, a traffic descriptor 332, an ATM interface 333 and logical service endpoint 316. As described above, logical service endpoint model 316 is coupled to service endpoint model 314. It is also coupled to ATM interface model 333.

The UML logical model is layered on the physical computer system to add a layer of abstraction between the physical system and the software applications. Adding or removing known (i.e., not new) hardware from computer system 10 will not require changes to the logical model or the software applications. However, changes to the physical system, for example, adding a new type of board, will require changes to the logical model. In addition, the logical model is modified when new or upgraded processes are created. Changes to the logical model will likely require changes to most, if not all, existing software applications, and multiple versions of the same software processes (e.g., upgraded and older) are not supported by the same logical model.

To decouple software processes from the logical model—as well as the physical system—another layer of abstraction is added in the form of views. A view is a logical slice of the logical model and defines a particular set of data within the logical model to which an associated process has access. Views allow multiple versions of the same process to be supported by the same logical model since each view limits the data that a corresponding process "views" or has access to, to the data relevant to the version of that process. Similarly, views allow multiple different processes to use the same logical model.

Figure 3:
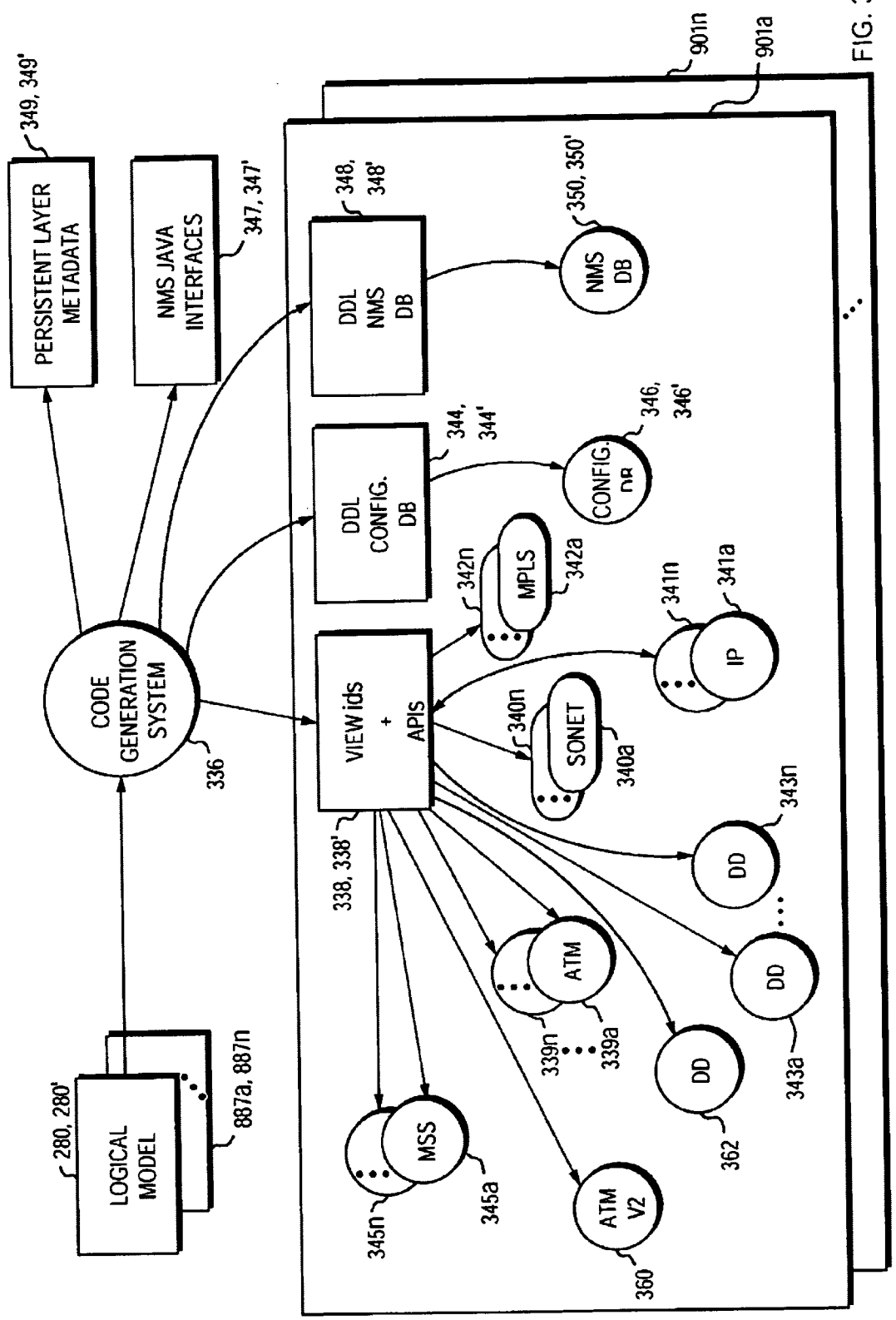
FIG. 3 is a flow diagram illustrating a method for generating views and database data definition language files from a logical system model.

Referring to FIG. 3, UML logical model 280 is used as input to a code generator 336. The code generator creates a view identification (id) and an application programming interface (API) 338 for each process that will require configuration data. For example, a view id and an API may be created for each ATM application 339*a*–339*n*, each SONET application 340*a*–340*n*, each MPLS application 341*a*–341*n* and each IP application 342*a*–342*n*. In addition, a view id and API will also be created for each device driver process, for example, device drivers 343*a*–343*n*, and for modular system services (MSS) 345*a*–345*n* (described below), for example, a Master Control Driver (MCD), a System Resiliency Manager (SRM), and a Software Management System (SMS). The code generator provides data consistency across processes, centralized tuning and an abstraction of embedded configuration and NMS databases (described below) ensuring that changes to their database schema do not affect existing processes.

The code generator also creates a data definition language (DDL) file 344 including structured query language (SQL) commands used to construct various tables and views within a configuration database 346 (described below) and a DDL file 348 including SQL commands used to construct various tables and views within a network management (NMS) database 350 (described below). This is also referred to as converting the UML logical model into a database schema and various views look at particular portions of that schema within the database. If the same database software is used for both the configuration and NMS databases, then one DDL file may be used for both. The databases do not have to be generated from a UML model for views to work. Instead, database files can be supplied directly without having to generate them using the code generator.

Prior to shipping computer system 10 to customers, a software build process is initiated to establish the software architecture and processes. The code generator is part of this process. Each process when pulled into the build process links the associated view id and API into its image. When the computer system is powered-up, as described below, configuration database software will use DDL file 344 to populate a configuration database 346. The computer system will send DDL file 348 to the NMS such that NMS database software can use it to populate an NMS database 350. Memory and storage space within network devices is typically very limited. The configuration database software is robust and takes a considerable amount of these limited resources but provides many advantages as described below.

Figure 4:
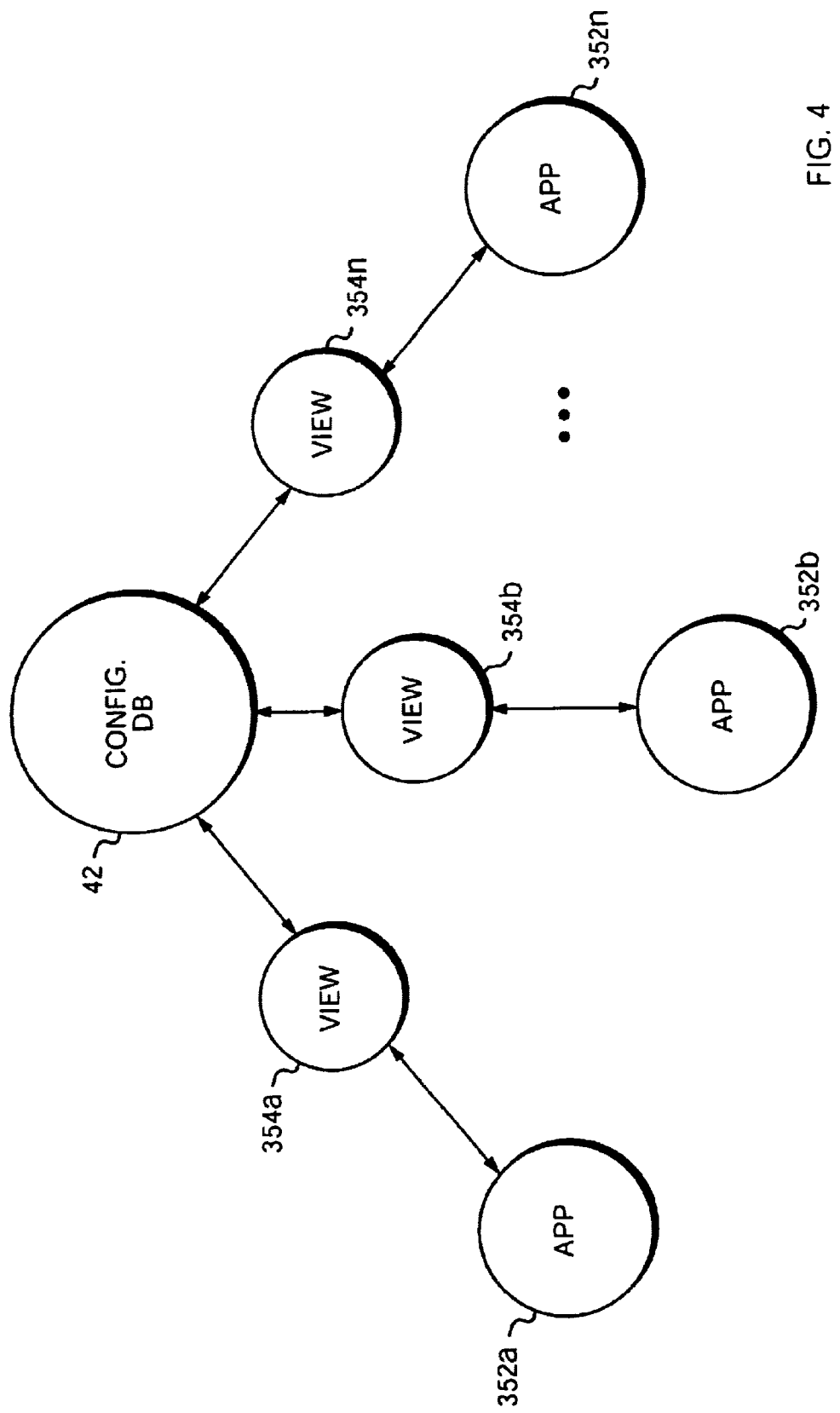
FIG. 4 is a flow diagram illustrating a method for allowing applications to view data within a database.

Referring to FIG. 4, applications 352*a*–352*n* each have an associated view 354*a*–354*n* of configuration database 42. The views may be similar allowing each application to view similar data within configuration database 42. For example, each application may be ATM version 1.0 and each view may be ATM view version 1.3. Instead, the applications and views may be different versions. For example, application 352*a* may be ATM version 1.0 and view 354*a* may be ATM view version 1.3 while application 352*b* is ATM version 1.7 and view 354*b* is ATM view version 1.5. A later version, for example, ATM version 1.7, of the same application may represent an upgrade of that application and its corresponding view allows the upgraded application access only to data relevant to the upgraded version and not data relevant to the older version. If the upgraded version of the application uses the same configuration data as an older version, then the view version may be the same for both applications. In addition, application 352*n* may represent a completely different type of application, for example, MPLS, and view 354*n* allows it to have access to data relevant to MPLS and not ATM or any other application. Consequently, through the use of database views, different versions of the same software applications and different types of software applications may be executed on computer system 10 simultaneously.

Views also allow the logical model and physical system to be changed, evolved and grown to support new applications and hardware without having to change existing applications. In addition, software applications may be upgraded and downgraded independent of each other and without having to re-boot computer system 10. For example, after computer system 10 is shipped to a customer, changes may be made to hardware or software. For instance, a new version of an application, for example, ATM version 2.0, may be created or new hardware may be released requiring a new or upgraded device driver process. To make this a new process and/or hardware available to the user of computer system 10, first the software image including the new process must be re-built.

Referring again to FIG. 3, logical model 280 is changed (280') to include models representing the new software and/or hardware. Code generator 336 then uses new logical model 280' to re-generate view ids and APIs 338' for each application, including, for example, ATM version two 360 and device driver 362, and DDL files 344' and 348'. The new application(s) and/or device driver(s) processes then bind to the new view ids and APIs. A copy of the new application(s) and/or device driver process as well as the new DDL files and any new hardware are sent to the user of computer system 10. The user can then download the new software and plug the new hardware into computer system 10. The upgrade process is described in more detail below.

Power-up:

Referring again to FIG. 1, on power-up, reset or reboot, the processor on each board (central processor and each line card) downloads and executes boot-strap code (i.e., minimal instances of the kernel software) and power-up diagnostic test code from its local memory subsystem. After passing the power-up tests, processor 24 on central processor 12 then downloads kernel software 20 from persistent storage 21 into non-persistent memory in memory subsystem 28. Kernel software 20 includes operating system (OS), system services (SS) and modular system services (MSS).

In one embodiment, the operating system software and system services software are the OSE operating system and system services from Enea OSE Systems, Inc. in Dallas, Tex. The OSE operating system is a pre-emptive multi-tasking operating system that provides a set of services that together support the development of distributed applications (i.e., dynamic loading). The OSE approach uses a layered architecture that builds a high level set of services around kernel primitives. The operating system, system services, and modular system services provide support for the creation and management of processes; inter-process communication (IPC) through a process-to-process messaging model; standard semaphore creation and manipulation services; the ability to locate and communicate with a process regardless of its location in the system; the ability to determine when another process has terminated; and the ability to locate the provider of a service by name.

These services support the construction of a distributed system wherein applications can be located by name and processes can use a single form of communication regardless of their location. By using these services, distributed applications may be designed to allow services to transparently move from one location to another such as during a fail over.

The OSE operating system and system services provide a single inter-process communications mechanism that allows processes to communicate regardless of their location in the system. OSE IPC differs from the traditional IPC model in that there are no explicit IPC queues to be managed by the application. Instead each process is assigned a unique process identification that all IPC messages use. Because OSE IPC supports inter-board communication the process identification includes a path component. Processes locate each other by performing an OSE Hunt call on the process identification. The Hunt call will return the Process ID of the process that maps to the specified path/name. Inter-board communication is carried over some number of communication links. Each link interface is assigned to an OSE Link Handler. The path component of a process path/name is the concatenation of the Link Handler names that one must transverse in order to reach the process.

In addition, the OSE operating system includes memory management that supports a "protected memory model". The protected memory model dedicates a memory block (i.e., defined memory space) to each process and erects "walls" around each memory block to prevent access by processes outside the "wall". This prevents one process from corrupting the memory space used by another process. For example, a corrupt software memory pointer in a first process may incorrectly point to the memory space of a second processor and cause the first process to corrupt the second processor's memory space. The protected memory model prevents the first process with the corrupted memory pointer from corrupting the memory space or block assigned to the second process. As a result, if a process fails, only the memory block assigned to that process is assumed corrupted while the remaining memory space is considered uncorrupted.

The modular software architecture takes advantage of the isolation provided to each process (e.g., device driver or application) by the protected memory model. Because each process is assigned a unique or separate protected memory block, processes may be started, upgraded or restarted independently of other processes.

Figure 5:
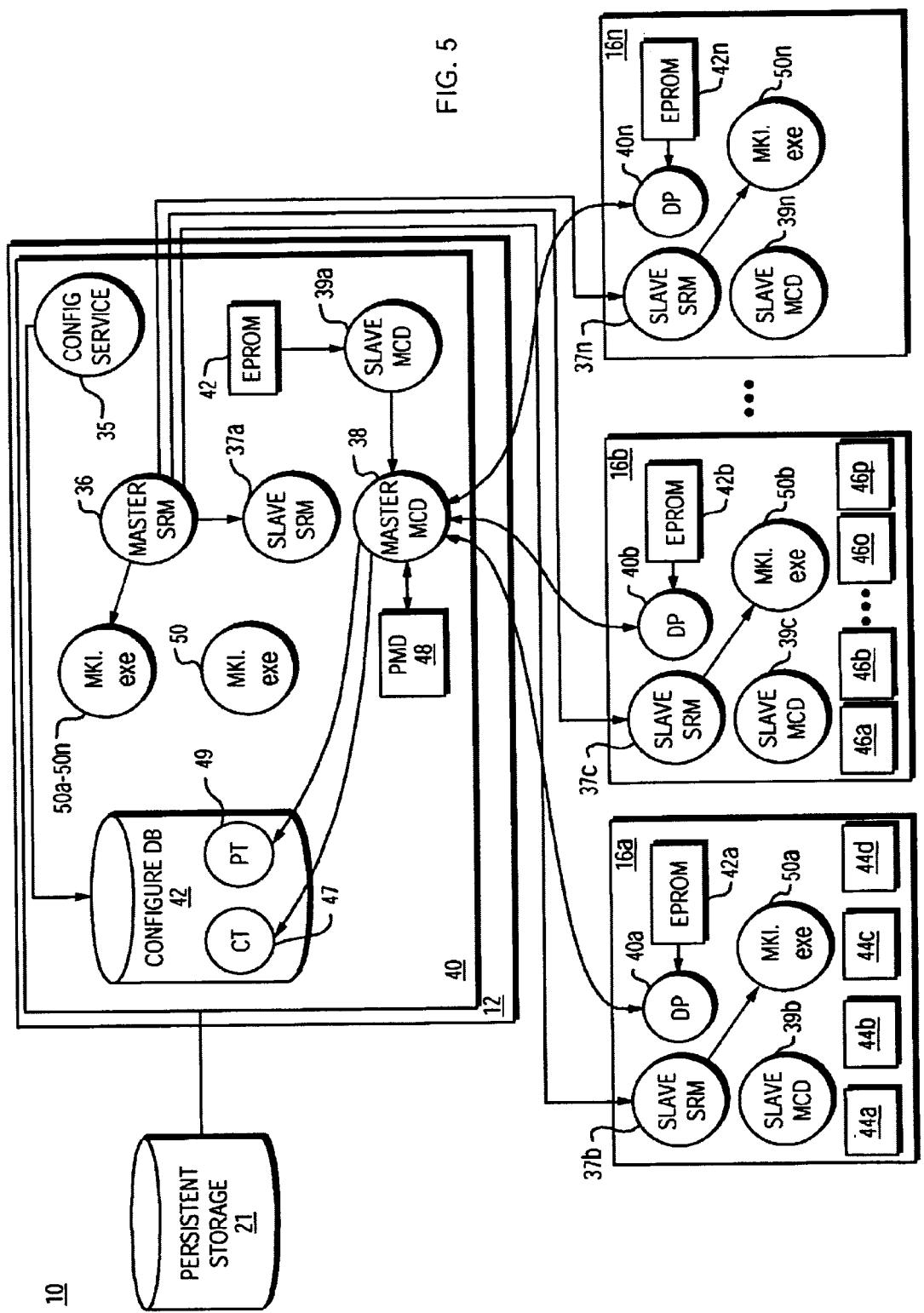
FIGS. 5 and 8 are block and flow diagrams of a computer system incorporating a modular system architecture and illustrating a method for accomplishing hardware inventory and setup.

Referring to FIG. 5, the main modular system service that controls the operation of computer system 10 is a System Resiliency Manager (SRM). Also within modular system services is a Master Control Driver (MCD) that learns the physical characteristics of the particular computer system on which it is running, in this instance, computer system 10. The MCD and the SRM are distributed applications. A master SRM 36 and a master MCD 38 are executed by central processor 12 while slave SRMs 37a–37n and slave MCDs 39a–39n are executed on each board (central processor 12 and each line card 16a–16n). The SRM and MCD work together and use their assigned view ids and APIs to load the appropriate software drivers on each board and to configure computer system 10.

Also within the modular system services is a configuration service program 35 that downloads a configuration database program 42 and its corresponding DDL file from persistent storage into non-persistent memory 40 on central processor 12. In one embodiment, configuration database 42 is a Polyhedra database from Polyhedra, Inc. in the United Kingdom.

Hardware Inventory and Set-up:

Master MCD 38 begins by taking a physical inventory of computer system 10 (over the I$^2$C bus) and assigning a unique physical identification number (PID) to each item. Despite the name, the PID is a logical number unrelated to any physical aspect of the component being numbered. In one embodiment, pull-down/pull-up resistors on the chassis mid-plane provide the number space of Slot Identifiers. The master MCD may read a register for each slot that allows it to get the bit pattern produced by these resistors. MCD 38 assigns a unique PID to the chassis, each shelf in the chassis, each slot in each shelf, each line card 16a–16n inserted in each slot, and each port on each line card. (Other items or components may also be inventoried.)

Typically, the number of line cards and ports on each line card in a computer system is variable but the number of chasses, shelves and slots is fixed. Consequently, a PID could be permanently assigned to the chassis, shelves and slots and stored in a file. To add flexibility, however, MCD 38 assigns a PID even to the chassis, shelves and slots to allow the modular software architecture to be ported to another computer system with a different physical construction (i.e., multiple chasses and/or a different number of shelves and slots) without having to change the PID numbering scheme.

Referring to FIGS. 5–7, for each line card 16a–16n in computer system 10, MCD 38 communicates with a diagnostic program (DP) 40a–40n being executed by the line card's processor to learn each card's type and version. The diagnostic program reads a line card type and version number out of persistent storage, for example, EPROM 42a–42n, and passes this information to the MCD. For example, line cards 16a and 16b could be cards that implement Asynchronous Transfer Mode (ATM) protocol over Synchronous Optical Network (SONET) protocol as indicated by a particular card type, e.g., 0XF002, and line card 16e could be a card that implements Internet Protocol (IP) over SONET as indicated by a different card type, e.g., 0XE002. In addition, line card 16a could be a version three ATM over SONET card meaning that it includes four SONET ports 44a–44d each of which may be connected to an external SONET optical fiber that carries an OC-48 stream, as indicated by a particular port type 00620, while line card 16b may be a version four ATM over SONET card meaning that it includes sixteen SONET ports 46a–46f each of which carries an OC-3 stream as indicated by a particular port type, e.g., 00820. Other information is also passed to the MCD by the DP, for example, diagnostic test pass/fail status. With this information, MCD 38 creates card table (CT) 47 and port table (PT) 49 in configuration database 42. As described below, the configuration database copies all changes to an NMS database. If the MCD cannot communicate with the diagnostic program to learn the card type and version number, then the MCD assumes the slot is empty.

Even after initial power-up, master MCD 38 will continue to take physical inventories to determine if hardware has been added or removed from computer system 10. For example, line cards may be added to empty slots or removed from slots. When changes are detected, master MCD 38 will update CT 47 and PT 49 accordingly.

For each line card 16a–16n, master MCD 38 searches a physical module description (PMD) file 48 in memory 40 for a record that matches the card type and version number retrieved from that line card. The PMD file may include multiple files. The PMD file includes a table that corresponds card type and version number with name of the mission kernel image executable file (MKI.exe) that needs to be loaded on that line card. Once determined, master MCD 38 passes the name of each MKI executable file to master SRM 36. Master SRM 36 requests a bootserver (not shown) to download the MKI executable files 50a–50n from persistent storage 21 into memory 40 (i.e., dynamic loading) and passes each MKI executable file 50a–50n to a bootloader (not shown) running on each board (central processor and each line card). The bootloaders execute the received MKI executable file.

Figure 8:
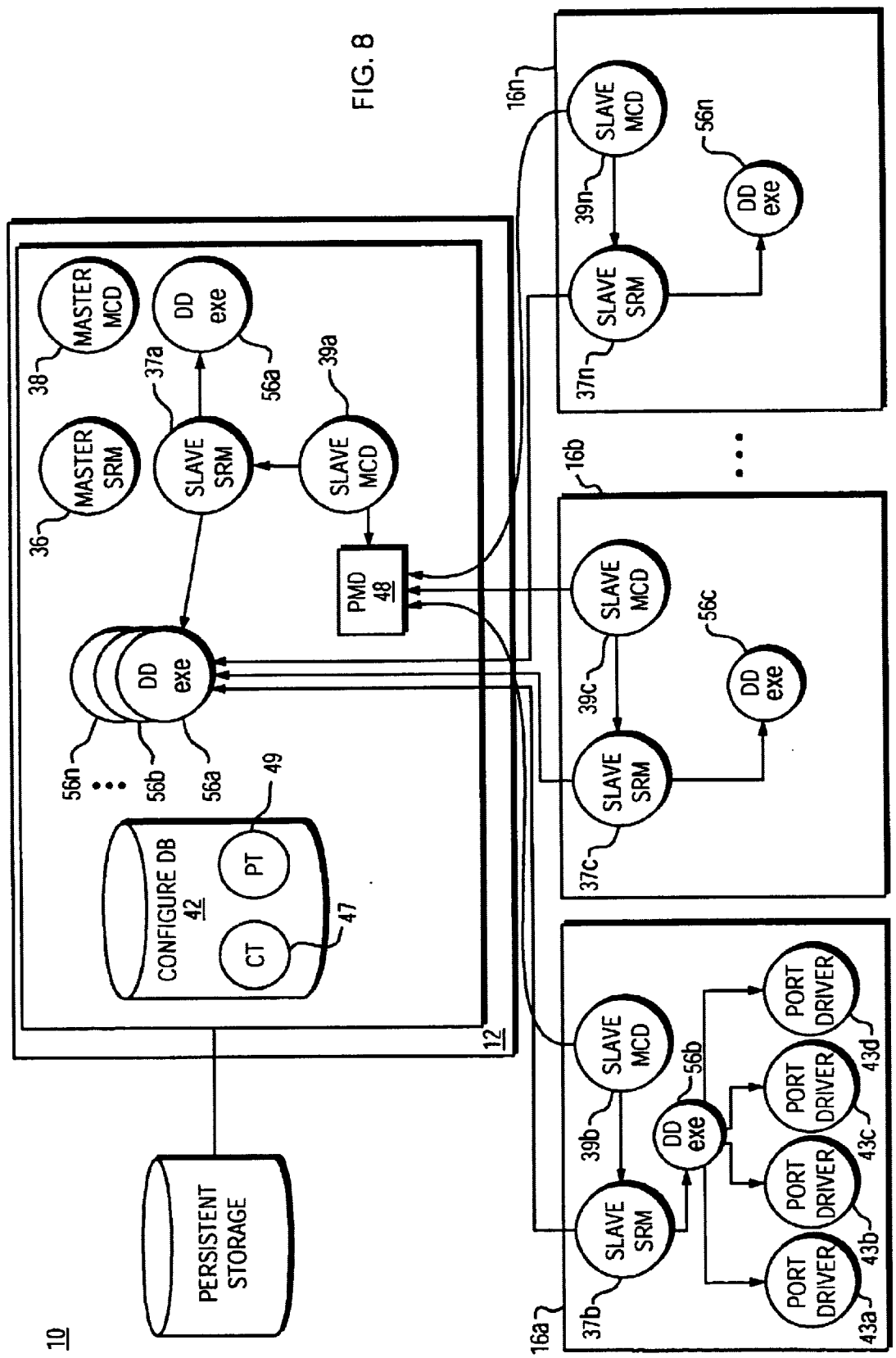

Once all the line cards are executing the appropriate MKI, slave MCDs 39a–39n and slave SRMs 37a–37n on each line card need to download device driver software corresponding to the particular devices on each card. Referring to FIG. 8, slave MCDs 39a–39n search PMD file 48 in memory 40 on central processor 12 for a match with their line card type and version number. Just as the master MCD 36 found the name of the MKI executable file for each line card in the PMD file, each slave MCD 39a–39n reads the PMD file to learn the names of all the device driver executable files associated with each line card type and version. The slave MCDs provide these names to the slave SRMs on their boards. Slave SRMs 37a–37n then download and execute the device driver executable files (DD.exe) 56a–56n from memory 40. As one example, one port device driver 43a–43d may be started for each port 44a–44d on line card 16a. The port driver and port are linked together through the assigned port PID number.

In order to understand the significance of the PMD file (i.e., metadata), note that the MCD software does not have knowledge of board types built into it. Instead, the MCD parameterizes its operations on a particular board by looking up the card type and version number in the PMD file and acting accordingly. Consequently, the MCD software does not need to be modified, rebuilt, tested and distributed with new hardware. The changes required in the software system infrastructure to support new hardware are simpler modify logical model 280 (FIG. 3) to include: a new entry in the PMD file (or a new PMD file) and, where necessary, new device drivers and applications. Because the MCD software, which resides in the kernel, will not need to be modified, the new applications and device drivers and the new DDL files (reflecting the new PMD file) for the configuration database and NMS database are downloaded and upgraded (as described below) without re-booting the computer system.

Figure 9:
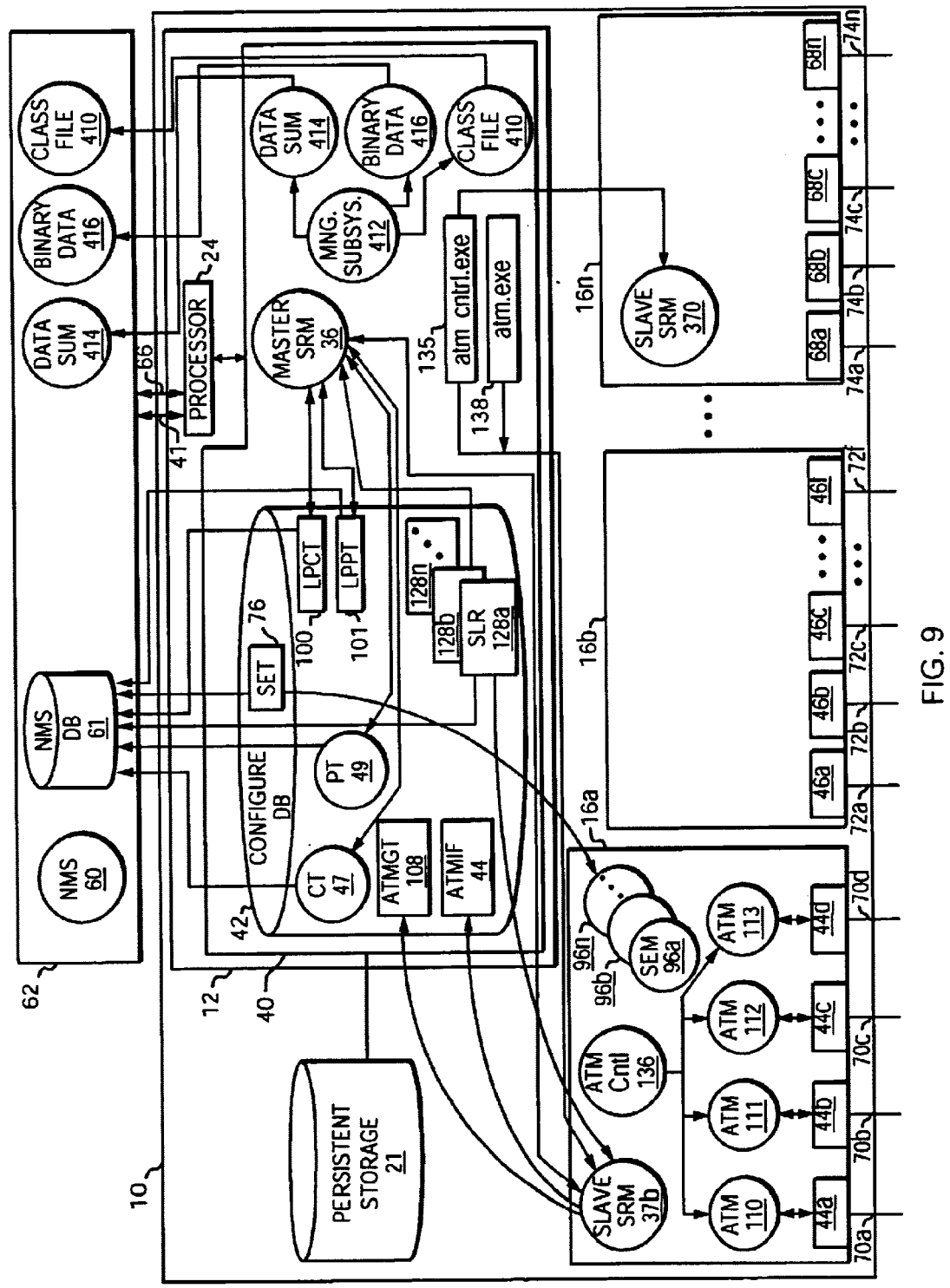
FIG. 9 is a block and flow diagram of a computer system incorporating a modular system architecture and illustrating a method for configuring the computer system using a network management system.

Network Management System (NMS):

Referring to FIG. 9, a user of computer system 10 works with network management system (NMS) software 60 to configure computer system 10. In the embodiment described below, NMS 60 runs on a personal computer or workstation 62 and communicates with central processor 12 over Ethernet network 41 (out-of-band). Instead, the NMS may communicate with central processor 12 over data path 34 (FIG. 1, in-band). Alternatively (or in addition as a back-up communication port), a user may communicate with computer system 10 through a terminal connected to a serial line 66 connecting to the data or control path using a command line interface (CLI) protocol. Instead, NMS 60 could run directly on computer system 10 provided computer system 10 has an input mechanism for the user.

NMS 60 establishes an NMS database 61 on work station 62 using a DDL file corresponding to the NMS database and downloaded from persistent storage 21 in computer system 10. The NMS database mirrors the configuration database through an active query feature (described below). In one embodiment, the NMS database is an Oracle database from Oracle Corporation in Boston, Mass. The NMS and central processor 12 pass control and data over Ethernet 41 using, for example, the Java Database Connectivity (JDBC) protocol. Use of the JDBC protocol allows the NMS to communicate with the configuration database in the same manner that it communicates with its own internal storage mechanisms, including the NMS database. Changes made to the configuration database are passed to the NMS database to insure that both databases store the same data. This synchronization process is much more efficient and timely than older methods that require the NMS to periodically poll the network device to determine whether configuration changes have been made. In these systems, NMS polling is unnecessary and wasteful if the configuration has not been changed. Additionally, if a configuration change is made through some other means, for example, a command line interface, and not through the NMS, the NMS will not be updated until the next poll, and if the network device crashes prior to the NMS poll, then the configuration change will be lost. In computer system 10, however, command line interface changes made to configuration database 42 are passed immediately to the NMS database through the active query feature ensuring that the NMS is immediately aware of any configuration changes.

Typically, work station 62 is coupled to many network computer systems, and NMS 60 is used to configure and manage each of these systems. In addition to configuring each system, the NMS also interprets data gathered by each system relevant to each system's network accounting data, statistics, and fault logging and presents this to the user. Instead of having the NMS interpret each system's data in the same fashion, flexibility is added by having each system send the NMS a JAVA class file 410 indicating how its network data should be interpreted. Through the File Transfer Protocol (ftp), an accounting subsystem process 412 running on central processor 12 pushes a data summary file 414 and a binary data file 416 to the NMS. The data summary file indicates the name of the JAVA Class file the NMS should use to interpret the binary data file. If the computer system has not already done so, it pushes the class file to the NMS. JAVA Reflection is used to load the application class file and process the data in the binary data file. As a result, a new class file can be added or updated on a computer system without having to reboot the computer system or update the NMS. The computer system simply pushes the new class file to the NMS. In addition, the NMS can use different class files for each computer system such that the data gathered on each system can be particularized to each system.

Configuration:

As described above, unlike a monolithic software architecture which is directly linked to the hardware of the computer system on which it runs, a modular software architecture includes independent applications that are significantly decoupled from the hardware through the use of a logical model of the computer system. Using the logical model, a view id and API are generated for each application to define each application's access to particular data in a configuration database. The configuration database is established using a data definition language (DDL) file also generated from the logical model. As a result, there is only a limited connection between the computer system's software and hardware, which allows for multiple versions of the same application to run on the computer system simultaneously and different types of applications to run simultaneously on the computer system. In addition, while the computer system is running, application upgrades and downgrades may be executed without affecting other applications and new hardware and software may be added to the system also without affecting other applications.

Referring again to FIG. 9, initially, NMS 60 reads card table 47 and port table 49 to determine what hardware is available in computer system 10. The NMS assigns a logical identification number (LID) 98 (FIGS. 11a and 1b) to each card and port and inserts these numbers in an LID to PID Card table (LPCT) 100 and an LID to PID Port table (LPPT) 101 in configuration database 42. Alternatively, the NMS could use the PID previously assigned to each board by the MCD. However, to allow for hardware redundancy, the NMS assigns an LID and may associate the LID with at least two PIDs, a primary PID 102 and a backup PID 104. (LPCT 100 may include multiple backup PID fields to allow more than one backup PID to be assigned to each primary PID.)

The user chooses the desired redundancy structure and instructs the NMS as to which boards are primary boards and which boards are backup boards. For example, the NMS may assign LID 30 to line card 16a—previously assigned PID 500 by the MCD—as a user defined primary card, and the NMS may assign LID 30 to line card 16n—previously assigned PID 513 by the MCD—as a user defined back-up card (see row 106, FIG. 11a). The NMS may also assign LID 40 to port 44a—previously assigned PID 1500 by the MCD—as a primary port, and the NMS may assign LID 40 to port 68a—previously assigned PID 1600 by the MCD—as a back-up port (see row 107, FIG. 11b).

In a 1:1 redundant system, each backup line card backs-up only one other line card and the NMS assigns a unique primary PID and a unique backup PID to each LID (no LIDs share the same PIDs). In a 1:N redundant system, each backup line card backs-up at least two other line cards and the NMS assigns a different primary PID to each LID and the same backup PID to at least two LIDs. For example, if computer system 10 is a 1:N redundant system, then one line card, for example, line card 16n, serves as the hardware backup card for at least two other line cards, for example, line cards 16a and 16b. If the NMS assigns an LID of 31 to line card 16b, then in logical to physical card table 100 (see row 109, FIG. 11a), the NMS associates LID 31 with primary PID 501 (line card 16b) and backup PID 513 (line card 16n). As a result, backup PID 513 (line card 16n) is associated with both LID 30 and 31.

The logical to physical card table provides the user with maximum flexibility in choosing a redundancy structure. In the same computer system, the user may provide full redundancy (1:1), partial redundancy (1:N), no redundancy or a combination of these redundancy structures. For example, a network manager (user) may have certain customers that are willing to pay more to ensure their network availability, and the user may provide a backup line card for each of that customer's primary line cards (1:1). Other customers may be willing to pay for some redundancy but not full redundancy, and the user may provide one backup line card for all of that customer's primary line cards (1:N). Still other customers may not need any redundancy, and the user will not provide any backup line cards for that customer's primary line cards. For no redundancy, the NMS would leave the backup PID field in the logical to physical table blank. Each of these customers may be serviced by separate computer systems or the same computer system. Redundancy is discussed in more detail below.

The NMS and MCD use the same numbering space for LIDs, PIDs and other assigned numbers to ensure that the numbers are different (no collisions).

The configuration database, for example, a Polyhedra database, supports an "active query" feature. Through the active query feature, other software applications can be notified of changes to configuration database records in which they are interested. The NMS database establishes an active query for all configuration database records to insure it is updated with all changes. The master SRM establishes an active query with configuration database 42 for LPCT 100 and LPPT 101. Consequently, when the NMS adds to or changes these tables, configuration database 42 sends a notification to the master SRM and includes the change. In this example, configuration database 42 notifies master SRM 36 that LID 30 has been assigned to PID 500 and 513 and LID 31 has been assigned to PID 501 and 513. The master SRM then uses card table 47 to determine the physical location of boards associated with new or changed LIDs and then tells the corresponding slave SRM of its assigned LID(s). In the continuing example, master SRM reads CT 47 to learn that PID 500 is line card 16*a*, PID 501 is line card 16*b* and PID 513 is line card 16*n*. The master SRM then notifies slave SRM 37*b* on line card 16*a* that it has been assigned LID 30 and is a primary line card, SRM 37*c* on line card 16*b* that it has been assigned LID 31 and is a primary line card and SRM 37*o* on line card 16*n* that it has been assigned LIDs 30 and 31 and is a backup line card. All three slave SRMs 37*b*, 37*c* and 37*o* then set up active queries with configuration database 42 to insure that they are notified of any software load records (SLRs) created for their LIDs. A similar process is followed for the LIDs assigned to each port.

The NMS informs the user of the hardware available in computer system 10. This information may be provided as a text list, as a logical picture in a graphical user interface (GUI), or in a variety of other formats. The user then tells the NMS how they want the system configured.

The user will select which ports (e.g., 44*a*–44*d*, 46*a*–46*f*, 68*a*–68*n*) the NMS should enable. There may be instances where some ports are not currently needed and, therefore, not enabled. The user also needs to provide the NMS with information about the type of network connection (e.g., connection 70*a*–70*d*, 72*a*–72*f*, 74*a*–74*n*). For example, the user may want all ports 44*a*–44*d* on line card 16*a* enabled to run ATM over SONET. The NMS may start one ATM application to control all four ports, or, for resiliency, the NMS may start one ATM application for each port. Alternatively, each port may be enabled to run a different protocol (e.g., MPLS, IP, Frame Relay).

In the example given above, the user must also indicate the type of SONET fiber they have connected to each port and what paths to expect. For example, the user may indicate that each port 44*a*–44*d* is connected to a SONET optical fiber carrying an OC-48 stream. A channelized OC-48 stream is capable of carrying forty-eight STS-1 paths, sixteen STS-3c paths, four STS-12c paths or a combination of STS-1, STS-3c and STS-12c paths. A clear channel OC-48c stream carries one concatenated STS-48 path. In the example, the user may indicate that the network connection to port 44*a* is a clear channel OC-48 SONET stream having one STS-48 path, the network connection to port 44*b* is a channelized OC-48 SONET stream having three STS-12c paths (i.e., the SONET fiber is not at full capacity—more paths may be added later), the network connection to port 44*c* is a channelized OC-48 SONET stream having two STS-3c paths (not at full capacity) and the network connection to port 44*d* is a channelized OC-48 SONET stream having three STS-12c paths (not at full capacity). In the current example, all paths within each stream carry data transmitted according to the ATM protocol. Alternatively, each path within a stream may carry data transmitted according to a different protocol.

The NMS uses the information received from the user to create records in several tables in the configuration database, which are then copied to the NMS database. These tables are accessed by other applications to configure computer system 10. One table, the service endpoint table (SET) 76 (see also FIG. 10), is created when the NMS assigns a unique service endpoint number (SE) to each path on each enabled port and corresponds each service endpoint number with the physical identification number (PID) previously assigned to each port by the MCD. Through the use of the logical to physical port table (LPPT), the service endpoint number also corresponds to the logical identification number (LID) of the port. For example, since the user indicated that port 44*a* (PID 1500) has a single STS-48 path, the NMS assigns one service endpoint number (e.g. SE 1, see row 78, FIG.10). Similarly, the NMS assigns three service endpoint numbers (e.g., SE 2, 3, 4, see rows 80–84) to port 44*b* (PID 1501), two service endpoint numbers (e.g., SE 5, 6, see rows 86, 88) to port 44*c* (PID 1502) and three service endpoint numbers (e.g., SE 7, 8, 9, see rows 90, 92, 94) to port 44*d*.

Service endpoint managers (SEMs) within the modular system services of the kernel software running on each line card use the service endpoint numbers assigned by the NMS to enable ports and to link instances of applications, for example, ATM, running on the line cards with the correct port. The kernel may start one SEM to handle all ports on one line card, or, for resiliency, the kernel may start one SEM for each particular port. For example, SEMs 96*a*–96*d* are spawned to independently control ports 44*a*–44*d*.

The service endpoint managers (SEMs) running on each board establish active queries with the configuration database for SET 76. Thus, when the NMS changes or adds to the service endpoint table (SET), the configuration database sends the service endpoint manager associated with the port PID in the SET a change notification including information on the change that was made. In the continuing example, configuration database 42 notifies SEM 96*a* that SET 76 has been changed and that SE 1 was assigned to port 44*a* (PID 1500). Configuration database 42 notifies SEM 96*b* that SE 2, 3, and 4 were assigned to port 44*b* (PID 1501), SEM 96*c* that SE 5 and 6 were assigned to port 44*c* (PID 1502) and SEM 96*d* that SE 7, 8, and 9 were assigned to port 44*d* (PID 1503). When a service endpoint is assigned to a port, the SEM associated with that port passes the assigned SE number to the port driver for that port using the port PID number associated with the SE number.

To load instances of software applications on the correct boards, the NMS creates software load records (SLR) 128*a*–128*n* in configuration database 42. The SLR includes the name 130 (FIG. 14) of a control shim executable file and an LID 132 for cards on which the application must be spawned. In the continuing example, NMS 60 creates SLR 128*a* including the executable name atm_cntrl.exe and card LID 30 (row 134). The configuration database detects LID 30 in SLR 128*a* and sends slave SRMs 37*b* (line card 16*a*) and 37*o* (line card 16*n*) a change notification including the name of the executable file (e.g., atm_cntrl.exe) to be loaded. The primary slave SRMs then download and execute a copy of atm_cntrl.exe 135 from memory 40 to spawn the ATM controllers (e.g., ATM controller 136 on line card 16*a*). Since slave SRM 37*o* is on backup line card 16*n*, it may or may not spawn an ATM controller in backup mode. Software backup is described in more detail below. Instead of downloading a copy of atm_cntrl.exe 135 from memory 40, a slave SRM may download it from another line card that already downloaded a copy from memory 40. There may be instances when downloading from a line card is quicker than downloading from central processor 12. Through software load records and the tables in configuration database 42, applications are downloaded and executed without the need for the system services, including the SRM, or any other software in the kernel to have information as to how the applications should be configured. The control shims (e.g., atm_cntrl.exe 135) interpret the next layer of the application (e.g., ATM) configuration.

For each application that needs to be spawned, for example, an ATM application and a SONET application, the NMS creates an application group table. Referring to FIG. 12, ATM group table 108 indicates that four instances of ATM (i.e., group number 1, 2, 3, 4)—corresponding to four enabled ports 44*a*–44*n*—are to be started on line card 16*a*

(LID 30). If other instances of ATM are started on other line cards, they would also be listed in ATM group table 108 but associated with the appropriate line card LID. ATM group table 108 may also include additional information needed to execute ATM applications on each particular line card. (See description of software backup below.)

In the above example, one instance of ATM was started for each port on the line card. This provides resiliency and fault isolation should one instance of ATM fail or should one port suffer a failure. An even more resilient scheme would include multiple instances of ATM for each port. For example, one instance of ATM may be started for each path received by a port.

The application controllers on each board now need to know how many instances of the corresponding application they need to spawn. This information is in the application group table in the configuration database. Through the active query feature, the configuration database notifies the application controller of records associated with the board's LID from corresponding application group tables. In the continuing example, configuration database 42 sends ATM controller 136 records from ATM group table 108 that correspond to LID 30 (line card 16a). With these records, ATM controller 136 learns that there are four ATM groups associated with LID 30 meaning ATM must be instantiated four times on line card 16a. ATM controller 136 asks slave SRM 37b to download and execute four instances (ATM 110–113, FIG. 15) of atm.exe 138.

Once spawned, each instantiation of ATM 110–113 sends an active database query to search ATM interface table 114 for its corresponding group number and to retrieve associated records. The data in the records indicates how many ATM interfaces each instantiation of ATM needs to spawn. Alternatively, a master ATM application (not shown) running on central processor 12 may perform active queries of the configuration database and pass information to each slave ATM application running on the various line cards regarding the number of ATM interfaces each slave ATM application needs to spawn.

Figure 15:
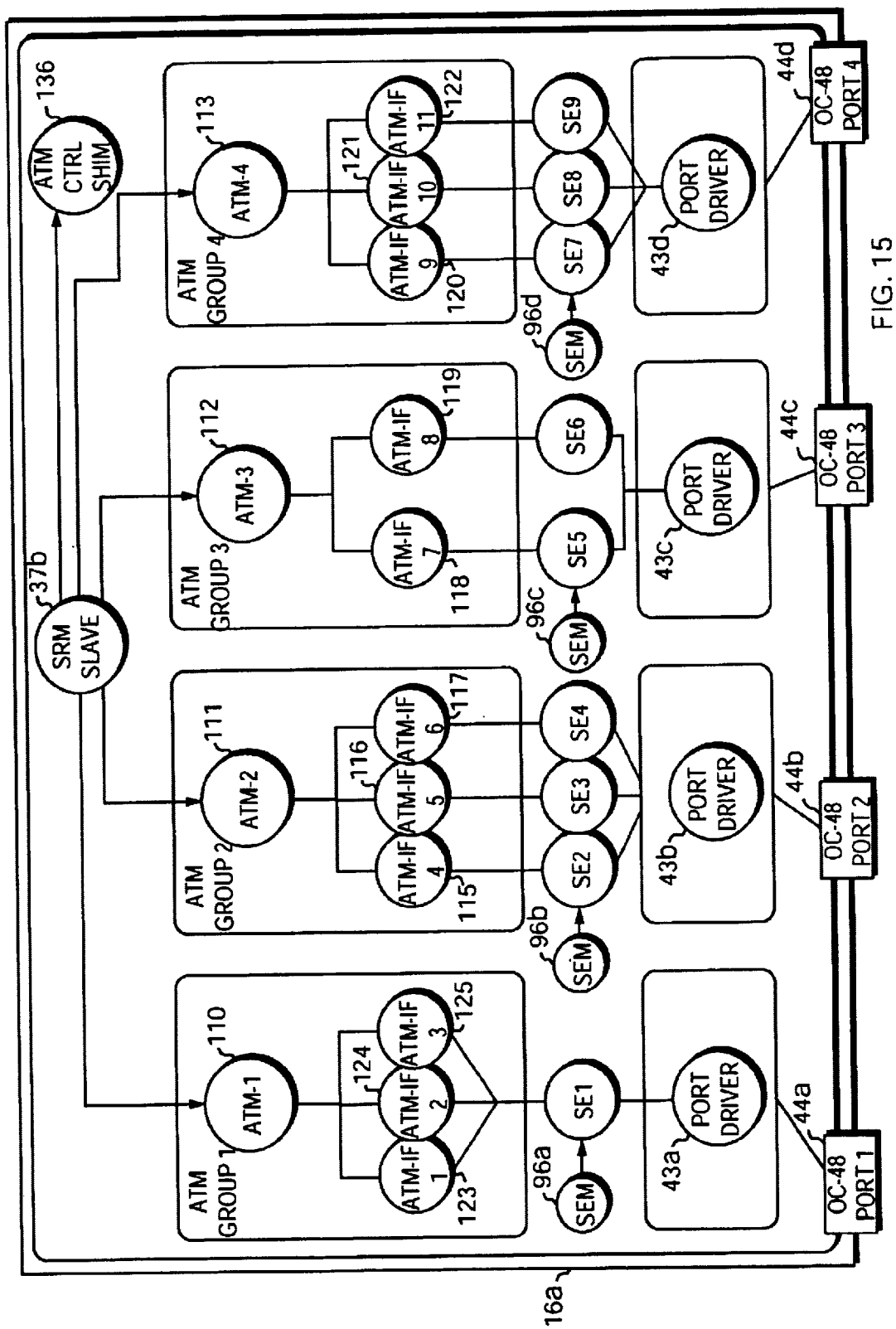
FIG. 15 is a block and flow diagram of a line card and a method for executing multiple instances of processes.

Referring to FIGS. 13 and 15, for each instance of ATM 110–113 there may be one or more ATM interfaces. To configure these ATM interfaces, the NMS creates an ATM interface table 114. There may be one ATM interface 115–122 per path/service endpoint or multiple virtual ATM interfaces 123–125 per path. This flexibility is left up to the user and NMS, and the ATM interface table allows the NMS to communicate this configuration information to each instance of each application running on the different line cards. For example, ATM interface table 114 indicates that for ATM group 1, service endpoint 1, there are three virtual ATM interfaces (ATM-IF 1–3) and for ATM group 2, there is one ATM interface for each service endpoint: ATM-IF 4 and SE 2; ATM-IF 5 and SE 3; and ATM-IF 6 and SE 4.

Computer system 10 is now ready to operate as a network switch using line card 16a and ports 44a–44d. The user will likely provide the NMS with further instructions to configure more of computer system 10. For example, instances of other software applications, such as an IP application, and additional instances of ATM may be spawned (as described above) on line cards 16a or other boards in computer system 10.

As shown above, all application dependent data resides in memory 40 and not in kernel software. Consequently, changes may be made to applications and configuration data in memory 40 to allow hot (while computer system 10 is running) upgrades of software and hardware and configuration changes. Although the above described power-up and configuration of computer system 10 is complex, it provides massive flexibility as described in more detail below.

Inter-process Communication:

As described above, the operating system assigns a unique process identification number (proc_id) to each spawned process. Each process has a name, and each process knows the names of other processes with which it needs to communicate. The operating system keeps a list of process names and the assigned process identification numbers. Processes send messages to other processes using the assigned process identification numbers without regard to what board is executing each process (i.e., process location). Application Programming Interfaces (APIs) define the format and type of information included in the messages.

The modular software architecture configuration model requires a single software process to support multiple configurable objects. For example, as described above, an ATM application may support configurations requiring multiple ATM interfaces and thousands of permanent virtual connections per ATM interface. The number of processes and configurable objects in a modular software architecture can quickly grow especially in a distributed processing system. If the operating system assigns a new process for each configurable object, the operating system's capabilities may be quickly exceeded. For example, the operating system may be unable to assign a process for each ATM interface, each service endpoint, each permanent virtual circuit, etc. In some instances, the process identification numbering scheme itself may not be large enough. Where protected memory is supported, the system may have insufficient memory to assign each process and configurable object a separate memory block. In addition, supporting a large number of independent processes may reduce the operating system's efficiency and slow the operation of the entire computer system.

Figure 16A:
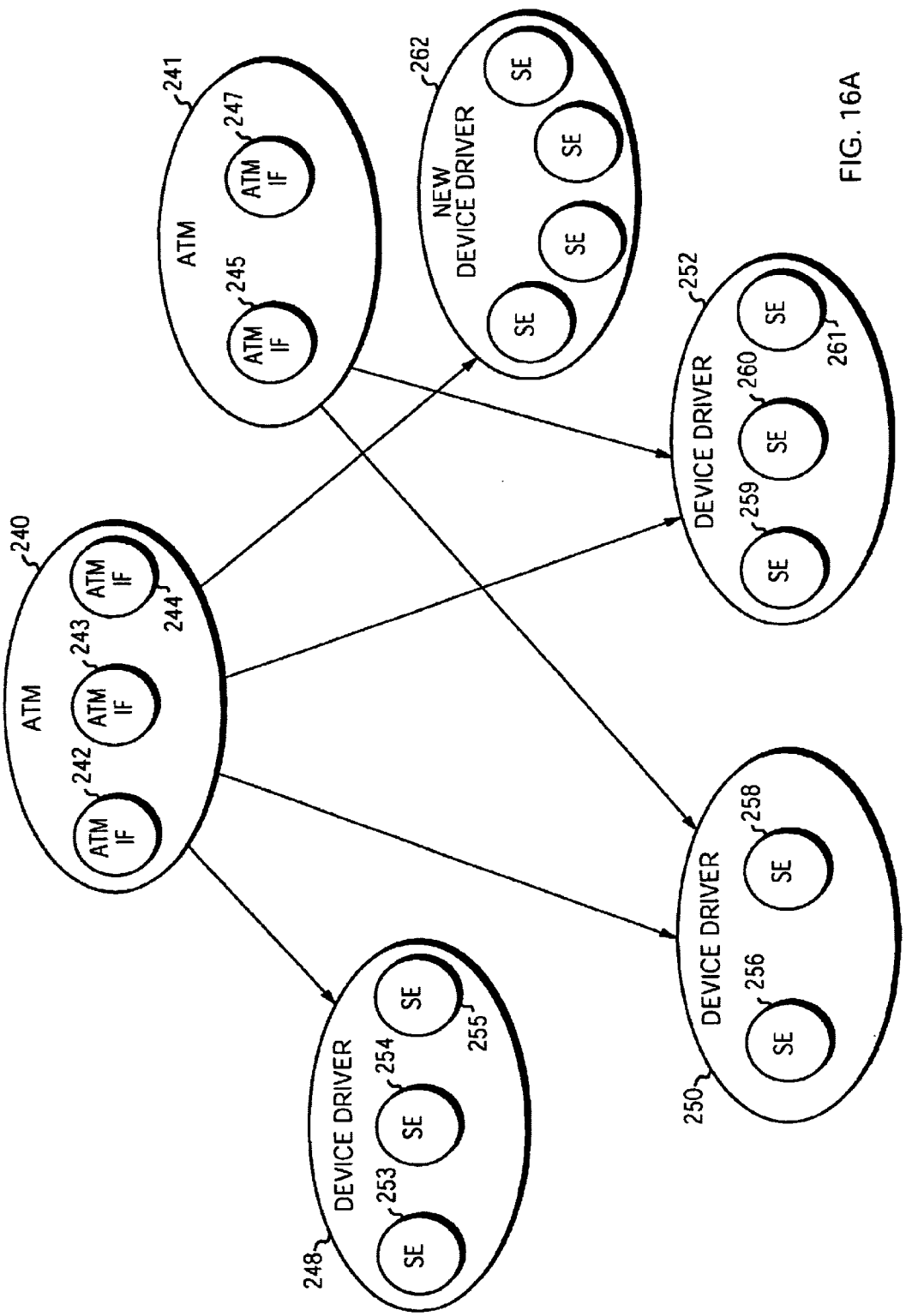
FIGS. 16a–16b are flow diagrams illustrating a method for assigning logical names for inter-process communications.

One alternative is to assign a unique process identification number to only certain high level processes. Referring to FIG. 16a, for example, process identification numbers may only be assigned to each ATM process (e.g., ATMs 240, 241) and not to each ATM interface (e.g., ATM IFs 242–247) and process identification numbers may only be assigned to each port device driver (e.g., device drivers 248, 250, 252) and not to each service endpoint (e.g., SE 253–261). A disadvantage to this approach is that objects within one high level process will likely need to communicate with objects within other high level processes. For example, ATM interface 242 within ATM 240 may need to communicate with SE 253 within device driver 248. ATM IF 242 needs to know if SE 253 is active and perhaps certain other information about SE 253. Since SE 253 was not assigned a process identification number, however, neither ATM 240 nor ATM IF 242 knows if it exists. Similarly, ATM IF 242 knows it needs to communicate with SE 253 but does not know that device driver 248 controls SE 253.

One possible solution is to hard code the name of device driver 248 into ATM 240. ATM 240 then knows it must communicate with device driver 248 to learn about the existence of any service endpoints within device driver 248 that may be needed by ATM IF 242, 243 or 244. Unfortunately, this can lead to scalability issues. For instance, each instantiation of ATM (e.g., ATM 240, 241) needs to know the name of all device drivers (e.g., device drivers 248, 250, 252) and must query each device driver to locate each needed service endpoint. An ATM query to a device driver that does not include a necessary service endpoint is a waste of time and resources. In addition, each high level process must periodically poll other high level processes to determine whether objects within them are still active (i.e., not terminated) and whether new objects have been started. If the object status has not changed between polls, then the poll wasted resources. If the status did change, then communications have been stalled for the length of time between polls. In addition, if a new device driver is added (e.g., device driver 262), then ATM 240 and 241 cannot communicate with it or any of the service endpoints within it until they have been upgraded to include the new device driver's name.

Preferably, computer system 10 implements a name server process and a flexible naming procedure. The name server process allows high level processes to register information about the objects within them and to subscribe for information about the objects with which they need to communicate. The flexible naming procedure is used instead of hard coding names in processes. Each process, for example, applications and device drivers, use tables in the configuration database to derive the names of other configurable objects with which they need to communicate. For example, both an ATM application and a device driver process may use an assigned service endpoint number from the service endpoint table (SET) to derive the name of the service endpoint that is registered by the device driver and subscribed for by the ATM application. Since the service endpoint numbers are assigned by the NMS during configuration, stored in SET 76 and passed to local SEMs, they will not be changed if device drivers or applications are upgraded or restarted.

Figure 16B:
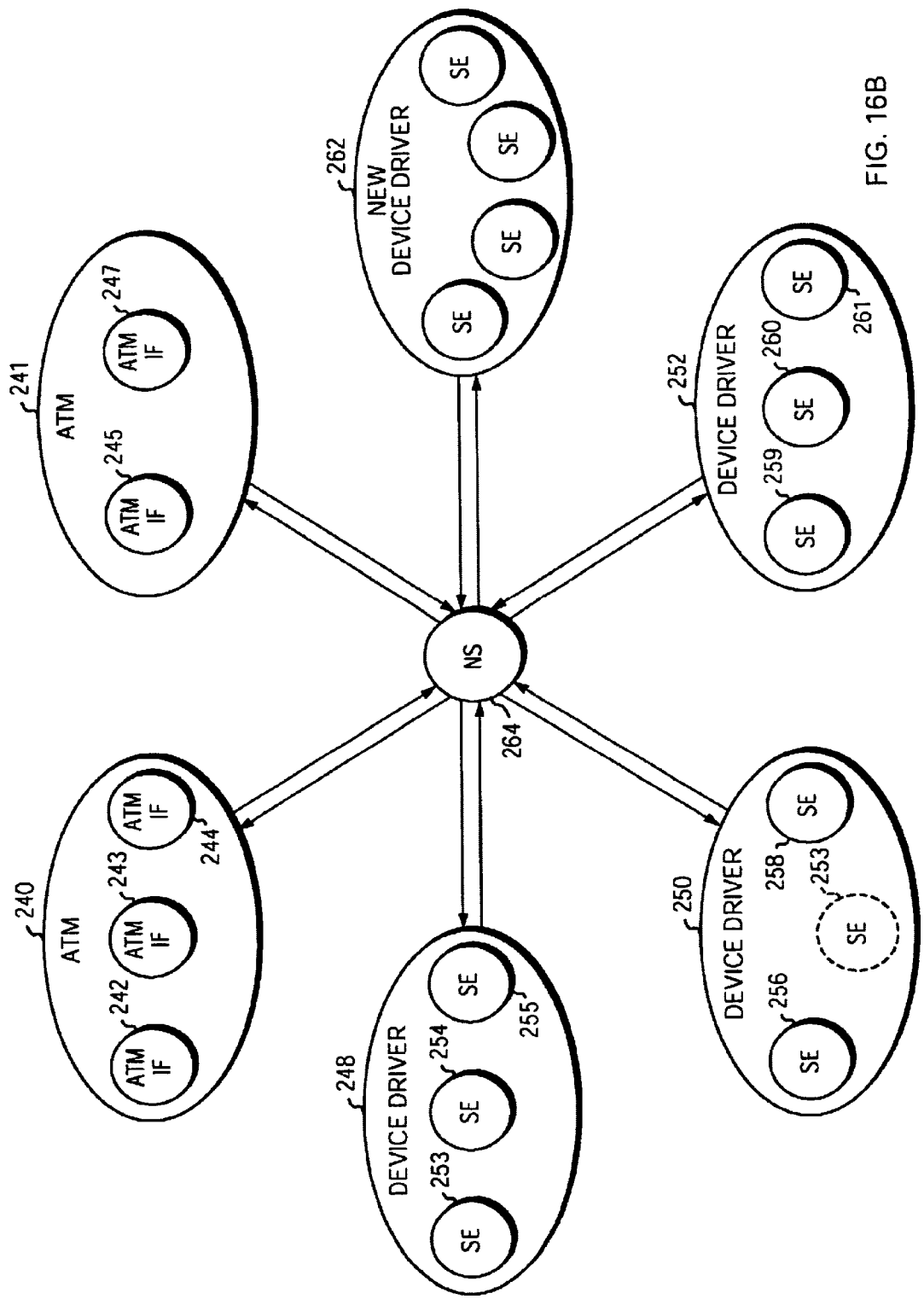

Referring to FIG. 16b, for example, when device drivers 248, 250 and 252 are started they each register with name server (NS) 264. Each device driver provides a name, a process identification number and the name of each of its service endpoints. Each device driver also updates the name server as service endpoints are started, terminated or restarted. Similarly, each instantiation of ATM 240, 241 subscribes with name server 264 and provides its name, process identification number and the name of each of the service endpoints in which it is interested. The name server then notifies ATM 240 and 241 as to the process identification of the device driver with which they should communicate to reach a desired service endpoint. The name server updates ATM 240 and 241 in accordance with updates from the device drivers. As a result, updates are provided only when necessary (i.e., no wasted resources), and the computer system is highly scalable. For example, if a new device driver 262 is started, it simply registers with name server 264, and name server 264 notifies either ATM 240 or 241 if a service endpoint in which they are interested is within the new device driver. The same is true if a new instantiation of ATM—perhaps an upgraded version—is started or if either an ATM application or a device driver fails and is restarted.

Figure 16C:
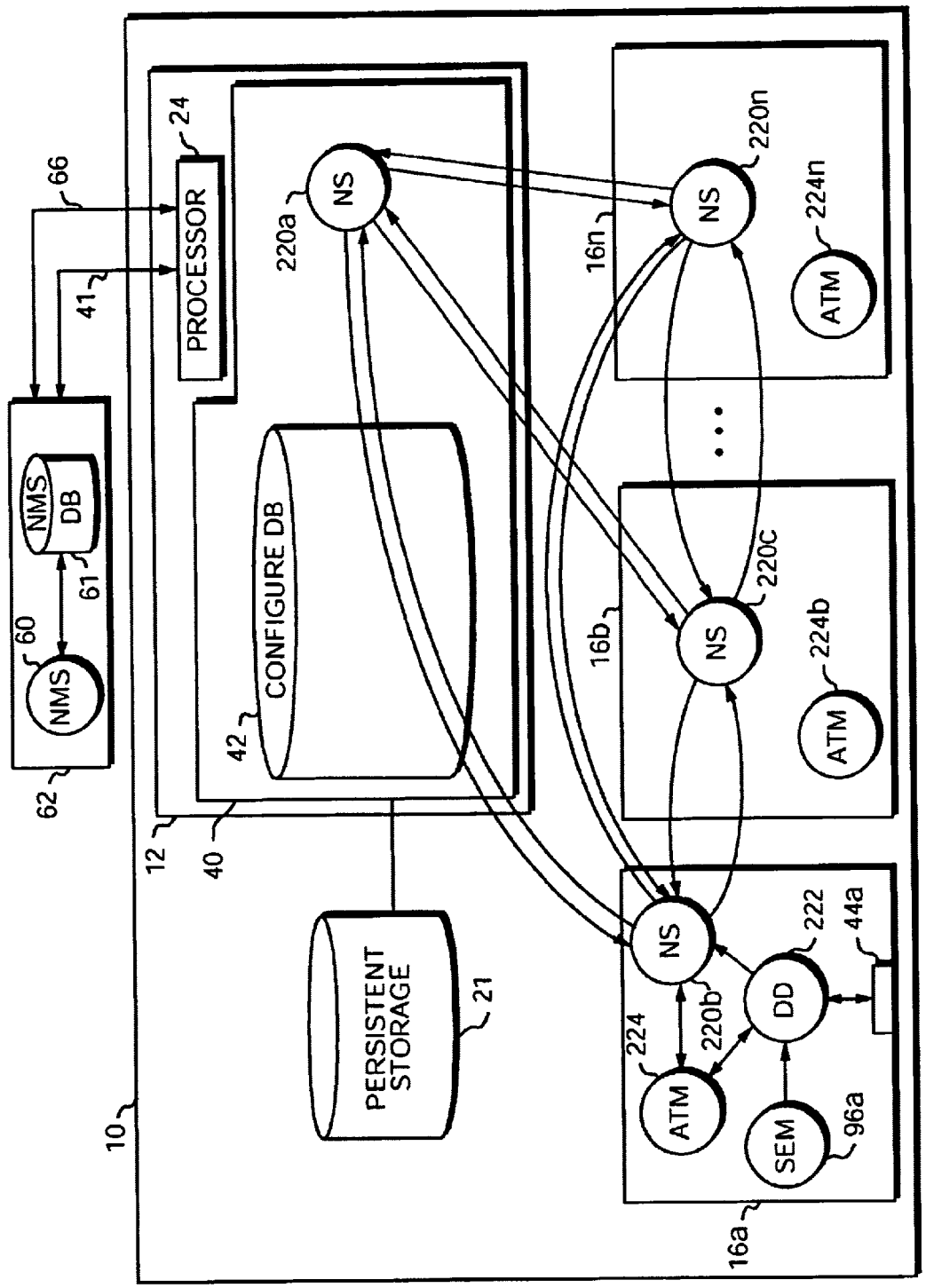
FIG. 16c is a block and flow diagram of a computer system incorporating a modular system architecture and illustrating a method for using logical names for inter-process communications.

Referring to FIG. 16c, when the SEM, for example, SEM 96a, notifies a device driver, for example, device driver (DD) 222, of its assigned SE number, DD 222 uses the SE number to generate a device driver name. In the continuing example from above, where the ATM over SONET protocol is to be delivered to port 44a and DD 222, the device driver name may be for example, atm.se1. DD 222 publishes this name to NS 220b along with the process identification assigned by the operating system and the name of its service endpoints.

Applications, for example, ATM 224, also use SE numbers to generate the names of device drivers with which they need to communicate and subscribe to NS 220b for those device driver names, for example, atm.se1. If the device driver has published its name and process identification with NS 220b, then NS 220b notifies ATM 224 of the process identification number associated with atm.se1 and the name of its service endpoints. ATM 224 can then use the process identification to communicate with DD 222 and, hence, any objects within DD 222. If device driver 222 is restarted or upgraded, SEM 96a will again notify DD 222 that its associated service endpoint is SE 1 which will cause DD 222 to generate the same name of atm.se1. DD 222 will then re-publish with NS 220b and include the newly assigned process identification number. NS 220b will provide the new process identification number to ATM 224 to allow the processes to continue to communicate. Similarly, if ATM 224 is restarted or upgraded, it will use the service endpoint numbers from ATM interface table 114 and, as a result, derive the same name of atm.se1 for DD 222. ATM 224 will then re-subscribe with NS 220b.

Computer system 10 includes a distributed name server (NS) application including a name server process 220a–220n on each board (central processor and line card). Each name server process handles the registration and subscription for the processes on its corresponding board. For distributed applications, after each application (e.g., ATM 224a–224n) registers with its local name server (e.g., 220b–220n), the name server registers the application with each of the other name servers. In this way, only distributed applications are registered/subscribed system wide which avoids wasting system resources by registering local processes system wide.

The operating system, through the use of assigned process identification numbers, allows for inter-process communication (IPC) regardless of the location of the processes within the computer system. The flexible naming process allows applications to use data in the configuration database to determine the names of other applications and configurable objects, thus, alleviating the need for hard coded process names. The name server notifies individual processes of the existence of the processes and objects with which they need to communicate and the process identification numbers needed for that communication. The termination, re-start or upgrade of an object or process is, therefore, transparent to other processes, with the exception of being notified of new process identification numbers. For example, due to a configuration change initiated by the user of the computer system, service endpoint 253 (FIG. 16b), may be terminated within device driver 248 and started instead within device driver 250. This movement of the location of object 253 is transparent to both ATM 240 and 241. Name server 264 simply notifies whichever processes have subscribed for SE 253 of the newly assigned process identification number corresponding to device driver 250.

The name server or a separate binding object manager (BOM) process may allow processes and configurable objects to pass additional information adding further flexibility to inter-process communications. For example, flexibility may be added to the application programming interfaces (APIs) used between processes. As discussed above, once a process is given a process identification number by the name server corresponding to an object with which it needs to communicate, the process can then send messages to the other process in accordance with a predefined application programming interface (API). Instead of having a predefined API, the API could have variables defined by data passed through the name server or BOM, and instead of having a single API, multiple APIs may be available and the selection of the API may be dependent upon information passed by the name server or BOM to the subscribed application.

Figure 16D:
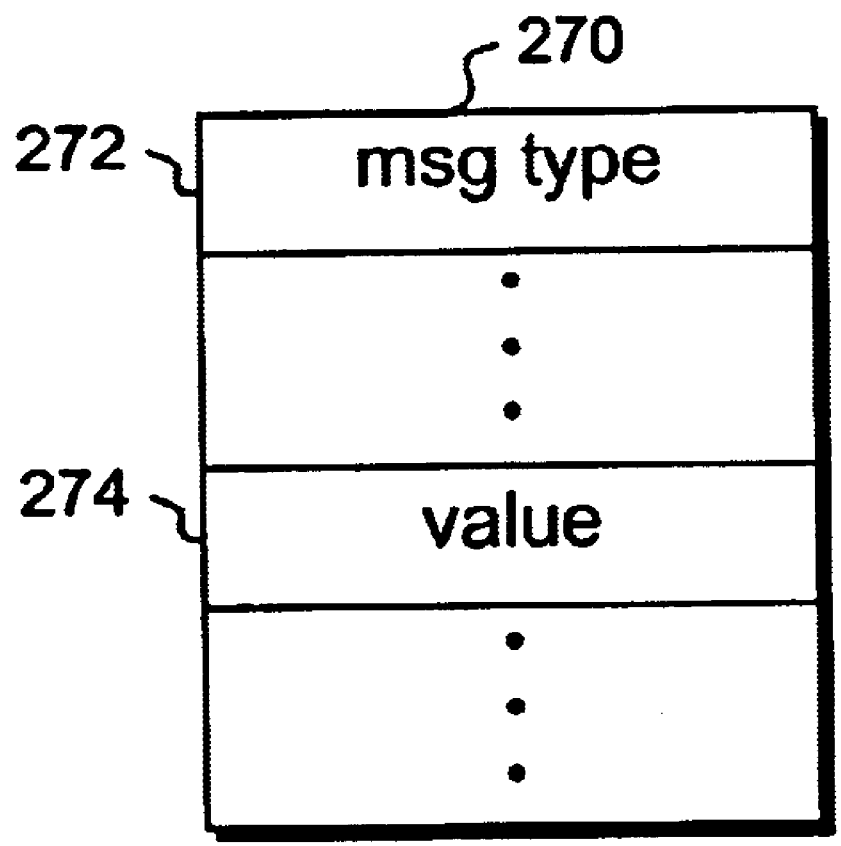
FIG. 16d is a chart representing a message format.

Referring to FIG. 16d, a typical API will have a predefined message format 270 including, for example, a message type 272 and a value 274 of a fixed number of bits (e.g., 32). Processes that use this API must use the predefined message format. If a process is upgraded, it will be forced to use the same message format or change the API/message format which would require that all processes that use this API also be similarly upgraded to use the new API. Instead, the message format can be made more flexible by passing information through the name server or BOM. For example, instead of having the value field 274 be a fixed number of bits, when an application registers a name and process identification number it may also register the number of bits it plans on using for the value field (or any other field). Perhaps a zero indicates a value field of 32 bits and a one indicates a value filed of 64 bits. Thus, both processes know the message format but some flexibility has been added.

In addition to adding flexibility to the size of fields in a message format, flexibility may be added to the overall message format including the type of fields included in the message. When a process registers its name and process identification number, it may also register a version number indicating which API version should be used by other processes wishing to communicate with it. For example, device driver 250 (FIG. 16b) may register SE 258 with NS 264 and provide the name of SE 258, device driver 250's process identification number and a version number one, and device driver 252 may register SE 261 with NS 264 and provide the name of SE 261, device driver 252's process identification number and a version number (e.g., version number two). If ATM 240 has subscribed for either SE 258 or SE 261, then NS 264 notifies ATM 240 that SE 258 and SE 261 exist and provides the process identification numbers and version numbers. The version number tells ATM 240 what message format and information SE 258 and SE 261 expect. The different message formats for each version may be hard coded into ATM 240 or ATM 240 may access system memory or the configuration database for the message formats corresponding to service endpoint version one and version two. As a result, the same application may communicate with different versions of the same configurable object using a different API.

This also allows an application, for example, ATM, to be upgraded to support new configurable objects, for example, new ATM interfaces, while still being backward compatible by supporting older configurable objects, for example, old ATM interfaces. Backward compatibility has been provided in the past through revision numbers, however, initial communication between processes involved polling to determine version numbers and where multiple applications need to communicate, each would need to poll the other. The name server/BOM eliminates the need for polling.

As described above, the name server notifies subscriber applications each time a subscribed for process is terminated. Instead, the name server/BOM may not send such a notification unless the System Resiliency Manager (SRM) tells the name server/BOM to send such a notification. For example, depending upon the fault policy/resiliency of the system, a particular software fault may simply require that a process be restarted. In such a situation, the name server/BOM may not notify subscriber applications of the termination of the failed process and instead simply notify the subscriber applications of the newly assigned process identification number after the failed process has been restarted. Data that is sent by the subscriber processes after the termination of the failed process and prior to the notification of the new process identification number may be lost but the recovery of this data (if any) may be less problematic than notifying the subscriber processes of the failure and having them hold all transmissions. For other faults, or after a particular software fault occurs a predetermined number of times, the SRM may then require the name server/BOM to notify all subscriber processes of the termination of the failed process. Alternatively, if a terminated process does not re-register within a predetermined amount of time, the name server/BOM may then notify all subscriber processes of the termination of the failed process.

Configuration Change:

Over time the user will likely make hardware changes to the computer system that require configuration changes. For example, the user may plug a fiber or cable (i.e., network connection) into an as yet unused port, in which case, the port must be enabled and, if not already enabled, then the port's line card must also be enabled. As other examples, the user may add another path to an already enabled port that was not fully utilized, and the user may add another line card to the computer system. Many types of configuration changes are possible, and the modular software architecture allows them to be made while the computer system is running (hot changes). Configuration changes may be automatically copied to persistent storage as they are made so that if the computer system is shut down and rebooted, the memory and configuration database will reflect the last known state of the hardware.

To make a configuration change, the user informs the NMS of the particular change, and similar to the process for initial configuration, the NMS changes the appropriate tables in the configuration database (copied to the NMS database) to implement the change.

Figure 17:
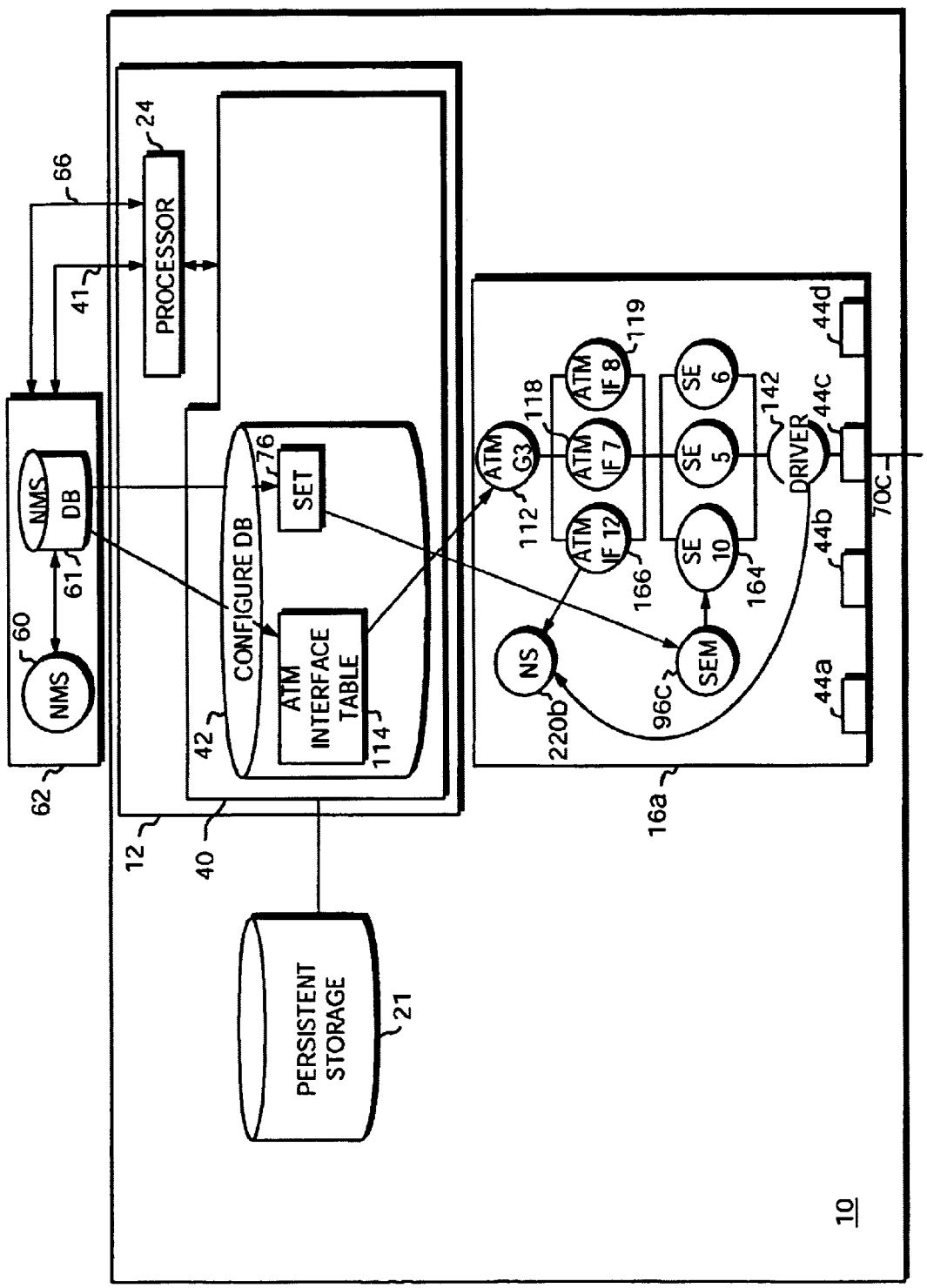
FIGS. 17–19 are block and flow diagrams of a computer system incorporating a modular system architecture and illustrating methods for making configuration changes.

Referring to FIG. 17, intone example of a configuration change, the user notifies the NMS that an additional path will be carried by SONET fiber 70c connected to port 44c. A new service endpoint (SE) 164 and a new ATM interface 166 are needed to handle the new path. The NMS adds a new record (row 168, FIG. 10) to service endpoint table (SET) 76 to include service endpoint 10 corresponding to port physical identification number (PID) 1502 (port 44c). The NMS also adds a new record (row 170, FIG. 13) to ATM instance table 114 to include ATM interface (IF) 12 corresponding to ATM group 3 and SE 10. Configuration database 42 may automatically copy the changes made to SET 76 and ATM instance table 114 to persistent storage 21 such that if the computer system is shut down and rebooted, the changes to the configuration database will be maintained.

Configuration database 42 also notifies (through the active query process) SEM 96c that a new service endpoint (SE 10) was added to the SET corresponding to its port (PID 1502), and configuration database 42 also notifies ATM instantiation 112 that a new ATM interface (ATM-IF 166) was added to the ATM interface table corresponding to ATM group 3. ATM 112 establishes ATM interface 166 and SEM 96c notifies port driver 142 that it has been assigned SE10. A communication link is established through NS 220b. Device driver 142 generates a service endpoint name using the assigned SE number and publishes this name and its process identification number with NS 220b. ATM interface 166 generates the same service endpoint name and subscribes to NS 220b for that service endpoint name. NS 220b provides ATM interface 166 with the process identification assigned to DD 142 allowing ATM interface 166 to communicate with device driver 142.

Certain board changes to computer system 10 are also configuration changes. After power-up and configuration, a user may plug another board into an empty computer system slot or remove an enabled board and replace it with a different board. In the case where applications and drivers for a line card added to computer system 10 are already loaded, the configuration change is similar to initial configuration. The additional line card may be identical to an already enabled line card, for example, line card 16a or if the additional line card requires different drivers (for different components) or different applications (e.g., IP), the different drivers and applications are already loaded because computer system 10 expects such cards to be inserted.

Figure 18:
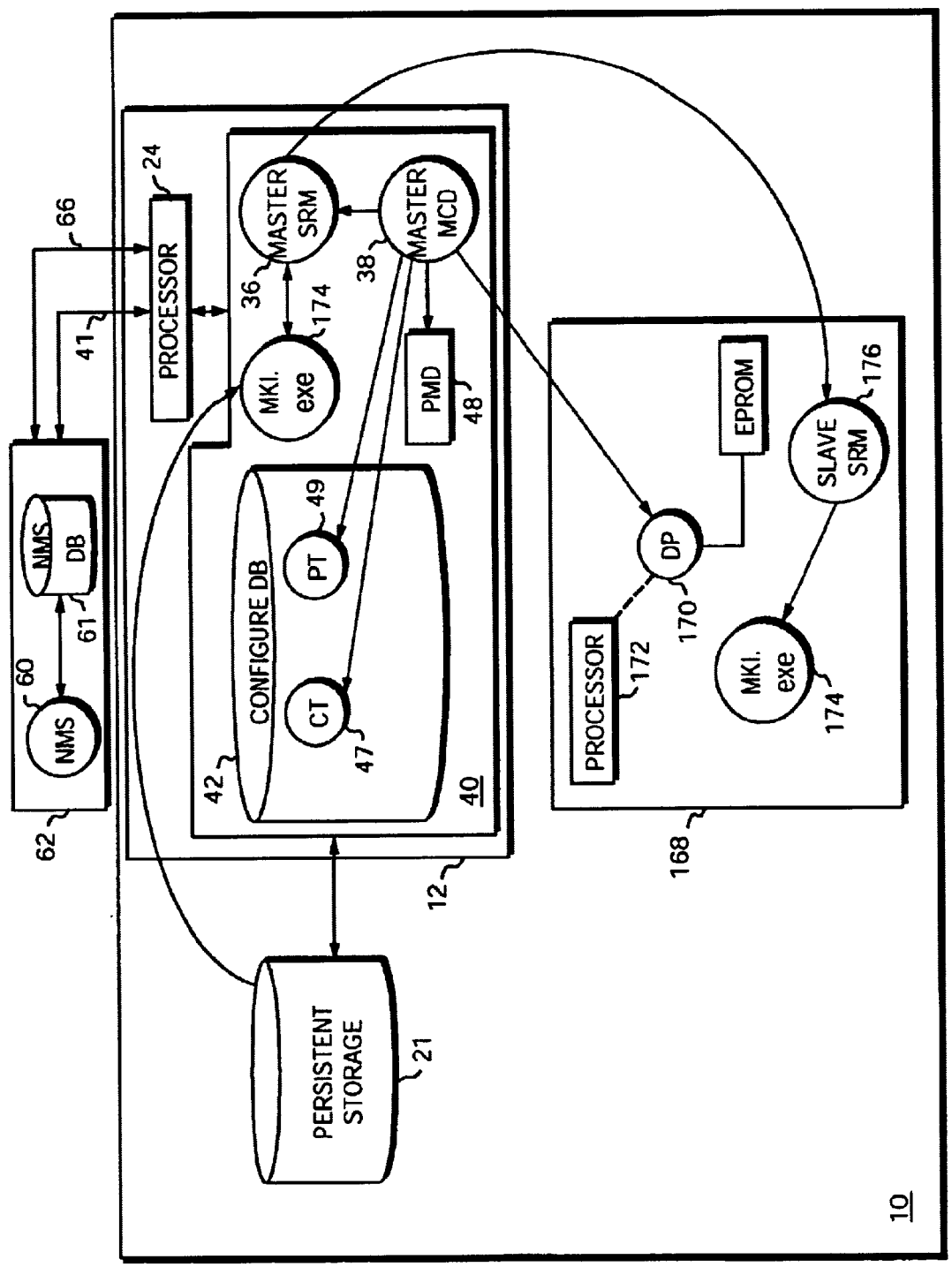

Referring to FIG. 18, while computer system 10 is running, when another line card 168 is inserted, master MCD 38 detects the insertion and communicates with a diagnostic program 170 being executed by the line card's processor 172 to learn the card's type and version number. MCD 38 uses the information it retrieves to update card table 47 and port table 49. MCD 38 then searches physical module description (PMD) file 48 in memory 40 for a record that matches the retrieved card type and version number and retrieves the name of the mission kernel image executable file (MKI.exe) that needs to be loaded on line card 168. Once determined, master MCD 38 passes the name of the MKI executable file to master SRM 36. SRM 36 downloads MKI executable file 174 from persistent storage 21 and passes it to a slave SRM 176 running on line card 168. The slave SRM executes the received MKI executable file.

Figure 19:
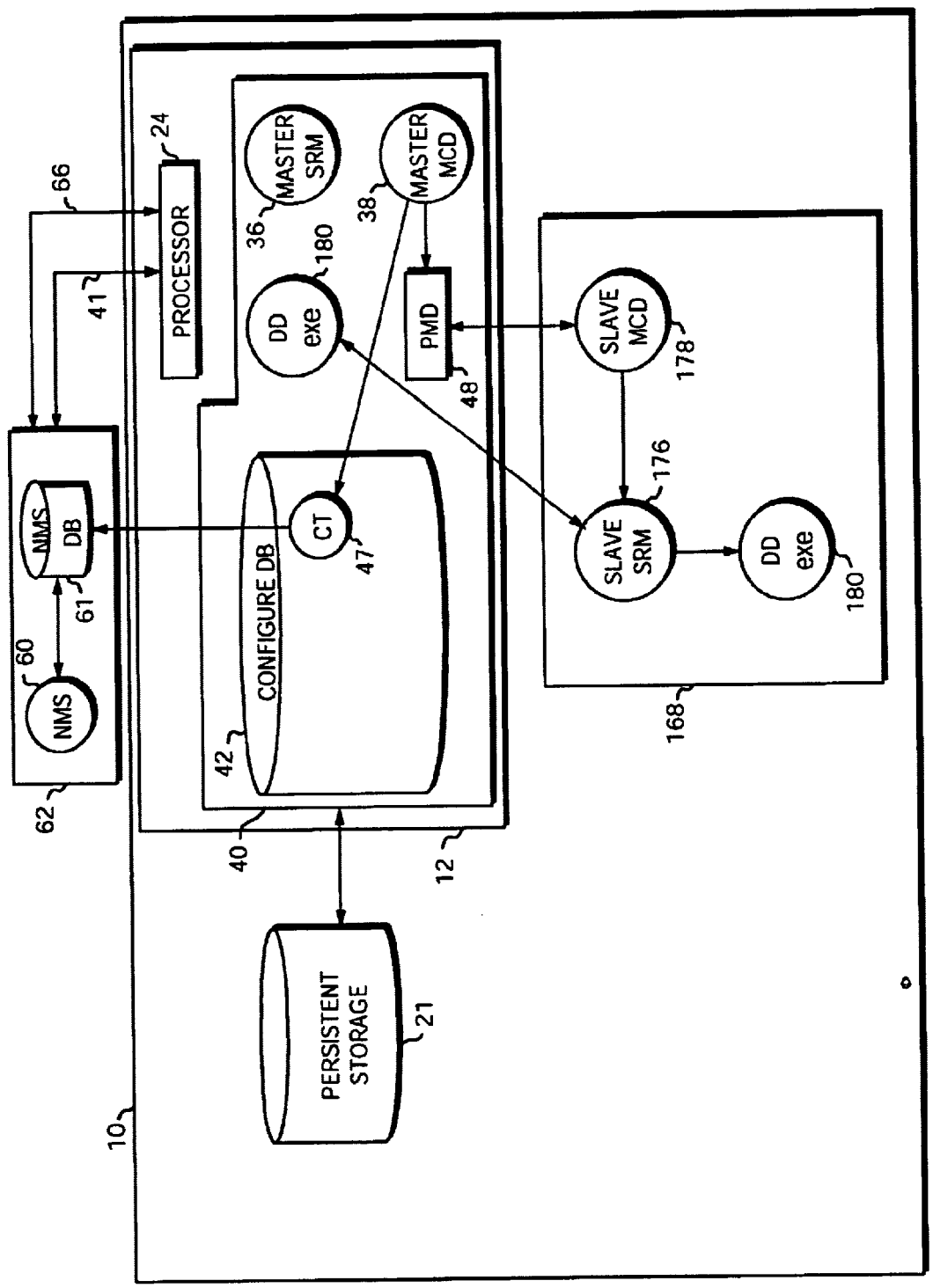

Referring to FIG. 19, slave MCD 178 then searches PMD file 48 in memory 40 on central processor 12 for a match with its line card's type and version number to find the names of all the device driver executable files associated needed by its line card. Slave MCD 178 provides these names to slave SRM 176 which then downloads and executes the device driver executable files (DD.exe) 180 from memory 40.

When master MCD 38 updates card table 47, configuration database 42 updated NMS database 61 which sends NMS 60 a notification of the change including card type and version number, the slot number into which the card was inserted and the physical identification (PID) assigned to the card by the master MCD. The NMS is updated, assigns an LID and updates the logical to physical table and notifies the user of the new hardware. The user then tells the NMS how to configure the new hardware, and the NMS implements the configuration change as described above for initial configuration.

Logical Model Change:

Where applications and device drivers for a new line card are not already loaded and where changes or upgrades to already loaded applications and device drivers are needed, logical model 280 (FIGS. 2–3) must be changed and new view ids and APIs and new DDL files must be re-generated. Software model 286 is changed to include models of the new or upgraded software, and hardware model 284 is changed to include models of any new hardware. New logical model 280' is then used by code generator 336 to re-generate view ids and APIs for each application, including any new applications, for example, ATM version two 360, or device drivers, for example, device driver 362, and to regenerate DDL files 344' and 348' including new SQL commands and data relevant to the new hardware and/or software. Each application, including any new applications or drivers, is then pulled into the build process and links in a corresponding view id and API. The new applications and/or device drivers and the new DDL files as well as any new hardware are then sent to the user of computer system 10.

New and upgraded applications and device drivers are being used by way of an example, and it should be understood that other processes, for example, modular system services and new Mission Kernel Images (MKIs), may be changed or upgraded in the same fashion.

Figure 20:
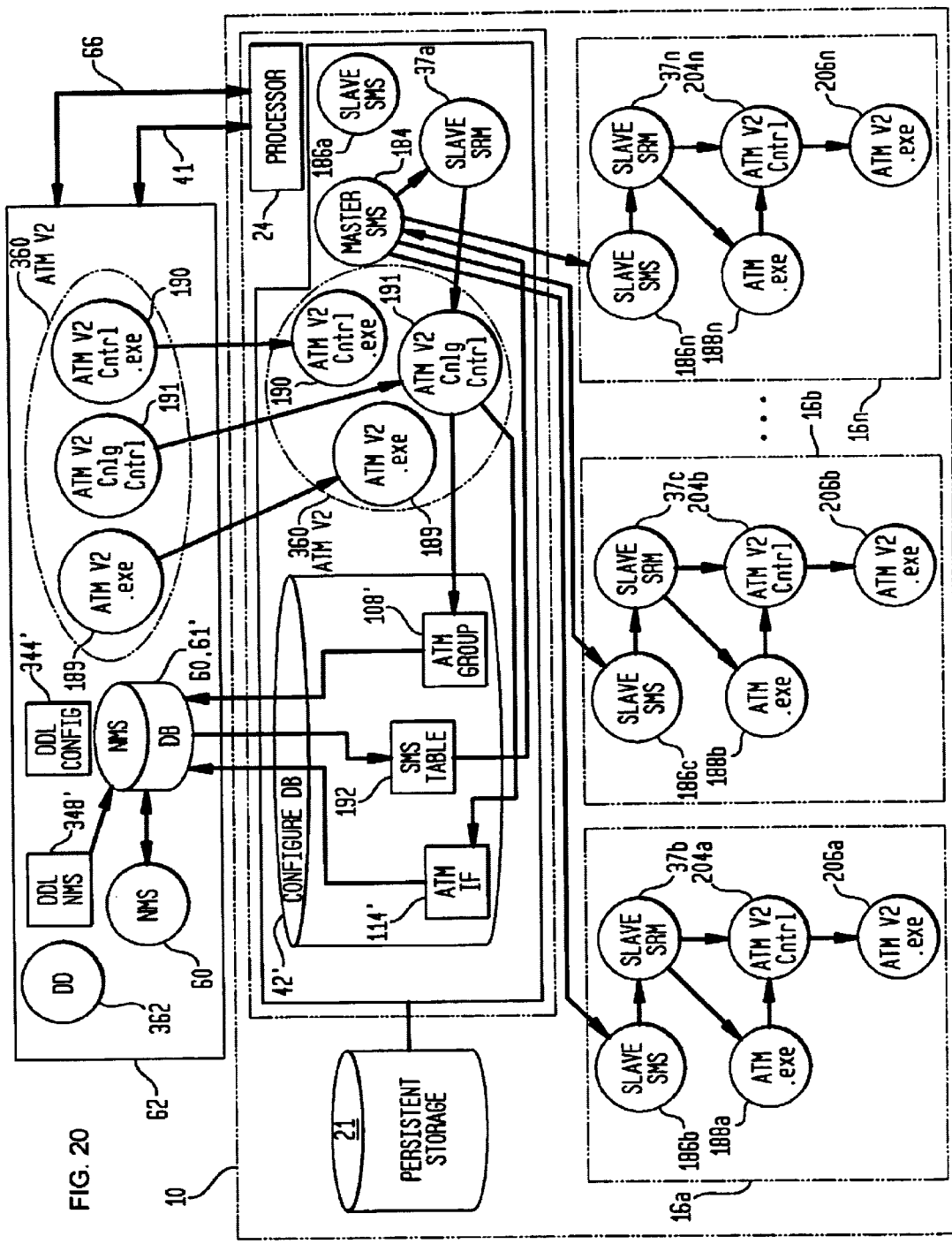
FIG. 20 is a block and flow diagram of a computer system incorporating a modular system architecture and illustrating a method for distributing logical model changes to users.

Referring to FIG. 20, the user instructs the NMS to download the new applications and/or device drivers, for example, ATM version two 360 and device driver 362, as well as the new DDL files, for example, DDL files 344' and 348', into memory on work station 62. The NMS uses new NMS database DDL file 348' to upgrade NMS database 61 into new NMS database 61'. Alternatively, a new NMS database may be created using DDL file 348' and both databases temporarily maintained.

Application Upgrade:

For new applications and application upgrades, the NMS works with a software management system (SMS) service to implement the change while the computer system is running (hot upgrades or additions). The SMS is one of the modular system services, and like the MCD and the SRM, the SMS is a distributed application. Referring to FIG. 20, a master SMS 184 is executed by central processor 12 while slave SMSs 186a–186n are executed on each board.

Upgrading a distributed application that is running on multiple boards is more complicated than upgrading an application running on only one board. As an example of a distributed application upgrade, the user may want to upgrade all ATM applications running on various boards in the system using new ATM version two 360. This is by way of example, and it should be understood, that only one ATM application may be upgraded so long as it is compatible with the other versions of ATM running on other boards. ATM version two 360 may include many sub-processes, for example, an upgraded ATM application executable file (ATMv2.exe 189), an upgraded ATM control executable file (ATMv2_cntrl.exe 190) and an ATM configuration control file (ATMv2_cnfg_cntrl.exe). The NMS downloads ATMv2.exe 189, ATMv2_cntrl.exe and ATMv2_cnfg_cntrl.exe to memory 40 on central processor 12.

Figure 21:
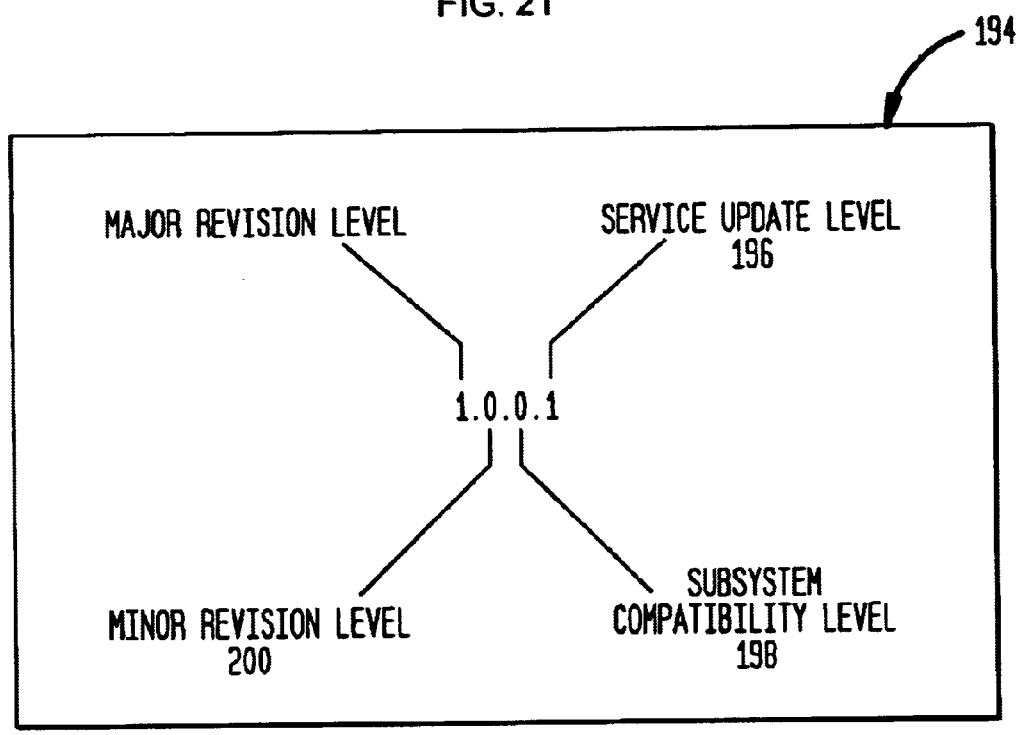
FIG. 21 is a block and flow diagram of a computer system incorporating a modular system architecture and illustrating a method for making a process upgrade.

The NMS then writes a new record into SMS table 192 indicating the scope of the configuration update. The scope of an upgrade may be indicated in a variety of ways. In one embodiment, the SMS table includes a field for the name of the application to be changed and other fields indicating the changes to be made. In another embodiment, the SMS table includes a revision number field 194 (FIG. 21) through which the NMS can indicate the scope of the change. Referring to FIG. 21, the right most position in the revision number may indicate, for example, the simplest configuration update (e.g., a bug fix), in this case, termed a "service update level" 196. Any software revisions that differ by only the service update level can be directly applied without making changes in the configuration database or API changes between the new and current revision. The next position may indicate a slightly more complex update, in this case, termed a "subsystem compatibility level" 198. These changes include changes to the configuration database and/ or an API. The next position may indicate a "minor revision level" 200 update indicating more comprehensive changes in both the configuration database and one or more APIs. The last position may indicate a "major revision level" 202 update indicative of wholesale changes in multiple areas and may require a reboot of the computer system to implement. For a major revision level change, the NMS will download a complete image including a kernel image.

During initial configuration, the SMS establishes an active query on SMS table 192. Consequently, when the NMS changes the SMS table, the configuration database sends a notification to master SMS 184 including the change. In some instances, the change to an application may require changes to configuration database 42. The SMS determines the need for configuration conversion based on the scope of the release or update. If the configuration database needs to be changed, then the software, for example, ATM version two 360, provided by the user and downloaded by the NMS also includes a configuration control executable file, for example, ATMv2_cnfig_cntrl.exe 191, and the name of this file will be in the SMS table record. The master SMS then directs slave SRM 37a on central processor 12 to execute the configuration control file which uses DDL file 344' to upgrade old configuration database 42 into new configuration database 42' by creating new tables, for example, ATM group table 108' and ATM interface table 114'.

Existing processes using their view ids and APIs to access new configuration database 42' in the same manner as they accessed old configuration database 42. However, when new processes (e.g., ATM version two 360 and device driver 362) access new configuration database 42', their view ids and APIs allow them to access new tables and data within new configuration database 42'.

The master SMS also reads ATM group table 108' to determine that instances of ATM are being executed on line cards 16a–16n. In order to upgrade a distributed application, in this instance, ATM, the Master SMS will use a lock step procedure. Master SMS 184 tells each slave SMS 186b–186n to stall the current versions of ATM. When each slave responds, Master SMS 184 then tells slave SMSs 186b–186n to download and execute ATMv2_cntrl.exe 190 from memory 40. Upon instructions from the slave SMSs, slave SRMs 37b–37n download and execute copies of ATMv2_cntrl.exe 204a–204n. The slave SMSs also pass data to the ATMv2cntrl.exe file through the SRM. The data instructs the control shim to start in upgrade mode and passes required configuration information. The upgraded ATMv2 controllers 204a–204n then use ATM group table 108' and ATM interface table 114' as described above to implement ATMv2 206a–206n on each of the line cards. In this example, each ATM controller is shown implementing one instance of ATM on each line card, but as explained below, the ATM controller may implement multiple instances of ATM on each line card.

As part of the upgrade mode, the updated versions of ATMv2 206a–206n retrieve active state from the current versions of ATM 188a–188n. The retrieval of active state can be accomplished in the same manner that a redundant or backup instantiation of ATM retrieves active state from the primary instantiation of ATM. When the upgraded instances of ATMv2 are executing and updated with active state, the ATMv2 controllers notify the slave SMSs 186b–186n on their board and each slave SMS 186b–186n notifies master SMS 184. When all boards have notified the master SMS, the master SMS tells the slave SMSs to switchover to ATMv2 206a–206n. The slave SMSs tell the slave SRMs running on their board, and the slave SRMs transition the new ATMv2 processes to the primary role. This is termed "lock step upgrade" because each of the line cards is switched over to the new ATMv2 processes simultaneously.

There may be upgrades that require changes to multiple applications and to the APIs for those applications. For example, a new feature may be added to ATM that also requires additional functionality to be added to the Multi-Protocol Label Switching (MPLS) application. The additionally functionality may change the peer-to-peer API for ATM, the peer-to-peer API for MPLS and the API between ATM and MPLS. In this scenario, the upgrade operation must avoid allowing the "new" version of ATM to communicate with itself or the "old" version of MPLS and vice versa. The master SMS will use the release number scheme to determine the requirements for the individual upgrade. For example, the upgrade may be from release 1.0.0.0 to 1.0.1.3 where the release differs by the subsystem compatibility level. The SMS implements the upgrade in a lock step fashion. All instances of ATM and MPLS are upgraded first. The slave SMS on each line card then directs the slave SRM on its board to terminate all "old" instances of ATM and MPLS and switchover to the new instances of MPLS and ATM. The simultaneous switchover to new versions of both MPLS and ATM eliminate any API compatibility errors.

Figure 22:
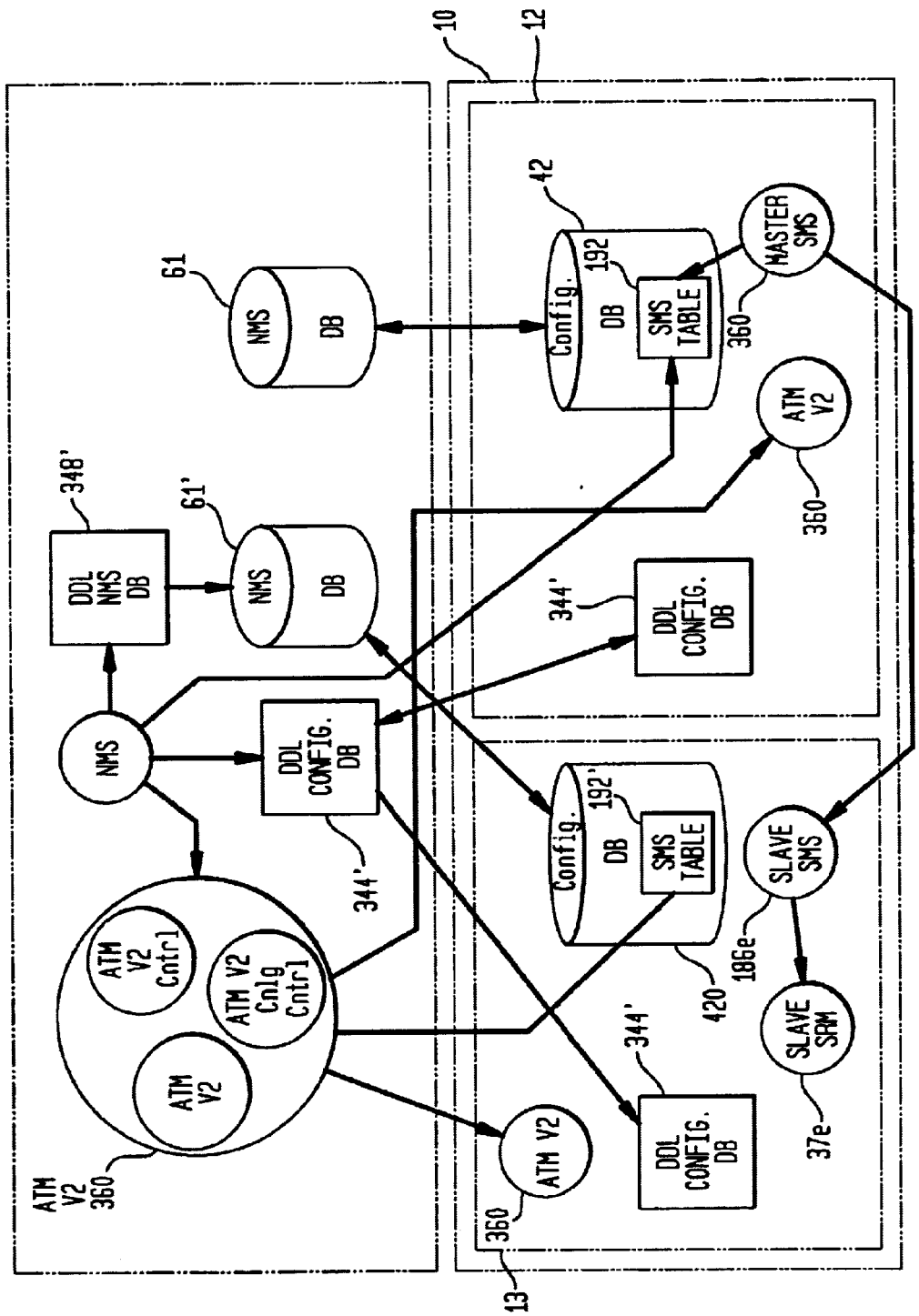
FIG. 22 is a block diagram representing a revision numbering scheme.

Referring to FIG. 22, instead of directly upgrading configuration database 42 on central processor 12, a backup configuration database 420 on a backup central processor 13 may be upgraded first. As described above, computer system 10 includes central processor 12. Computer system 10 may also include a redundant or backup central processor 13 that mirrors or replicates the active state of central processor 12. Backup central processor 13 is generally in stand-by mode unless central processor 12 fails at which point a fail-over to backup central processor 13 is initiated to allow the backup central processor to be substituted for central processor 12. In addition to failures, backup central processor 13 may be used for software and hardware upgrades that require changes to the configuration database. Through backup central processor 13, upgrades can be made to backup configuration database 420 instead of to configuration database 42.

The upgrade is begun as discussed above with the NMS downloading ATM version two 360—including ATMv2.exe 189, ATMv2_cntrl.exe and ATMv2_cnfg_cntrl.exe—and DDL file 344' to memory on central processor 12. Simultaneously, because central processor 13 is in backup mode, the application and DDL file are also copied to memory on central processor 13. The NMS also creates a software load record in SMS table 192, 192' indicating the upgrade. In this embodiment, when the SMS determines that the scope of the upgrade requires an upgrade to the configuration database, the master SMS instructs slave SMS 186e on central processor 13 to perform the upgrade. Slave SMS 186e works with slave SRM 37e to cause backup processor 13 to change from backup mode to upgrade mode.

In upgrade mode, backup processor 13 stops replicating the active state of central processor 12. Any changes made to new configuration database 420 are copied to new NMS database 61'. Slave SMS 186e then directs slave SRM 37e to execute the configuration control file which uses DDL file 344' to upgrade configuration database 420.

Once configuration database 420 is upgraded, a fail-over or switch-over from central processor 12 to backup central processor 13 is initiated. Central processor 13 then begins acting as the primary central processor and applications running on central processor 13 and other boards throughout computer system 10 begin using upgraded configuration database 420.

Central processor 12 may not become the backup central processor right away. Instead, central processor 12 with its older copy of configuration database 42 stays dormant in case an automatic downgrade is necessary (described below). If the upgrade goes smoothly and is committed (described below), then central processor 12 will begin operating in backup mode and replace old configuration database 42 with new configuration database 420.

Figure 23:
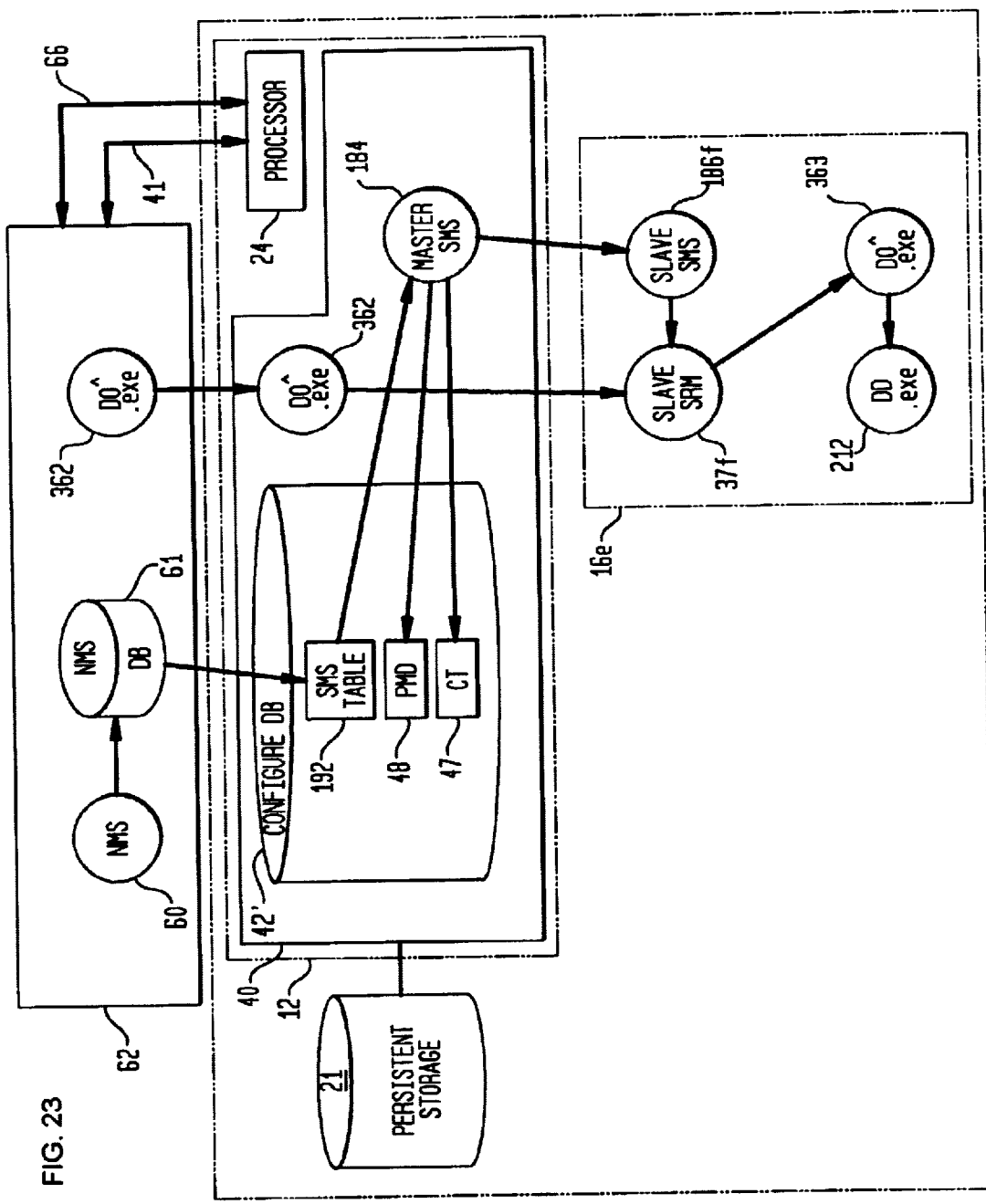
FIG. 23 is a block and flow diagram of a computer system incorporating a modular system architecture and illustrating a method for making a device driver upgrade.

Device Driver Upgrade:

Device driver software may also be upgraded and the implementation of device driver upgrades is similar to the implementation of application upgrades. The user informs the NMS of the device driver change and provides a copy of the new software (e.g., DDA^.exe 362, FIGS. 20 and 23). The NMS downloads the new device driver to memory 40 on central processor 12, and the NMS writes a new record in SMS table 192 indicating the device driver upgrade. Configuration database 42 sends a notification to master SMS 184 including the name of the driver to be upgraded. To determine where the original device driver is currently running in computer system 10, the master SMS searches PMD file 48 for a match of the device driver name (existing device driver, not upgraded device driver) to learn with which module type and version number the device driver is associated. The device driver may be running on one or more boards in computer system 10. As described above, the PMD file corresponds the module type and version number of a board with the mission kernel image for that board as well as the device drivers for that board. The SMS then searches card table 47 for a match with the module type and version number found in the PMD file. Card table 47 includes records corresponding module type and version number with the physical identification (PID) and slot number of that board. The master SMS now knows the board or boards within computer system 10 on which to load the upgraded device driver. If the device driver is for a particular port, then the SMS must also search the port table to learn the PID for that port.

The master SMS notifies each slave SMS running on boards to be upgraded of the name of the device driver executable file to download and execute. In the example, master SMS 184 sends slave SMS 186f the name of the upgraded device driver (DD^.exe 362) to download. Slave SMS 186f tells slave SRM to download and execute DD^.exe 362 in upgrade mode. Once downloaded, DD^.exe 363 (copy of DD^.exe 362) gathers active state information from the currently running DD.exe 212 in a similar fashion as a redundant or backup device driver would gather active state. DD^.exe 362 then notifies slave SRM 37f that active state has been gathered, and slave SRM 37f stops the current DD.exe 212 process and transitions the upgraded DD^.exe 362 process to the primary role.

Automatic Downgrade:

Often, implementation of an upgrade, can cause unexpected errors in the upgraded software, in other applications or in hardware. As described above, a new configuration database 42' (FIG. 20) is generated and changes to the new configuration database are made in new tables (e.g., ATM interface table 114' and ATM group table 108', FIG. 20) and new executable files (e.g., ATMv2.exe 189, ATMv2_cntrl.exe 190 and ATMv2cnfg_cntrl.exe 191) are downloaded to memory 40. Importantly, the old configuration database records and the original application files are not deleted or altered. In the embodiment where changes are made directly to configuration database 42 on central processor 12, they are made only in non-persistent memory until committed (described below). In the embodiment where changes are made to backup configuration database 420 on backup central processor 13, original configuration database 42 remains unchanged.

Because the operating system provides a protected memory model that assigns different process blocks to different processes, including upgraded applications, the original applications will not share memory space with the upgraded applications and, therefore, cannot corrupt or change the memory used by the original application. Similarly, memory 40 is capable of simultaneously maintaining the original and upgraded versions of the configuration database records and executable files as well as the original and upgraded versions of the applications (e.g., ATM 188a–188n). As a result, the SMS is capable of an automatic downgrade on the detection of an error. To allow for automatic downgrade, the SRMs pass error information to the SMS. The SMS may cause the system to revert to the old configuration and application (i.e., automatic downgrade) on any error or only for particular errors.

As mentioned, often upgrades to one application may cause unexpected faults or errors in other software. If the problem causes a system shut down and the configuration upgrade was stored in persistent storage, then the system, when powered back up, will experience the error again and shut down again. Since, the upgrade changes to the configuration database are not copied to persistent storage 21 until the upgrade is committed, if the computer system is shut down, when it is powered back up, it will use the original version of the configuration database and the original executable files, that is, the computer system will experience an automatic downgrade.

Additionally, a fault induced by an upgrade may cause the system to hang, that is, the computer system will not shut down but will also become inaccessible by the NMS and inoperable. To address this concern, in one embodiment, the NMS and the master SMS periodically send messages to each other indicating they are executing appropriately. If the SMS does not receive one of these messages in a predetermined period of time, then the SMS knows the system has hung. The master SMS may then tell the slave SMSs to revert to the old configuration (i.e., previously executing copies of ATM 188a–188n) and if that does not work, the master SMS may re-start/re-boot computer system 10. Again, because the configuration changes were not saved in persistent storage, when the computer system powers back up, the old configuration will be the one implemented.

Evaluation Mode:

Instead of implementing a change to a distributed application across the entire computer system, an evaluation mode allows the SMS to implement the change in only a portion of the computer system. If the evaluation mode is successful, then the SMS may fully implement the change system wide. If the evaluation mode is unsuccessful, then service interruption is limited to only that portion of the computer system on which the upgrade was deployed. In the above example, instead of executing the upgraded ATMv2 189 on each of the line cards, the ATMv2 configuration convert file 191 will create an ATMv2 group table 108' indicating an upgrade only to one line card, for example, line card 16a. Moreover, if multiple instantiations of ATM are running on line card 16a (e.g., one instantiation per port), the ATMv2 configuration convert file may indicate through ATMv2 interface table 114' that the upgrade is for only one instantiation (e.g., one port) on line card 16a. Consequently, a failure is likely to only disrupt service on that one port, and again, the SMS can further minimize the disruption by automatically downgrading the configuration of that port on the detection of an error. If no error is detected during the evaluation mode, then the upgrade can be implemented over the entire computer system.

Upgrade Commitment:

Upgrades are made permanent by saving the new application software and new configuration database and DDL file in persistent storage and removing the old configuration data from memory 40 as well as persistent storage. As mentioned above, changes may be automatically saved in persistent storage as they are made in non-persistent memory (no automatic downgrade), or the user may choose to automatically commit an upgrade after a successful time interval lapses (evaluation mode). The time interval from upgrade to commitment may be significant. During this time, configuration changes may be made to the system. Since these changes are typically made in non-persistent memory, they will be lost if the system is rebooted prior to upgrade commitment. Instead, to maintain the changes, the user may request that certain configuration changes made prior to upgrade commitment be copied into the old configuration database in persistent memory. Alternatively, the user may choose to manually commit the upgrade at his or her leisure. In the manual mode, the user would ask the NMS to commit the upgrade and the NMS would inform the master SMS, for example, through a record in the SMS table.

Independent Process Failure and Restart:

Depending upon the fault policy managed by the slave SRMs on each board, the failure of an application or device driver may not immediately cause an automatic downgrade during an upgrade process. Similarly, the failure of an application or device driver during normal operation may not immediately cause the fail over to a backup or redundant board. Instead, the slave SRM running on the board may simply restart the failing process. After multiple failures by the same process, the fault policy may cause the SRM to take more aggressive measures such as automatic downgrade or fail-over.

Figure 24:
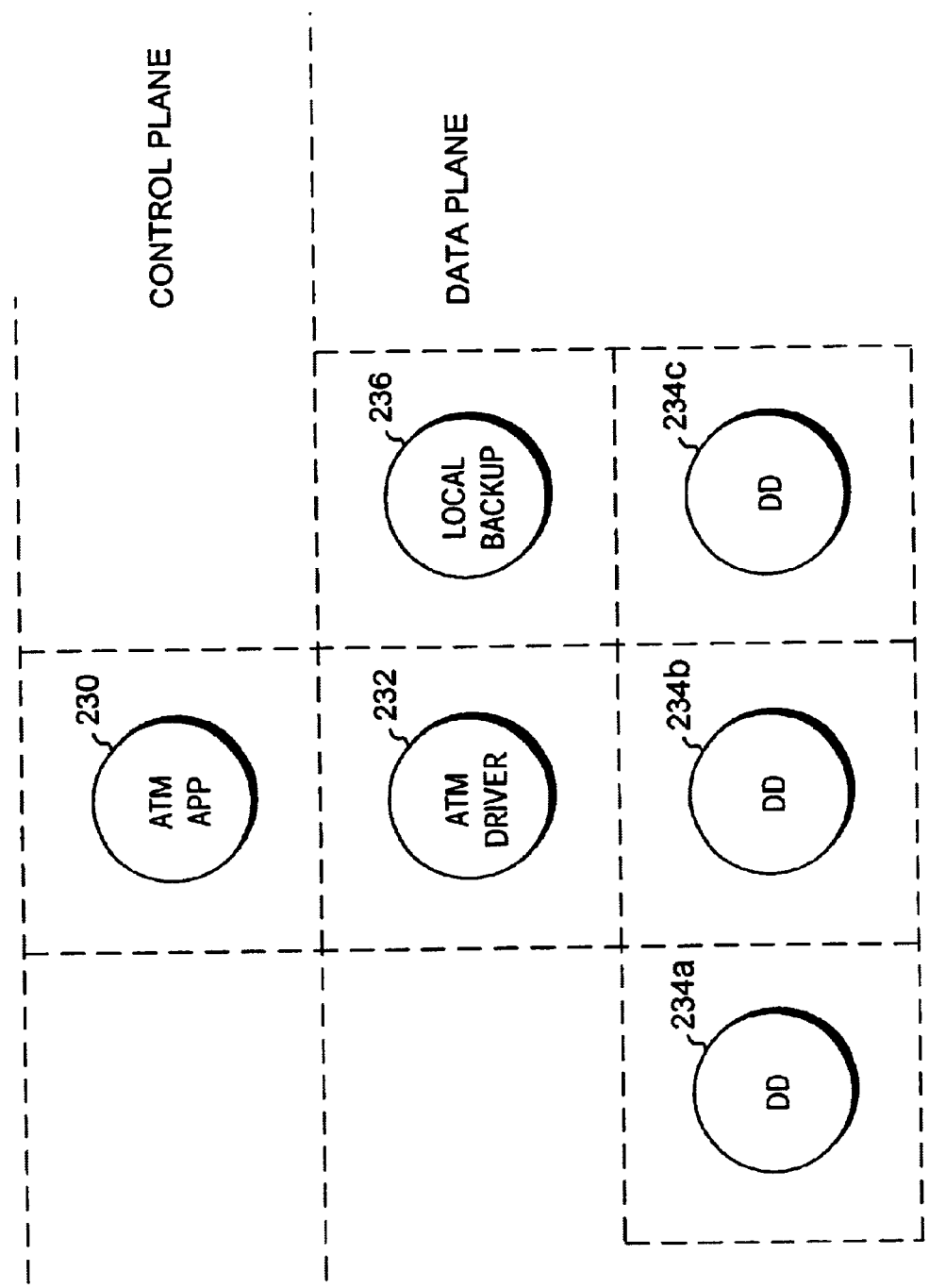
FIG. 24 is a block diagram representing processes within separate protected memory blocks.

Referring to FIG. 24, if an application, for example, ATM application 230 fails, the slave SRM on the same board as ATM 230 may simply restart it without having to reboot the entire system. As described above, under the protected memory model, a failing process cannot corrupt the memory blocks used by other processes. Typically, an application and its corresponding device drivers would be part of the same memory block or even part of the same software program, such that if the application failed, both the application and device drivers would need to be restarted. Under the modular software architecture, however, applications, for example ATM application 230, are independent of the device drivers, for example, ATM driver 232 and Device Drivers (DD) 234a–234c. This separation of the data plane (device drivers) and control plane (applications) results in the device drivers being peers of the applications. Hence, while the ATM application is terminated and restarted, the device drivers continue to function.

For network devices, this separation of the control plane and data plane means that the connections previously established by the ATM application are not lost when ATM fails and hardware controlled by the device drivers continue to pass data through connections previously established by the ATM application. Until the ATM application is restarted and re-synchronized (e.g., through an audit process, described below) with the active state of the device drivers, no new network connections may be established but the device drivers continue to pass data through the previously established connections to allow the network device to minimize disruption and maintain high availability.

Local Backup:

If a device driver, for example, device driver 234, fails instead of an application, for example, ATM 230, then data cannot be passed. For a network device, it is critical to continue to pass data and not lose network connections. Hence, the failed device driver must be brought back up (i.e., recovered) as soon as possible. In addition, the failing device driver may have corrupted the hardware it controls, therefore, that hardware must be reset and reinitialized. The hardware may be reset as soon as the device driver terminates or the hardware may be reset later when the device driver is restarted. Resetting the hardware stops data flow. In some instances, therefore, resetting the hardware will be delayed until the device driver is restarted to minimize the time period during which data is not flowing. Alternatively, the failing device driver may have corrupted the hardware, thus, resetting the hardware as soon as the device driver is terminated may be important to prevent data corruption. In either case, the device driver re-initializes the hardware during its recovery.

Again, because applications and device drivers are assigned independent memory blocks, a failed device driver can be restarted without having to restart associated applications and device drivers. Independent recovery may save significant time as described above for applications. In addition, restoring the data plane (i.e., device drivers) can be simpler and faster than restoring the control plane (i.e., applications). While it may be just as challenging in terms of raw data size, device driver recovery may simply require that critical state data be copied into place in a few large blocks, as opposed to application recovery which requires the successive application of individual configuration elements and considerable parsing, checking and analyzing. In addition, the application may require data stored in the configuration database on the central processor or data stored in the memory of other boards. The configuration database may be slow to access especially since many other applications also access this database. The application may also need time to access a management information base (MIB) interface.

To increase the speed with which a device driver is brought back up, the restarted device driver program accesses local backup 236. In one example, local backup is a simple storage/retrieval process that maintains the data in simple lists in physical memory (e.g., random access memory, RAM) for quick access. Alternatively, local backup may be a database process, for example, a Polyhedra database, similar to the configuration database.

Local backup 236 stores the last snap shot of critical state information used by the original device driver before it failed. The data in local backup 236 is in the format required by the device driver. In the case of a network device, local back up data may include path information, for example, service endpoint, path width and path location. Local back up data may also include virtual interface information, for example, which virtual interfaces were configured on which paths and virtual circuit (VC) information, for example, whether each VC is switched or passed through segmentation and reassembly (SAR), whether each VC is a virtual channel or virtual path and whether each VC is multicast or merge. The data may also include traffic parameters for each VC, for example, service class, bandwidth and/or delay requirements.

Using the data in the local backup allows the device driver to quickly recover. An Audit process resynchronizes the restarted device driver with associated applications and other device drivers such that the data plane can again transfer network data. Having the backup be local reduces recovery time. Alternatively, the backup could be stored remotely on another board but the recovery time would be increased by the amount of time required to download the information from the remote location.

Audit Process:

It is virtually impossible to ensure that a failed process is synchronized with other processes when it restarts, even when backup data is available. For example, an ATM application may have set up or torn down a connection with a device driver but the device driver failed before it updated corresponding backup data. When the device driver is restarted, it will have a different list of established connections than the corresponding ATM application (i.e., out of synchronization). The audit process allows processes like device drivers and ATM applications to compare information, for example, connection tables, and resolve differences. For instance, connections included in the driver's connection table and not in the ATM connection table were likely torn down by ATM prior to the device driver crash and are, therefore, deleted from the device driver connection table. Connections that exist in the ATM connection table and not in the device driver connection table were likely set up prior to the device driver failure and may be copied into the device driver connection table or deleted from the ATM connection table and re-set up later. If an ATM application fails and is restarted, it must execute an audit procedure with its corresponding device driver or drivers as well as with other ATM applications since this is a distributed application.

Vertical Fault Isolation:

Typically, a single instance of an application executes on a single card or in a system. Fault isolation, therefore, occurs at the card level or the system level, and if a fault occurs, an entire card—and all the ports on that card—or the entire system—and all the ports in the system—is affected. In a large communications platform, thousands of customers may experience service outages due to a single process failure.

For resiliency and fault isolation one or more instances of an application and/or device driver may be started per port on each line card. Multiple instances of applications and device drivers are more difficult to manage and require more processor cycles than a single instance of each but if an application or device driver fails, only the port those processes are associated with is affected. Other applications and associated ports—as well as the customers serviced by those ports—will not experience service outages. Similarly, a hardware failure associated with only one port will only affect the processes associated with that port. This is referred to as vertical fault isolation.

Figure 25:
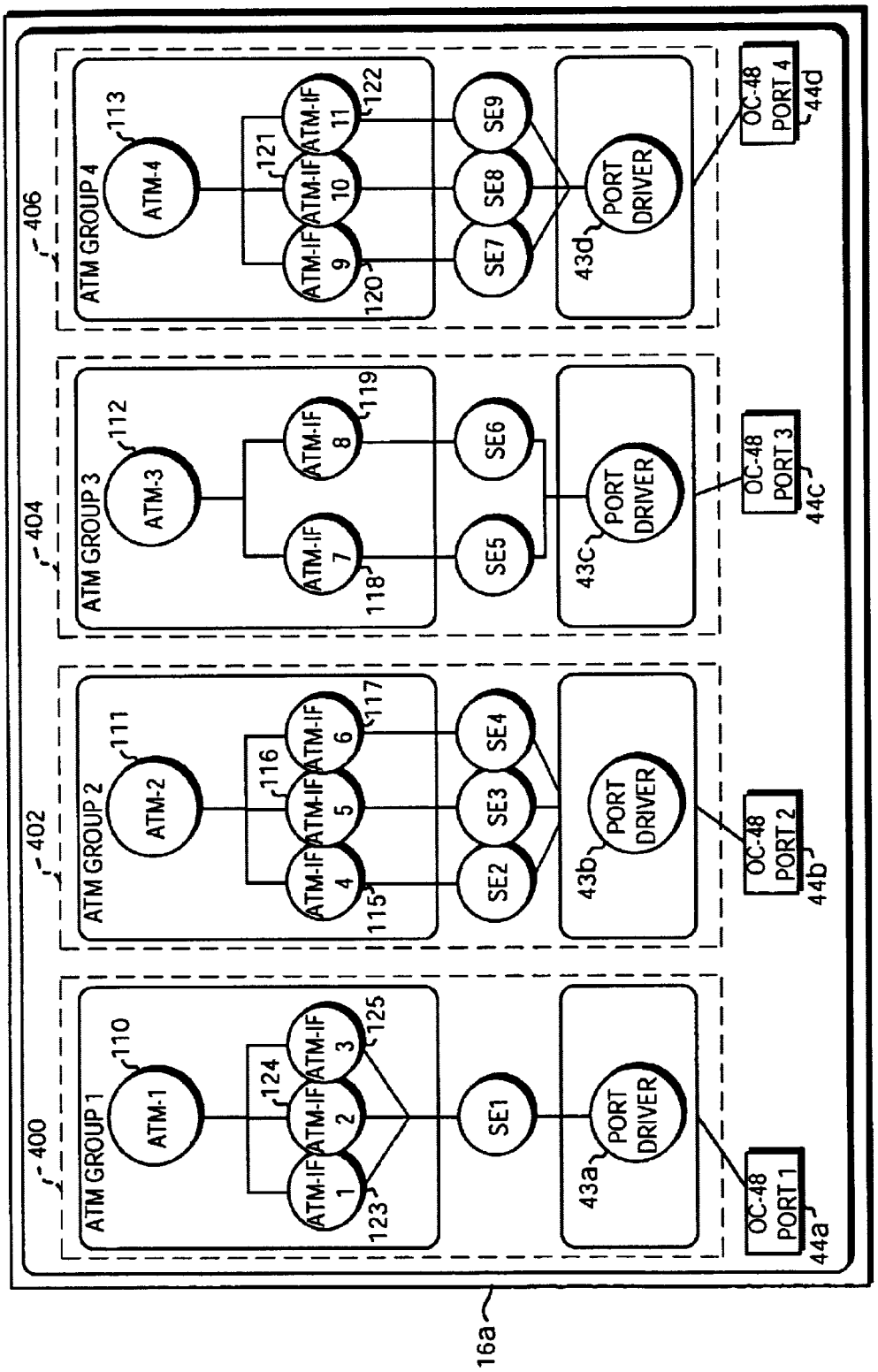
FIG. 25 is a block and flow diagram of a line card and a method for accomplishing vertical fault isolation.

Referring to FIG. 25, as one example, line card 16*a* is shown to include four vertical stacks 400, 402, 404, and 406. Vertical stack 400 includes one instance of ATM 110 and one device driver 43*a* and is associated with port 44*a*. Similarly, vertical stacks 402, 404 and 406 include one instance of ATM 111, 112, 113 and one device driver 43*b*, 43*c*, 43*d*, respectively and each vertical stack is associated with a separate port 44*b*, 44*c*, 44*d*, respectively. If ATM 112 fails, then only vertical stack 404 and its associated port 44*c* are affected. Service is not disrupted on the other ports (ports 44*a*, 44*b*, 44*d*) since vertical stacks 400, 402, and 406 are unaffected and the applications and drivers within those stacks continue to execute and transmit data. Similarly, if device driver 43*b* fails, then only vertical stack 402 and its associated port 44*b* are affected.

Vertical fault isolation allows processes to be deployed in a fashion supportive of the underlying hardware architecture and allows processes associated with particular hardware (e.g., a port) to be isolated from processes associated with other hardware (e.g., other ports) on the same or a different line card. Any single hardware or software failure will affect only those customers serviced by the same vertical stack. Vertical fault isolation provides a fine grain of fault isolation and containment. In addition, recovery time is reduced to only the time required to re-start a particular application or driver instead of the time required to re-start all the processes associated with a line card or the entire system.

Fault/Event Detection:

Traditionally, fault detection and monitoring does not receive a great deal of attention from network equipment designers. Hardware components are subjected to a suite of diagnostic tests when the system powers up. After that, the only way to detect a hardware failure is to watch for a red light on a board or wait for a software component to fail when it attempts to use the faulty hardware. Software monitoring is also reactive. When a program fails, the operating system usually detects the failure and records minimal debug information.

Current methods provide only sporadic coverage for a narrow set of hard faults. Many subtler failures and events often go undetected. For example, hardware components sometimes suffer a minor deterioration in functionality, and changing network conditions stress the software in ways that were never expected by the designers. At times, the software may be equipped with the appropriate instrumentation to detect these problems before they become hard failures, but even then, network operators are responsible for manually detecting and repairing the conditions.

Systems with high availability goals must adopt a more proactive approach to fault and event monitoring. In order to provide comprehensive fault and event detection, different hierarchical levels of fault/event management software are provided that intelligently monitor hardware and software and proactively take action in accordance with a defined fault policy. A fault policy based on hierarchical scopes ensures that for each particular type of failure the most appropriate action is taken. This is important because over-reacting to a failure, for example, re-booting an entire computer system or re-starting an entire line card, may severely and unnecessarily impact service to customers not affected by the failure, and under-reacting to failures, for example, restarting only one process, may not completely resolve the fault and lead to additional, larger failures. Monitoring and proactively responding to events may also allow the computer system and network operators to address issues before they become failures. For example, additional memory may be assigned to programs or added to the computer system before a lack of memory causes a failure.

Figure 26:
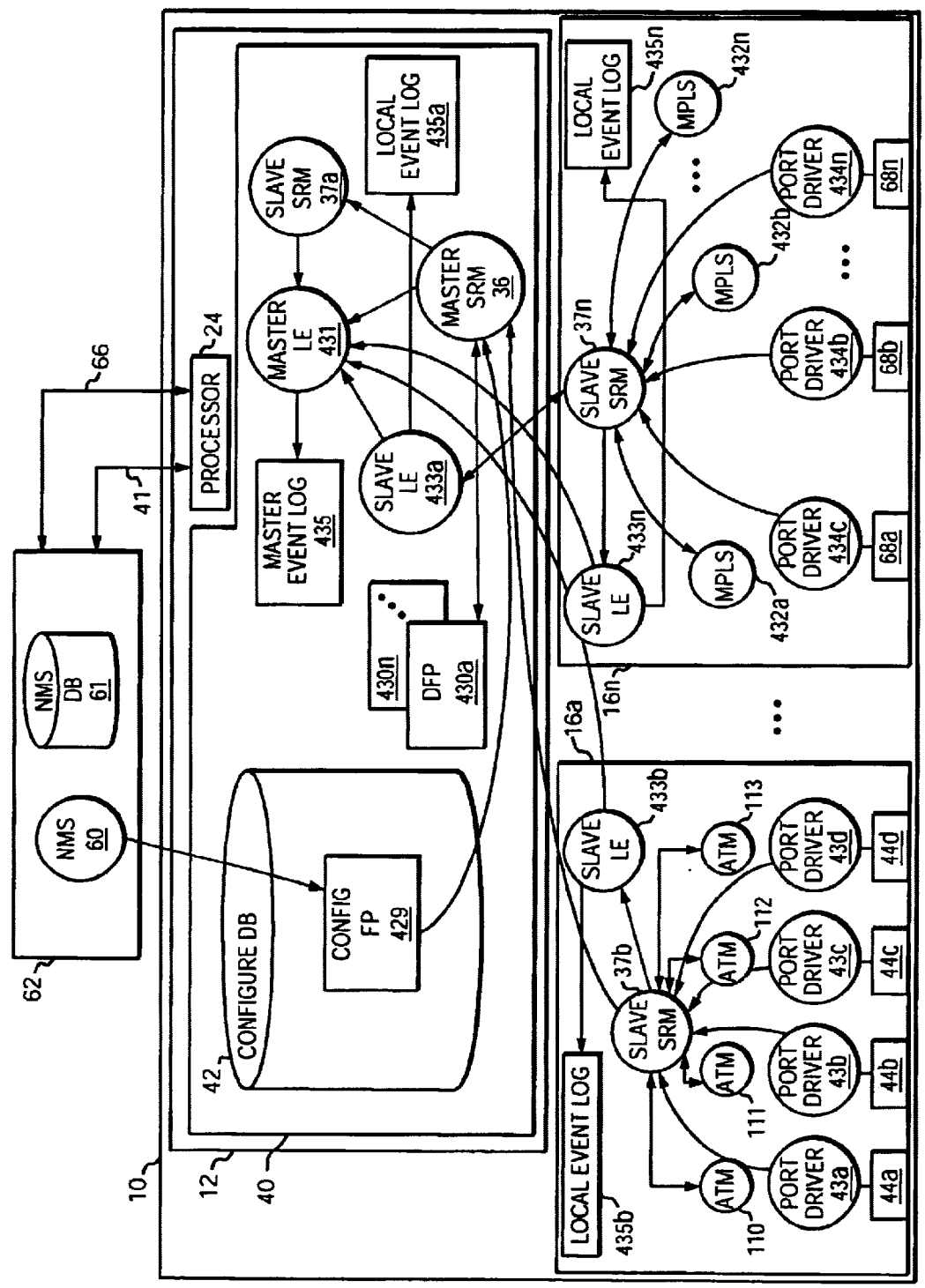
FIG. 26 is a block and flow diagram of a computer system incorporating a hierarchical and configurable fault management system and illustrating a method for accomplishing fault escalation.

Hierarchical Scopes and Escalation:

Referring to FIG. 26, in one embodiment, master SRM 36 serves as the top hierarchical level fault/event manager, each slave SRM 37*a*–37*n* serves as the next hierarchical level fault/event manager, and software applications resident on each board, for example, ATM 110–113 and device drivers 43*a*–43*d* on line card 16*a* include sub-processes that serve as the lowest hierarchical level fault/event managers (i.e., local resiliency managers, LRM). Master SRM 36 downloads default fault policy (DFP) files (metadata) 430*a*–430*n* from persistent storage to memory 40. Master SRM 36 reads a master default fault policy file (e.g., DFP 430*a*) to understand its fault policy, and each slave SRM 37*a*–37*n* downloads a default fault policy file (e.g., DFP 430*b*–430*n*) corresponding to the board on which the slave SRM is running. Each slave SRM then passes to each LRM a fault policy specific to each local process.

A master logging entity 431 also runs on central processor 12 and slave logging entities 433*a*–433*n* run on each board. Notifications of failures and other events are sent by the master SRM, slave SRMs and LRMs to their local logging entity which then notifies the master logging entity. The master logging entity enters the event in a master event log file 435. Each local logging entity may also log local events in a local event log file 435*a*–435*n*.

In addition, a fault policy table 429 may be created in configuration database 42 by the NMS when the user wishes to over-ride some or all of the default fault policy (see configurable fault policy below), and the master and slave SRMs are notified of the fault policies through the active query process.

Figure 27:
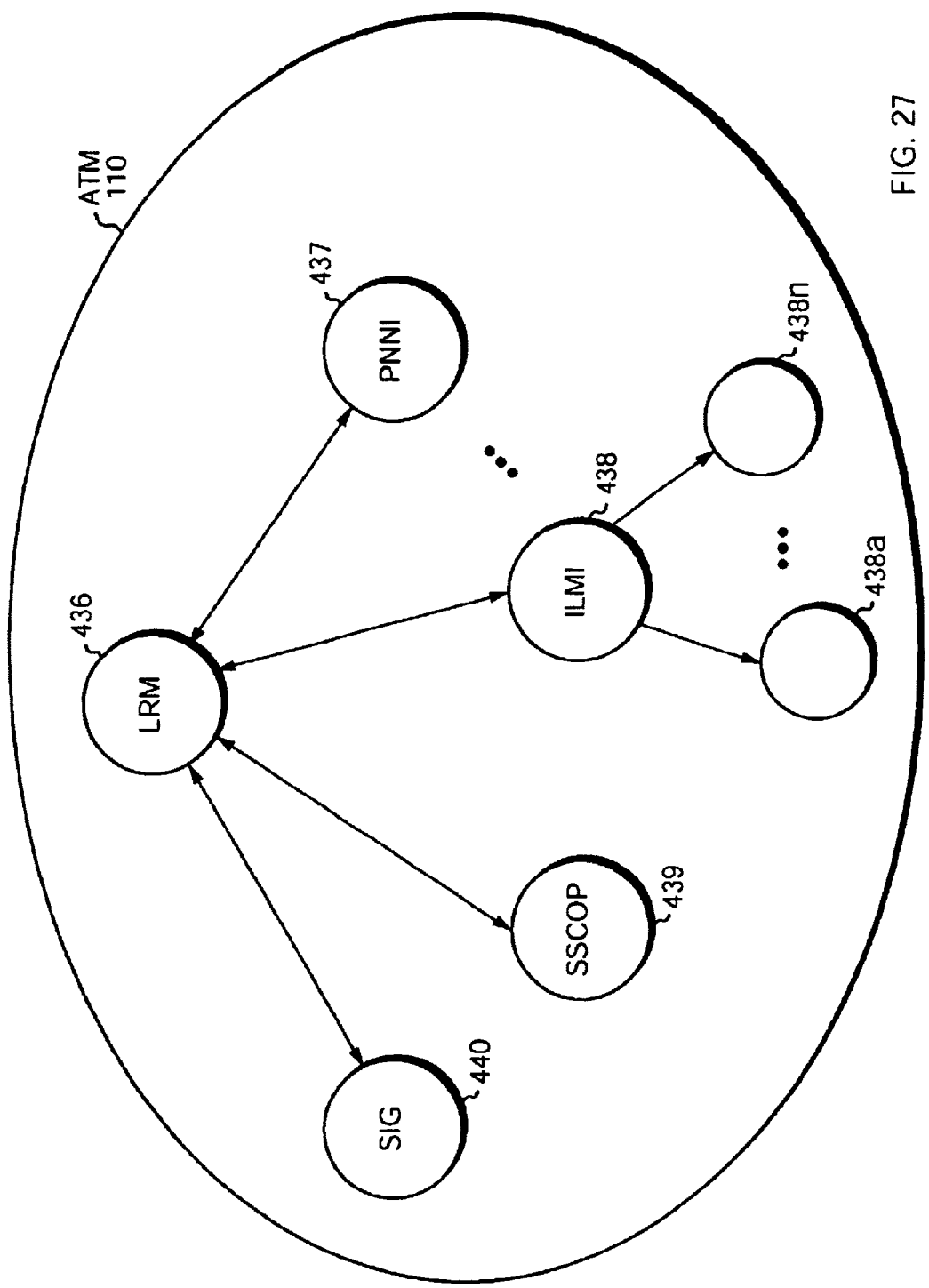
FIG. 27 is a block diagram of an application having multiple sub-processes.

Referring to FIG. 27, as one example, ATM application 110 includes many sub-processes including, for example, an LRM program 436, a Private Network-to-Network Interface (PNNI) program 437, an Interim Link Management Interface (ILMI) program 438, a Service Specific Connection Oriented Protocol (SSCOP) program 439, and an ATM signaling (SIG) program 440. ATM application 110 may include many other sub-programs only a few have been shown for convenience. Each sub-process may also include sub-processes, for example, ILMI sub-processes 438a–438n. In general, the upper level application (e.g., ATM 110) is assigned a process memory block that is shared by all its sub-processes.

If, for example, SSCOP 439 detects a fault, it notifies LRM 436. LRM 436 passes the fault to local slave SRM 37b, which catalogs the fault in the ATM application's fault history and sends a notice to local slave logging entity 433b. The slave logging entity sends a notice to master logging entity 431, which may log the event in master log event file 435. The local logging entity may also log the failure in local event log 435a. LRM 436 also determines, based on the type of failure, whether it can fully resolve the error and do so without affecting other processes outside its scope, for example, ATM 111–113, device drivers 43a–43d and their sub-processes and processes running on other boards. If yes, then the LRM takes corrective action in accordance with its fault policy. Corrective action may include restarting SSCOP 439 or resetting it to a known state.

Since all sub-processes within an application, including the LRM sub-process, share the same memory space, it may be insufficient to restart or reset a failing sub-process (e.g., SSCOP 439). Hence, for most failures, the fault policy will cause the LRM to escalate the failure to the local slave SRM. In addition, many failures will not be presented to the LRM but will, instead, be presented directly to the local slave SRM. These failures are likely to have been detected by either processor exceptions, OS errors or low-level system service errors. Instead of failures, however, the sub-processes may notify the LRM of events that may require action. For example, the LRM may be notified that the PNNI message queue is growing quickly. The LRM's fault policy may direct it to request more memory from the operating system. The LRM will also pass the event to the local slave SRM as a non-fatal fault. The local slave SRM will catalog the event and log it with the local logging entity, which may also log it with the master logging entity. The local slave SRM may take more severe action to recover from an excessive number of these non-fatal faults that result in memory requests.

If the event or fault (or the actions required to handle either) will affect processes outside the LRM's scope, then the LRM notifies slave SRM 37b of the event or failure. In addition, if the LRM detects and logs the same failure or event multiple times and in excess of a predetermined threshold set within the fault policy, the LRM may escalate the failure or event to the next hierarchical scope by notifying slave SRM 37b. Alternatively or in addition, the slave SRM may use the fault history for the application instance to determine when a threshold is exceeded and automatically execute its fault policy.

When slave SRM-37b detects or is notified of a failure or event, it notifies slave logging entity 435b. The slave logging entity notifies master logging entity 431, which may log the failure or event in master event log 435, and the slave logging entity may also log the failure or event in local event log 435b. Slave SRM 37b also determines, based on the type of failure or event, whether it can handle the error without affecting other processes outside its scope, for example, processes running on other boards. If yes, then slave SRM 37b takes corrective action in accordance with its fault policy and logs the fault. Corrective action may include re-starting one or more applications on line card 16a.

If the fault or recovery actions will affect processes outside the slave SRM's scope, then the slave SRM notifies master SRM 36. In addition, if the slave SRM has detected and logged the same failure multiple times and in excess of a predetermined threshold, then the slave SRM may escalate the failure to the next hierarchical scope by notifying master SRM 36 of the failure. Alternatively, the master SRM may use its fault history for a particular line card to determine when a threshold is exceeded and automatically execute its fault policy.

When master SRM 36 detects or receives notice of a failure or event, it notifies slave logging entity 433a, which notifies master,logging entity 431. The master logging entity 431 may log the failure or event in master log file 435 and the slave logging entity may log the failure or event in local event log 435a. Master SRM 36 also determines the appropriate corrective action based on the type of failure or event and its fault policy. Corrective action may require failing-over one or more line cards 16a–16n or other boards, including central processor 12, to redundant backup boards or, where backup boards are not available, simply shutting particular boards down. Some failures may require the master SRM to re-boot the entire computer system.

An example of a common error is a memory access error. As described above, when the slave SRM starts a new instance of an application, it requests a protected memory block from the local operating system. The local operating systems assign each instance of an application one block of local memory and then program the local memory management unit (MMU) hardware with which processes have access (read and/or write) to each block of memory. An MMU detects a memory access error when a process attempts to access a memory block not assigned to that process. This type of error may result when the process generates an invalid memory pointer. The MMU prevents the failing process from corrupting memory blocks used by other processes (i.e., protected memory model) and sends a hardware exception to the local processor. A local operating system fault handler detects the hardware exception and determines which process attempted the invalid memory access. The fault handler then notifies the local slave SRM of the hardware exception and the process that caused it. The slave SRM determines the application instance within which the fault occurred and then goes through the process described above to determine whether to take corrective action, such as restarting the application, or escalate the fault to the master SRM.

As another example, a device driver, for example, device driver 43a may determine that the hardware associated with its port, for example, port 44a, is in a bad state. Since the failure may require the hardware to be swapped out or failed-over to redundant hardware or the device driver itself to be re-started, the device driver notifies slave SRM 37b. The slave SRM then goes through the process described above to determine whether to take corrective action or escalate the fault to the master SRM.

As a third example, if a particular application instance repeatedly experiences the same software error but other similar application instances running on different ports do not experience the same error, the slave SRM may determine that it is likely a hardware error. The slave SRM would then notify thee master SRM which may initiate a fail-over to a backup board or, if no backup board exists, simply shut down that board or only the failing port on that board. Similarly, if the master SRM receives failure reports from multiple boards indicating Ethernet failures, the master SRM may determine that the Ethernet hardware is the problem and initiate a fail-over to backup Ethernet hardware.

Consequently, the failure type and the failure policy determine at what scope recovery action will be taken. The higher the scope of the recovery action, the larger the temporary loss of services. Speed of recovery is one of the primary considerations when establishing a fault policy. Restarting a single software process is much faster than switching over an entire board to a redundant board or re-booting the entire computer system. When a single process is restarted, only a fraction of a card's services are affected. Allowing failures to be handled at appropriate hierarchical levels avoids unnecessary recovery actions while ensuring that sufficient recovery actions arc taken, both of which minimize service disruption to customers.

Hierarchical Descriptors:

Hierarchical descriptors may be used to provide information specific to each failure or event. The hierarchical descriptors provide granularity with which to report faults, take action based on fault history and apply fault recovery policies. The descriptors can be stored in master event log file 435 or local event log files 435a–435n through which faults and events may be tracked and displayed to the user and allow for fault detection at a fine granular level and proactive response to events. In addition, the descriptors can be matched with descriptors in the fault policy to determine the recovery action to be taken.

Figure 28:
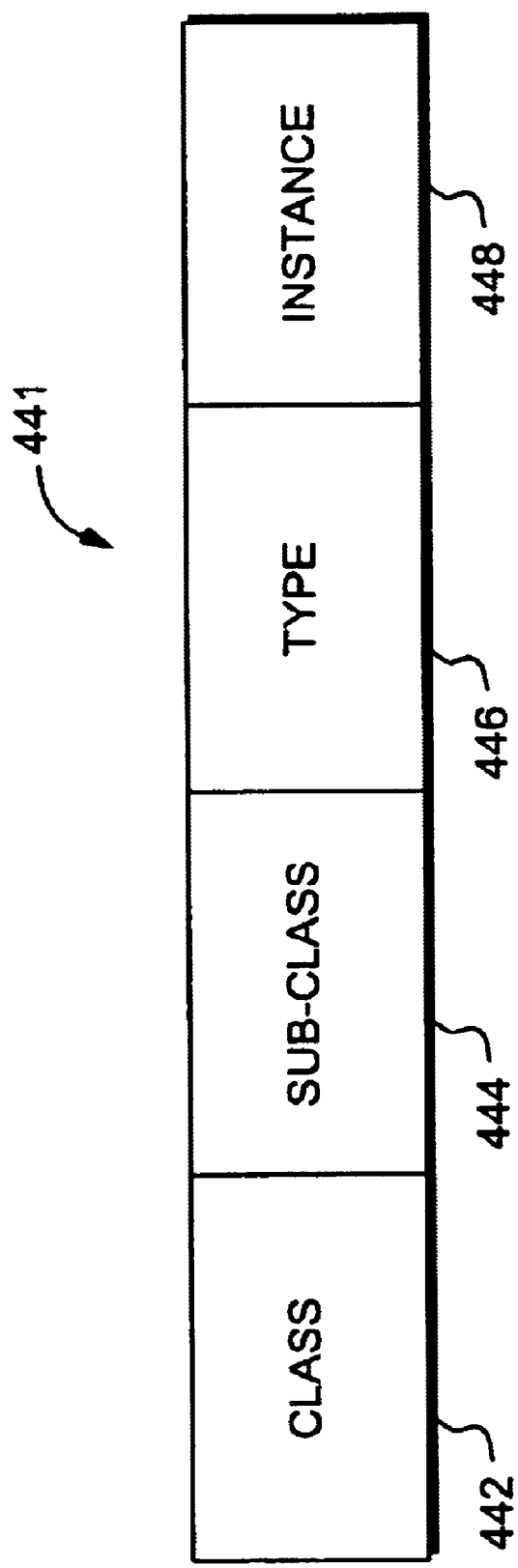
FIG. 28 is a block diagram of a hierarchical fault descriptor.

Referring to FIG. 28, in one embodiment, a descriptor 441 includes a top hierarchical class field 442, a next hierarchical level sub-class field 444, a lower hierarchical level type field 446 and a lowest level instance field 448. The class field indicates whether the failure or event is related (or suspected to relate) to hardware or software. The subclass field categorizes events and failures into particular hardware or software groups. For example, under the hardware class, subclass indications may include whether the fault or event is related to memory, Ethernet, switch fabric or network data transfer hardware. Under the software class, subclass indications may include whether the fault or event is a system fault, an exception or related to a specific application, for example, ATM.

The type field more specifically defines the subclass failure or event. For example, if a hardware class, Ethernet subclass failure has occurred, the type field may indicate a more specific type of Ethernet failure, for instance, a cyclic redundancy check (CRC) error or a runt packet error. Similarly, if a software class, ATM failure or event has occurred, the type field may indicate a more specific type of ATM failure or event, for instance, a private network-to-network interface (PNNI) error or a growing message queue event. The instance field identifies the actual hardware or software that failed or generated the event. For example, with regard to a hardware class, Ethernet subclass, CRC type failure, the instance indicates the actual Ethernet port that experienced the failure. Similarly, with regard to a software class, ATM subclass, PNNI type, the instance indicates the actual PNNI sub-program that experienced the failure or generated the event.

When a fault or event occurs, the hierarchical scope that first detects the failure or event creates a descriptor by filling in the fields described above. In some cases, however, the Instance field is not applicable. The descriptor is sent to the local logging entity, which may log it in the local event log file before notifying the master logging entity, which may log it in the master event log file 435. The descriptor may also be sent to the local slave SRM, which tracks fault history based on the descriptor contents per application instance. If the fault or event is escalated, then the descriptor is passed to the next higher hierarchical scope.

When slave SRM 37b receives the fault/event notification and the descriptor, it compares it to descriptors in the fault policy for the particular scope in which the fault occurred looking for a match or a best case match which will indicate the recovery procedure to follow. Fault descriptors within the fault policy can either be complete descriptors or have wildcards in one or more fields. Since the descriptors are hierarchical from left to right, wildcards in descriptor fields only make sense from right to left. The fewer the fields with wildcards, the more specific the descriptor. For example, a particular fault policy may apply to all software faults and would, therefore, include a fault descriptor having the class field set to "software" and the remaining fields—subclass, type, and instance—set to wildcard or "match all." The slave SRM searches the fault policy for the best match (i.e., the most fields matched) with the descriptor to determine the recovery action to be taken.

Configurable Fault Policy:

In actual use, a computer system is likely to encounter scenarios that differ from those in which the system was designed and tested. Consequently, it is nearly impossible to determine all the ways in which a computer system might fail, and in the face of an unexpected error, the default fault policy that was shipped with the computer system may cause the hierarchical scope (master SRM, slave SRM or LRM) to under-react or over-react. Even for expected errors, after a computer system ships, certain recovery actions in the default fault policy may be determined to be over aggressive or too lenient. Similar issues may arise as new software and hardware is released and/or upgraded.

A configurable fault policy allows the default fault policy to be modified to address behavior specific to a particular upgrade or release or to address behavior that was learned after the implementation was released. In addition, a configurable fault policy allows users to perform manual overrides to suit their specific requirements and to tailor their policies based on the individual failure scenarios that they are experiencing. The modification may cause the hierarchical scope to react more or less aggressively to particular known faults or events, and the modification may add recovery actions to handle newly learned faults or events. The modification may also provide a temporary patch while a software or hardware upgrade is developed to fix a particular error.

If an application runs out of memory space, it notifies the operating system and asks for more memory. For certain applications, this is standard operating procedure. As an example, an ATM application may have set up a large number of virtual circuits and to continue setting up more, additional memory is needed. For other applications, a request for more memory indicates a memory leak error. The fault policy may require that the application be re-started causing some service disruption. It may be that re-starting the application eventually leads to the same error due to a bug in the software. In this instance, while a software upgrade to fix the bug is developed, a temporary patch to the fault policy may be necessary to allow the memory leak to continue and prevent repeated application re-starts that may escalate to line card re-start or fail-over and eventually to a re-boot of the entire computer system. A temporary patch to the default fault policy may simply allow the hierarchical scope, for example, the local resiliency manager or the slave SRM, to assign additional memory to the application. Of course, an eventual re-start of the application is likely to be required if the application's leak consumes too much memory.

A temporary patch may also be needed while a hardware upgrade or fix is developed for a particular hardware fault. For instance, under the default fault policy, when a particular hardware fault occurs, the recovery policy may be to fail-over to a backup board. If the backup board includes the same hardware with the same hardware bug, for example, a particular semiconductor chip, then the same error will occur on the backup board. To prevent a repetitive fail-over while a hardware fix is developed, the temporary patch to the default fault policy may be to restart the device driver associated with the particular hardware instead of failing-over to the backup board.

In addition to the above needs, a configurable fault policy also allows purchasers of computer system 10 (e.g., network service providers) to define their own policies. For example, a network service provider may have a high priority customer on a particular port and may want all errors and events (even minor ones) to be reported to the NMS and displayed to the network manager. Watching all errors and events might give the network manager early notice of growing resource consumption and the need to plan to dedicate additional resources to this customer.

As another example, a user of computer system 10 may want to be notified when any process requests more memory. This may give the user early notice of the need to add more memory to their system or to move some customers to different line cards.

Referring again to FIG. 26, to change the default fault policy as defined by default fault policy (DFP) files 430a–430n, a configuration fault policy file 429 is created by the NMS in the configuration database. An active query notification is sent by the configuration database to the master SRM indicating the changes to the default fault policy. The master SRM notifies any slave SRMs of any changes to the default fault policies specific to the boards on which they are executing, and the slave. SRMs notify any LRMs of any changes to the default fault policies specific to their process. Going forward, the default fault policies—as modified by the configuration fault policy—are used to detect, track and respond to events or failures.

Alternatively, active queries may be established with the configuration database for configuration fault policies specific to each board type such that the slave SRMs are notified directly of changes to their default fault policies.

A fault policy (whether default or configured) is specific to a particular scope and descriptor and indicates a particular recovery action to take. As one example, a temporary patch may be required to handle hardware faults specific to a known bug in an integrated circuit chip. The configured fault policy, therefore, may indicate a scope of all line cards, if the component is on all line cards, or only a specific type of line card that includes that component. The configured fault policy may also indicate that it is to be applied to all hardware faults with that scope, for example, the class will indicate hardware (HW) and all other fields will include wildcards (e.g., HW.*.*.*). Instead, the configured fault policy may only indicate a particular type of hardware failure, for example, CRC errors on transmitted Ethernet packets (e.g., HW.Ethernet.TxCRC.*).

Redundancy:

As previously mentioned, a major concern for service providers is network downtime. In pursuit of "five 9's availability" or 99.999% network up time, service providers must minimize network outages due to equipment (i.e., hardware) and all too common software failures. Developers of computer systems often use redundancy measures to minimize downtime and enhance system resiliency. Redundant designs rely on alternate or backup resources to overcome hardware and/or software faults. Ideally, the redundancy architecture allows the computer system to continue operating in the face of a fault with minimal service disruption, for example, in a manner transparent to the service provider's customer.

Generally, redundancy designs come in two forms: 1:1 and 1:N. In a so-called "1:1 redundancy" design, a backup element exists for every active or primary element (i.e., hardware backup). In the event that a fault affects a primary element, a corresponding backup element is substituted for the primary element. If the backup element has not been in a "hot" state (i.e., software backup), then the backup element must be booted, configured to operate as a substitute for the failing element, and also provided with the "active state" of the failing element to allow the backup element to take over where the failed primary element left off. The time required to bring the software on the backup element to an "active state" is referred to as synchronization time. A long synchronization time can significantly disrupt system service, and in the case of a computer network device, if synchronization is not done quickly enough, then hundreds or thousands of network connections may be lost which directly impacts the service provider's availability statistics and angers network customers.

To minimize synchronization time, many 1:1 redundancy schemes support hot backup of software, which means that the software on the backup elements mirror the software on the primary elements at some level. The "hotter" the backup element—that is, the closer the backup mirrors the primary—the faster a failed primary can be switched over or failed over to the backup. The "hottest" backup element is one that runs hardware and software simultaneously with a primary element conducting all operations in parallel with the primary element. This is referred to as a "1+1 redundancy" design and provides the fastest synchronization.

Significant costs are associated with 1:1 and 1+1 redundancy. For example, additional hardware costs may include duplicate memory components and printed circuit boards including all the components on those boards. The additional hardware may also require a larger supporting chassis. Space is often limited, especially in the case of network service providers who may maintain hundreds of network devices. Although 1:1 redundancy improves system reliability, it decreases service density and decreases the mean time between failures. Service density refers to the proportionality between the net output of a particular device and its gross hardware capability. Net output, in the case of a network device (e.g., switch or router), might include, for example, the number of calls handled per second. Redundancy adds to gross hardware capability but not to the net output and, thus, decreases service density. Adding hardware increases the likelihood of a failure and, thus, decreases the mean time between failures. Likewise, hot backup comes at the expense of system power. Each active element consumes some amount of the limited power available to the system. In general, the 1+1 or 1:1 redundancy designs provide the highest reliability but at a relatively high cost. Due to the importance of network availability, most network service providers prefer the 1+1 redundancy design to minimize network downtime.

In a 1:N redundancy design, instead of having one backup element per primary element, a single backup element or spare is used to backup multiple (N) primary elements. As a result, the 1:N design is generally less expensive to manufacture, offers greater service density and better mean time between failures than the 1:1 design and requires a smaller chassis/less space than a 1:1 design. One disadvantage of such a system, however, is that once a primary element fails over to the backup element, the system is no longer redundant (i.e., no available backup element for any primary element). Another disadvantage relates to hot state backup. Because one backup element must support multiple primary elements, the typical 1:N design provides no hot state on the backup element leading to long synchronization times and, for network devices, the likelihood that connections will be dropped and availability reduced.

Even where the backup element provides some level of hot state backup it generally lacks the processing power and memory to provide a full hot state backup (i.e., 1+N) for all primary elements. To enable some level of hot state backup for each primary element, the backup element is generally a "mega spare" equipped with a more powerful processor and additional memory. This requires customers to stock more hardware than in a design with identical backup and primary elements. For instance, users typically maintain extra hardware in the case of a failure. If a primary fails over to the backup, the failed primary may be replaced with a new primary. If the primary and backup elements are identical, then users need only stock that one type of board, that is, a failed backup is also replaced with the same hardware used to replace the failed primary. If they are different, then the user must stock each type of board, thereby increasing the user's cost.

Distributed Redundancy:

A distributed redundancy architecture spreads software backup (hot state) across multiple elements. Each element may provide software backup for one or more other elements. For software backup alone, therefore, the distributed redundancy architecture eliminates the need for hardware backup elements (i.e., spare hardware). Where hardware backup is also provided, spreading resource demands across multiple elements makes it possible to have significant (perhaps full) hot state backup without the need for a mega spare. Identical backup (spare) and primary hardware provides manufacturing advantages and customer inventory advantages. A distributed redundancy design is less expensive than many 1:1 designs and a distributed redundancy architecture also permits the location of the hardware backup element to float, that is, if a primary element fails over to the backup element, when the failed primary element is replaced, that new hardware may serve as the hardware backup.

Figure 29:
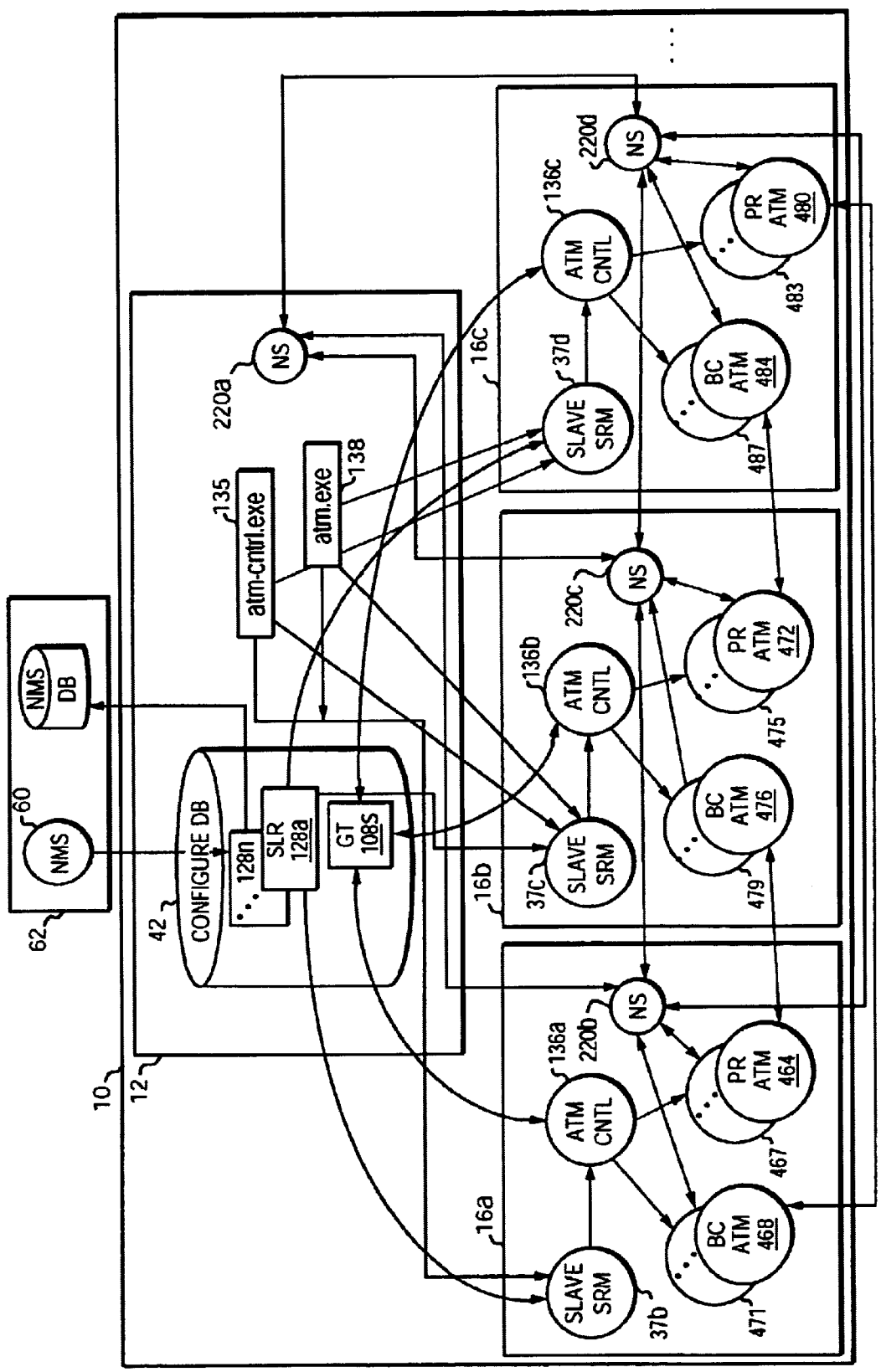
FIG. 29 is a block and flow diagram of a computer system incorporating a distributed redundancy architecture and illustrating a method for accomplishing distributed software redundancy.

Software Redundancy:

In its simplest form, a distributed redundancy system provides software redundancy (i.e., backup) with or without redundant (i.e., backup) hardware, for example, with or without using backup line card 16*n* as discussed earlier with reference to the logical to physical card table (FIG. 11*a*). Referring to FIG. 29, computer system 10 includes primary line cards 16*a*, 16*b* and 16*c*. Computer system 10 will likely include additional primary line cards; only three are discussed herein (and shown in FIG. 29) for convenience. As described above, to load instances of software applications, the NMS creates software load records (SLR) 128*a*–128*n* in configuration database 42. The SLR includes the name of a control shim executable file and a logical identification (LID) associated with a primary line card on which the application is to be spawned. In the current example, there either are no hardware backup line cards or, if there are, the slave SRM executing on that line card does not download and execute backup applications.

As one example, NMS 60 creates SLR 128*a* including the executable name atm_cntrl.exe and card LID 30 (line card 16*a*), SLR 128*b* including atm_cntrl.exe and LID 31 (line card 16*b*) and SLR 128*c* including atm_cntrl.exe and LID 32 (line card 16*c*). The configuration database detects LID 30, 31 and 32 in SLRs 128*a*, 128*b* and 128*c*, respectively, and sends slave SRMs 37*b*, 37*c* and 37*d* (line cards 16*a*, 16*b*, and 16*c*) notifications including the name of the executable file (e.g., atm_cntrl.exe) to be loaded. The slave SRMs then download and execute a copy of atm_cntrl.exe 135 from memory 40 to spawn ATM controllers 136*a*, 136*b* and 136*c*.

Through the active query feature, the ATM controllers are sent records from group table (GT) 108' (FIG. 30) indicating how many instances of ATM each must start on their associated line cards. Group table 108' includes a primary line card LID field 447 and a backup line card LID field 449 such that, in addition to starting primary instances of ATM, each primary line card also executes backup instances of ATM. For example, ATM controller 136*a* receives records 450–453 and 458–461 from group table 108' including LID 30 (line card 16*a*). Records 450–453 indicate that ATM controller 136*a* is to start four primary instantiations of ATM 464–467 (FIG. 29), and records 458–461 indicate that ATM controller 136*a* is to start four backup, instantiations of ATM 468–471 as backup for four primary instantiations on LID 32 (line card 16*c*). Similarly, ATM controller 136*b* receives records 450–457 from group table 108', including LID 31 (line card 16*b*). Records 454–457 indicate that ATM controller 136*b* is to start four primary instantiations of ATM 472–475, and records 450–453 indicate that ATM controller 136*b* is to start four backup instantiations of ATM 476–479 as backup for four primary instantiations on LID 30 (line card 16*a*). ATM controller 136*c* receives records 454–461 from group table 108' including LID 32 (line card 16*c*). Records 458–461 indicate that ATM controller 136*c* is to start four primary instantiations of ATM 480–483, and records 454–457 indicate that ATM controller 136*c* is to start four backup instantiations of ATM 484–487 as backup for four primary instantiations on LID 31 (line card 16*b*). ATM controllers 136*a*, 136*b* and 136*c* then download atm.exe 138 and generate the appropriate number of ATM instantiations and also indicate to each instantiation whether it is a primary or backup instantiation. Alternatively, the ATM controllers may download atm.exe and generate the appropriate number of primary. ATM instantiations and download a separate backup_atm.exe and generate the appropriate number of backup ATM instantiations.

Each primary instantiation registers with its local name server 220*b*–220*d*, as described above, and each backup instantiation subscribes to its local name server 220*b*–220*d* for information about its corresponding primary instantiation. The name server passes each backup instantiation at least the process identification number assigned to its corresponding primary instantiation, and with this, the backup instantiation sends a message to the primary instantiation to set up a dynamic state check-pointing procedure. Periodically or asynchronously as state changes, the primary instantiation passes dynamic state information to the backup instantiation (i.e., check-pointing). In one embodiment, a Redundancy Manager Service available from Harris and Jefferies of Dedham, Mass. may be used to allow backup and primary instantiations to pass dynamic state information. If the primary instantiation fails, it can be re-started, retrieve its last known dynamic state from the backup instantiation and then initiate an audit procedure (as described above) to resynchronize with other processes. The retrieval and audit process will normally be completed very quickly, resulting in no discernable service disruption.

Although each line card in the example above is instructed by the group table to start four instantiations of ATM, this is by way of example only. The user could instruct the NMS to set up the group table to have each line card start one or more instantiations and to have each line card start a different number of instantiations.

Figure 31A:
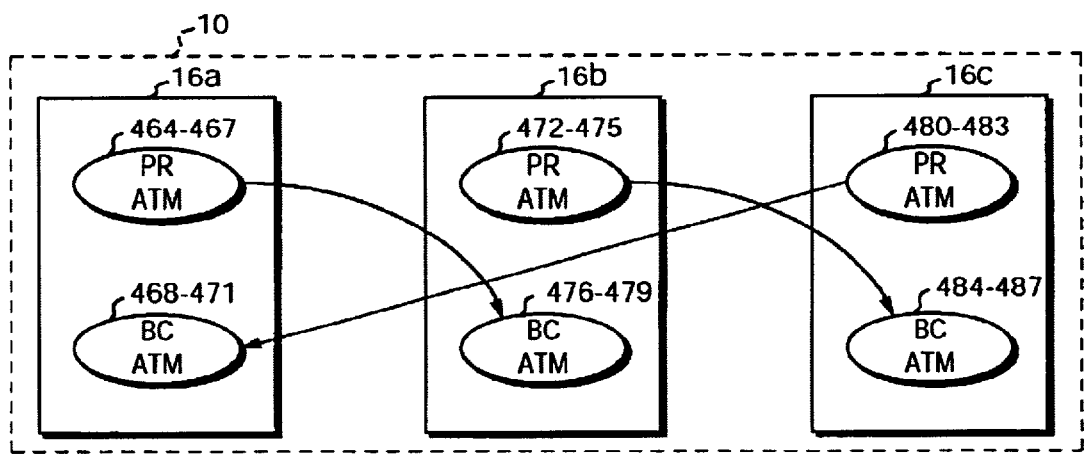
Figure 31B:
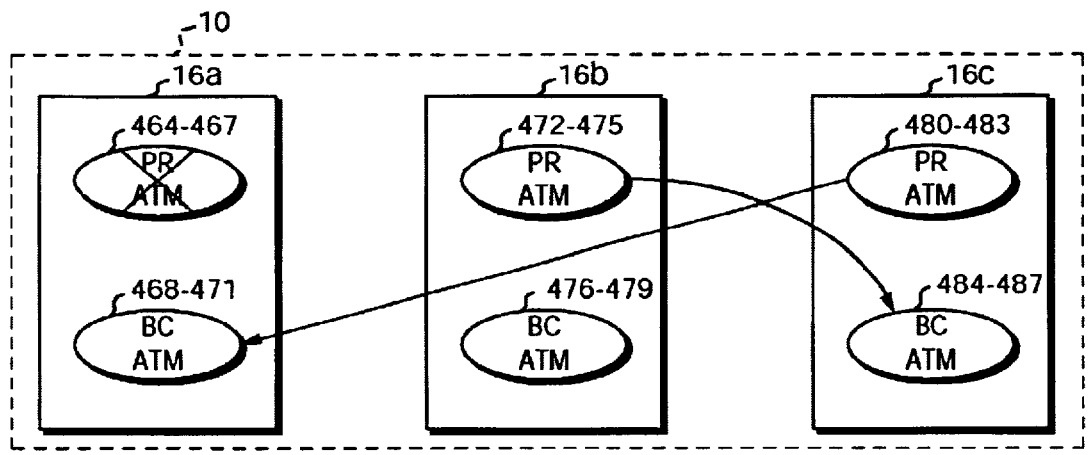
Figure 31C:
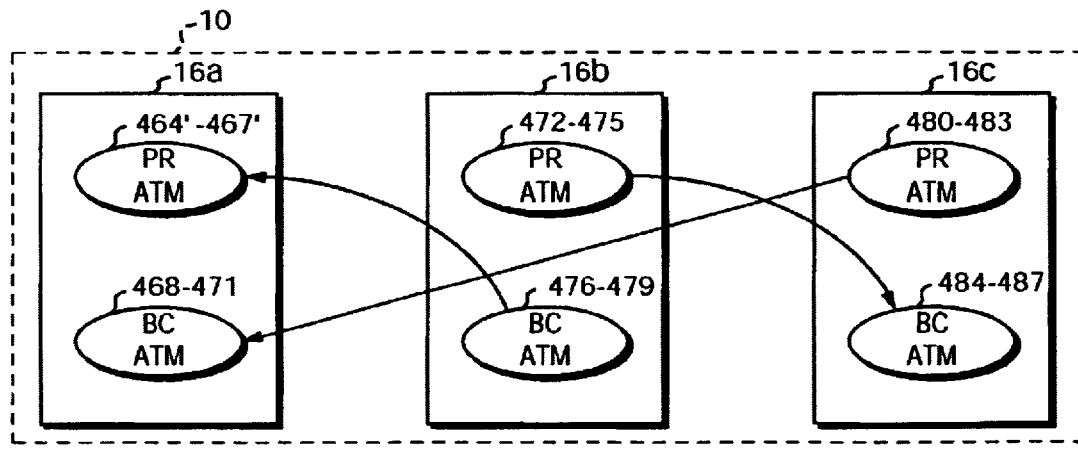

Referring to FIG. 31a–31c, if one or more of the primary processes on element 16a (ATM 464–467) experiences a software fault (FIG. 31b), the processor on line card 16a may terminate and restart the failing process or processes. Once the process or processes are restarted (ATM 464'–467', FIG. 31c), they retrieve a copy of the last known dynamic state (i.e., backup state) from corresponding backup processes (ATM 476–479) executing on line card 16b and initiate an audit process to synchronize retrieved state with the dynamic state of associated other processes. The backup state represents the last known active or dynamic state of the process or processes prior to termination, and retrieving this state from line card 16b allows the restarted processes on line card 16a to quickly resynchronize and continue operating. The retrieval and audit process will normally be completed very quickly, and in the case of a network device, quick resynchronization may avoid losing network connections, resulting in no discernable service disruption.

Figure 32A:
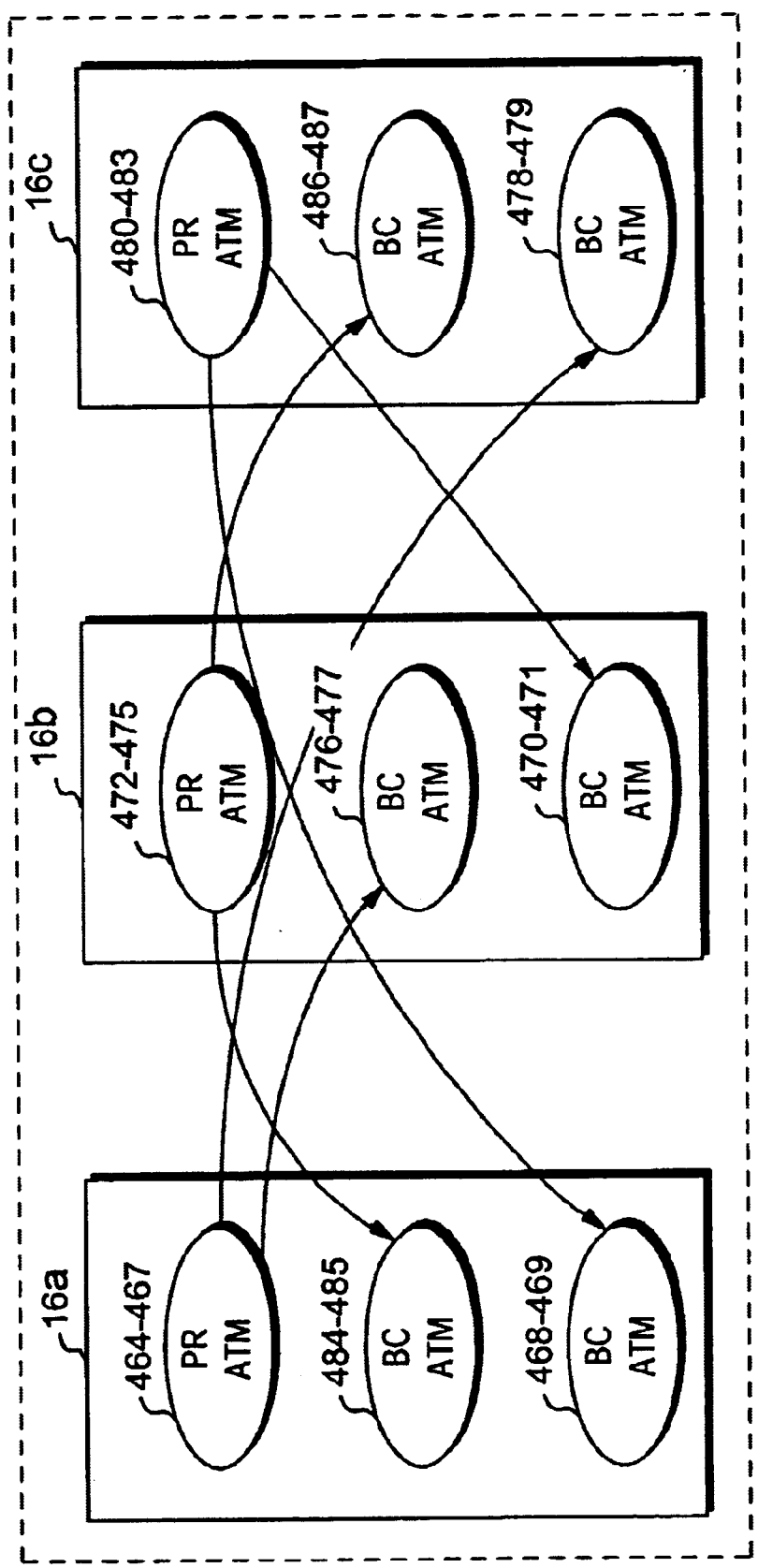
Figure 32B:
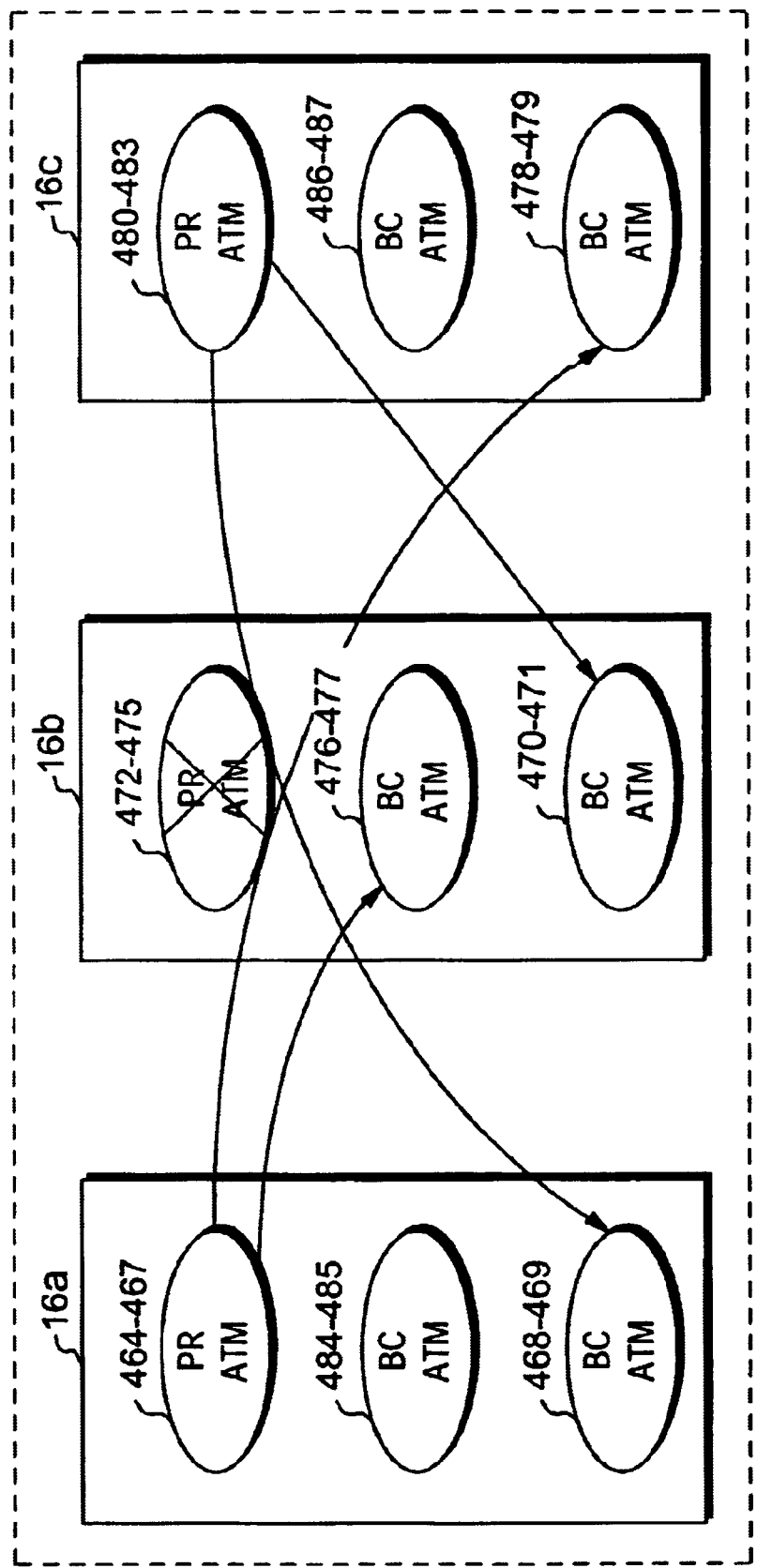
Figure 32C:
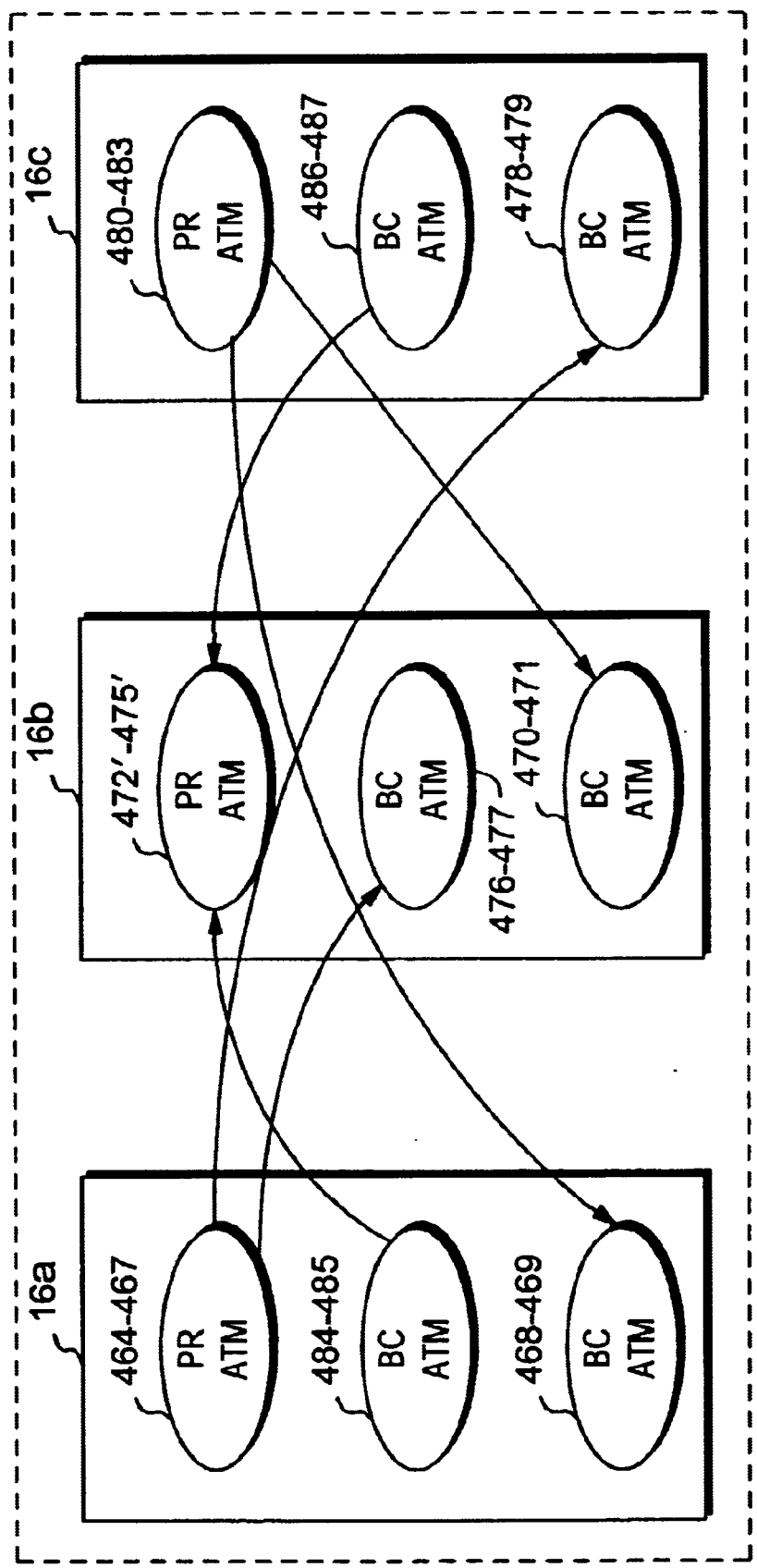

If, instead of restarting a particular application, the software fault experienced by line card 16a requires the entire element to be shut down and rebooted, then all of the processes executing on line card 16a will be terminated including backup processes ATM 468–471. When the primary processes are restarted, backup state information is retrieved from backup processes executing on line card 16b as explained above. Simultaneously, the restarted backup processes on line card 16a again initiate the check-pointing procedure with primary ATM processes 480–483 executing on line card 16c to again serve as backup processes for these primary processes. Referring to FIGS. 32a–32c, the primary processes executing on one line card may be backed-up by backup processes running on one or more other line cards. In addition, each primary process may be backed-up by one or more backup processes executing on one or more of the other line cards.

Since the operating system assigns each process its own memory block, each primary process may be backed-up by a backup process running on the same line card. This would minimize the time required to retrieve backup state and resynchronize if a primary process fails and is restarted. In a computer system that includes a spare or backup line card (described below), the backup state is best saved on another line card such that in the event of a hardware fault, the backup state is not lost and can be copied from the other line card. If memory and processor limitations permit, backup processes may run simultaneously on the same line card as the primary process and on another line card such that software faults are recovered from using local backup state and hardware faults are recovered from using remote backup state.

Where limitations on processing power or memory make full hot state backup impossible or impractical, only certain hot state data will be stored as backup. The level of hot state backup is inversely proportional to the resynchronization time, that is, as the level of hot state backup increases, resynchronization time decreases. For a network device, backup state may include critical information that allows the primary process to quickly resynchronize.

Critical information for a network device may include connection data relevant to established network connections (e.g., call set up information and virtual circuit information). For example, after primary ATM applications 464–467, executing on line card 16a, establish network connections, those applications send critical state information relevant to those connections to backup ATM applications 479–476 executing on line card 16b. Retrieving connection data allows the hardware (i.e., line card 16a) to send and receive network data over the previously established network connections preventing these connections from being terminated/dropped.

Although ATM applications were used in the examples above, this is by way of example only. Any application (e.g., IP or MPLS), process (e.g., MCD or NS) or device driver (e.g., port driver) may have a backup process started on another line card to store backup state through a check-pointing procedure.

Hardware and Software Backup:

By adding one or more hardware backup elements (e.g., line card 16n) to the computer system, the distributed redundancy architecture provides both hardware and software backup. Software backup may be spread across all of the line cards or only some of the line cards. For example, software backup may be spread only across the primary line cards, only on one or more backup line cards or on a combination of both primary and backup line cards.

Figure 33A:
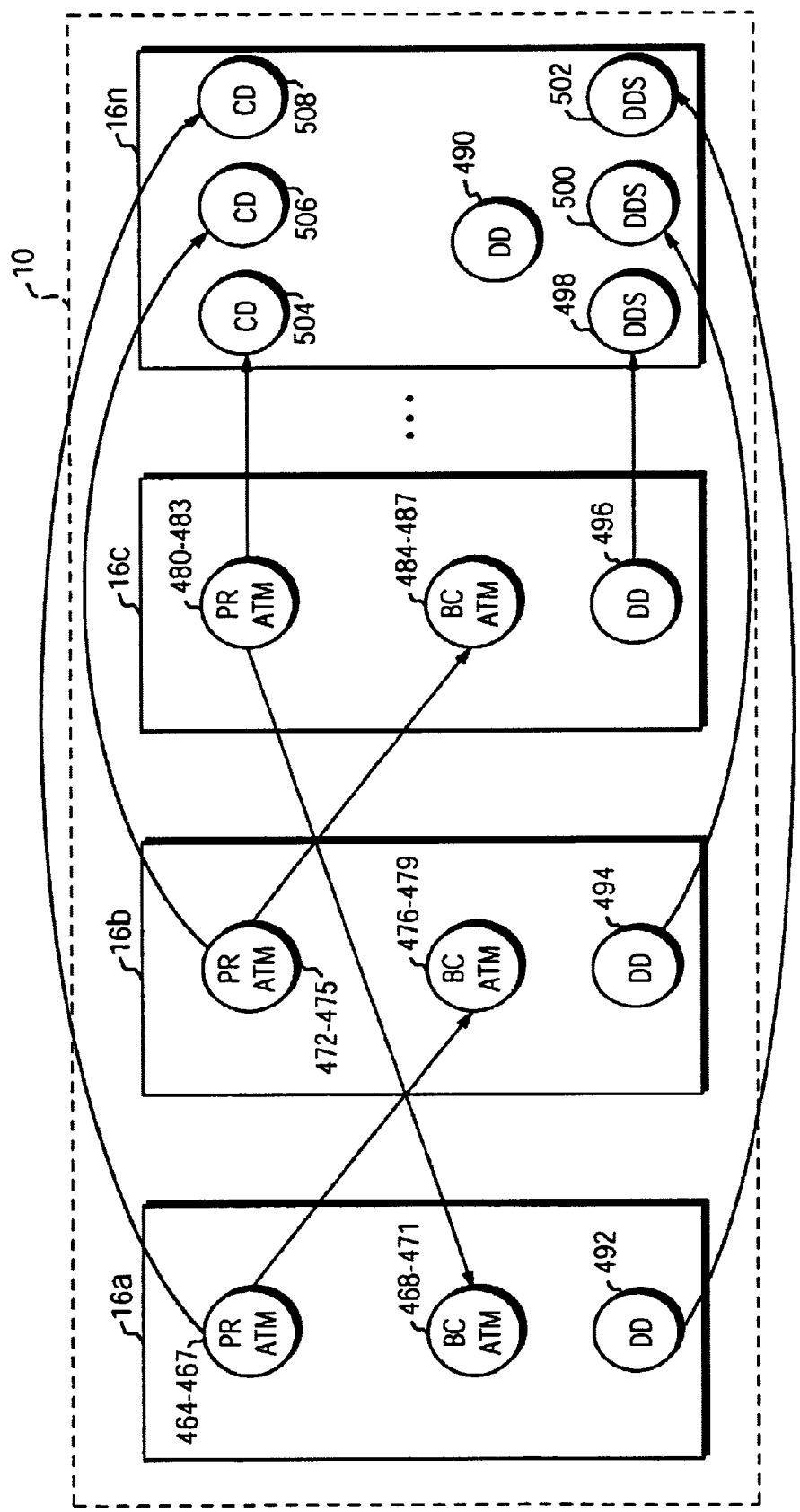

Referring to FIG. 33a, in the continuing example, line cards 16a, 16b and 16c are primary hardware elements and line card 16n is a spare or backup hardware element. In this example, software backup is spread across only the primary line cards. Alternatively, backup line card 16n may also execute backup processes to provide software backup. Backup line card 16n may execute all backup processes such that the primary elements need not execute any backup processes or line card 16n may execute only some of the backup processes. Regardless of whether backup line card 16n executes any backup processes, it is preferred that line card 16n be at least partially operational and ready to use the backup processes to quickly begin performing as if it was a failed primary line card.

There are many levels at which a backup line card may be partially operational. For example, the backup line card's hardware may be configured and device driver processes 490 loaded and ready to execute. In addition, the active state of the device drivers 492, 494, and 496 on each of the primary line cards may be stored as backup device driver state (DDS) 498, 500, 502 on backup line card 16n such that after a primary line card fails, the backup device driver state corresponding to that primary element is used by device driver processes 490 to quickly synchronize the hardware on backup line card 16n. In addition, data reflecting the network connections established by each primary process may be stored within each of the backup processes or independently on backup line card 16n, for example, connection data (CD) 504, 506, 508. Having a copy of the connection data on the backup line card allows the hardware to quickly begin transmitting network data over previously established connections to avoid the loss of these connections and minimize service disruption. The more operational (i.e., hotter) backup line card 16n is the faster it will be able to transfer data over network connections previously established by the failed primary line card and resynchronize with the rest of the system.

Figure 33B:
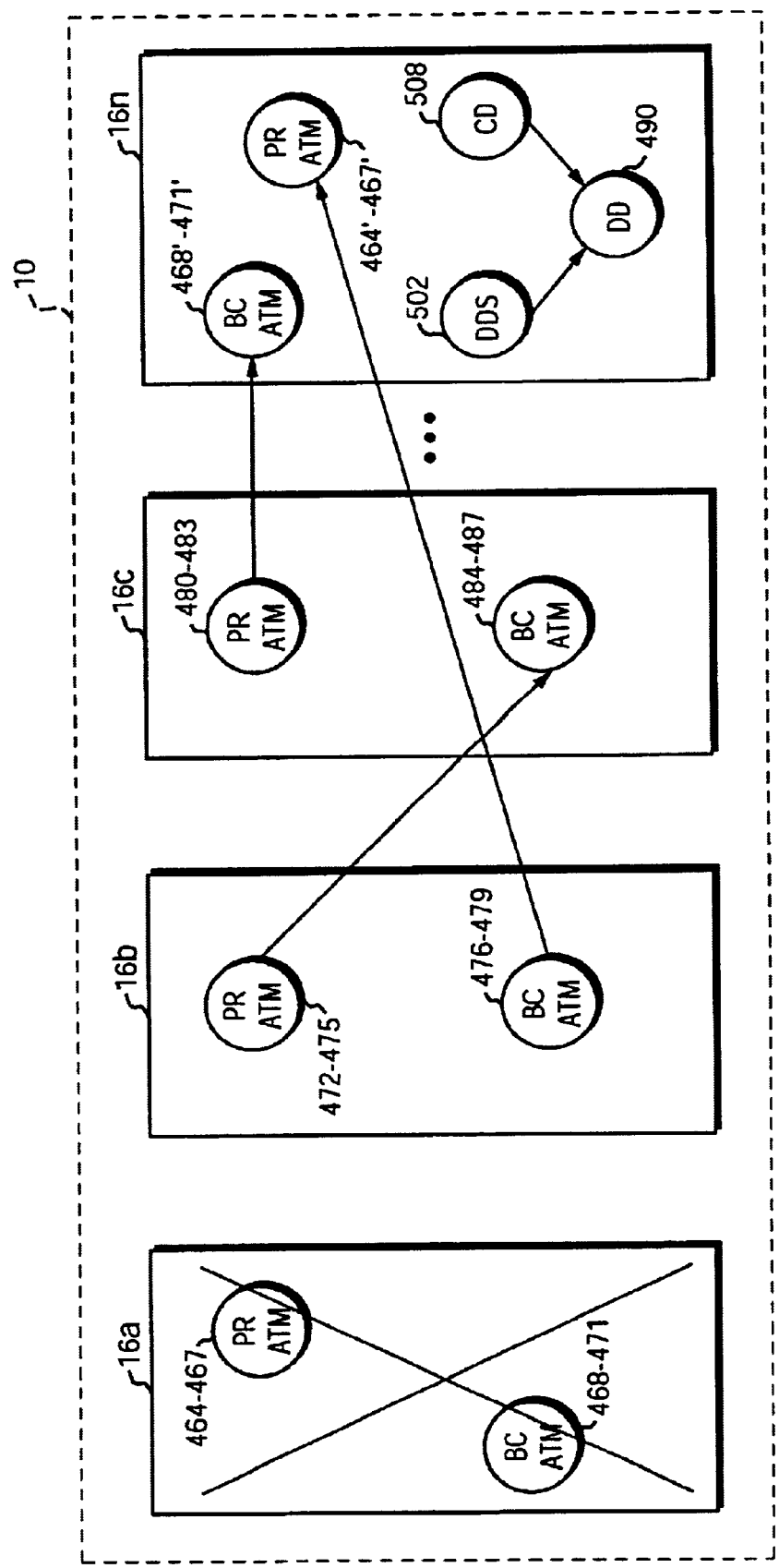

In the case of a primary line card hardware fault, the backup or spare line card takes the place of the failed primary line card. The backup line card starts new primary processes that register with the name server on the backup line card and begin retrieving active state from backup processes associated with the original primary processes. As described above, the same may also be true for software faults. Referring to FIG. 33b, if, for example, line card 16a in computer system, 10 is affected by a fault, the slave SRM executing on backup line card 16n may start new primary processes 464'–467' corresponding to the original primary processes 464–467. The new primary processes register with the name server process executing on line card 16n and begin retrieving active state from backup processes 476–479 on line card 16b. This is referred to as a "fail-over" from failed primary line card 16a to backup line card 16n.

As discussed above, preferably, backup line card 16n is partially operational. While active state is being retrieved from backup processes on line card 16b, device driver processes 490 use device driver state 502 and connection data 508 corresponding to failed primary line card 16a to quickly continue passing network data over previously established connections. Once the active state is retrieved then the ATM applications resynchronize and may begin establishing new connections and tearing down old connections.

Figure 33C:
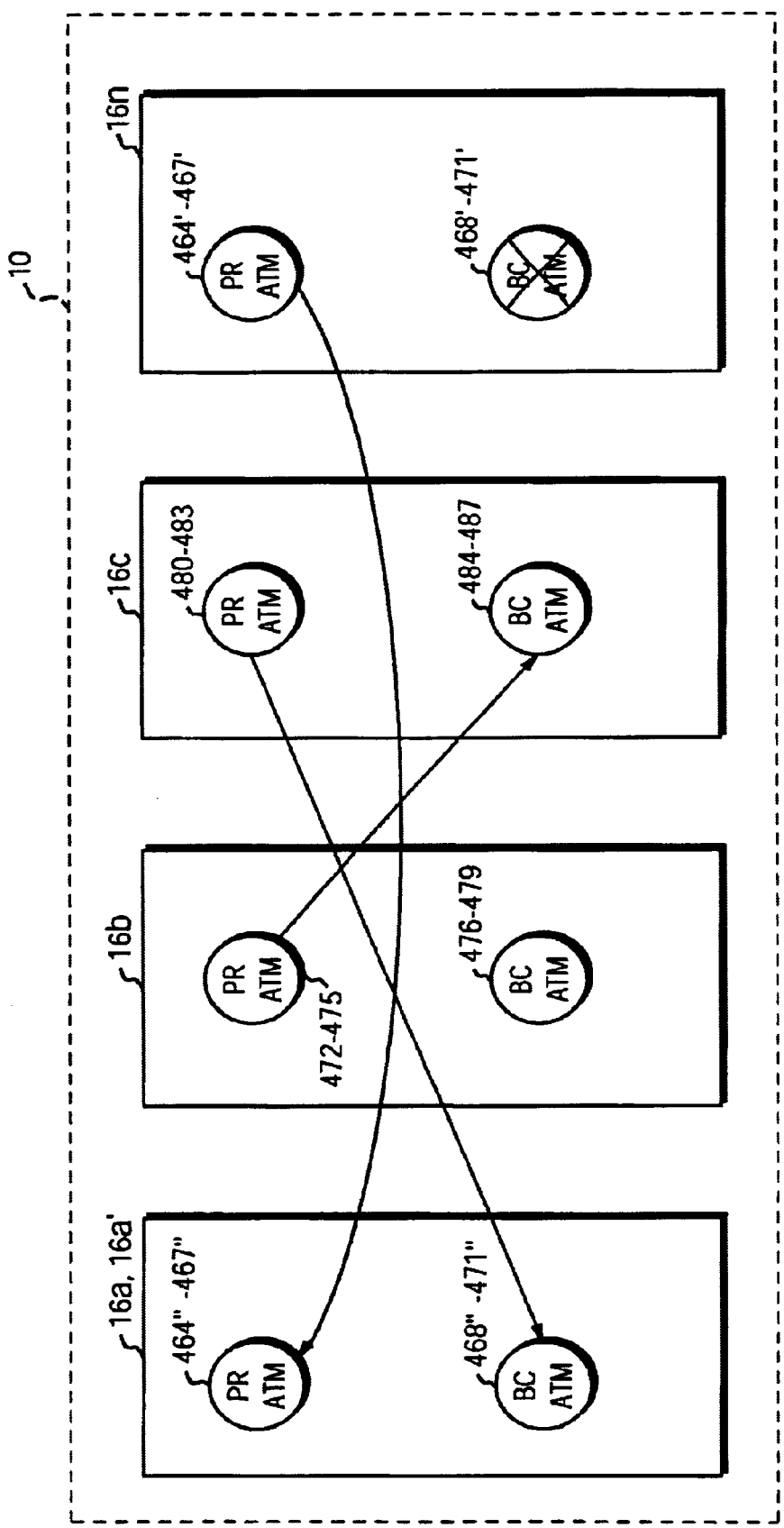

Floating Backup Element:

Referring to FIG. 33c, when the fault is detected on line card 16a, diagnostic tests may be run to determine if the error was caused by software or hardware. If the fault is a software error, then line card 16a may again be used as a primary line card. If the fault is a hardware error, then line card 16a is replaced with a new line card 16a' that is booted and configured and again ready to be used as a primary element. In one embodiment, once line card 16a or 16a' is ready to serve as a primary element, a fail-over is initiated from line card 16n to line card 16a or 16a' as described above, including starting new primary processes 464"–467" and retrieving active state from primary processes 464'–467' on line card 16n (or backup processes 476–479 on line card 16b). Backup processes 468"–471" are also started, and those backup processes initiate a check-pointing procedure with primary processes 480–483 on line card 16c. This fail-over may cause the same level of service interruption as an actual failure.

Figure 33D:
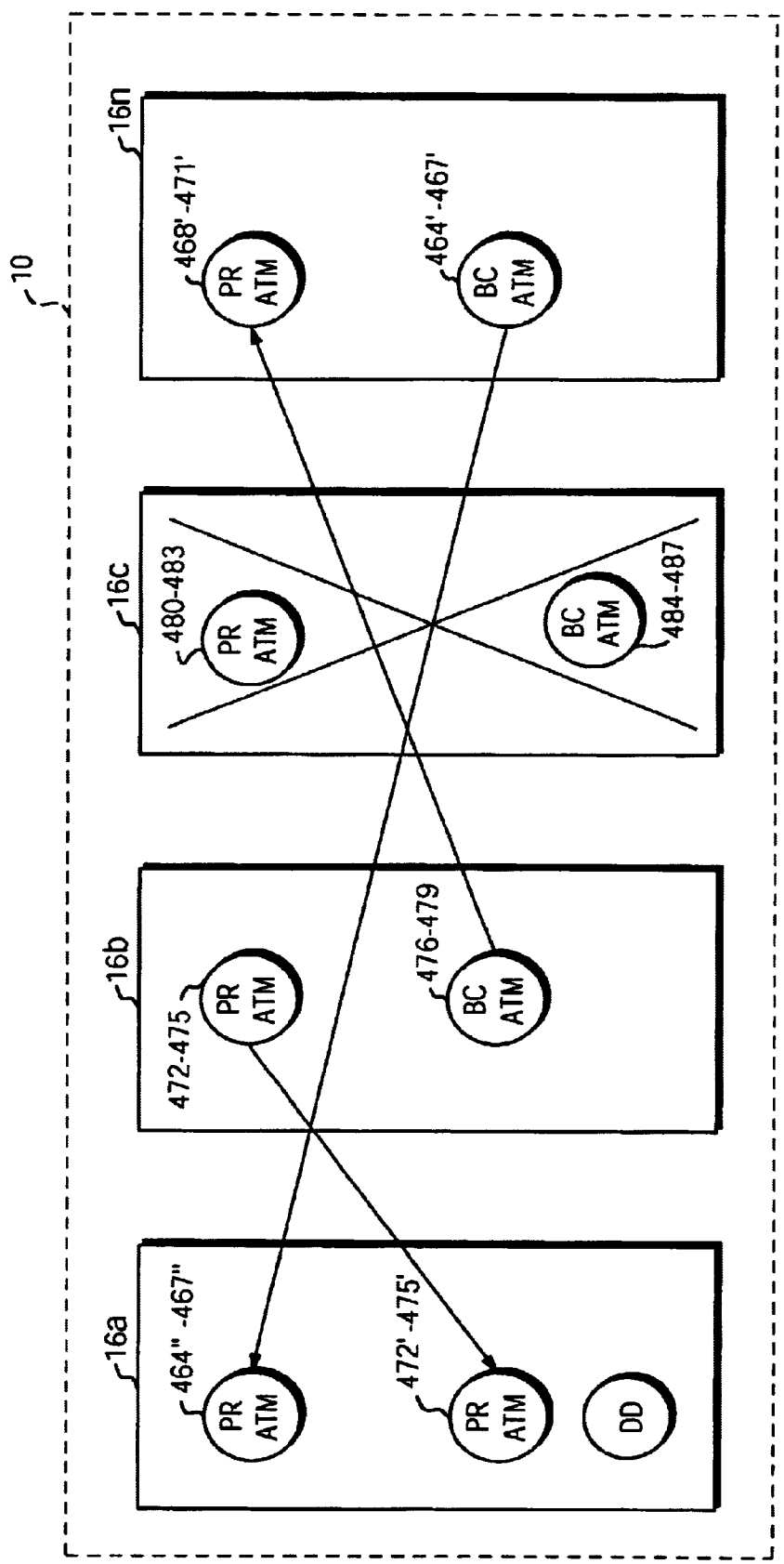

Instead of failing-over from line card 16n back to line card 16a or 16a' and risking further service disruption, line card 16a or 16a' may serve as the new backup line card with line card 16n serving as the primary line card. If line cards 16b, 16c or 16n experience a fault, a fail-over to line card 16a is initiated as discussed above and the primary line card that failed (or a replacement of that line card) serves as the new backup line card. This is referred to as a "floating" backup element. Referring to FIG. 33d, if, for example, line card 16c experiences a fault, primary processes 480'–483' are started on backup line card 16a and active state is retrieved from backup processes 464'–467' on line card 16n. After line card 16c is rebooted or replaced and rebooted, it serves as the new backup line card for primary line cards 16a, 16b and 16n.

Alternatively, computer system 10 may be physically configured to only allow a line card in a particular chassis slot, for example, line card 16n, to serve as the backup line card. This may be the case where physically, the slot line card 16n is inserted within is wired to provide the necessary connections to allow line card 16n to communicate with each of the other line cards but no other slot provides these connections. In addition, even where the computer system is capable of allowing line cards in other chassis slots to act as the backup line card, the person acting as network manager, may prefer to have the backup line card in each of his computer systems in the same slot. In either case, where only line card 16n serves as the backup line card, once line card 16a (or any other failed primary line card) is ready to act as a primary line card again, a fail-over, as described above, is initiated from line card 16n to the primary line card to allow line card 16n to again serve as a backup line card to each of the primary line cards.

Figure 34A:
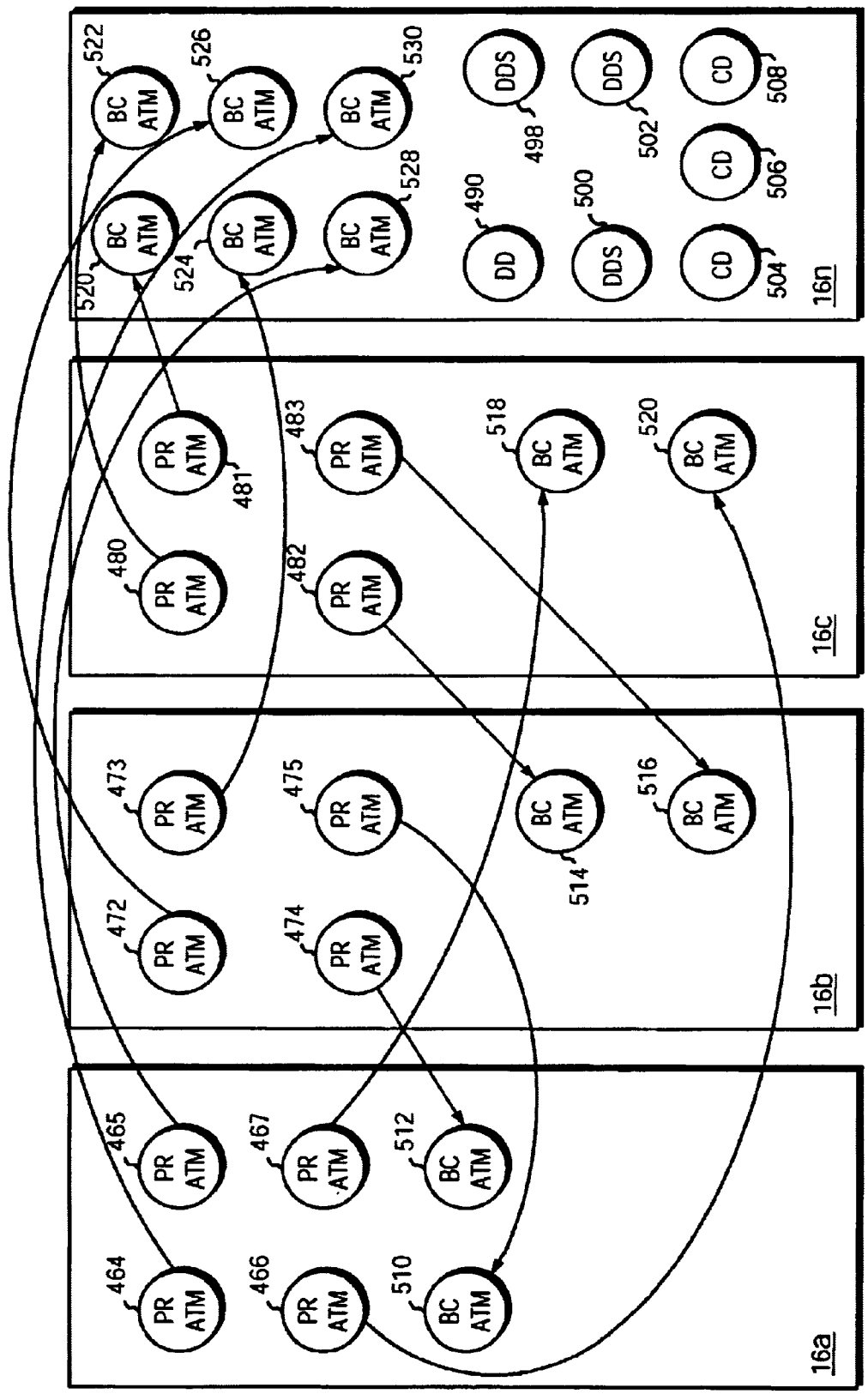

Balancing Resources:

Typically, multiple processes or applications are executed on each primary line card. Referring to FIG. 34a, in one embodiment, each primary line card 16a, 16b, 16c executes four applications. Due to physical limitations (e.g., memory space, processor power), each primary line card may not be capable of fully backing up four applications executing on another primary line card. The distributed redundancy architecture allows backup processes to be spread across multiple line cards, including any backup line cards, to more efficiently use all system resources.

For instance, primary line card 16a executes backup processes 510 and 512 corresponding to primary processes 474 and 475 executing on primary line card 16b. Primary line card 16b executes backup processes 514 and 516 corresponding to primary processes 482 and 483 executing on primary line card 16c, and primary line card 16c executes backup processes 518 and 520 corresponding to primary processes 466 and 467 executing on primary line card 16a. Backup line card 16n executes backup processes 520, 522, 524, 526, 528 and 530 corresponding to primary processes 464, 465, 472, 473, 480 and 481 executing on each of the primary line cards. Having each primary line card execute backup processes for only two primary processes executing on another primary line card reduces the primary line card resources required for backup. Since backup line card 16n is not executing primary processes, more resources are available for backup. Hence, backup line card 16n executes six backup processes corresponding to six primary processes executing on primary line cards. In addition, backup line card 16n is partially operational and is executing device driver processes 490 and storing device driver backup state 498, 500 and 502 corresponding to the device drivers on each of the primary elements and network connection data 504, 506 and 508 corresponding to the network connections established by each of the primary line cards.

Alternatively, each primary line card could)execute more or less than two backup processes. Similarly, each primary line card could execute no backup processes and backup line card 16n could execute all backup processes. Many alternatives are possible and backup processes need not be spread evenly across all primary line cards or all primary line cards and the backup line card.

Referring to FIG. 5b, if primary line card 16b experiences a failure, device drivers 490 on backup line card 16n begins using the device driver state, for example, DDS 498, corresponding to the device drivers on primary line card 16b and the network connection data, for example, CD 506, corresponding to the connections established by primary line card 16b to continue transferring network data. Simultaneously, backup line card 16n starts substitute primary processes 510' and 512' corresponding to the primary processes 474 and 475 on failed primary line card 16b. Substitute primary processes 510' and 512' retrieve active state from backup processes 510 and 512 executing on primary line card 16*a*. In addition, the slave SRM on backup line card 16*n* informs backup processes 526 and 524 corresponding to primary processes 472 and 473 on failed primary line card 16*b* that they are now primary processes. The new primary applications then synchronize with the rest of the system such that new network connections may be established and old network connections torn down. That is, backup line card 16*n* begins operating as if it were primary line card 16*b*.

Multiple Backup Elements:

In the examples given above, one backup line card is shown. Alternatively, multiple backup line cards may be provided in a computer system. In one embodiment, a computer system includes multiple different primary line cards. For example, some primary line cards may support the Asynchronous Transfer Mode (ATM) protocol while others support the Multi-Protocol Label Switching (MPLS) protocol, and one backup line card may be provided for the ATM primary line cards and another backup line card may be provided for the MPLS primary line cards. As another example, some primary line cards may support four ports while others support eight ports and one backup line card may be provided for the four port primaries and another backup line card may be provided for the eight port primaries. One or more backup line cards may be provided for each different type of primary line card.

Figure 35:
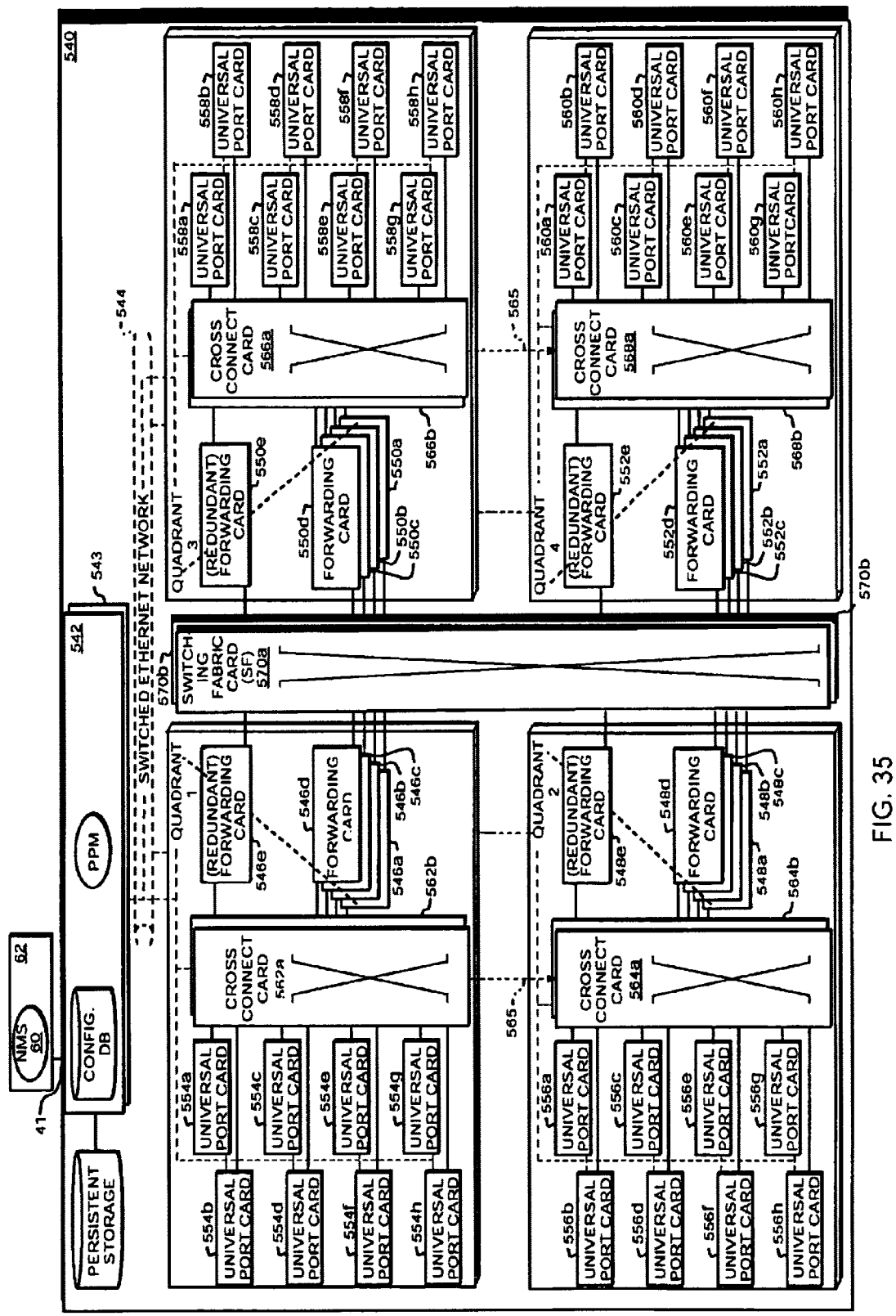
FIG. 35 is a block diagram of a network device.

Data Plane:

Referring to FIG. 35, a network device 540 includes a central processor 542, a redundant central processor 543 and a Fast Ethernet control bus 544 similar to central processors 12 and 13 and Ethernet 32 discussed above with respect to computer system 10. In addition, network device 540 includes forwarding cards (FC) 546*a*–546*e*, 548*a*–548*e*, 550*a*–550*e* and 552*a*–552*e* that are similar to line cards 16*a*–16*n* discussed above with respect to computer system 10. Network device 540 also includes (and computer system 10 may also include) universal port (UP) cards 554*a*–554*h*, 556*a*–556*h*, 558*a*–558*h*, and 560*a*–560*h*, cross-connection (XC) cards 562*a*–562*b*, 564*a*–564*b*, 566*a*–566*b*, and 568*a*–568*b*, and switch fabric (SF) cards 570*a*–570*b*. In one embodiment, network device 540 includes four quadrants where each quadrant includes five forwarding cards (e.g., 546*a*–546*e*), two cross connection cards (e.g., 562*a*–562*b*) and eight universal port cards (e.g., 554*a*–554*h*). Network device 540 is a distributed processing system. Each of the cards includes a processor and is connected to the Ethernet control bus. In addition, each of the cards are configured as described above with respect to line cards.

In one embodiment, the forwarding cards have a 1:4 hardware redundancy structure and distributed software redundancy as described above. For example, forwarding card 546*e* is the hardware backup for primary forwarding cards 546*a*–546*d* and each of the forwarding cards provide software backup. The cross-connection cards are 1:1 redundant. For example, cross-connection card 562*b* provides both hardware and software backup for cross-connection card 562*a*. Each port on the universal port cards may be 1:1, 1+1, 1:N redundant or not redundant at all depending upon the quality of service paid for by the customer associated with that port. For example, port cards 554*e*–554*h* may be the hardware and software backup cards for port cards 554*a*–554*d* in which case the port cards are 1:1 or 1+1 redundant. As another example, one or more ports on port card 554*a* may be backed-up by separate ports on one or more port cards (e.g., port cards 554*b* and 554*c*) such that each port is 1:1 or 1+1 redundant, one or more ports on port card 554*a* may not be backed-up at all (i.e., not redundant) and two or more ports on 554*a* may be backed-up by one port on another port card (e.g., port card 554*b*) such that those ports are 1:N redundant. Many redundancy structures are possible using the LID to PID Card table (LPCT) 100 (FIG. 9) and LID to PID Port table (LPPT) as described above.

Each port card includes one or more ports for connecting to external network connections. One type of network connection is an optical fiber carrying an OC-48 SONET stream, and as described above, an OC-48 SONET stream may include connections to one or more end points using one or more paths. A SONET fiber carries a time division multiplexed (TDM) byte stream of aggregated time slots (TS). A time slot has a bandwidth of 51 Mbps and is the fundamental unit of bandwidth for SONET. An STS-1 path has one time slot within the byte stream dedicated to it, while an STS-3c path (i.e., three concatenated STS-1s) has three time slots within the byte stream dedicated to it. The same or different protocols may be carried over different paths within the same TDM byte stream. In other words, ATM over SONET may be carried on an STS-1 path within a TDM byte stream that also includes IP over SONET on another STS-1 path or on an STS-3c path.

Through network management system 60 on workstation 62, after a user connects an external network connection to a port, the user may enable that port and one or more paths within that port (described below). Data received on a port card path is passed to the cross-connection card in the same quadrant as the port card, and the cross-connection card passes the path data to one of the five forwarding cards or eight port cards also within the same quadrant. The forwarding card determines whether the payload (e.g., packets, frames or cells) it is receiving includes user payload data or network control information. The forwarding card itself processes certain network control information and sends certain other network control information to the central processor over the Fast Ethernet control bus. The forwarding card also generates network control payloads and receives network control payloads from the central processor. The forwarding card sends any user data payloads from the cross-connection card or control information from itself or the central processor as path data to the switch fabric card. The switch fabric card then passes the path data to one of the forwarding cards in any quadrant, including the forwarding card that just sent the data to the switch fabric card. That forwarding card then sends the path data to the cross-connection card within its quadrant, which passes the path data to one of the port cards within its quadrant.

Figure 36:
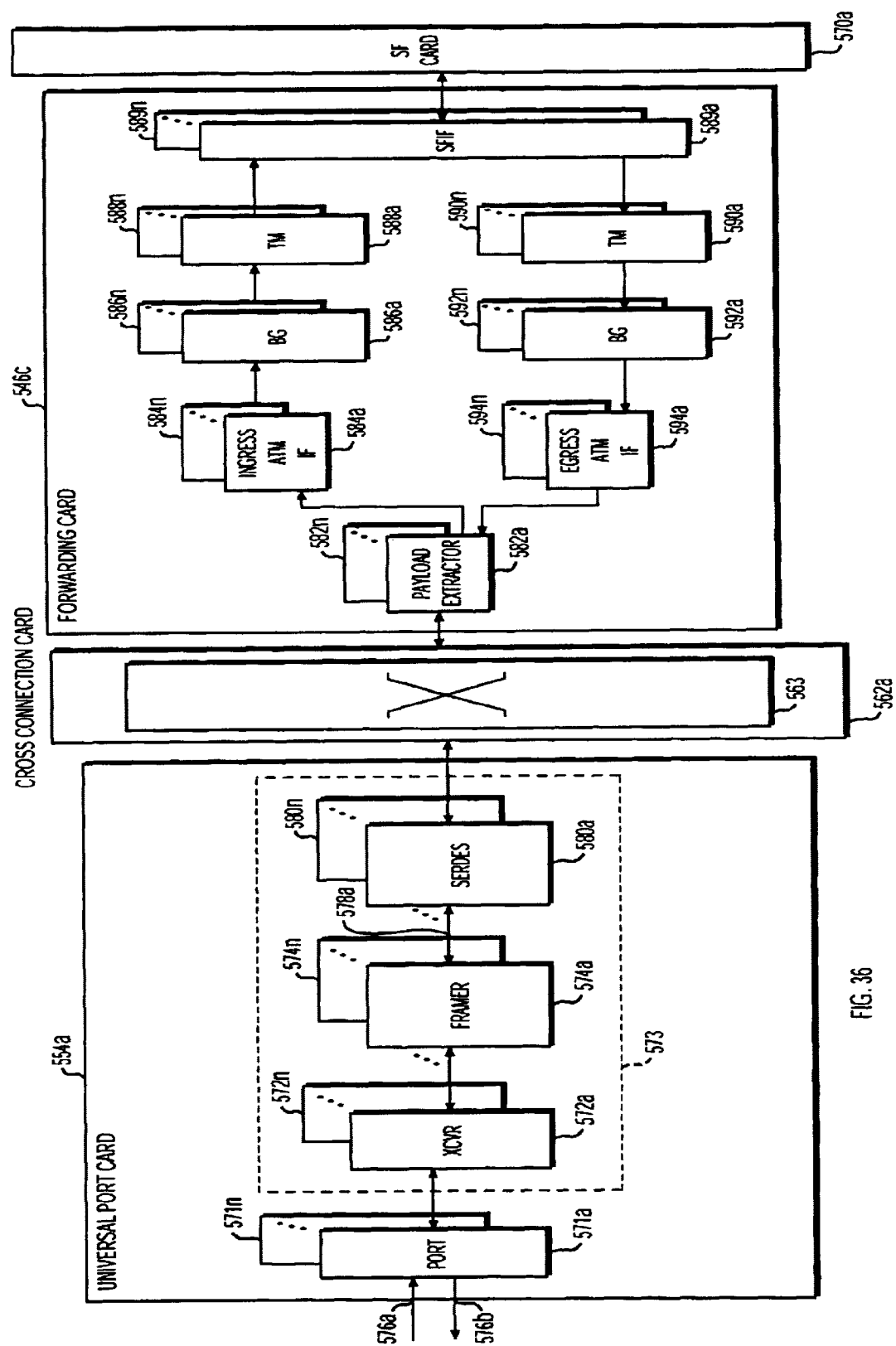
FIG. 36 is a block diagram of a portion of a data plane of a network device.

Referring to FIG. 36, in one embodiment, a universal port card 554*a* includes one or more ports 571*a*–571*n* connected to one or more transceivers 572*a*–572*n*. The user may connect an external network connection to each port. As one example, port 571*a* is connected to an ingress optical fiber 576*a* carrying an OC-48 SONET stream and an egress optical fiber 576*b* carrying an OC-48 SONET stream. Port 571*a* passes optical data from the SONET stream on fiber 576*a* to transceiver 572*a*. Transceiver 572*a* converts the optical data into electrical signals that it sends to a SONET framer 574*a*. The SONET framer 574*a* organizes the data it receives from the transceiver into SONET frames. SONET framer 574*a* sends data over a telecommunications bus 578*a* to a serializer-deserializer (SERDES) 580*a* that serializes the data into four serial lines with twelve STS-1 time slots each and transmits the four serial lines to cross-connect card 562*a*.

Each cross-connection card is a switch that provides connections between port cards and forwarding cards within its quadrant. Each cross-connection card is programmed to transfer each serial line on each port card within its quadrant to a forwarding card within its quadrant or to serial line on a port card, including the port card that transmitted the data to the cross-connection card. The programming of the cross-connect card is discussed in more detail below under Policy Based Provisioning.

Each forwarding card (e.g., forwarding card 546c) receives SONET frames over serial lines from the cross-connection card in its quadrant through a payload extractor chip (e.g., payload extractor 582a). In one embodiment, each forwarding card includes four payload extractor chips where each payload extractor chip represents a "slice" and each serial line input represents a forwarding card "port". Each payload extractor chip receives four serial line inputs, and since each serial line includes twelve STS-1 time slots, the payload extractor chips combine and separate time slots where necessary to output data paths with the appropriate number of time slots. Each STS-1 time slot may represent a separate data path, or multiple STS-1 time slots may need to be combined to form a data path. For example, an STS-3c path requires the combination of three STS-1 time slots to form a data path while an STS-48c path requires the combination of all forty-eight STS-1 time slots. Each path represents a separate network connection, for example, an ATM cell stream.

The payload extractor chip also strips off all vestigial SONET frame information and transfers the data path to an ingress interface chip. The ingress interface chip will be specific to the protocol of the data within the path. As one example, the data may be formatted in accordance with the ATM protocol, and the ingress interface chip is an ATM interface chip (e.g., ATM IF 584a). Other protocols can also be implemented including, for example, Internet Protocol (IP), Multi-Protocol Label Switching (MPLS) protocol or Frame Relay.

The ingress ATM IF chip performs many functions including determining connection information (e.g., virtual circuit or virtual path information) from the ATM header in the payload. The ATM IF chip uses the connection information as well as a forwarding table to perform an address translation from the external address to an internal address. The ATM IF chip passes ATM cells to an ingress bridge chip (e.g., BG 586a–586b) which serves as an interface to an ingress traffic management chip or chip set (e.g., TM 588a–588n).

The traffic management chips ensure that high priority traffic, for example, voice data, is passed to switch fabric card 570a faster than lower priority traffic, for example, e-mail data. The traffic management chips may buffer lower priority traffic while higher priority traffic is transmitted, and in times of traffic congestion, the traffic management chips will ensure that low priority traffic is dropped prior to any high priority traffic. The traffic management chips also perform an address translation to add the address of the traffic management chip to which the data is going to be sent by the switch fabric card. The address corresponds to internal virtual circuits set up between forwarding cards by the software and available to the traffic management chips in tables.

The traffic management chips send the modified ATM cells to switch fabric interface chips (SFIF) 589a–589n that then transfer the ATM cells to switch fabric card 570a. The switch fabric card uses the address provided by the ingress traffic management chips to pass ATM cells to the appropriate egress traffic management chips (e.g., TM 590a–590n) on the various forwarding cards. In one embodiment, the switch fabric card 570a is a 320 Gbps, non-blocking fabric. Since each forwarding card serves as both an ingress and egress, the switching fabric card provides a high degree of flexibility in directing the data between any of the forwarding cards, including the forwarding card that sent the data to the switch fabric card.

When a forwarding card (e.g., forwarding card 546c) receives ATM cells from switch fabric card 570a, the egress traffic management chips re-translate the address of each cell and pass the cells to egress bridge chips (e.g., BG 592a–592b). The bridge chips pass the cells to egress ATM interface chips (e.g., ATM IF 594a–594n), and the ATM interface chips add a re-translated address to the payload representing an ATM virtual circuit. The ATM interface chips then send the data to the payload extractor chips (e.g., payload extractor 582a–582n) that separate, where necessary, the path data into STS-1 time slots and combine twelve STS-1 time slots into four serial lines and send the serial lines back through the cross-connection card to the appropriate port card.

The port card SERDES chips receive the serial lines from the cross-connection card and de-serialize the data and send it to SONET framer chips 574a–574n. The Framers properly format the SONET overhead and send the data back through the transceivers that change the data from electrical to optical before sending it to the appropriate port and SONET fiber.

Although the port card ports above were described as connected to a SONET fiber carrying an OC-48 stream, other SONET fibers carrying other streams (e.g., OC-12) and other types of fibers and cables, for example, Ethernet, may be used instead. The transceivers are standard parts available from many companies, including Hewlett Packard Company and Sumitomo Corporation. The SONET framer may be a Spectra chip available from PMC-Sierra, Inc. in British Columbia. A Spectra 2488 has a maximum bandwidth of 2488 Mbps and may be coupled with a 1×OC48 transceiver coupled with a port connected to a SONET optical fiber carrying an OC-48 stream also having a maximum bandwidth of 2488 Mbps. Instead, four SONET optical fibers carrying OC-12 streams each having a maximum bandwidth of 622 Mbps may be connected to four 1×OC12 transceivers and coupled with one Spectra 2488. Alternatively, a Spectra 4×155 may be coupled with four OC-3 transceivers that are coupled with ports connected to four SONET fibers carrying OC-3 streams each having a maximum bandwidth of 155 Mbps. Many variables are possible.

The SERDES chip may be a Telecommunications Bus Serializer (TBS) chip from PMC-Sierra, and each cross-connection card may include a Time Switch Element (TSE) from PMC-Sierra, Inc. Similarly, the payload extractor chips may be MACH 2488 chips and the ATM interface chips may be ATLAS chips both of which are available from PMC-Sierra. Several chips are available from Extreme Packet Devices (EPD), a subsidiary of PMC-Sierra, including PP3 bridge chips and Data Path Element (DPE) traffic management chips. The switch fabric interface chips may include a Switch Fabric Interface (SIF) chip also from EPD. Other switch fabric interface chips are available from Abrizio, also a subsidiary of PMC-Sierra, including a data slice chip and an enhanced port processor (EPP) chip. The switch fabric card may also include chips from Abrizio, including a cross-bar chip and a scheduler chip.

Although the port cards, cross-connection cards and forwarding cards have been shown as separate cards, this is by way of example only and they may be combined into one or more different cards.

Multiple Redundancy Schemes:

Coupling universal port cards to forwarding cards through a cross-connection card provides flexibility in data transmission by allowing data to be transmitted from any path on any port to any port on any forwarding card. In addition, decoupling the universal port cards and the forwarding cards enables redundancy schemes (e.g., 1:1, 1+1, 1:N, no redundancy) to be set up separately for the forwarding cards and universal port cards. The same redundancy scheme may be set up for both or they may be different. As described above, the LID to PID card and port tables are used to setup the various redundancy schemes for the line cards (forwarding or universal port cards) and ports. Network devices often implement industry standard redundancy schemes, such as those defined by the Automatic Protection Switching (APS) standard. In network device 540 (FIG. 35), an APS standard redundancy scheme may be implemented for the universal port cards while another redundancy scheme is implemented for the forwarding cards.

Referring again to FIG. 35, further data transmission flexibility may be provided by connecting (i.e., connections 565) each cross-connection card 562a–562b, 564a–564b, 566a–566b and 568a–568b to each of the other cross-connection cards. Through connections 565, a cross-connection card (e.g., cross-connection card 562a) may transmit data between any port or any path on any port on a universal port card (e.g., universal port cards 554a–554h) in its quadrant to a cross-connection card (e.g., cross-connection card 568a) in any other quadrant, and that cross-connection card (e.g., cross-connection card 568a) may transmit the data to any forwarding card (e.g., forwarding cards 552a–552e) or universal port card (e.g., universal port cards 560a–560h) in its quadrant. Similarly, any cross-connection card may transmit data received from any forwarding card in its quadrant to any other cross-connection card and that cross-connection card may transmit the data to any universal port card port in its quadrant.

Alternatively, the cross-connection cards in each quadrant may be coupled only with cross-connection cards in one other quadrant. For example, cross-connection cards in quadrants 1 and 2 may be connected and cross-connection cards in quadrants 3 and 4 may be connected. Similarly, the cross-connection cards in each quadrant may be coupled with cross-connection cards in only two other quadrants, or only the cross-connection cards in one quadrant (e.g., quadrant 1) may be connected to cross-connection cards in another quadrant (e.g., quadrant 2) while the cross-connection cards in the other quadrants (e.g., quadrants 3 and 4) are not connected to other cross-connection cards or are connected only to cross-connection cards in one quadrant (e.g., quadrant 2). Many variations are possible. Although these connections do not provide the flexibility of having all cross-connection cards inter-connected, these connections require less routing resources and still provide some increase in the data transmission flexibility of the network device.

The additional flexibility provided by inter-connecting one or more cross-connection cards may be used to optimize the efficiency of network device 540. For instance, a redundant forwarding card in one quadrant may be used as a backup for primary forwarding cards in other quadrants thereby reducing the number of backup modules and increasing the network device's service density. Similarly, a redundant universal port card or a redundant port on a universal port card in one quadrant may be used as a backup for primary universal port cards or ports in other quadrants. As previously mentioned, each primary forwarding card may support a different protocol (e.g., ATM, MPLS, IP, Frame Relay). Similarly, each universal port card may support a different protocol (e.g., SONET, Ethernet). A backup or spare forwarding card or universal port card must support the same protocol as the primary card or cards. If forwarding or universal port cards in one quadrant support multiple protocols and the cross-connection cards are not interconnected, then each quadrant may need multiple backup forwarding and universal port cards (i.e., one for each protocol supported). If each of the quadrants includes forwarding and universal port cards that support different protocols then each quadrant may include multiple backup forwarding and universal port cards further decreasing the network device's service density.

By inter-connecting the cross-connection cards, a forwarding card in one quadrant may serve as a backup for primary forwarding cards in its own quadrant and in other quadrants. Similarly, a universal port card or port in one quadrant may serve as a backup for a primary universal port card or ports in its own quadrant and in other quadrants. For example, forwarding card 546e in quadrant 1 that supports a particular protocol (e.g., the ATM protocol) may serve as the backup forwarding card for primary forwarding cards supporting ATM in its own quadrant (e.g., forwarding cards 546a–546b) as well as for primary forwarding cards supporting ATM in quadrant 2 (e.g., forwarding cards 548b–548c) or all quadrants (e.g., forwarding card 550c in quadrant 3 and forwarding cards 552b–552d in quadrant 4). Similarly, forwarding card 548e in quadrant 2 that supports a different protocol (e.g., the MPLS protocol) may serve as the backup forwarding card for primary forwarding cards supporting MPLS in its own quadrant (e.g., forwarding cards 548a and 548d) as well as for primary forwarding cards supporting MPLS in quadrant 1 (e.g., forwarding card 546c) or all quadrants (e.g., forwarding card 550a in quadrant 3 and forwarding card 552a in quadrant 4). Even with this flexibility, to provide sufficient redundancy, multiple backup modules supporting the same protocol may be used, especially where a large number of primary modules support one protocol.

As previously discussed, each port on a universal port card may be connected to an external network connection, for example, an optical fiber transmitting data according to the SONET protocol. Each external network connection may provide multiple streams or paths and each stream or path may include data being transmitted according to a different protocol over SONET. For example, one path may include data being transmitted according to ATM over SONET while another path may include data being transmitted according to MPLS over SONET. The cross-connection cards may be programmed (as described below) to transmit protocol specific data (e.g., ATM, MPLS, IP, Frame Relay) from ports on universal port cards within their quadrants to forwarding cards within any quadrant that support the specific protocol. Because the traffic management chips on the forwarding cards provide protocol-independent addresses to be used by switch fabric cards 570a–570b, the switch fabric cards may transmit data between any of the forwarding cards regardless of the underlying protocol.

Alternatively, the network manager may dedicate each quadrant to a specific protocol by putting forwarding cards in each quadrant according to the protocol they support. Within each quadrant then, one forwarding card may be a backup card for each of the other forwarding cards (1:N, for network device 540, 1:4). Protocol specific data received from ports or paths on ports on universal port cards within any quadrant may then be forwarded by one or more cross-connection cards to forwarding cards within the protocol specific quadrant. For instance, quadrant 1 may include forwarding cards for processing data transmissions using the ATM protocol, quadrant 2 may include forwarding cards for processing data transmissions using the IP protocol, quadrant 3 may include forwarding cards for processing data transmissions using the MPLS protocol and quadrant 4 may be used for processing data transmissions using the Frame Relay protocol. ATM data received on a port path is then transmitted by one or more cross-connection cards to a forwarding card in quadrant 1, while MPLS data received on another path on that same port or on a path in another port is transmitted by one or more cross-connection cards to a forwarding card in quadrant 3.

Policy Based Provisioning:

Unlike the switch fabric card, the cross-connection card does not examine header information in a payload to determine where to send the data. Instead, the cross-connection card is programmed to transmit payloads, for example, SONET frames, between a particular serial line on a universal port card port and a particular serial line on a forwarding card port regardless of the information in the payload. As a result, one port card serial line and one forwarding card serial line will transmit data to each other through the cross-connection card until that programmed connection is changed.

In one embodiment, connections established through a path table and service endpoint table (SET) in a configuration database are passed to path managers on port cards and service endpoint managers (SEMS) on forwarding cards, respectively. The path managers and service endpoint managers then communicate with a cross-connect manager (CCM) on the cross-connection card in their quadrant to provide connection information. The CCM uses the connection information to generate a connection program table that is used by one or more components (e.g., a TSE chip 563) to program internal connection paths through the cross-connection card.

Typically, connections are fixed or are generated according to a predetermined map with a fixed set of rules. Unfortunately, a fixed set of rules may not provide flexibility for future network device changes or the different needs of different users/customers. Instead, within network device 540, each time a user wishes to enable/configure a path on a port on a universal port card, a Policy Provisioning Manager (PPM) 599 (FIG. 37) executing on central processor 542 selects the forwarding card port to which the port card port will be connected based on a configurable provisioning policy (PP) 603 in configuration database 42. The configurable provisioning policy may take into consideration many factors such as available system resources, balancing those resources and quality of service. Similar to other programs and files stored within the configuration database of computer system 10 described above, the provisioning policy may be modified while network device 540 is running to allow to policy to be changed according to a user's changing needs or changing network device system requirements.

Figure 37:
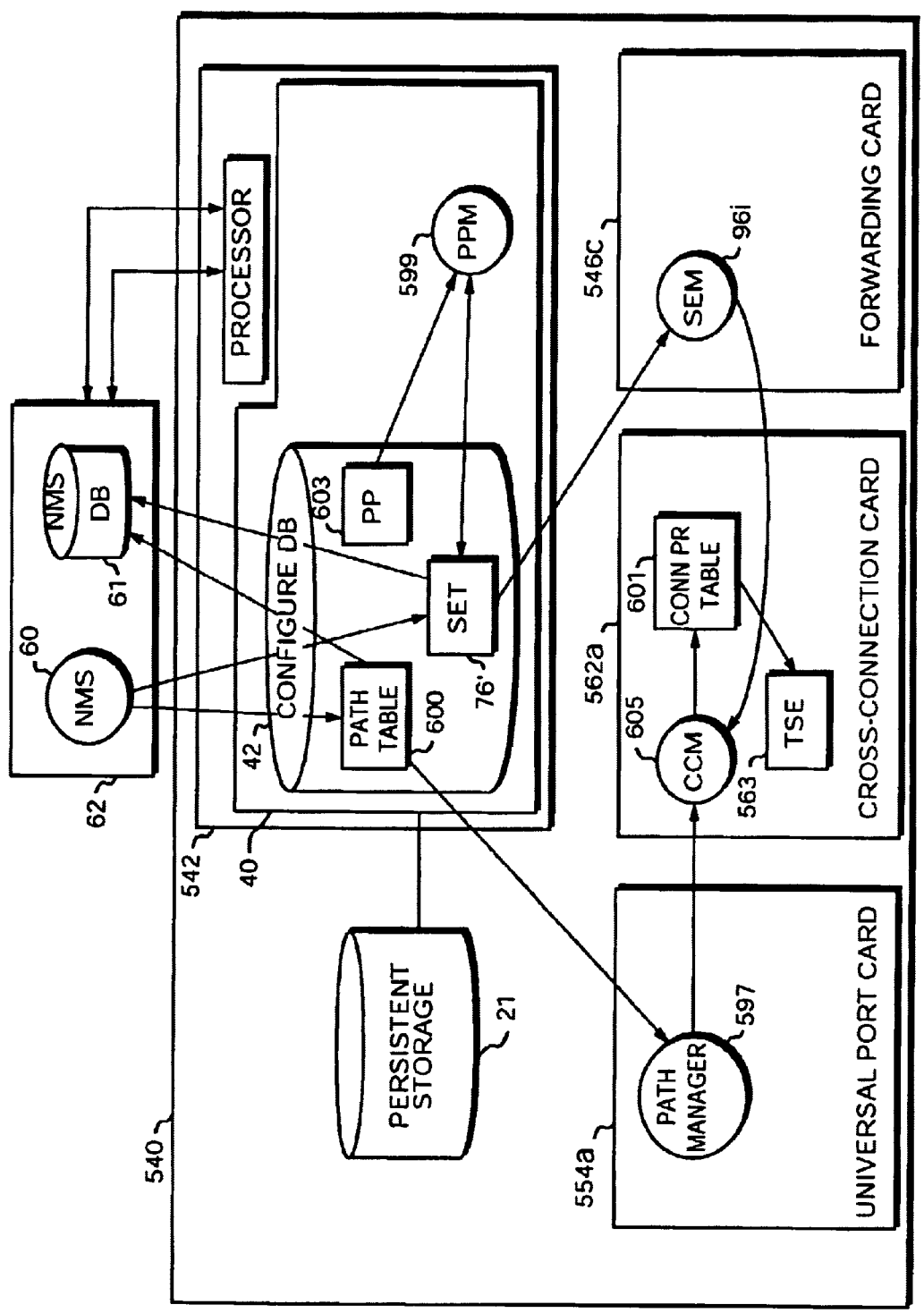
FIG. 37 is a block and flow diagram of a network device incorporating a policy provisioning manager.

When a user connects an external network connection to a particular port on a universal port card, the user notifies the NMS as to which port on which universal port card should be enabled, which path or paths should be enabled, and the number of time slots in each path. The user may also notify the NMS as to a new path and its number of time slots on an already enabled port that was not fully utilized or the user may notify the NMS of a modification to one or more paths on already enabled ports and the number of time slots required for that path or paths. With this information, the NMS fills in a Path table 600 (FIGS. 37 and 38) and partially fills in a Service Endpoint Table (SET) 76' (FIGS. 37 and 39).

When a record in the path table is filled in, the configuration database sends an active query notification to a path manager (e.g., path manager 597) executing on a universal port card (e.g., port card 554a) corresponding to the universal port card port LID (e.g., port 1231, FIG. 38) in the path table record (e.g., record 602).

Leaving some fields in the SET blank or assigning a particular value (e.g., zero), causes the configuration database to send an active query notification to Policy Provisioning Manager (PPM) 599. The PPM then determines—using provisioning policy 603—which forwarding card (FC) port or ports to assign to the new path or paths. For example, the PPM may first compare the new path's requirements, including its protocol (e.g., ATM over SONET), the number of time slots, the number of virtual circuits and virtual circuit scheduling restrictions, to the available forwarding card resources in the quadrant containing the universal port card port and path. The PPM also takes other factors into consideration including quality of service, for example, redundancy requirements or dedicated resource requirements, and balancing resource usage (i.e., load balancing) evenly within a quadrant.

As an example, a user connects SONET optical fiber 576a (FIG. 36) to port 571a on universal port card 554a and wants to enable a path with three time slots (i.e., STS-3c). The NMS assigns a path LID number (e.g., path LID 1666) and fills in a record (e.g., row 602) in Path Table 600 to include path LID 1666, a universal port card port LID (e.g., UP port LID 1231) previously assigned by the NMS and retrieved from the Logical to Physical Port Table, the first time slot (e.g., time slot 4) in the SONET stream corresponding with the path and the total number of time slots—in this example, 3—in the path. Other information may also be filled into Path Table 600.

The NMS also partially fills in a record (e.g., row 604) in SET 76' by filling in the quadrant number—in this example, 1—and the assigned path LID 1666 and by assigning a service endpoint number 878. The SET table also includes other fields, for example, a forwarding card LID field 606, a forwarding card slice 608 (i.e., port) and a forwarding card serial line 610. In one embodiment, the NMS fills in these fields with a particular value (e.g., zero), and in another embodiment, the NMS leaves these fields blank.

In either case, the particular value or a blank field causes the configuration database to send an active query notice to the PPM indicating a new path LID, quadrant number and service endpoint number. It is up to the PPM to decide which forwarding card, slice (i.e., payload extractor chip) and time slot (i.e., port) to assign to the new universal port card path. Once decided, the PPM fills in the SET Table fields. Since the user and NMS do not completely fill in the SET record, this may be referred to as a "self-completing configuration record." Self-completing configuration records reduce the administrative workload of provisioning a network.

The SET and path table records may be automatically copied to persistent storage 21 to insure that if network device 540 is re-booted these configuration records are maintained. If the network device shuts down prior to the PPM filling in the SET record fields and having those fields saved in persistent storage, when the network device is rebooted, the SET will still include blank fields or fields with particular values which will cause the configuration database to again send an active query to the PPM.

When the forwarding card LID (e.g., 1667) corresponding, for example, to forwarding card 546c, is filled into the SET table, the configuration database sends an active query notification to an SEM (e.g., SEM 96i) executing on that forwarding card and corresponding to the assigned slice and/or time slots. The active query notifies the SEM of the newly assigned service endpoint number (e.g., SE 878) and the forwarding card slice (e.g., payload extractor 582a) and time slots (i.e., 3 time slots from one of the serial line inputs to payload extractor 582a) dedicated to the new path.

Path manager 597 and SEM 96i both send connection information to a cross-connection manager 605 executing on cross-connection card 562a—the cross-connection card within their quadrant. The CCM uses the connection information to generate a connection program table 601 and uses this table to program internal connections through one or more components (e.g., a TSE chip 563) on the cross-connection card. Once programmed, cross-connection card 562a transmits data between new path LID 1666 on SONET fiber 576a connected to port 571a on universal port card 554a and the serial line input to payload extractor 582a on forwarding card 546c.

An active query notification is also sent to NMS database 61, and the NMS then displays the new system configuration to the user.

Alternatively, the user may choose which forwarding card to assign to the new path and notify the NMS. The NMS would then fill in the forwarding card LID in the SET, and the PPM would only determine which time slots and slice within the forwarding card to assign.

In the description above, when the PPM is notified of a new path, it compares the requirements of the new path to the available/unused forwarding card resources. If the necessary resources are not available, the PPM may signal an error. Alternatively, the PPM could move existing forwarding card resources to make the necessary forwarding card resources available for the new path. For example, if no payload extractor chip is completely available in the entire quadrant, one path requiring only one time slot is assigned to payload extractor chip 582a and a new path requires forty-eight time slots, the one path assigned to payload extractor chip 582a may be moved to another payload extractor chip, for example, payload extractor chip 582b that has at least one time slot available and the new path may be assigned all of the time slots on payload extractor chip 582a. Moving the existing path is accomplished by having the PPM modify an existing SET record. The new path is configured as described above.

Moving existing paths may result in some service disruption. To avoid this, the provisioning policy may include certain guidelines to hypothesize about future growth. For example, the policy may require small paths—for example, three or less time slots—to be assigned to payload extractor chips that already have some paths assigned instead of to completely unassigned payload extractor chips to provide a higher likelihood that forwarding card resources will be available for large paths—for example, sixteen or more time slots—added in the future.

Multi-layer Network Device in One Telco Rack:

Referring again to FIG. 35, in one embodiment, each universal port card includes four ports, each of which is capable of being connected to an OC-48 SONET fiber. Since an OC-48 SONET fiber is capable of transferring data at 2.5 Giga bits per second (Gbps), each universal port card is capable of transferring data at 10 Gbps(4×2.5=10). With eight port cards per quadrant, the cross-connection card must be capable of transferring data at 80 Gbps. Typically, however, the eight port cards will be 1:1 redundant and only transfer 40 Gbps. In one embodiment, each forwarding card is capable of transferring 10 Gbps, and with five forwarding cards per quadrant, the switch fabric cards must be capable of transferring data at 200 Gbps. Typically, however, the five forwarding cards will be 1:N redundant and only transfer data at 40 Gbps. With four quadrants and full redundancy (1:1 for port cards and 1:N for forwarding cards), network device 540 is capable of transferring data at 160 Gbps.

In other embodiments, each port card includes one port capable of being connected to an OC-192 SONET fiber. Since OC-192 SONET fibers are capable of transferring data at 10 Gpbs, a fully redundant network device 540 is again capable of transferring 160 Gpbs. In the embodiment employing one OC-192 connection per port card, each port card may include one hundred and ninety-two logical DS3 connections using sub-rate data multiplexing (SDRM). In addition, each port card may differ in its number and type of ports to provide more or less data through put. As previously mentioned, ports other than SONET ports may be provided, for example, Ethernet ports, Plesiochronous Digital Hierarchy ports (i.e., DS0, DS1, DS3, E0, E1, E3, J0, J1, J3) and Synchronous Digital Hierarchy (SDH) ports (i.e., STM1, STM4, STM16, STM64).

The universal port cards and cross-connect cards in each quadrant are in effect a physical layer switch, and the forwarding cards and switch fabric cards are effectively an upper layer switch. Prior systems have packaged these two switches into separate network devices. One reason for this is the large number of signals that need to be routed. Taken separately, each cross-connect card 562a–562b, 564a–564b, 566a–566b and 568a–568b is essentially a switch fabric or mesh allowing switching between any path on any universal port card to any serial input line on any forwarding card in its quadrant and each switch fabric card 570a–570b allows switching between any paths on any forwarding cards. Approximately six thousand, seven hundred and twenty etches are required to support a 200 Gpbs switch fabric, and about eight hundred and thirty-two etches are required to support an 80 Gpbs cross-connect. Combining such high capacity multi-layer switches into one network device in a single telco rack (seven feet by nineteen inches by 24 inches) has not been thought possible by those skilled in the art of telecommunications network devices.

To fit network device 540 into a single telco rack, dual mid-planes are used. All of the functional printed circuit boards connect to at least one of the mid-planes, and the switch fabric cards and certain control cards connect to both mid-planes thereby providing connections between the two mid-planes. In addition, to efficiently utilize routing resources, instead of providing a single cross-connection card, the cross-connection functionality is separated into four cross-connection cards—one for each quadrant—(as shown in FIG. 35). Further, routing through the lower mid-plane is improved by flipping the forwarding cards and cross-connection cards in the bottom half of the front of the chassis upside down to be the mirror image of the forwarding cards and cross-connection cards in the top of the front half of the chassis.

Figure 40:
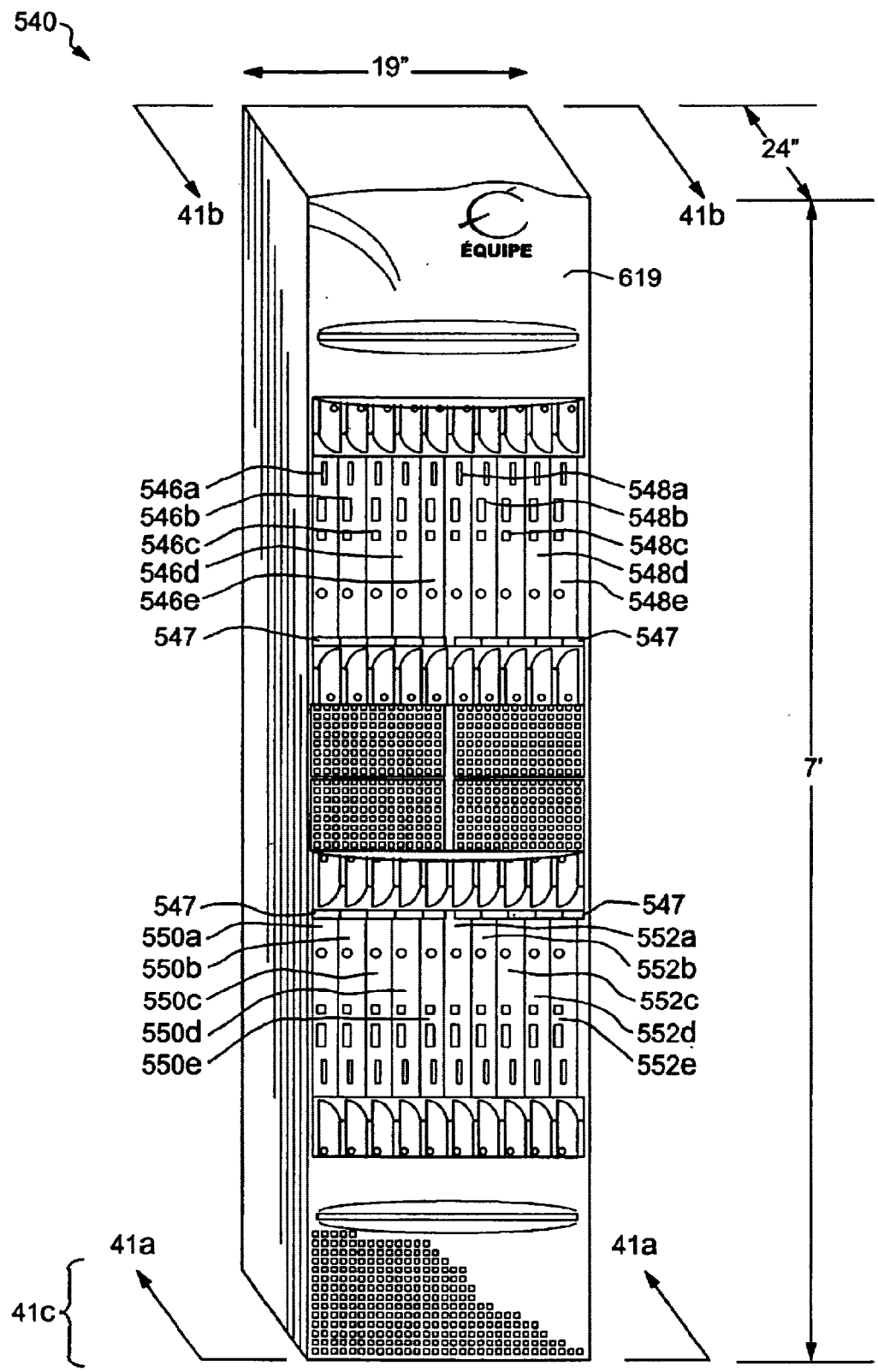
FIG. 40 is an isometric view of a network device.
Figure 41A:
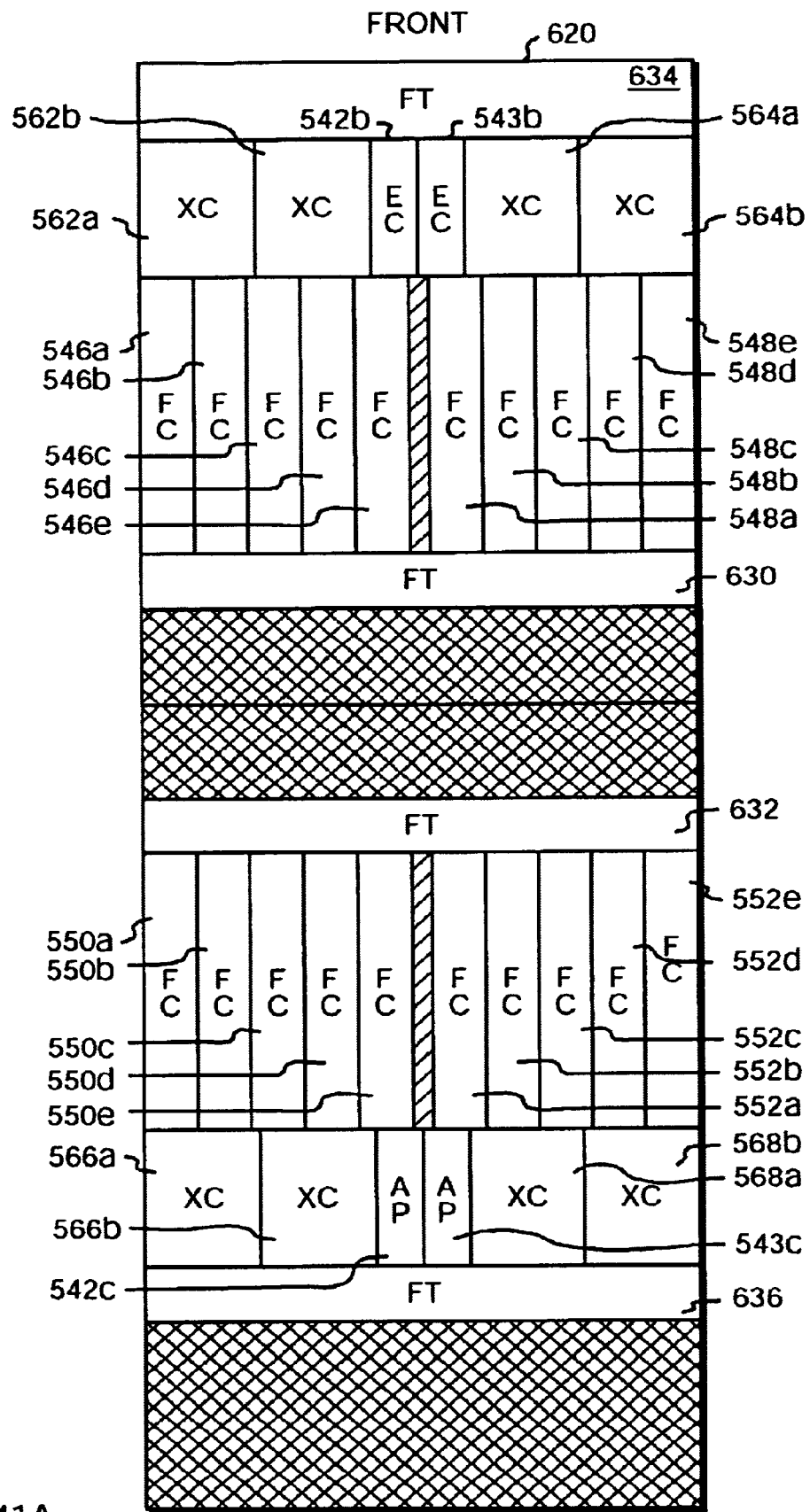
Figure 41B:
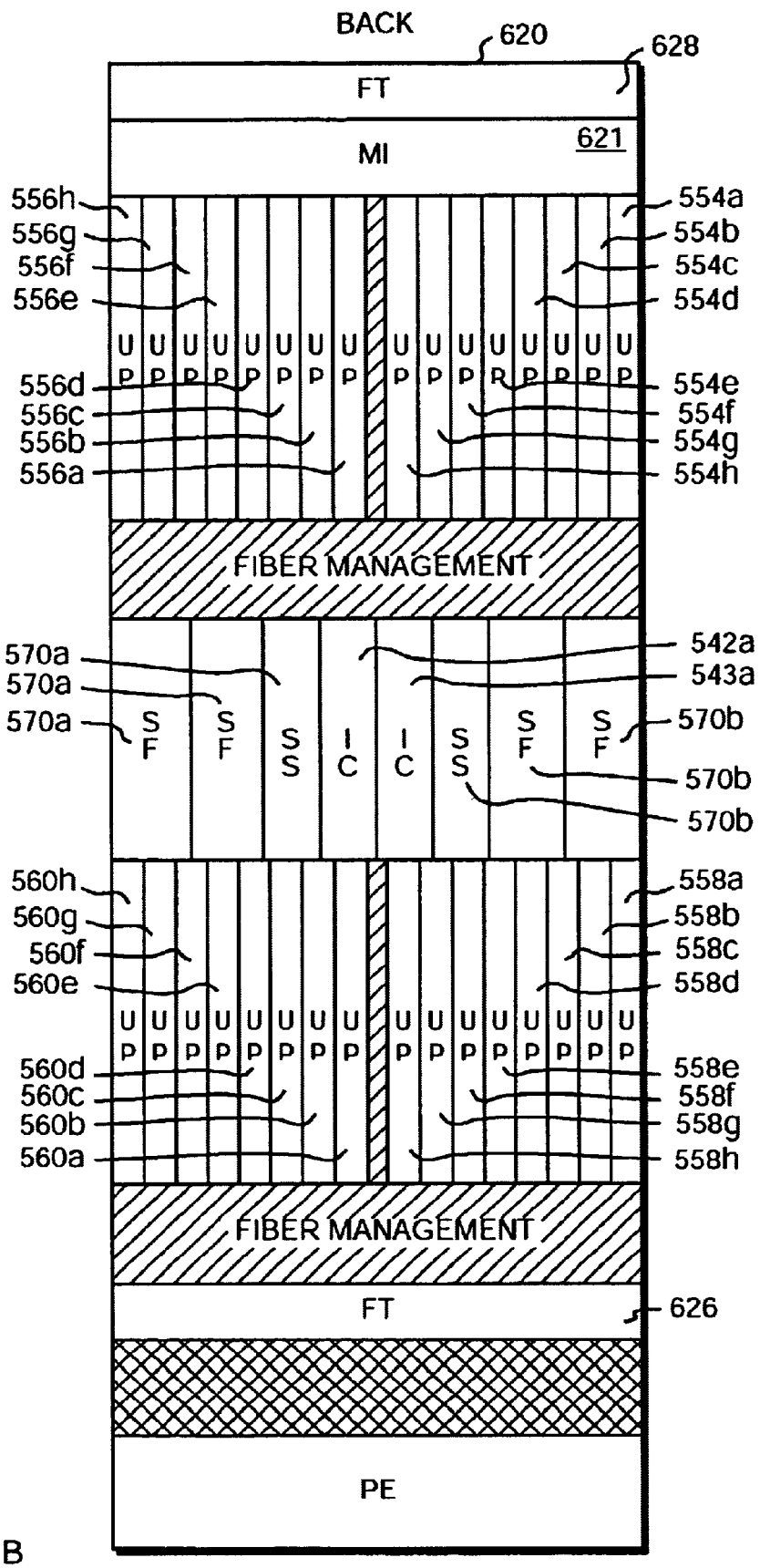

Referring to FIG. 40, a network device 540 is packaged in a box 619 conforming to the telco standard rack of seven feet in height, nineteen inches in width and 24 inches in depth. Referring also to FIGS. 41a–41c, a chassis 620 within box 619 provides support for forwarding cards 546a–546e, 548a–548e, 550a–550e and 552a–552e, universal port cards 554a–554h, 556a–556h, 558a–558h and 560a–560h, and cross-connection cards 562a–562b, 564a–564b, 566a–566b and 568a–568b. As is typical of telco network devices, the forwarding cards (FC) are located in the front portion of the chassis where network administrators may easily add and remove these cards from the box, and the universal port cards (UP) are located in the back portion of the chassis where external network attachments/cables may be easily connected.

The chassis also supports switch fabric cards 570a and 570b. As shown, each switch fabric card may include multiple switch fabric (SF) cards and a switch scheduler (SS) card. In addition, the chassis supports multiple central processor cards (542 and 543, FIG. 35). Instead of having a single central processor card, the external control functions and the internal control functions may be separated onto different cards as described in U.S. patent application Ser. No. 09/574,343, filed May 20, 2000 and entitled "Functional Separation of Internal and External Controls in Network Devices", which is hereby incorporated herein by reference. As shown, the chassis may support internal control (IC) processor cards 542a and 543a and external control (EC) processor cards 542b and 543b. Auxiliary processor (AP) cards 542c and 543c are provided for future expansion to allow more external control cards to be added, for example, to handle new upper layer protocols. In addition, a management interface (MI) card 621 for connecting to an external network management system (62, FIG. 35) is also provided.

The chassis also support two mid-plane printed circuit boards 622a and 622b (FIG. 41c) located toward the middle of chassis 620. Mid-plane 622a is located in the top portion of chassis 620 and is connected to quadrant 1 and 2 forwarding cards 546a–546e and 548a–548e, universal port cards 554a–554h and 556a–556h, and cross-connection cards 562a–562b and 564a–564b. Similarly, mid-plane 622b is located in the bottom portion of chassis 620 and is connected to quadrant 3 and 4 forwarding cards 550a–550e and 552a–552e, universal port cards 558a–558h and 560a–560h, and cross-connection cards 566a–566b and 568a–568b. Through each mid-plane, the cross-connection card in each quadrant may transfer network packets between any of the universal port cards in its quadrant and any of the forwarding cards in its quadrant. In addition, through mid-plane 622a the cross-connection cards in quadrants 1 and 2 may be connected to allow for transfer of network packets between any forwarding cards and port cards in quadrants 1 and 2, and through mid-plane 622b the cross-connection cards in quadrants 3 and 4 may be connected to allow for transfer of network packets between any forwarding cards and port cards in quadrants 3 and 4.

Mid-plane 622a is also connected to external control processor cards 542b and 543b and management interface card 621. Mid-plane 622b is also connected to auxiliary processor cards 542c and 543c.

Switch fabric cards 570a and 570b are located in the back portion of chassis 620, approximately mid-way between the top and bottom of the chassis. The switch fabric cards are connected to both mid-planes 622a and 622b to allow the switch fabric cards to transfer signals between any of the forwarding cards in any quadrant. In addition, the cross-connection cards in quadrants 1 and 2 may be connected through the mid-planes and switch fabric cards to the cross-connection cards in quadrants 3 and 4 to enable network packets to be transferred between any universal port card and any forwarding card.

To provide for better routing efficiency through mid-plane 622b, forwarding cards 550a–550e and 552a–552e and cross-connection cards 566a–566b and 568a–568b in quadrants 3 and 4, located in the bottom portion of the chassis, are flipped over when plugged into mid-plane 622b. This permits the switch fabric interface 589a–589n on each of the lower forwarding cards to be oriented nearest the switch fabric cards and the cross-connection interface 582a–582n on each of the lower forwarding cards to be oriented nearest the cross-connection cards in quadrants 3 and 4. This orientation avoids having to cross switch fabric and cross-connection etches in mid-plane 622b.

Typically, airflow for cooling a network device is brought in at the bottom of the device and released at the top of the device. For example, in the back portion of chassis 620, a fan tray (FT) 626 pulls air into the device from the bottom portion of the device and a fan tray 628 blows air out of the top portion of the device. When the lower forwarding cards are flipped over, the airflow/cooling pattern is reversed. To accommodate this reversal, fan trays 630 and 632 pull air into the middle portion of the device and then fan trays 634 and 636 pull the air upwards and downwards, respectively, and blow the heated air out the top and bottom of the device, respectively.

The quadrant 3 and 4 universal port cards 558a–558h and 560a–560h may also be flipped over to orient the port card's cross-connection interface nearest the cross-connection cards and more efficiently use the routing resources. It is preferred, however, not to flip the universal port cards for serviceability reasons and airflow issues. The network managers at the telco site expect network attachments/cables to be in a certain pattern. Reversing this pattern could cause confusion in a large telcolsite with many different types of network devices. Also, flipping the port cards will change the airflow and cooling pattern and require a similar airflow pattern and fan tray configuration as implemented in the front of the chassis. However, with the switch fabric and internal control processor cards in the middle of the back portion of the chassis, it may be impossible to implement this fan tray configuration.

Figure 42A:
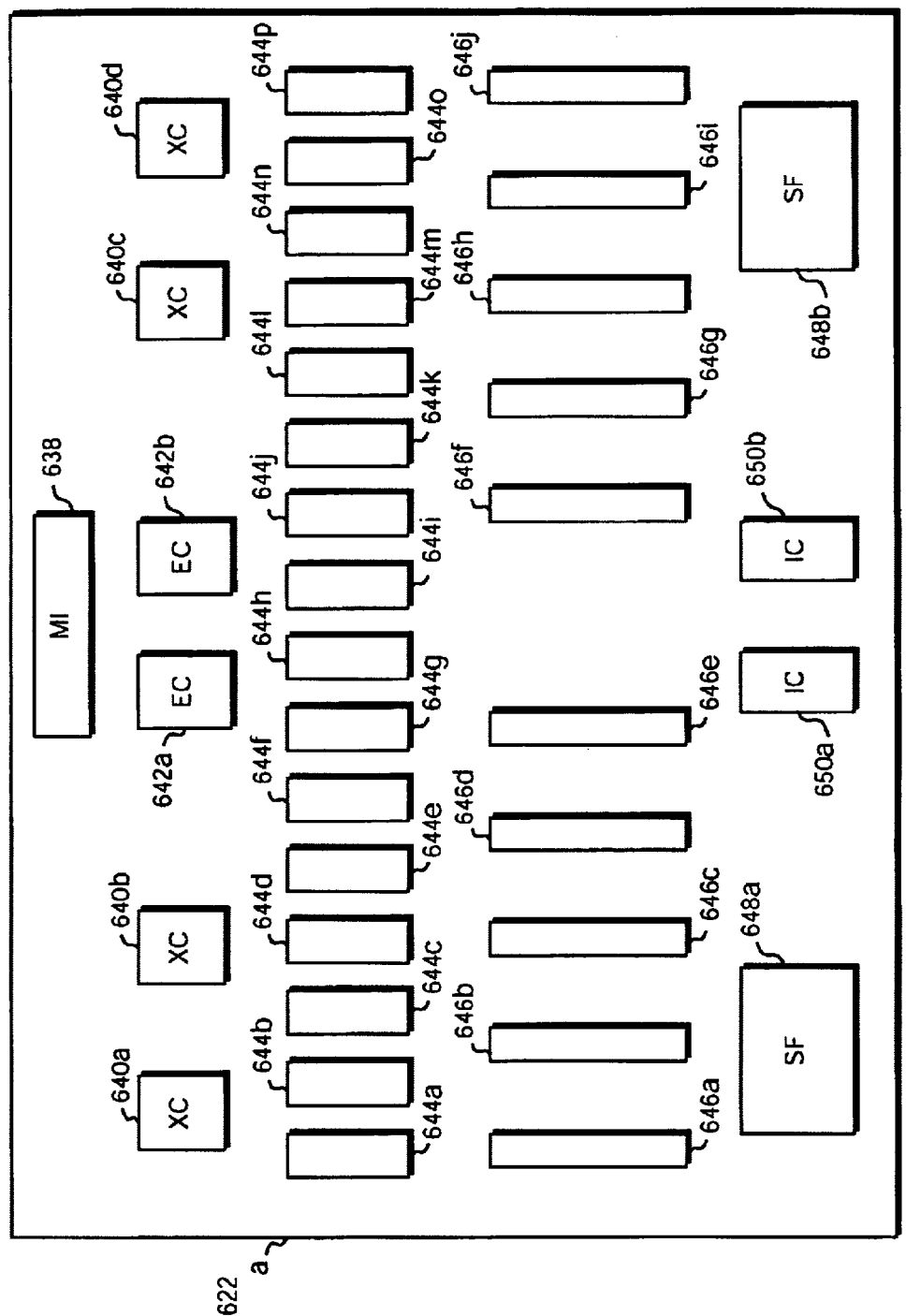
FIG. 42 is a block diagram of dual mid-planes.
Figure 42B:
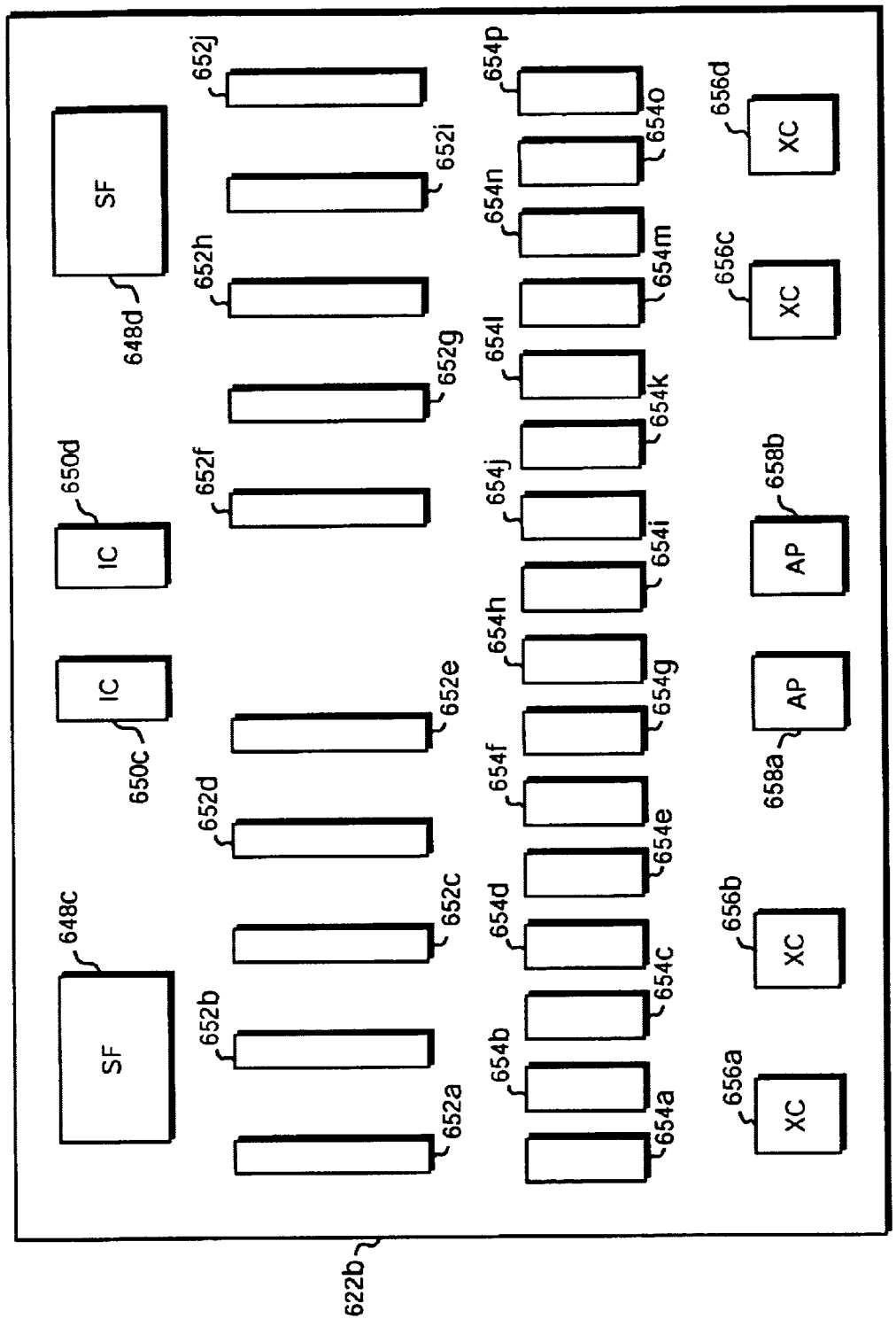

Referring to FIG. 42, mid-plane 622a includes connectors 638 mounted on the back side of the mid-plane ("back mounted") for the management interface card, connectors 640a–640d mounted on the front side of the mid-plane ("front mounted") for the quadrant 1 and 2 cross-connection cards, and front mounted connectors 642a–642b for the external control processor cards. Multiple connectors may be used for each card. Mid-plane 622a also includes back mounted connectors 644a–644p for the quadrant 1 and 2 universal port cards and front mounted connectors 646a–646j for the quadrant 1 and 2 forwarding cards.

Both mid-planes 622a and 622b include back mounted connectors 648a–648d for the switch fabric cards and back mounted connectors 650a–650d for the internal control cards. Mid-plane 622b further includes front, reverse mounted connectors 652a–652j for the quadrant 3 and 4 forwarding cards and back mounted connectors 654a–654p for the quadrant 3 and 4 universal port cards. In addition, mid-plane 622b also includes front, reverse mounted connectors 656a–656d for the quadrant 3 and 4 cross-connection cards and front mounted connectors 658a–658b for the auxiliary processor cards.

Combining both physical layer switch/router subsystems and upper layer switch/router subsystems in one network device allows for intelligent layer 1 switching. For example, the network device may be used to establish dynamic network connections on the layer 1 network to better utilize resources as service subscriptions change. In addition, network management is greatly simplified since the layer 1 and multiple upper layer networks may be managed by the same network management system and grooming fees are eliminated. Combining the physical layer switch/router and upper layer switch/routers into a network device that fits into one telco racks provides a less expensive network device and saves valuable telco site space.

Splitting the cross-connection function into four separate cards/quadrants enables the cross-connection routing requirements to be spread between the two mid-planes and alleviates the need to route cross-connection signals through the center of the device where the switch fabric is routed. In addition, segmenting the cross-connection function into multiple, independent subsystems allows customers/network managers to add functionality to network device 540 in pieces and in accordance with network service subscriptions. When a network device is first installed, a network manager may need only a few port cards and forwarding cards to service network customers. The modularity of network device 540 allows the network manager to purchase and install only one cross-connection card and the required number of port and forwarding cards. As the network becomes more subscribed, the network manager may add forwarding cards and port cards and eventually additional cross-connection cards. Since network devices are often very expensive, this modularity allows network managers to spread the cost of the system out in accordance with new service requests. The fees paid by customers to the network manager for the new services can then be applied to the cost of the new cards.

Although the embodiment describes the use of two mid-planes, it should be understood that more than two mid-planes may be used. Similarly, although the embodiment described flipped/reversed the forwarding cards and cross-connection cards in the lower half of the chassis, alternatively, the forwarding cards and cross-connection cards in the upper half of the chassis could be flipped.

Distributed Switch Fabric:

A network device having a distributed switch fabric locates a portion of the switch fabric functionality on cards separate from the remaining/central switch fabric functionality. For example, a portion of the switch fabric may be distributed on each forwarding card. There are a number of difficulties associated with distributing a portion of the switch fabric. For instance, distributing the switch fabric makes mid-plane/back-plane routing more difficult which further increases the difficulty of fitting the network device into one telco rack, switch fabric redundancy and timing are also made more difficult, valuable forwarding card space must be allocated for switch fabric components and the cost of each forwarding card is increased. However, since the entire switch fabric need not be included in a minimally configured network device, the cost of the minimal configuration is reduced allowing network service providers to more quickly recover the initial cost of the device. As new services are requested, additional functionality, including both forwarding cards (with additional switch fabric functionality) and universal port cards may be added to the network device to handle the new requests, and the fees for the new services may be applied to the cost of the additional functionality. Consequently, the cost of the network device more closely tracks the service fees received by network providers.

Referring again to FIG. 36, as described above, each forwarding card (e.g., 546c) includes traffic management chips (e.g., 588a–588n and 590a–590b) that ensure high priority network data/traffic (e.g., voice) is transferred faster than lower priority traffic (e.g., email). Each forwarding card also includes switch fabric interface (SFIF) chips (e.g., 589a–589n) that transfer network data between the traffic management chips and the switch fabric cards 570a–570b.

Figure 43:
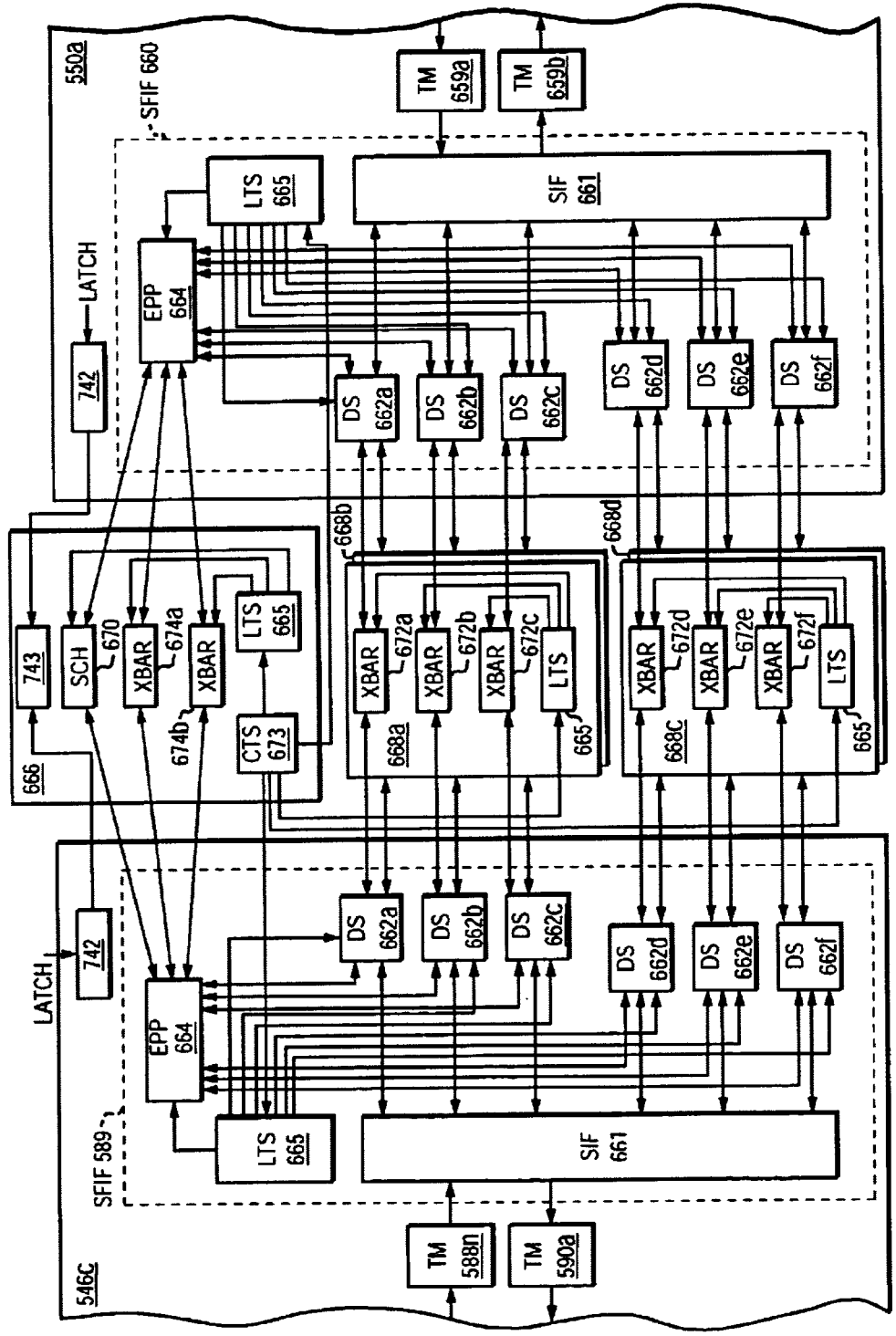
FIG. 43 is a block diagram of two distributed switch fabrics and a central switch fabric.

Referring also to FIG. 43, forwarding card 546c includes traffic management (TM) chips 588n and 590a and SFIF chips 589, and forwarding card 550a includes traffic management chips 659a and 659b and SFIF chips 660. (FIG. 43 includes only two forwarding cards for convenience but it is to be understood that many forwarding cards may be included in a network device as shown in FIG. 35.) SFIF chips 589 and 660 on both boards include a switch fabric interface (SIF) chip 661, data slice chips 662a–662f, an enhanced port processor (EPP) chip 664 and a local timing subsystem (LTS) 665. The SFIF chips receive data from ingress TM chips 588n and 659a and forward it to the switch fabric cards 570a–570b (FIG. 36). Similarly, the SFIF chips receive data from the switch fabric cards and forward it to the egress TM chips 590a and 659b.

Due to the size and complexity of the switch fabric, each switch fabric card 570a–570b may include multiple separate cards. In one embodiment, each switch fabric card 570a–570b includes a control card 666 and four data cards 668a–668d. A scheduler chip 670 on control card 666 works with the EPP chips on each of the forwarding cards to transfer network data between the data slice chips on the forwarding cards through cross-bar chips 672a–672l (only chips 672a–672f are shown) on data cards 668a–668d. Each of the data slice chips on each of the forwarding cards is connected to two of the cross-bar chips on the data cards. Switch fabric control card 666 and each of the switch fabric data cards 668a–668d also include a switch fabric local timing subsystem (LTS) 665, and a switch fabric central timing subsystem (CTS) 673 on control card 666 provides a start of segment (SOS) reference signal to each LTS 665 on each of the forwarding cards and switch fabric cards.

The traffic management chips perform upper level network traffic management within the network device while scheduler chip 670 on control card 666 performs the lower level data transfer between forwarding cards. The traffic management chips determine the priority of received network data and then forward the highest priority data to SIF chips 661. The traffic management chips include large buffers to store lower priority data until higher priority data has been transferred. The traffic management chips also store data in these buffers when the local EPP chip indicates that data transfers are to be stopped (i.e., back pressure). The scheduler chip works with the EPP chips to stop or hold-off data transfers when necessary, for example, when buffers on one forwarding card are close to full, the local EPP chip sends notice to each of the other EPP chips and the scheduler to hold off sending more data. Back pressure may be applied to all forwarding cards when a new switch fabric control card is added to the network device, as described below.

The traffic management chips forward network data in predefined segments to the SIF chips. In the case of ATM data, each ATM cell is a segment. In the case of IP and MPLS, where the amount of network data in each packet may vary, the data is first arranged into appropriately sized segments before being sent to the SIF chips. This may be accomplished through segmentation and reassembly (SAR) chips (not shown).

When the SIF chip receives a segment of network data, it organizes the data into a segment consistent with that expected by the switch fabric components, including any required header information. The SIF chip may be a PMC9324-TC chip available from Extreme Packet Devices (EPD), a subsidiary of PMC-Sierra, and the data slice chips may be PM9313-HC chips and the EPP chip may be a PM9315-HC chip available from Abrizio, also a subsidiary of PMC-Sierra. In this case, the SIF chip organizes each segment of data—including header information—in accordance with a line-card-to-switch two (LCS-2) protocol. The SIF chip then divides each data segment into twelve slices and sends two slices to each data slice chip 662a–662f. Two slices are sent because each data slice chip includes the functionality of two data slices.

When the data slice chips receive the LCS segments, the data slice chips strip off the header information, including both a destination address and quality of service (QoS) information, and send the header information to the local EPP chip. Alternatively, the SIF chip may send the header information directly to the EPP chip and send only data to the data slice chips. However, the manufacturer teaches that the SIF chip should be on the forwarding card and the EPP and data slice chips should be on a separate switch fabric card within the network device or in a separate box connected to the network device. Minimizing connections between cards is important, and where the EPP and data slice chips are not on the same card as the SIF chips, the header information is sent with the data by the SIF chip to reduce the required inter-card connections, and the data slice chips then strip off this information and send it to the EPP chip.

The EPP chips on all of the forwarding cards communicate and synchronize through cross-bar chips 674a–674b on control card 666. For each time interval (e.g., every 40 nanoseconds, "ns"), the EPP chips inform the scheduler chip as to which data segment they would like to send and the data slice chips send a segment of data previously set up by the scheduler and EPP chips. The EPP chips and the scheduler use the destination addresses to determine if there are any conflicts, for example, to determine if two or more forwarding cards are trying to send data to the same forwarding card. If a conflict is found, then the quality of service information is used to determine which forwarding card is trying to send the higher priority data. The highest priority data will likely be sent first. However, the scheduler chips include an algorithm that takes into account both the quality of service and a need to keep the switch fabric data cards 668a–668d full (maximum data through put). Where a conflict exists, the scheduler chip may inform the EPP chip to send a different, for example, lower priority, data segment from the data slice chip buffers or to send an empty data segment during the time interval.

Scheduler chip 670 informs each of the EPP chips which data segment is to be sent and received in each time interval. The EPP chips then inform their local data slice chips as to which data segments are to be sent in each interval and which data segments will be received in each interval. As previously mentioned, the forwarding cards each send and receive data. The data slice chips include small buffers to hold certain data (e.g., lower priority) while other data (e.g., higher priority) data is sent and small buffers to store received data. The data slice chips also include header information with each segment of data sent to the switch fabric cards. The header information is used by cross-bar chips 672a–672l (only cross-bar chips 672a–672f are shown) to switch the data to the correct forwarding card. The cross-bar chips may be PM9312-UC chips and the scheduler chip may be a PM9311-UC chip both of which are available from Abrizio.

Specifications for the EPD, Abrizio and PMC-Sierra chips may be found at www.pmc-sierra.com and are hereby incorporated herein by reference.

Distributed Switch Fabric Timing:

As previously mentioned, a segment of data (e.g., an ATM cell) is transferred between the data slice chips through the cross-bar chips every predetermined time interval. In one embodiment, this time interval is 40 ns and is established by a 25 MHz start of segment (SOS) signal. A higher frequency clock (e.g., 200 MHz, having a 5 ns time interval) is used by the data slice and cross-bar chips to transfer the bits of data within each segment such that all the bits of data in a segment are transferred within one 40 ns interval. More specifically, in one embodiment, each switch fabric component multiplies the 200 MHz clock signal by four to provide an 800 MHz internal clock signal allowing data to be transferred through the data slice and cross-bar components at 320 Gpbs. As a result, every 40 ns one segment of data (e.g., an ATM cell) is transferred. It is crucial that the EPP, scheduler, data slice and cross-bar chips transfer data according to the same/synchronized timing signals (e.g., clock and SOS), including both frequency and phase. Transferring data at different times, even slightly different times, may lead to data corruption, the wrong data being sent and/or a network device crash.

When distributed signals (e.g., reference SOS or clock signals) are used to synchronize actions across multiple components (e.g., the transmission of data through a switch fabric), any time-difference in events (e.g., clock pulse) on the distributed signals is generally termed "skew". Skew between distributed signals may result in the actions not occurring at the same time, and in the case of transmission of data through a switch fabric, skew can cause data corruption and other errors. Many variables can introduce skew into these signals. For example, components used to distribute the clock signal introduce skew, and etches on the mid-plane(s) introduce skew in proportion to the differences in their length (e.g., about 180 picoseconds per inch of etch in FR 4 printed circuit board material).

To minimize skew, one manufacturer teaches that all switch fabric components (i.e., scheduler, EPP, data slice and cross-bar chips) should be located on centralized switch fabric cards. That manufacturer also suggests distributing a central clock reference signal (e.g., 200 MHz) and a separate SOS signal (e.g., 25 MHz) to the switch fabric components on the switch fabric cards. Such a timing distribution scheme is difficult but possible where all the components are on one switch fabric card or on a limited number of switch fabric cards that are located near each other within the network device or in a separate box connected to the network device. Locating the boards near each other within the network device or in a separate box allows etch lengths on the mid-plane for the reference timing signals to be more easily matched and, thus, introduce less skew.

When the switch fabric components are distributed, maintaining a very tight skew becomes difficult due to the long lengths of etches required to reach some of the distributed cards and the routing difficulties that arise in trying to match the lengths of all the etches across the mid-plane(s). Because the clock signal needs to be distributed not only to the five switch fabric cards but also the forwarding cards (e.g., twenty), it becomes a significant routing problem to distribute all clocks to all loads with a fixed etch length.

Since timing is so critical to network device operation, typical network devices include redundant central timing subsystems. Certainly, the additional reference timing signals from a redundant central timing subsystem to each of the forwarding cards and switch fabric cards create further routing difficulties. In addition, if the two central timing subsystems (i.e., sources) are not synchronous with matched distribution etches, then all of the loads (i.e., LTSs) must use the same reference clock source to avoid introducing clock. skew—that is, unless both sources are synchronous and have matched distribution networks, the reference timing signals from both sources are likely to be skewed with respect to each other and, thus, all loads must use the same source/reference timing signal or be skewed with respect to each other.

A redundant, distributed switch fabric greatly increases the number of reference timing signals that must be routed over the mid-planes and yet remain accurately synchronized. In addition, since the timing signals must be sent to each card having a distributed switch fabric, the distance between the cards may vary greatly and, thus, make matching the lengths of timing signal etches on the mid-planes difficult. Further, the lengths of the etches for the reference timing signals from both the primary and redundant central timing subsystems must be matched. Compounding this with a fast clock signal and low skew component requirements makes distributing the timing very difficult.

The network device of the present invention, though difficult, includes two synchronized central timing subsystems (CTS) 673 (one is shown in FIG. 43). The etch lengths of reference timing signals from both central timing subsystems are matched to within, for example, +/−50 mils, and both central timing subsystems distribute only reference start of segment (SOS) signals to a local timing subsystem (LTS) 665 on each forwarding card and switch fabric card. The LTSs use the SOS reference signals to generate both an SOS signal and a higher frequency clock signal. This adds components and complexity to the LTSs, however, distributing only the SOS reference signals and not both the SOS and clock reference signals significantly reduces the number of reference timing signals that must be routed across the mid-plane on matched etch lengths.

Both electromagnetic radiation and electro-physical limitations prevent the 200 MHz reference clock signal from being widely distributed as required in a network device implementing distributed switch fabric subsystems. Such a fast reference clock increases the overall noise level generated by the network device and wide distribution may cause the network device to exceed Electro-Magnetic Interference (EMI) limitations. Clock errors are often measured as a percentage of the clock period, the smaller the clock period (5 ns for a 200 MHz clock), the larger the percentage of error a small skew can cause. For example, a skew of 3 ns represents a 60% error for a 5 ns clock period but only a 7.5% error for a 40 ns clock period. Higher frequency clock signals (e.g., 200 MHz) are susceptible to noise error and clock skew. The SOS signal has a larger clock period than the reference clock signal (40 ns versus 5 ns) and, thus, is less susceptible to noise error and reduces the percentage of error resulting from clock skew.

Figure 44:
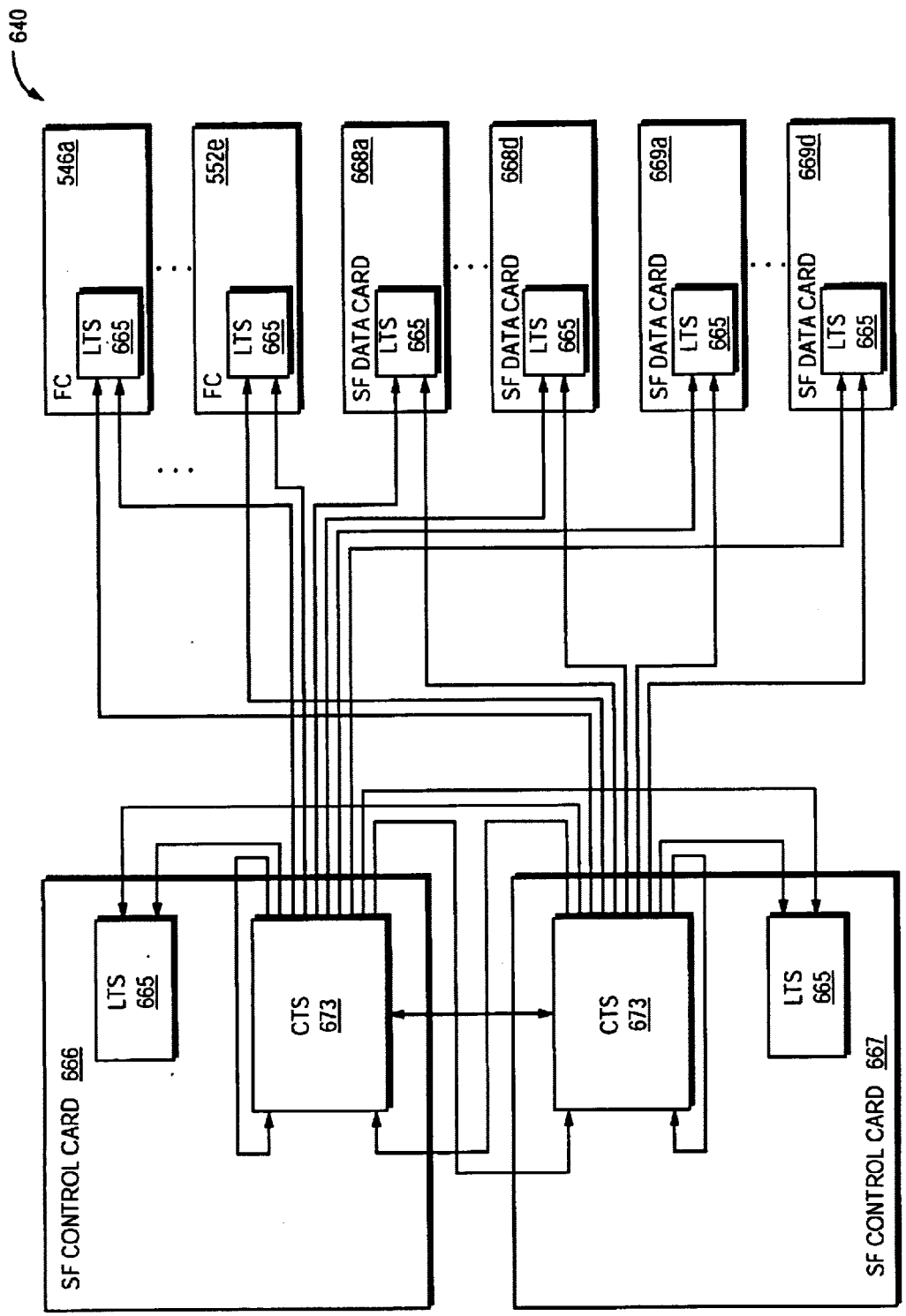
FIG. 44 is a block diagram of the interconnections between switch fabric central timing subsystems and switch fabric local timing subsystems.

As previously mentioned, the network device may include redundant switch fabric cards 570*a* and 570*b* (FIG. 36) and as described above with reference to FIG. 43, each switch fabric card 570*a* and 570*b* may include a control card and four or more data cards. Referring to FIG. 44, network device 540 may include switch fabric control card 666 (part of central switch fabric 570*a*) and redundant switch fabric control card 667 (part of redundant switch fabric 570*b*). Each control card 666 and 667 includes a central timing subsystem (CTS) 673. One CTS behaves as the master and the other CTS behaves as a slave and locks its output SOS signal to the master's output SOS signal. In one embodiment, upon power-up or system re-boot the CTS on the primary switch fabric control card 666 begins as the master and if a problem occurs with the CTS on the primary control card, then the CTS on redundant control card 667 takes over as master without requiring a switch over of the primary switch fabric control card.

Still referring to FIG. 44, each CTS sends a reference SOS signal to the LTSs on each forwarding card, switch fabric data cards 668*a*–668*d* and redundant switch fabric data cards 669*a*–669*b*. In addition, each CTS sends a reference SOS signal to the LTS on its own switch fabric control card and the LTS on the other switch fabric control card. As described in more detail below, each LTS then selects which reference SOS signal to use. Each CTS 673 also sends a reference SOS signal to the CTS on the other control card. The master CTS ignores the reference SOS signal from the slave CTS but the slave CTS locks its reference SOS signal to the reference SOS signal from the master, as described below. Locking the slave SOS signal to the master SOS signal synchronizes the slave signal to the master signal such that in the event that the master CTS fails and the LTSs switchover to the slave CTS reference SOS signal and the slave CTS becomes the master CTS, minimal phase change and no signal disruption is encountered between the master and slave reference SOS signals received by the LTSs.

Each of the CTS reference SOS signals sent to the LTSs and the other CTS over mid-plane etches are the same length (i.e., matched) to avoid introducing skew. The CTS may be on its own independent card or any other card in the system. Even when it is located on a switch fabric card, such as the control card, that has an LTS, the reference SOS signal is routed through the mid-plane with the same length etch as the other reference SOS signals to avoid adding skew.

Figure 45:
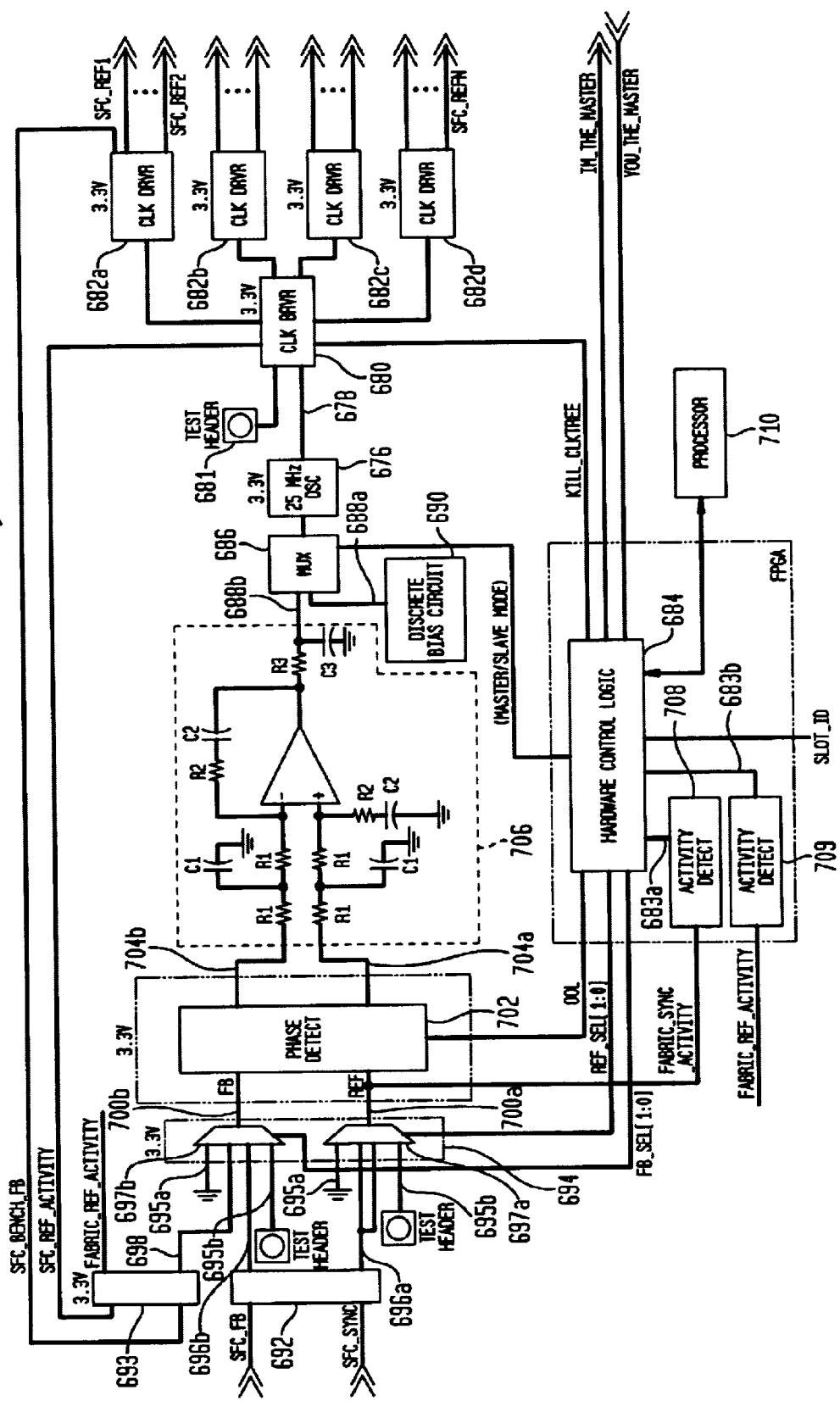
FIG. 45 is a block diagram of a switch fabric central timing subsystem.

Central Timing Subsystem (CTS):

Referring to FIG. 45, central timing subsystem (CTS) 673 includes a voltage controlled crystal oscillator (VCXO) 676 that generates a 25 MHz reference SOS signal 678. The SOS signal must be distributed to each of the local timing subsystems (LTSs) and is, thus, sent to a first level clock driver 680 and then to second level clock drivers 682*a*–682*d* that output reference SOS signals SFC_BENCH_FB and SFC_REF1-SFC_REFn. SFC_BENCH_FB is a local feedback signal returned to the input of the CTS. One of SFC_REF1-SFC_REFn is sent to each LTS, the other CTS, which receives it on SFC_SYNC, and one is routed over a mid-plane and returned as a feedback signal SFC_FB to the input of the CTS that generated it. Additional levels of clock drivers may be added as the number of necessary reference SOS signals increases.

VCXO 676 may be a VF596ES50 25 MHz LVPECL available from Conner-Winfield. Positive Emitter Coupled Logic (PECL) is preferred over Transistor-Transistor Logic (TTL) for its lower skew properties. In addition, though it requires two etches to transfer a single clock reference— significantly increasing routing resources—, differential PECL is preferred over PECL for its lower skew properties and high noise immunity. The clock drivers are also differential PECL and may be one to ten (1:10) MC100 LVEP111 clock drivers available from On Semiconductor. A test header 681 may be connected to clock driver 680 to allow a test clock to be input into the system.

Hardware control logic 684 determines (as described below) whether the CTS is the master or slave, and hardware control logic 684 is connected to a multiplexor (MUX) 686 to select between a predetermined voltage input (i.e., master voltage input) 688*a* and a slave VCXO voltage input 688*b*. When the CTS is the master, hardware control logic 684 selects predetermined voltage input 688*a* from discrete bias circuit 690 and slave VCXO voltage input 688*b* is ignored. The predetermined voltage input causes VCXO 676 to generate a constant 25 MHz SOS signal; that is, the VCXO operates as a simple oscillator.

Hardware control logic may be implemented in a field programmable gate array (FPGA) or a programmable logic device (PLD). MUX 686 may be a 74CBTLV3257 FET 2:1 MUX available from Texas Instruments.

When the CTS is the slave, hardware control logic 684 selects slave VCXO voltage signal 688b. This provides a variable voltage level to the VCXO that causes the output of the VCXO to track or follow the SOS reference signal from the master CTS. Referring still to FIG. 45, the CTS receives the SOS reference signal from the other CTS on SFC_SYNC. Since this is a differential PECL signal, it is first passed through a differential PECL to TTL translator 692 before being sent to MUX 697a within dual MUX 694. In addition, two feedback signals from the CTS itself are supplied as inputs to the CTS. The first feedback signal SFC_FB is an output signal (e.g., one of SFC_REF1-SFC_REFn) from the CTS itself which has been sent out to the mid-plane and routed back to the switch fabric control card. This is done so that the feedback signal used by the CTS experiences identical conditions as the reference SOS signal delivered to the LTSs and skew is minimized. The second feedback'signal SFC_BENCH_FB is a local signal from the output of the CTS, for example, clock driver 682a. SFC_BENCH_FB may be used as the feedback signal in a test mode, for example, when the control card is not plugged into the network device chassis and SFC_SB is unavailable. SFC_BENCH_FB and SFC_FB are also differential PECL signals and must be sent through translators 693 and 692, respectively, prior to being sent to MUX 697b within dual MUX 694. Hardware control logic 684 selects which inputs are used by MUX 694 by asserting signals on REF_SEL(1:0) and FB_SEL(1:0). In regular use, inputs 696a and 696b from translator 692 are selected. In test modes, grounded inputs 695a, test headers 695b or local feedback signal 698 from translator 693 may be selected. Also in regular use (and in test modes where a clock signal is not inserted through the test headers), copies of the selected input signals are provided on the test headers.

The reference output 700a and the feedback output 700b are then sent from the MUX to phase detector circuit 702. The phase detector compares the rising edge of the two input signals to determine the magnitude of any phase shift between the two. The phase detector then generates variable voltage pulses on outputs 704a and 704b representing the magnitude of the phase shift. The phase detector outputs are used by discrete logic circuit 706 to generate a voltage on a slave VCXO voltage signal 688b representing the magnitude of the phase shift. The voltage is used to speed up or slow down (i.e., change the phase of) the VCXO's output SOS signal to allow the output SOS signal to track any phase change in the reference SOS signal from the other CTS (i.e., SFC_SYNC). The discrete logic components implement filters that determine how quickly or slowly the VCXO's output will track the change in phase detected on the reference signal. The combination of the dual MUX, phase detector, discrete logic, VCXO, clock drivers and feedback signal forms a phase locked loop (PLL) circuit allowing the slave CTS to synchronize its reference SOS signal to the master CTS reference SOS signal. MUX 686 and discrete bias circuit 690 are not found in phase locked loop circuits.

The phase detector circuit may be implemented in a programmable logic device (PLD), for example a MACH4LV-32 available from Lattice/Vantis Semiconductor. Dual MUX 694 may be implemented in the same PLD. Preferably, however, dual MUX 694 is an SN74CBTLV3253 available from Texas Instruments, which has better skew properties than the PLD. The differential PECL to TTL translators may be MC100EPT23 dual differential PECL/TTL translators available from On Semiconductor.

Since quick, large phase shifts in the reference signal are likely to be the results of failures, the discrete logic implements a filter, and for any detected phase shift, only small incremental changes over time are made to the voltage provided on slave VCXO control signal 688b. As one example, if the reference signal from the master CTS dies, the slave VCXO control signal 688b only changes phase slowly over time meaning that the VCXO will continue to provide a reference SOS signal. If the reference signal from the master CTS is suddenly returned, the slave VCXO control signal 688b again only changes phase slowly over time to cause the VCXO signal to re-synchronize with the reference signal from the master CTS. This is a significant improvement over distributing a clock signal directly to components that use the signal because, in the case of direct clock distribution, if one clock signal dies (e.g., broken wire), then the components connected to that signal stop functioning causing the entire switch fabric to fail.

Slow phase changes on the reference SOS signals from both the master and slave CTSs are also important when LTSs switch over from using the master CTS reference signal to using the slave CTS reference signal. For example, if the reference SOS signal from the master CTS dies or other problems are detected (e.g., a clock driver dies), then the slave CTS switches over to become the master CTS and each of the LTSs begin using the slave CTS reference SOS signal. For these reasons, it is important that the slave CTS reference SOS signal be synchronized to the master reference signal but not quickly follow large phase shifts in the master reference signal.

It is not necessary for every LTS to use the reference SOS signals from the same CTS. In fact, some LTSs may use reference SOS signals from the master CTS while one or more are using the reference SOS signals from the slave CTS. In general, this is a transitional state prior to or during switch over. For example, one or more LTSs may start using the slave CTS's reference SOS signal prior to the slave CTS switching over to become the master CTS.

It is important for both the CTSs and the LTSs to monitor the activity of the reference SOS signals from both CTSs such that if there is a problem with one, the LTSs can begin using the other SOS signal immediately and/or the slave CTS can quickly become master. Reference output signal 700a–the translated reference SOS signal sent from the other CTS and received on SFC_SYNC—is sent to an activity detector circuit 708. The activity detector circuit determines whether the signal is active—that is, whether the signal is "stuck at" logic 1 or logic 0. If the signal is not active (i.e., stuck at logic 1 or 0), the activity detector sends a signal 683a to hardware control logic 684 indicating that the signal died. The hardware control logic may immediately select input 688a to MUX 686 to change the CTS from slave to master. The hardware control logic also sends an interrupt to a local processor 710 and software being executed by the processor detects the interrupt. Hardware control allows the CTS switch over to happen very quickly before a bad clock-signal can disrupt the system.

Similarly, an activity detector 709 monitors the output of the first level clock driver 680 regardless of whether the CTS is master or slave. Instead, the output of one the second level clock drivers could be monitored, however, a failure of a different second level clock will not be detected. SFC_REF_ACTIVITY is sent from the first level clock driver to differential PECL to TTL translator 693 and then as FABRIC_REF_ACTIVITY to activity detector 709. If activity detector 709 determines that the signal is not active, which may indicate that the clock driver, oscillator or other component(s) within the CTS have failed, then it sends a signal 683b to the hardware control logic. The hardware control logic asserts KILL_CLKTREE to stop the clock drivers from sending any signals and notifies a processor chip 710 on the switch fabric control card through an interrupt. Software being executed by the processor chip detects the interrupt. The slave CTS activity detector 708 detects a dead signal from the master CTS either before or after the hardware control logic sends KILL_CLKTREE and asserts error signal 683a to cause the hardware control logic to change the input selection on MUX 686 from 688b to 688a to become the master CTS. As described below, the LTSs also detect a dead signal from the master CTS either before or after the hardware control logic sends KILL_CLKTREE and switch over to the reference SOS signal from the slave CTS either before or after the slave CTS switches over to become the master.

As previously mentioned, in the past, a separate, common clock selection signal or etch was sent to each card in the network device to indicate whether to use the master or slave clock reference signal. This approach required significant routing resources, was under software control and resulted in every load selecting the same source at any given time.

Hence, if a clock signal problem was detected, components had to wait for the software to change the separate clock selection signal before beginning to use the standby clock signal and all components (i.e., loads) were always locked to the same source. This delay can cause data corruption errors, switch fabric failure and a network device crash.

Forcing a constant logic one or zero (i.e., "killing") clock signals from a failed source and having hardware in each LTS and CTS detect inactive (i.e., "dead" or stuck at logic one or zero) signals allows the hardware to quickly begin using the standby clock without the need for software intervention. In addition, if only one clock driver (e.g., 682b) dies in the master CTS, LTSs receiving output signals from that clock driver may immediately begin using signals from the slave CTS clock driver while the other LTSs continue to use the master CTS. Interrupts to the processor from each of the LTSs connected to the failed master CTS clock driver allow software, specifically the SRM, to detect the failure and initiate a switch over of the slave CTS to the master CTS. The software may also override the hardware control and force the LTSs to use the slave or master reference SOS signal.

When the slave CTS switches over to become the master CTS, the remaining switch fabric control card functionality (e.g., scheduler and cross-bar components) continue operating. The SRM (described above) decides—based on a failure policy—whether to switch over from the primary switch fabric control card to the secondary switch fabric control card. There may be instances where the CTS on the secondary switch fabric control card operates as the master CTS for a period of time before the network device switches over from the primary to the secondary switch fabric control card, or instead, there may be instances where the CTS on the secondary switch fabric control card operates as the master CTS for a period of time and then the software directs the hardware control logic on both switch fabric control cards to switch back such that the CTS on the primary switch fabric control card is again master. Many variations are possible since the CTS is independent of the remaining functionality on the switch fabric control card.

Phase detector 702 also includes an out of lock detector that determines whether the magnitude of change between the reference signal and the feedback signal is larger than a predetermined threshold. When the CTS is the slave, this circuit detects errors that may not be detected by activity detector 708 such as where the reference SOS signal from the master CTS is failing but is not dead. If the magnitude of the phase change exceeds the predetermined threshold, then the phase detector asserts an OOL signal to the hardware control logic. The hardware control logic may immediately change the input to MUX 686 to cause the slave CTS to switch over to Master CTS and send an interrupt to the processor, or the hardware control logic may only send the interrupt and wait for software (e.g., the SRM) to determine whether the slave CTS should switchover to master.

Master/Slave CTS Control:

In order to determine which CTS is the master and which is the slave, hardware control logic 684 implements a state machine. Each hardware control logic 684 sends an IM_THE_MASTER signal to the other hardware control logic 684 which is received as a YOU_THE_MASTER signal. If the IM_THE_MASTER signal—and, hence, the received YOU_THE_MASTER signal—is asserted then the CTS sending the signal is the master (and selects input 688a to MUX 686, FIG. 45) and the CTS receiving the signal is the slave (and selects input 688b to MUX 686). Each IM_THE_MASTER/YOU_THE_MASTER etch is pulled down to ground on the mid-planes such that if one of the CTSs is missing, the YOU_THE_MASTER signal received by the other CTS will be a logic 0 causing the receiving CTS to become the master. This situation may arise, for example, if a redundant control card including the CTS is not inserted within the network device. In addition, each of the hardware control logics receive SLOT_ID signals from pull-down/pull-up resistors on the chassis midplane indicating the slot in which the switch fabric control card is inserted.

Figure 46:
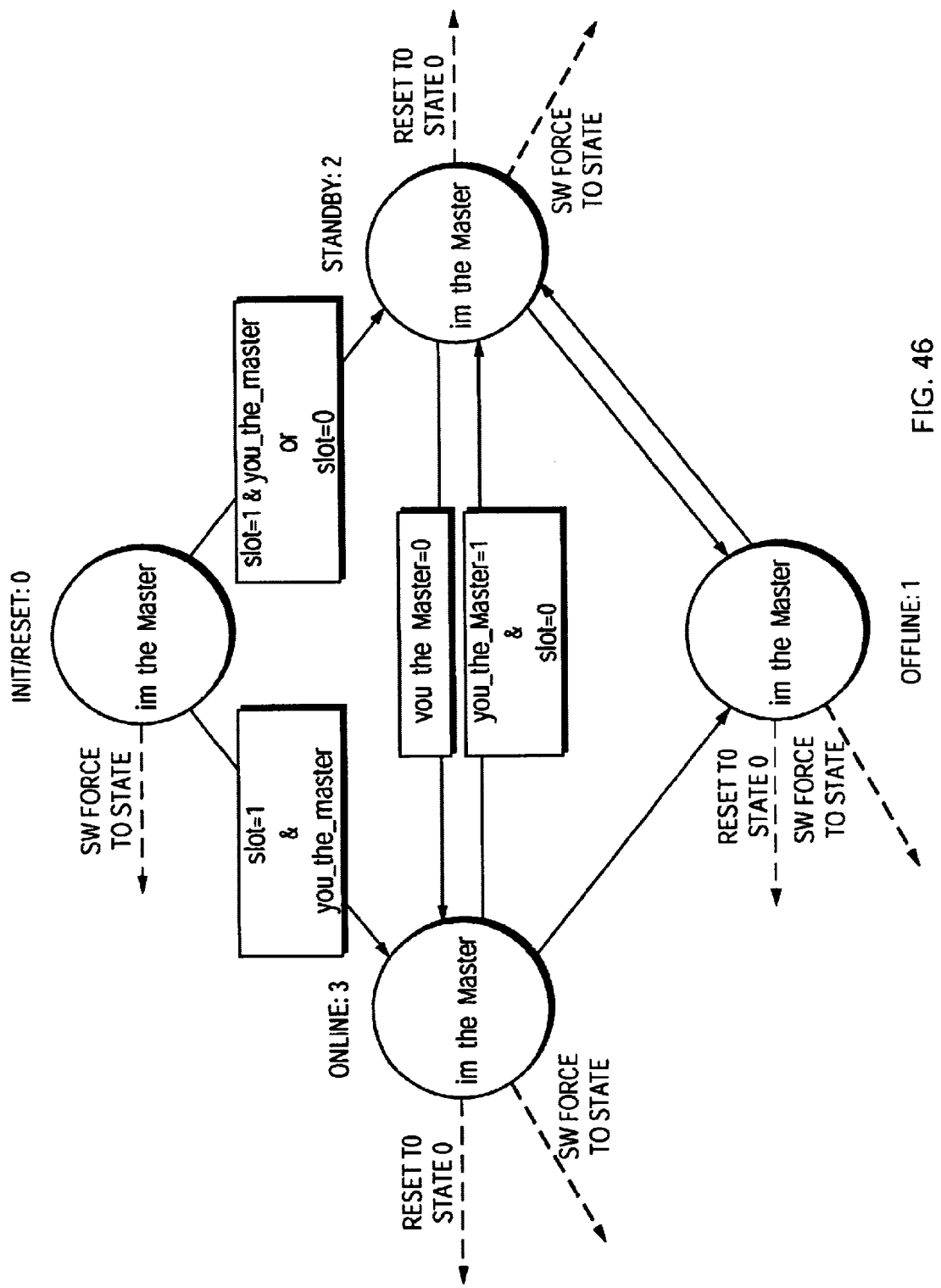
FIG. 46 is a state diagram of master/slave selection for switch fabric central timing subsystems.

Referring to FIG. 46, on power-up or after a system or card or CTS re-boot, the hardware control logic state machine begins in INIT/RESET state 0 and does not assert IM_THE_MASTER. If the SLOT_ID signals indicate that the control card is inserted in a preferred slot (e.g., slot one), and the received YOU_THE_MASTER is not asserted (i.e., 0), then the state machine transitions to the ONLINE state 3 and the hardware control logic asserts IM_THE_MASTER indicating its master status to the other CTS and selects input 688a to MUX 686. While in the ONLINE state 3, if a failure is detected or the software tells the hardware logic to switch over, the state machine enters the OFFLINE state 1 and the hardware control logic stops asserting IM_THE_MASTER and asserts KILL_CLKTREE. While in the OFFLINE state 1, the software may reset or re-boot the control card or just the CTS and force the state machine to enter the STANDBY state 2 as the slave CTS and the hardware control logic stops asserting KILL_CLKTREE and selects input 688b to MUX 686.

While in INIT/RESET state 0, if the SLOT_ID signals indicate that the control card is inserted in a non-preferred slot, (e.g., slot 0), then the state machine will enter STANDBY state 2 as the slave CTS and the hardware control logic will not assert IM_THE_MASTER and will select input 688b to MUX 686. While in NIT/RESET state 0, even if the SLOT_ID signals indicate that the control card is inserted in the preferred slot, if YOU_THE_MASTER is asserted, indicating that the other CTS is master, then the state machine transfers to STANDBY state 2. This situation may arise after a failure and recovery of the CTS in the preferred slot (e.g., reboot, reset or new control card).

While in the STANDBY state 2, if the YOU_THE_MASTER signal becomes zero (i.e., not asserted), indicating that the master CTS is no longer master, the state machine will transition to ONLINE state 3 and the hardware control logic will assert IM_THE_MASTER and select input 688*a* to MUX 686 to become master. While in ONLINE state 3, if the YOU_THE_MASTER signal is asserted and SLOT_ID indicating slot 0 the state machine enters STANDBY state 2 and the hardware control logic stops asserting IM_THE_MASTER and selects input 688*b* to MUX 686. This is the situation where the original master CTS is back up and running. The software may reset the state machine at any time or set the state machine to a particular state at any time.

Figure 47:
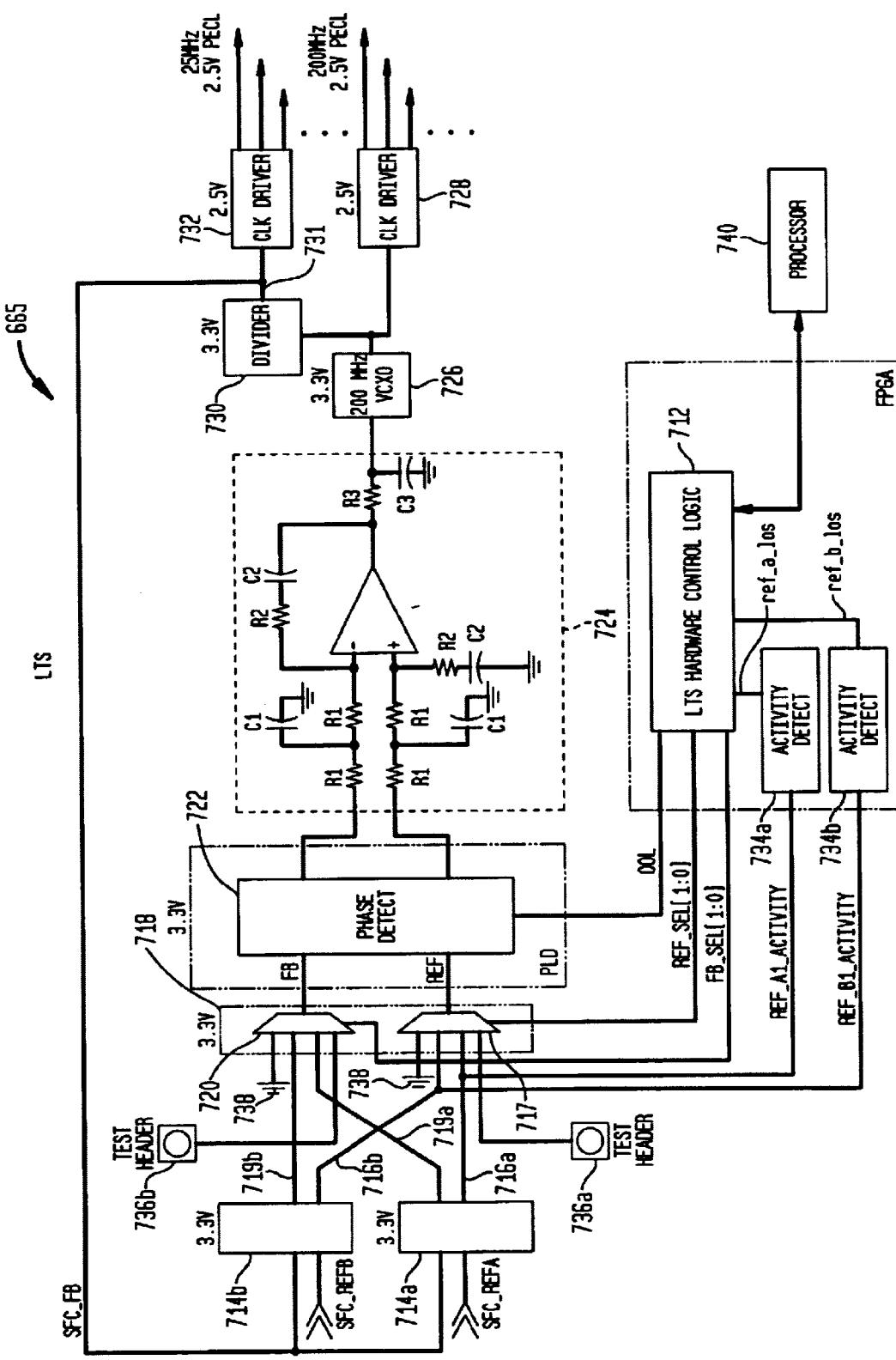
FIG. 47 is a block diagram of a switch fabric local timing subsystem.

Local Timing Subsystem:

Referring to FIG. 47, each local timing subsystem (LTS) 665 receives a reference SOS signal from each CTS on SFC_REFA and SFC_REFB. Since these are differential PECL signals, each is passed through a differential PECL to TTL translator 714*a* or 714*b*, respectively. A feedback signal SFC-FB is also passed from the LTS output to both translators 714*a* and 714*b*. The reference signal outputs 716*a* and 716*b* are fed into a first MUX 717 within dual MUX 718, and the feedback signal outputs 719*a* and 719*b* are fed into a second MUX 720 within dual MUX 718. LTS hardware control logic 712 controls selector inputs REF_SEL (1:0) and FB_SEL (1:0) to dual MUX 718. With regard to the feedback signals, the LTS hardware control logic selects the feedback signal that went through the same translator as the reference signal that is selected to minimize the effects of any skew introduced by the two translators.

A phase detector 722 receives the feedback (FB) and reference (REF) signals from the dual MUX and, as explained above, generates an output in accordance with the magnitude of any phase shift detected between the two signals. Discrete logic circuit 724 is used to filter the output of the phase detector, in a manner similar to discrete logic 706 in the CTS, and provide a signal to VCXO 726 representing a smaller change in phase than that output from the phase detector. Within the LTSs, the VCXO is a 200 MHz oscillator as opposed to the 25 MHz oscillator used in the CTS. The output of the VCXO is the reference switch fabric clock. It is sent to clock driver 728, which fans the signal out to each of the local switch fabric components. For example, on the forwarding cards, the LTSs supply the 200 MHz reference clock signal to the EPP and data slice chips, and on the switch fabric data cards, the LTSs supply the 200 MHz reference clock signal to the cross-bar chips. On the switch fabric control card, the LTSs supply the 200 MHz clock signal to the scheduler and cross-bar components.

The 200 MHz reference clock signal from the VCXO is also sent to a divider circuit or component 730 that divides the clock by eight to produce a 25 MHz reference SOS signal 731. This signal is sent to clock driver 732, which fans the signal out to each of the same local switch fabric components that the 200 MHz reference clock signal was sent to. In addition, reference SOS signal 731 is provided as feedback signal SFC_FB to translator 714*b*. The combination of the dual MUX, phase detector, discrete logic, VCXO, clock drivers and feedback signal forms a phase locked loop circuit allowing the 200 MHz and 25 MHz signals generated by the LTS to be synchronized to either of the reference SOS signals sent from the CTSs.

The divider component may be a SY100EL34L divider by Synergy Semiconductor Corporation.

Figure 48:
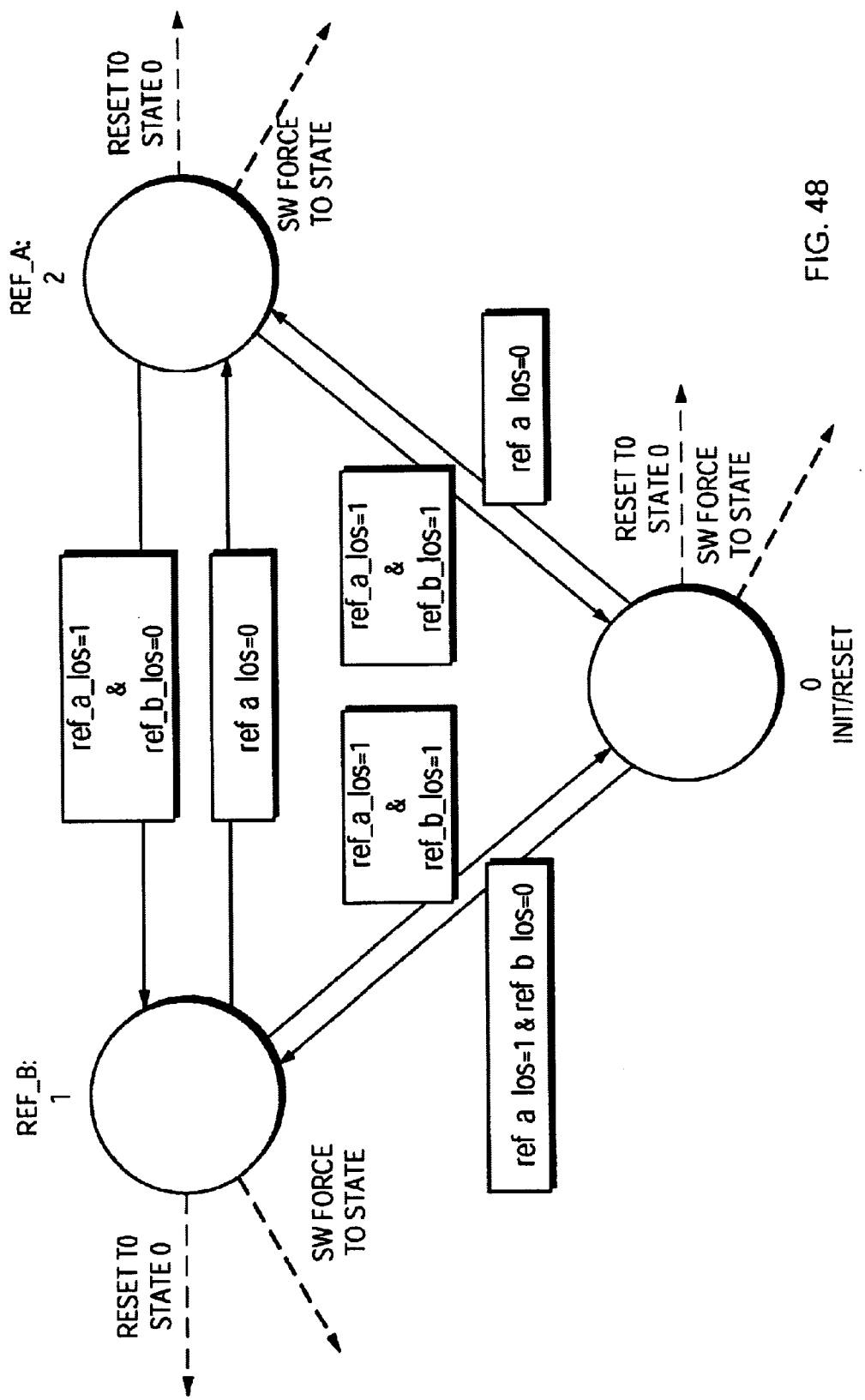
FIG. 48 is a state diagram of reference signal selection for switch fabric local timing subsystems.

Reference signals 716*a* and 716*b* from translator 714*a* are also sent to activity detectors 734*a* and 734*b*, respectively. These activity detectors perform the same function as the activity detectors in the CTSs and assert error signals ref_a_los or ref_b_los to the LTS hardware control logic if reference signal 716*a* or 716*b*, respectively, die. On power-up, reset or reboot, a state machine (FIG. 48) within the LTS hardware control logic starts in INIT/RESET state 0. Arbitrarily, reference signal 716*a* is the first signal considered. If activity detector 734*a* is not sending an error signal (i.e., ref_a_los is 0), indicating that that reference signal 716*a* is active, then the state machine changes to REF_A state 2 and sends signals over REF_SEL(1:0) to MUX 717 to select reference input 716*a* and sends signals over FB_SEL(1:0) to MUX 720 to select feedback input 719*a*. While in INIT/RESET state 0, if ref_a_los is asserted, indicating no signal on reference 716*a*, and if ref_b_los is not asserted, indicating there is a signal on reference 716*b*, then the state machine changes to REF_B state 1 and changes REF_SEL(1:0) and FB_SEL(1:0) to select reference input 716*b* and feedback signal 719*b*.

While in REF_A state 2, if activity detector 734*a* detects a loss of reference signal 716*a* and asserts ref_a_los, the state machine will change to REF_B state 1 and change REF_SEL(1:0) and FB_SEL(1:0) to select inputs 716*b* and 719*b*. Similarly, while in REF_B state 1, if activity detector 734*b* detects a loss of signal 716*b* and asserts ref_b_los, the state machine will change to REF_A state 2 and change REF_SEL(1:0) and FB_SEL(1:0) to select inputs 716*a* and 719*a*. While in either REF_A state 2 or REF_B state 1, if both ref_a_los and ref_b_los are asserted, indicating that both reference SOS signals have died, the state machine changes back to INIT/RESET state 0 and change REF_SEL (1:0) and FB_SEL(1:0) to select no inputs or test inputs 736*a* and 736*b* or ground 738. For a period of time, the LTS will continue to supply a clock and SOS signal to the switch fabric components even though it is receiving no input reference signal.

When ref_a_los and/or ref_b_los are asserted, the LTS hardware control logic notifies its local processor 740 through an interrupt. The SRM will decide, based on a failure policy, what actions to take, including whether to switch over from the master to slave CTS. Just as the phase detector in the CTS sends an out of lock signal to the CTS hardware control logic, the phase detector 722 also sends an out of lock signal OOL to the LTS hardware control logic if the magnitude of the phase difference between the reference and feedback signals exceeds a predetermined threshold. If the LTS hardware receives an asserted OOL signal, it notifies its local processor (e.g., 740) through an interrupt. The SRM will decide based on a failure policy what actions to take.

Shared LTS Hardware:

In the embodiment described above, the switch fabric data cards are four independent cards. More data cards may also be used. Alternatively, all of the cross-bar components may be located on one card. As another alternative, half of the cross-bar components may be located on two separate cards and yet attached to the same network device faceplate and share certain components. A network device faceplate is something the network manager can unlatch and pull on to remove cards from the network device. Attaching two switch fabric data cards to the same faceplate effectively makes them one board since they are added to and removed from the network device together. Since they are effectively one board, they may share certain hardware as if all components were on one physical card. In one embodiment, they may share a processor, hardware control logic and activity detectors. This means that these components will be on one of the physical cards but not on the other and signals connected to the two cards allow activity detectors on the one card to monitor the reference and feedback signals on the other card and allow the hardware control logic on the one card to select the inputs for dual MUX 718 on the other card.

Scheduler:

Another difficulty with distributing a portion of the switch fabric functionality involves the scheduler component on the switch fabric control cards. In current systems, the entire switch fabric, including all EPP chips, are always present in a network device. Registers in the scheduler component are configured on power-up or re-boot to indicate how many EPP chips are present in the current network device, and in one embodiment, the scheduler component detects an error and switches over to the redundant switch fabric control card when one of those EPP chips is no longer active. When the EPP chips are distributed to different cards (e.g., forwarding cards) within the network device, an EPP chip may be removed from a running network device when the printed circuit board on which it is located is removed. ("hot swap", "hot removal") from the network device. To prevent the scheduler chip from detecting the missing EPP chip as an error (e.g., a CRC error) and switching over to the redundant switch fabric control card, prior to the board being removed from the network device, software running on the switch fabric control card re-configures the scheduler chip to disable the scheduler chip's links to the EPP chip that is being removed.

To accomplish this, a latch 547 (FIG. 40) on the faceplate of each of the printed circuit boards on which a distributed switch fabric is located is connected to a circuit 742 (FIG. 44) also on the printed circuit board that detects when the latch is released. When the latch is released, indicating that the board is going to be removed from the network device, circuit 742 sends a signal to a circuit 743 on both switch fabric control cards indicating that the forwarding card is about to be removed. Circuit 743 sends an interrupt to the local processor (e.g., 710, FIG. 45) on the switch fabric control card. Software (e.g., slave SRM) being executed by the local processor detects the interrupt and sends a notice to software (e.g., master SRM) being executed by the processor (e.g., 24, FIG. 1) on the network device centralized processor card (e.g., 12, FIG. 1, 542 or 543, FIG. 35). The master SRM sends a notice to the slave SRMs being executed by the processors on the switch fabric data cards and forwarding cards to indicate the removal of the forwarding card. The redundant forwarding card switches over to become a replacement for the failed primary forwarding card. The master SRM also sends a notice to the slave SRM on the cross-connection card (e.g., 562–562*b*, 564*a*–564*b*, 566*a*–566*b*, 568*a*–565*b*, FIG. 35) to re-configure the connections between the port cards (e.g., 554*a*–554*h*, 556*a*–556*h*, 558*a*–558*h*, 560*a*–560*h*, FIG. 35) and the redundant forwarding card. The slave SRM on the switch fabric control card re-configures the registers in the scheduler component to disable the scheduler's links to the EPP chip on the forwarding card that's being removed from the network device. As a result, when the forwarding card is removed, the scheduler will not detect an error due to a missing EPP chip.

Similarly, when a forwarding card is added to the network device, circuit 742 detects the closing of the latch and sends an interrupt to the processor. The slave SRM running on the local processor sends a notice to the Master SRM which then sends a notice to the slave SRMs being executed by the processors on the switch fabric control cards, data cards and forwarding cards indicating the presence of the new forwarding card. The slave SRM on the cross-connection cards may be re-configured, and the slave SRM on the switch fabric control card may re-configure the scheduler chip to establish links with the new EPP chip to allow data to be transferred to the newly added forwarding card.

Switch Fabric Control Card Switch-over:

Typically, the primary and secondary scheduler components receive the same inputs, maintain the same state and generate the same outputs. The EPP chips are connected to both scheduler chips but only respond to the master/primary scheduler chip. If the primary scheduler or control card experiences a failure a switch over is initiated to allow the secondary scheduler to become the primary. When the failed switch fabric control card is re-booted, re-initialized or replaced, it and its scheduler component serve as the secondary switch fabric control card and scheduler component.

In currently available systems, a complex sequence of steps is required to "refresh" or synchronize the state of the newly added scheduler component to the primary scheduler component and for many of these steps, network data transfer through the switch fabric is temporarily stopped (i.e., back pressure). Stopping network data transfer may affect the availability of the network device. When the switch fabric is centralized and all on one board or only a few boards or in its own box, the refresh steps are quickly completed by one or only a few processors limiting the amount of time that network data is not transferred. When the switch fabric includes distributed switch fabric subsystems, the processors that are local to each of the distributed switch fabric subsystems must take part in the series of steps. This may increase the amount of time that data transfer is stopped further affecting network device availability.

To limit the amount of time that, data transfer is stopped in a network device including distributed switch fabric subsystems, the local processors each set up for a refresh while data is still being transferred. Communications between the processors take place over the Ethernet bus (e.g., 32, FIG. 1, 544, FIG. 35) to avoid interrupting network data transfer. When all processors have indicated (over the Ethernet bus) that they are ready for the refresh, the processor on the master switch fabric control card stops data transfer and sends a refresh command to each of the processors on the forwarding cards and switch fabric cards. Since all processors are waiting to complete the refresh, it is quickly completed. Each processor notifies the processor on the master switch fabric control card that the refresh is complete, and when all processors have completed the refresh, the master switch fabric control card re-starts the data transfer.

During the time in which the data transfer is stopped, the buffers in the traffic management chips are used to store data coming from external network devices. It is important that the data transfer be complete quickly to avoid overrunning the traffic management chip buffers.

Since the switch over of the switch fabric control cards is very complex and requires that data transfer be stopped, even if briefly, it is important that the CTSs on each switch fabric control card be independent of the switch fabric functionality. This independence allows the master CTS to switch over to the slave CTS quickly and without interrupting the switch fabric functionality or data transmission.

As described above, locating the EPP chips and data slice chips of the switch fabric subsystem on the forwarding cards is difficult and against the teachings of a manufacturer of these components. However, locating these components on the forwarding cards allows the base network device—that is, the minimal configuration—to include only a necessary portion of the switching fabric reducing the cost of a minimally configured network device. As additional forwarding cards are added to the minimal configuration—to track an increase in customer demand—additional portions of the switch fabric are simultaneously added since a portion of the switch fabric is located on each forwarding card. Consequently, switch fabric growth tracks the growth in customer demands and fees. Also, typical network devices include 1:1 redundant switch fabric subsystems. However, as previously mentioned, the forwarding cards may be 1:N redundant and, thus, the distributed switch fabric on each forwarding card is also 1:N redundant further reducing the cost of a minimally configured network device.

External Network Data Transfer Timing:

In addition to internal switch fabric timing, a network device must also include external network data transfer timing to allow the network device to transfer network data synchronously with other network devices. Generally, multiple network devices in the same service provider site synchronize themselves to Building Integrated Timing Supply (BITS) lines provided by a network service provider. BITS lines are typically from highly accurate stratum two clock sources. In the United States, standard T1 BITS lines (2.048 MHz) are provided, and in Europe, standard E1 BITS lines (1.544 MHz) are provided. Typically, a network service provider provides two T1 lines or two E1 lines from different sources for redundancy. Alternatively, if there are no BITS lines or when network devices in different sites want to synchronously transfer data, one network device may extract a timing signal received on a port connected to the other network device and use that timing signal to synchronize its data transfers with the other network device.

Figure 49:
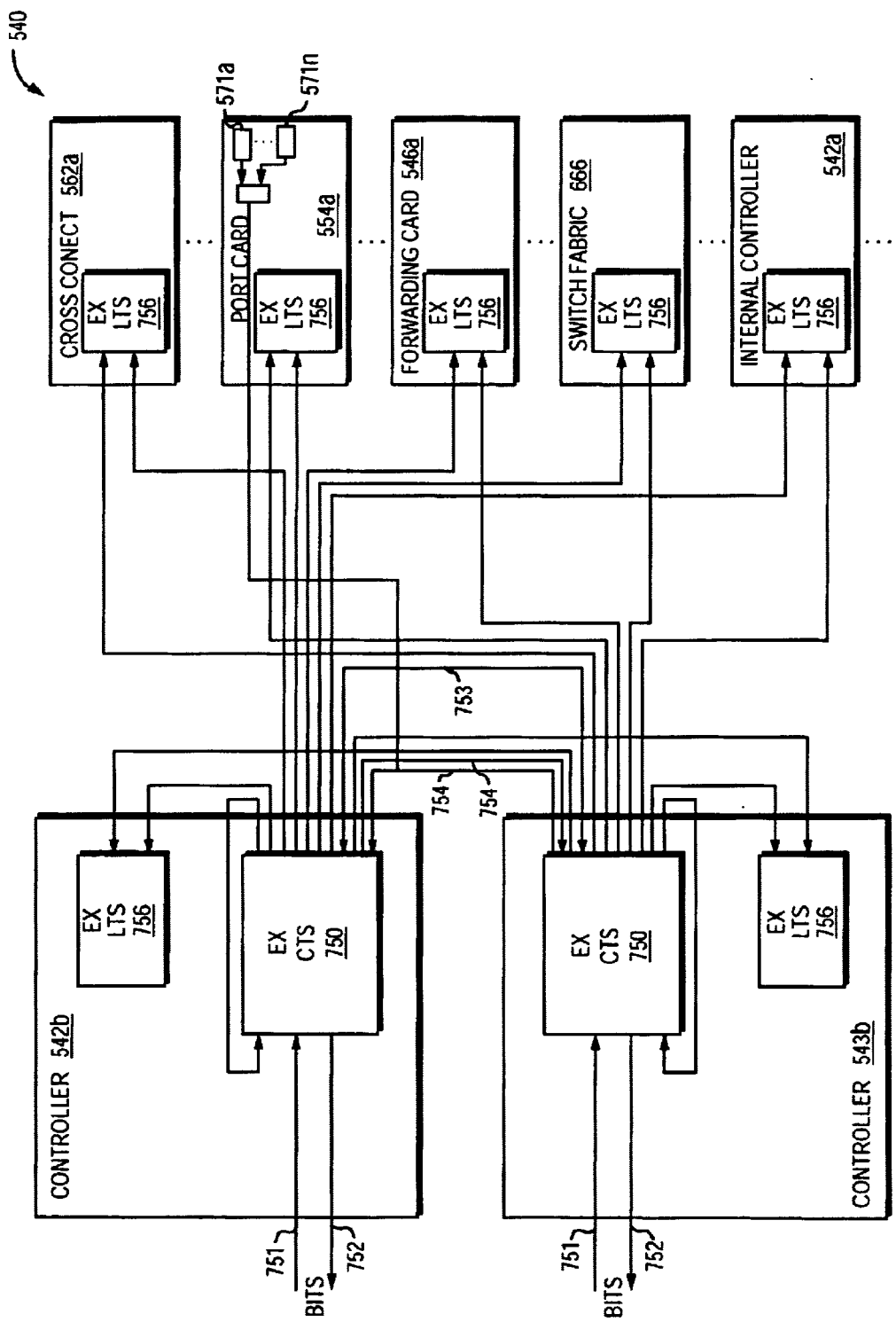
FIG. 49 is a block diagram of the interconnections between external central timing subsystems and external local timing subsystems.

Referring to FIG. 49, controller card 542b and redundant controller card 543b each include an external central timing subsystem (EX CTS) 750. Each EX CTS receives BITS lines 751 and provide BITS lines 752. In addition, each EX CTS receives a port timing signal 753 from each port card (554a–554h, 556a–556h, 558a–558h, 560a–560h, FIG. 35), and each EX CTS also receives an external timing reference signal 754 from itself and an external timing reference signal 755 from the other EX CTS.

One of the EX CTSs behaves as a master and the other EX CTS behaves as a slave. The master EX CTS may synchronize its output external reference timing signals to one of BITS lines 751 or one of the port timing signals 753, while the slave EX CTS synchronizes its output external reference timing signals to the received master external reference timing signal 755. Upon a master EX CTS failure, the slave EX CTS may automatically switch over to become the master EX CTS or software may upon an error or at any time force the slave EX CTS to switch over to become the master EX CTS.

An external reference timing signal from each EX CTS is sent to each external local timing subsystem (EX LTS) 756 on cards throughout the network device, and each EX LTS generates local external timing signals synchronized to one of the received external reference timing signals. Generally, external reference timing signals are sent only to cards including external data transfer functionality, for example, cross connection cards 562a–562b, 564a–564b, 566a–566b and 568a–568b (FIG. 35) and universal port cards 554a–554h, 556a–556h, 558a–558h, 560a–560h.

In network devices having multiple processor components, an additional central processor timing subsystem is needed to generate processor timing reference signals to allow the multiple processors to synchronize certain processes and functions. The addition of both external reference timing signals (primary and secondary) and processor timing reference signals (primary and secondary) require significant routing resources. In one embodiment of the invention, the EX CTSs embed a processor timing reference signal within each external timing reference signal to reduce the number of timing reference signals needed to be routed across the mid-plane(s). The external reference timing signals are then sent to EX LTSs on each card in the network device having a processor component, for example, cross connection cards 562a–562b, 564a–564b, 566a–566b, 568a–568b, universal port cards 554a–554h, 556a–556h, 558a–558h, 560a–560h, forwarding cards 546a–546e, 548a–548e, 550a–550e, 552a–552e, switch fabric cards 666, 667, 668a–668d, 669a–669d (FIG. 44) and both the internal controller cards 542a, 543a (FIG. 41b) and external controller cards 542b and 543b.

All of the EX LTSs extract out the embedded processor reference timing signal and send it to their local processor component. Only the cross-connection cards and port cards use the external reference timing signal to synchronize external network data transfers. As a result, the EX LTSs include extra circuitry not necessary to the function of cards not including external data transfer functionality, for example, forwarding cards, switch fabric cards and internal controller cards. The benefit of reducing the necessary routing resources, however, out weighs any disadvantage related to the excess circuitry. In addition, for the cards including external data transfer functionality, having one EX LTS that provides both local signals actually saves resources on those cards, and separate processor central timing subsystems are not necessary. Moreover, embedding the processor timing reference signal within the highly accurate, redundant external timing reference signal provides a highly accurate and redundant processor timing reference signal. Furthermore having a common EX LTS on each card allows access to the external timing signal for future modifications and having a common EX LTS, as opposed to different LTSs for each reference timing signal, results in less design time, less debug time, less risk, design re-use and simulation re-use.

Although the EX CTSs are described as being located on the external controllers 542b and 543b, similar to the switch fabric CTSs described above, the EX CTSs may be located on their own independent cards or on any other cards in the network device, for example, internal controllers 542a and 543a. In fact, one EX CTS could be located on an internal controller while the other is located on an external controller. Many variations are possible. In addition, just as the switch fabric CTSs may switch over from master to slave without affecting or requiring any other functionality on the local printed circuit board, the EX CTSs may also switch over from master to slave without affecting or requiring any other functionality on the local printed circuit board.

Figure 50:
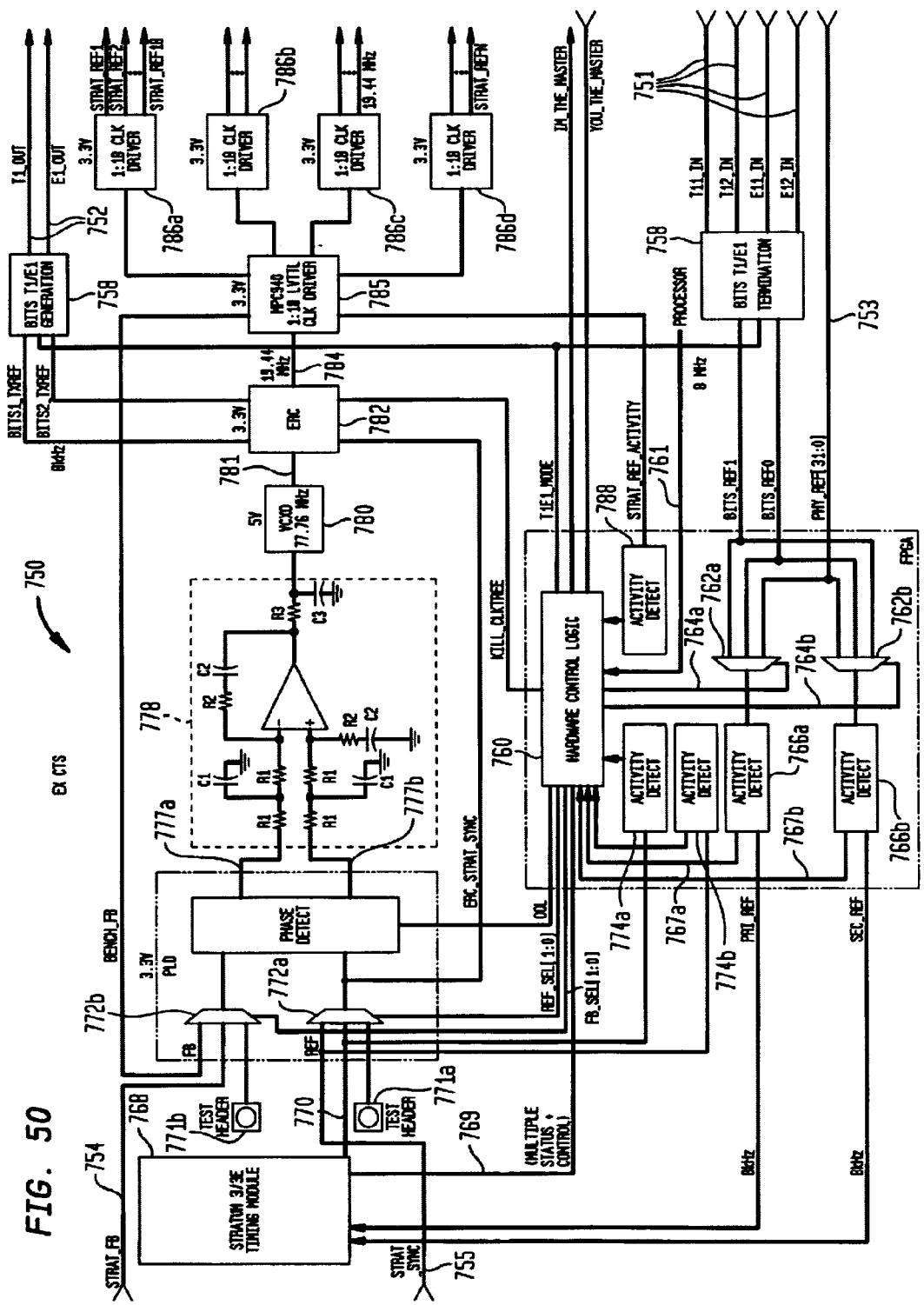
FIG. 50 is a block diagram of an external central timing subsystem.

External Central Timing Subsystem (EX CTS):

Referring to FIG. 50, EX CTS 750 includes a T1/E1 framer/LIU 758 for receiving and terminating BITS signals 751 and for generating and sending BITS signals 752. Although T1/E1 framer is shown in two separate boxes in FIG. 50, it is for convenience only and may be the same circuit or component. In one embodiment, two 5431 T1/E1 Framer Line Interface Units (LIU) available from PMC-Sierra are used. The T1/E1 framer supplies 8 KHz BITS_REF0 and BITS_REF1 signals and receives 8 KHz BITS1_TXREF and BITS2_TXREF signals. A network administrator notifies NMS 60 (FIG. 35) as to whether the BITS signals are T1 or E1, and the NMS notifies software running on the network device. Through signals 761 from a local processor, hardware control logic 760 within the EX CTS is configured for T1 or E1 sends an T1E1_MODE signal to the T1/E1 framer indicating T1 or E1 mode. The T1/E1 framer then forwards BITS_REF0 and BITS_REF1 to dual MUXs 762*a* and 762*b*.

Port timing signals 753 are also sent to dual MUXs 762*a* and 762*b*. The network administrator also notifies the NMS as to which timing reference signals should be used, the BITS lines or the port timing signals. The NMS again notifies software running on the network device and through signals 761, the local processor configures the hardware control logic. The hardware control logic then uses select signals 764*a* and 764*b* to select the appropriate output signals from the dual MUXs.

Activity detectors 766*a* and 766*b* provide status signals 767*a* and 767*b* to the hardware control logic indicating whether the PRI_REF signal and the SEC_REF signal are active or inactive (i.e., stuck at 1 or 0). The PRI_REF and SEC_REF signals are sent to a stratum 3 or stratum 3E timing module 768. Timing module 768 includes an internal MUX for selecting between the PRI_REF and SEC_REF signals, and the timing module receives control and status signals 769 from the hardware control logic indicating whether PRI_REF or SEC_REF should be used. If one of the activity detectors 766*a* or 766*b* indicates an inactive status to the hardware control logic, then the hardware control logic sends appropriate information over control and status signals 769 to cause the timing module to select the active one of PRI_REF or SEC_REF.

The timing module also includes an internal phase locked loop (PLL) circuit and an internal stratum 3 or 3E oscillator. The timing module synchronizes its output signal 770 to the selected input signal (PRI_REF or SEC_REF). The timing module may be an MSTM-S3 available from Conner-Winfield or an ATIMe-s or ATIMe-3E available from TF systems. The hardware control logic, activity detectors and dual MUXs may be implemented in an FPGA. The timing module also includes a Free-run mode and a Hold-Over mode. When there is no input signal to synchronize to, the timing module enter a free-run mode and uses the internal oscillator to generate a clock output signal. If the signal being synchronized to is lost, then the timing module enters a hold-over mode and maintains the frequency of the last known clock output signal for a period of time.

The EX CTS 750 also receives an external timing reference signal from the other EX CTS on STRAT_SYNC 755 (one of STRAT_REF1_STRAT_REFN from the other EX CTS). STRAT_SYNC and output 770 from the timing module are sent to a MUX 772*a*. REF_SEL(1:0) selection signals are sent from the hardware control logic to MUX 772*a* to select STRAT_SYNC when the EX CTS is the slave and output 770 when the EX CTS is the master. When in a test mode, the hardware control logic may also select a test input from a test header 771*a*.

An activity detector 774*a* monitors the status of output 770 from the timing module and provides a status signal to the hardware control logic. Similarly, an activity detector 774*b* monitors the status of STRAT_SYNC and provides a status signal to the hardware control logic. When the EX CTS is master, if the hardware control logic receives an inactive status from activity detector 774*a*, then the hardware control logic automatically changes the REF_SEL signals to select STRAT_SYNC forcing the EX CTS to switch over and become the slave. When the EX CTS is slave, if the hardware control logic receives an inactive status from activity detector 774*b*, then the hardware control logic may automatically change the REF_SEL signals to select output 770 from the timing module forcing the EX CTS to switch over and become master.

A MUX 772*b* receives feedback signals from the EX CTS itself. BENCH_FB is an external timing reference signal from the EX CTS that is routed back to the MUX on the local printed circuit board. STRAT_FB 754 is an external timing reference signal from the EX CTS (one of STRAT_REF1-STRAT_REFN) that is routed onto the mid-plane(s) and back onto the local printed circuit board such that is most closely resembles the external timing reference signals sent to the EX LTSs and the other EX CTS in order to minimize skew. The hardware control logic sends FB_SEL (1:0) signals to MUX 772*b* to select STRAT_FB in regular use or BENCHL_FB or an input from a test header 771*b* in test mode.

The outputs of both MUX 772*a* and 772*b* are provided to a phase detector 776. The phase detector compares the rising edge of the two input signals to determine the magnitude of any phase shift between the two. The phase detector then generates variable voltage pulses on outputs 777*a* and 777*b* representing the magnitude of the phase shift. The phase detector outputs are used by discrete logic circuit 778 to generate a voltage on signal 779 representing the magnitude of the phase shift. The voltage is used to speed up or slow down (i.e., change the phase of) a VCXO 780 to allow the output signal 781 to track any phase change in the external timing reference signal received from the other EX CTS (i.e., STRAT_SYNC) or to allow the output signal 781 to track any phase change in the output signal 770 from the timing module. The discrete logic components implement a filter that determines how quickly or slowly the VCXO's output tracks the change in phase detected on the reference signal.

The phase detector circuit may be implemented in a programmable logic device (PLD).

The output 781 of the VCXO is sent to an External Reference Clock (ERC) circuit 782 which may also be implemented in a PLD. ERC_STRAT_SYNC is also sent to ERC 782 from the output of MUX 772*a*. When the EX CTS is the master, the ERC circuit generates the external timing reference signal 784 with an embedded processor timing reference signal, as described below, based on the output signal 781 and synchronous with ERC_STRAT_SYNC (corresponding to timing module output 770). When the EX CTS is the slave, the ERC generates the external timing reference signal 784 based on the output signal 781 and synchronous with ERC_STRAT_SYNC (corresponding to STRAT_SYNC 755 from the other EX CTS).

External reference signal 784 is then sent to a first level clock driver 785 and from there to second level clock drivers 786*a*–786*d* which provide external timing reference signals (STRAT_REF1-STRAT_REFN) that are distributed across the mid-plane(s) to EX LTSs on the other network device cards and the EX LTS on the same network device card, the other EX CTS and the EX CTS itself. The ERC circuit also generates BITS1_TXREF and BITS2_TXREF signals that are provided to BITS T1/E1 framer 758.

The hardware control logic also includes an activity detector 788 that receives STRAT_REF_ACTIVITY from clock driver 785. Activity detector 788 sends a status signal to the hardware control logic, and if the status indicates that STRAT_REF_ACTIVITY is inactive, then the hardware control logic asserts KILL_CLKTREE. Whenever KILL_CLKTREE is asserted, the activity detector 774*b* in the other EX CTS detects inactivity on STRAT_SYNC and may become the master by selecting the output of the timing module as the input to MUX 772*a*.

Similar to hardware control logic 684 (FIG. 45) within the switch fabric CTS, hardware control logic 760 within the EX CTS implements a state machine (similar to the state machine shown in FIG. 46) based on IM_THE_MASTER and YOU_THE_MASTER signals sent between the two EX CTSs and also on slot identification signals (not shown).

In one embodiment, ports (e.g., 571a–571n, FIG. 49) on network device 540 are connected to external optical fibers carrying signals in accordance with the synchronous optical network (SONET) protocol and the external timing reference signal is a 19.44 MHz signal that may be used as the SONET transmit reference clock. This signal may also be divided down to provide an 8 KHz SONET framing pulse (i.e., J0FP) or multiplied up to provide higher frequency signals. For example, four times 19.44 MHz is 77.76 MHz which is the base frequency for a SONET OC1 stream, two times 77.76 MHz provides the base frequency for an OC3 stream and eight times 77.76 MHz provides the base frequency for an OC12 stream.

In one embodiment, the embedded processor timing reference signal within the 19.44 MHz external timing reference signal is 8 KHz. Since the processor timing reference signal and the SONET framing pulse are both 8 KHz, the embedded processor timing reference signal may used to supply both. In addition, the embedded processor timing reference signal may also be used to supply BITS_TXREF and BITS2_TXREF signals to BITS T1/E1 framer 758.

Figure 51:
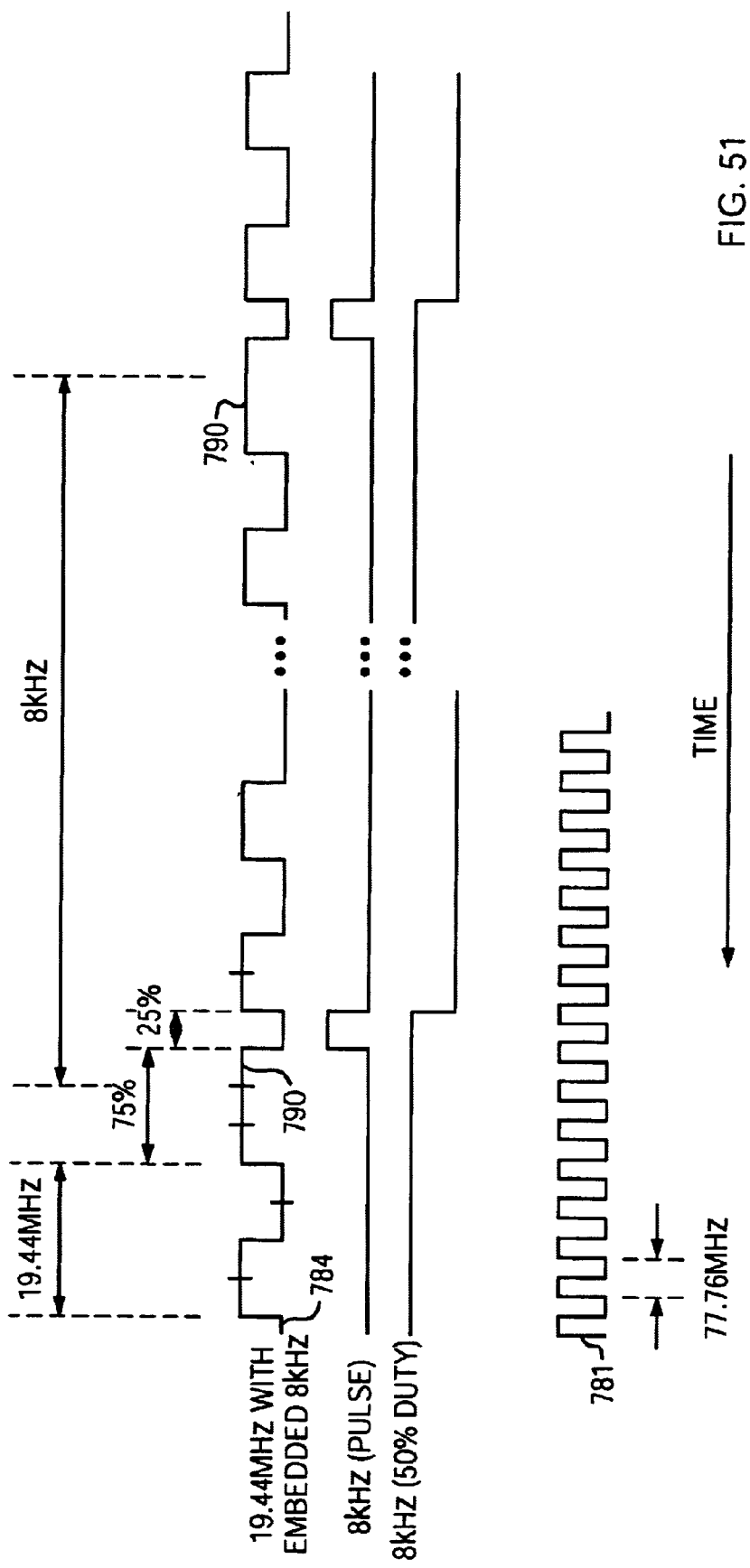
FIG. 51 is a timing diagram of a first timing reference signal with an embedded second timing signal.

Referring to FIG. 51, the 19.44 MHz external reference timing signal with embedded 8 KHz processor timing reference signal from ERC 782 (i.e., output signal 784) includes a duty-cycle distortion 790 every 125 microseconds (us) representing the embedded 8 KHz signal. In this embodiment, VCXO 780 is a 77.76 MHz VCXO providing a 77.76 MHz clock output signal 781. The ERC uses VCXO output signal 781 to generate output signal 784 as described in more detail below. Basically, every 125 us, the ERC holds the output signal 784 high for one extra 77.76 MHz clock cycle to create a 75%/25% duty cycle in output signal 784. This duty cycle distortion is used by the EX LTSs and EX CTSs to extract the 8 KHz signal from output signal 784, and since the EX LTS's use only the rising edge of the 19.44 MHz signal to synchronize local external timing signals, the duty cycle distortion does not affect that synchronization.

Figure 52:
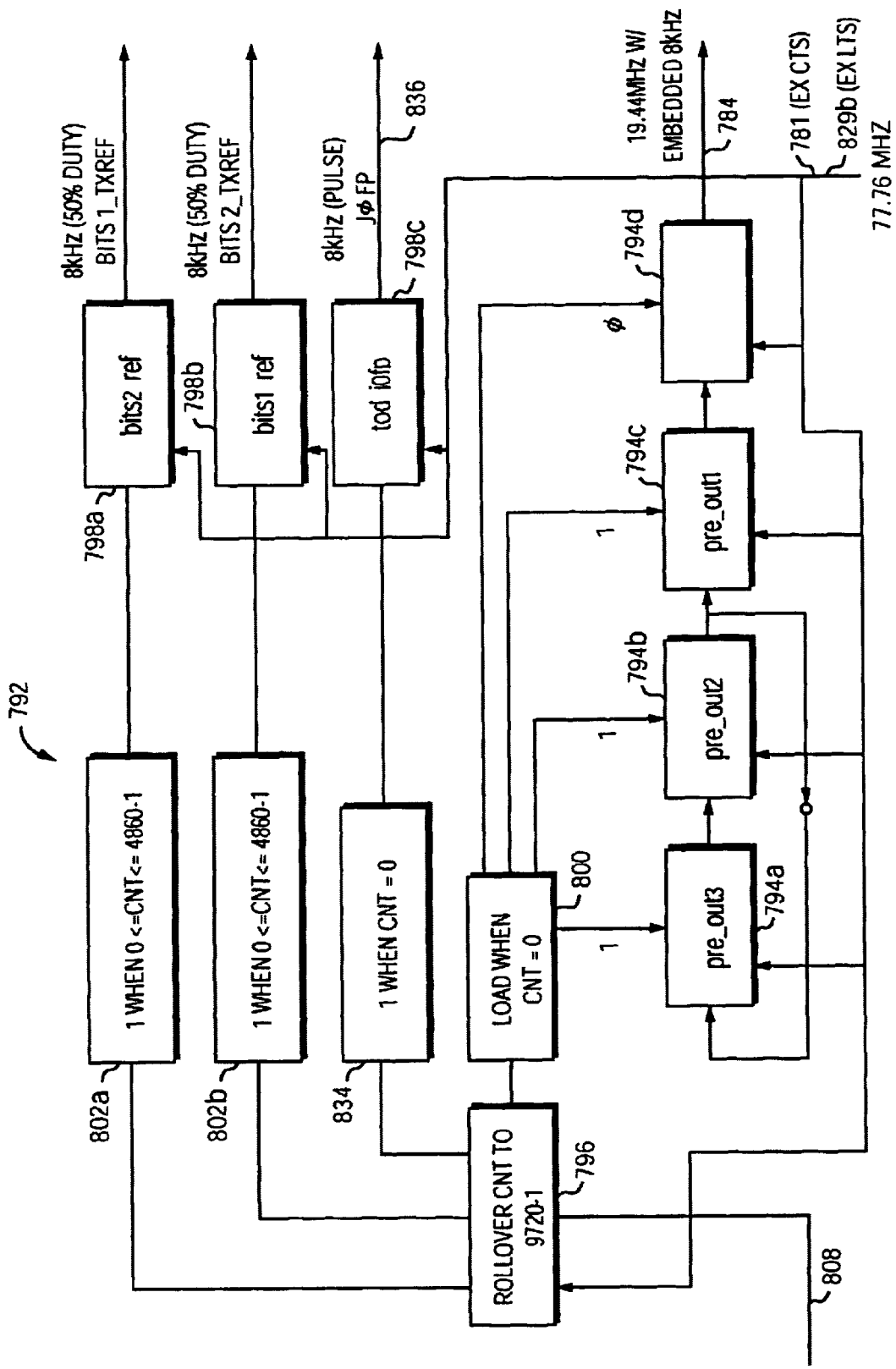
FIG. 52 is a block diagram of an embeddor circuit.

External Reference Clock (ERC) Circuit:

Referring to FIG. 52, an embeddor circuit 792 within the ERC receives VCXO output signal 781 (77.76 MHz) at four embedding registers 794a–794d, a 9720-1 rollover counter 796 and three 8 KHz output registers 798a–798b. Each embedding register passes its value (logic 1 or 0) to the next embedding register, and embedding register 794d provides ERC output signal 784 (19.44 MHz external timing reference signal with embedded 8 KHz processor timing reference signal). The output of embedding register 794b is also inverted and provided as an input to embedding register 794a. When running, therefore, the embedding registers maintain a repetitive output 784 of a high for two 77.76 MHz clock pulses and then low for two 77.76 MHz which provides a 19.44 MHz signal. Rollover counter 796 and a load circuit 800 are used to embed the 8 KHz signal.

The rollover counter increments on each 77.76 MHz clock tick and at 9720-1 (9720-1 times 77.76 MHz=8 KHz), the counter rolls over to zero. Load circuit 800 detects when the counter value is zero and loads a logic 1 into embedding registers 794a, 794b and 794c and a logic zero into embedding register 794d. As a result, the output of embedding register 794d is held high for three 77.76 MHz clock pulses (since logic ones are loaded into three embedding registers) which forces the duty cycle distortion into the 19.44 MHz output signal 784.

BITS circuits 802a and 802b also monitor the value of the rollover counter. While the value is less than or equal to 4860-1 (half of 8 KHz), the BITS circuits provide a logic one to 8 KHz output registers 798a and 798b, respectively. When the value changes to 4860, the BITS circuits toggle from a logic one to a logic zero and continue to send a logic zero to 8 KHz output registers 798a and 798b, respectively, until the rollover counter rolls over. As a result, 8 KHz output registers 798a and 798b provide 8 KHz signals with a 50% duty cycle on BITS1_TXREF and BITS2_TXREF to the BITS T1/E1 framer.

As long as a clock signal is received over signal 781 (77.76 MHz), rollover counter 796 continues to count causing BITS circuits 802a and 802b to continue toggling 8 KHz registers 798a and 798b and causing load circuit 800 to continue to load logic 1110 into the embedding registers every 8 KHz. As a result, the embedding registers will continue to provide a 19 MHz clock signal with an embedded 8 KHz signal on line 784. This is often referred to as "fly wheeling."

Figure 53:
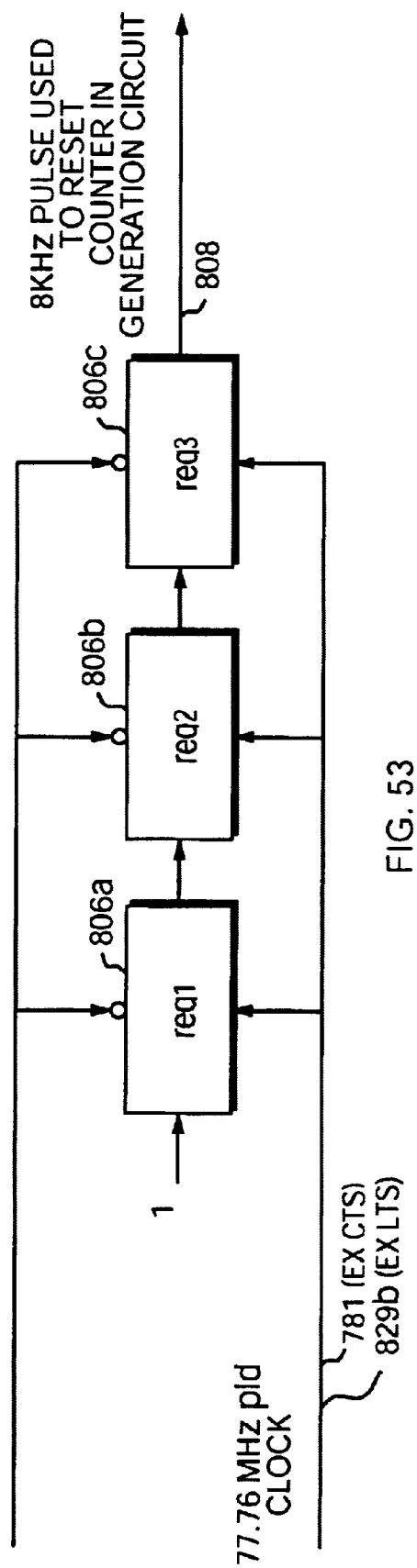
FIG. 53 is a block diagram of an extractor circuit.

Referring to FIG. 53, an extractor circuit 804 within the ERC is used to extract the embedded 8 KHz signal from ERC_STRAT_SYNC. When the EX CTS is the master, ERC_STRAT_SYNC corresponds to the output signal 770 from the timing module 768 (pure 19.44 MHz), and thus, no embedded 8 KHz signal is extracted. When the EX CTS is the slave, ERC_STRAT_SYNC corresponds to the external timing reference signal provided by the other EX CTS (i.e., STRAT_SYNC 755; 19.44 MHz with embedded 8 KHz) and the embedded 8 KHz signal is extracted. The extractor circuit includes three extractor registers 806a–806c. Each extractor register is connected to the 77.76 MHz VCXO output signal 781, and on each clock pulse, extractor register 806a receives a logic one input and passes its value to extractor register 806b which passes its value to extractor register 806c which provides an 8 KHz pulse 808. The extractor registers are also connected to ERC_SRAT_SYNC which provides an asynchronous reset to the extractor registers—that is, when ERC_STRAT_SYNC is logic zero, the registers are reset to zero. Every two 77.76 MHz clock pulses, therefore, the extractor registers are reset and for most cycles, extractor register 806c passes a logic zero to output signal 808. However, when the EX CTS is the slave, every 8 KHz ERC_STRAT_SYNC remains a logic one for three 77.76 MHz clock pulses allowing a logic one to be passed through each register and onto output signal 808 to provide an 8 KHz pulse.

8 KHz output signal 808 is passed to extractor circuit 804 and used to reset the rollover counter to synchronize the rollover counter to the embedded 8 KHz signal within ERC_STRAT_SYNC when the EX CTS is the slave. As a result, the 8 KHz embedded signal generated by both EX CTSs are synchronized.

Figure 54:
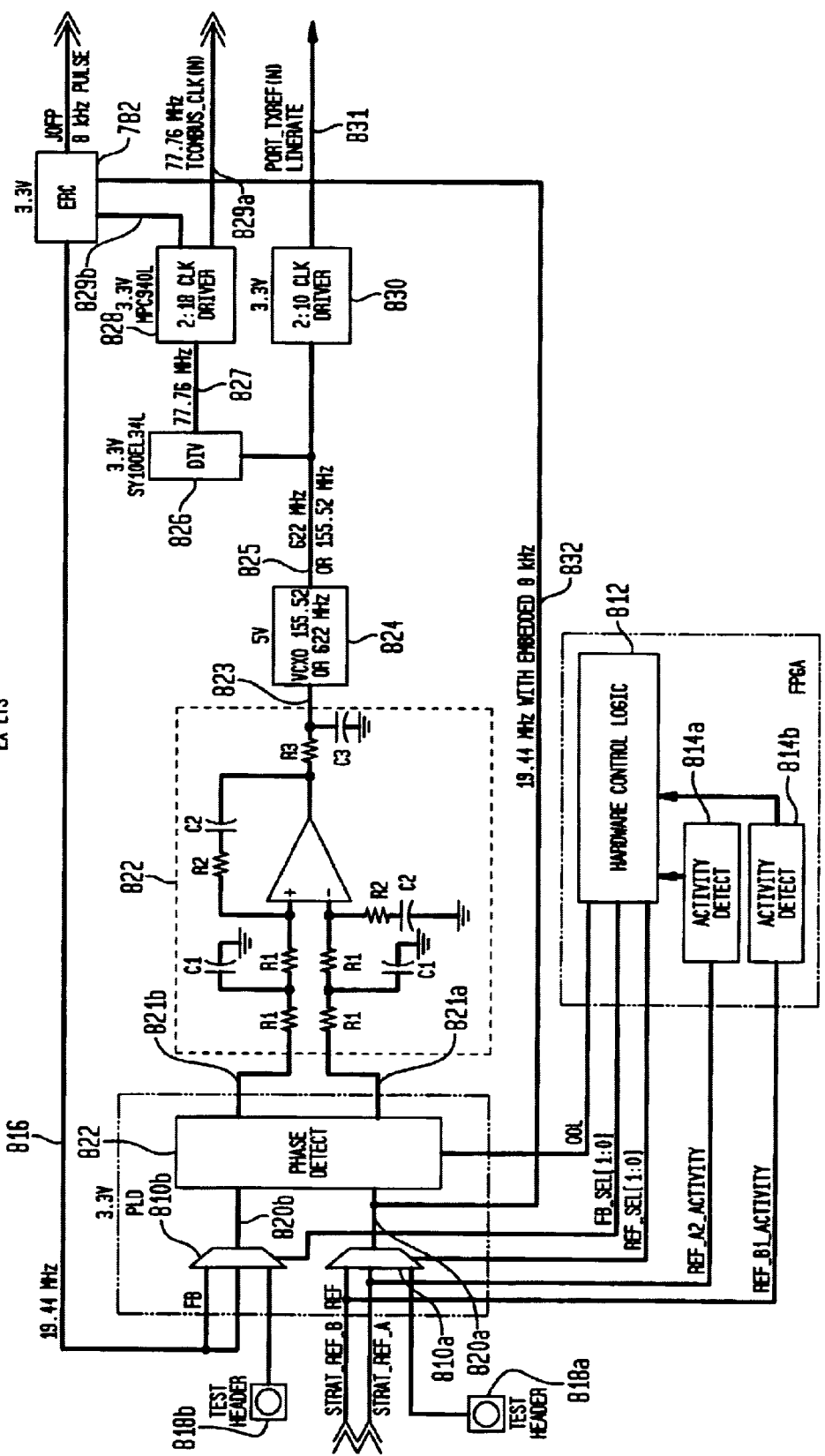
FIG. 54 is a block diagram of an external local timing subsystem.

External Local Timing Subsystem (EX LTS):

Referring to FIG. 54, EX LTS 756 receives STRAT_REF_B from one EX CTS and STRAT_REF_A from the other EX CTS. STRAT_REF_B and STRAT_REF_A correspond to one of STRAT_REF1-STRAT_REFN (FIG. 50) output from each EX CTS. STRAT_REF_B and STRAT_REF_A are provided as inputs to a MUX 810a and a hardware control logic 812 within the EX LTS selects the input to MUX 810a using REF_SEL (1:0) signals. An activity detector 814a monitors the activity of STRAT_REF_A and sends a signal to hardware control logic 812 if it detects an inactive signal (i.e., stuck at logic one or zero).

Similarly, an activity detector 814*b* monitors the activity of STRAT_REF_B and sends a signal to hardware control logic 812 if it detects an inactive signal (i.e., stuck at logic one or zero). If the hardware control logic receives a signal from either activity detector indicating that the monitored signal is inactive, the hardware control logic automatically changes the REF_SEL (1:0) signals to cause MUX 810*a* to select the other input signal and send an interrupt to the local processor.

A second MUX 810*b* receives a feed back signal 816 from the EX LTS itself. Hardware control logic 812 uses FB_SEL(1:0) to select either a feedback signal input to MUX 810*b* or a test header 818*b* input to MUX 810*b*. The test header input is only used in a test mode. In regular use, feedback signal 816 is selected. Similarly, in a test mode, the hardware control logic may use REF_SEL(1:0) to select a test header 818*a* input to MUX 810*a*.

Output signals 820*a* and 820*b* from MUXs 810*a* and 810*b*, respectively, are provided to phase detector 822. The phase detector compares the rising edge of the two input signals to determine the magnitude of any phase shift between the two. The phase detector then generates variable voltage pulses on outputs 821*a* and 821*b* representing the magnitude of the phase shift. The phase detector outputs are used by discrete logic circuit 822 to generate a voltage on signal 823 representing the magnitude of the phase shift. The voltage is used to speed up or slow down (i.e., change the phase of) an output 825 of a VCXO 824 to track any phase change in STRAT_REF_A or STRAT_REF_B. The discrete logic components implement filters that determine how quickly or slowly the VCXO's output will track the change in phase detected on the reference signal.

In one embodiment, the VCXO is a 155.51 MHz or a 622 MHz VCXO. This value is dependent upon the clock speeds required by components, outside the EX LTS but on the local card, that are responsible for transferring network data over the optical fibers in accordance with the SONET protocol. On at least the universal port card, the VCXO output 825 signal is sent to a clock driver 830 for providing local data transfer components with a 622 MHz or 155.52 MHz clock signal 831.

The VCXO output 825 is also sent to a divider chip 826 for dividing the signal down and outputting a 77.76 MHz output signal 827 to a clock driver chip 828. Clock driver chip 828 provides 77.76 MHz output signals 829*a* for use by components on the local printed circuit board and provides 77.76 MHz output signal 829*b* to ERC circuit 782. The ERC circuit also receives input signal 832 corresponding to the EX LTS selected input signal either STRAT_REF_B or STRAT_REF_A. As shown, the same ERC circuit that is used in the EX CTS may be used in the EX LTS to extract an 8 KHz J0FP pulse for use by data transfer components on the local printed circuit board. Alternatively, the ERC circuit could include only a portion of the logic in ERC circuit 782 on the EX CTS.

Similar to hardware control logic 712 (FIG. 47) within the switch fabric LTS, hardware control logic 812 within the EX LTS implements a state machine (similar to the state machine shown in FIG. 48) based on signals from activity detectors 814*a* and 814*b*.

External Reference Clock (ERC) Circuit:

Referring again to FIGS. 52 and 53, when the ERC circuit is within an EX LTS circuit, the inputs to extractor circuit 804 are input signal 832 corresponding to the LTS selected input signal either STRAT_REF_B or STRAT_REF_A and 77.76 MHz clock input signal 829*b*. The extracted 8 KHz pulse 808 is again provided to embeddor circuit 792 and used to reset rollover counter 796 in order to synchronize the counter with the embedded 8 KHz signal with STRAT_REF_A or STRAT_REF_B. Because the EX CTSs that provide STRAT_REF_A and STRAT_REF_B are synchronous, the embedded 8 KHz signals within both signals are also synchronous. Within the EX LTS, the embedding registers 794*a*–794*d* and BITS registers 798*a* and 798*b* are not used. Instead, a circuit 834 monitors the value of the rollover counter and when the rollover counter rolls over to a value of zero, circuit 834 sends a logic one to 8 KHz register 798*c* which provides an 8 KHz pulse signal 836 that may be sent by the LTS to local data transfer components (i.e., J0FP) and processor components as a local processor timing signal.

Again, as long as a clock signal is received over signal 829*b* (77.76 MHz), rollover counter 796 continues to count causing circuit 834 to continue pulsing 8 KHz register 798*c*.

Figure 55:
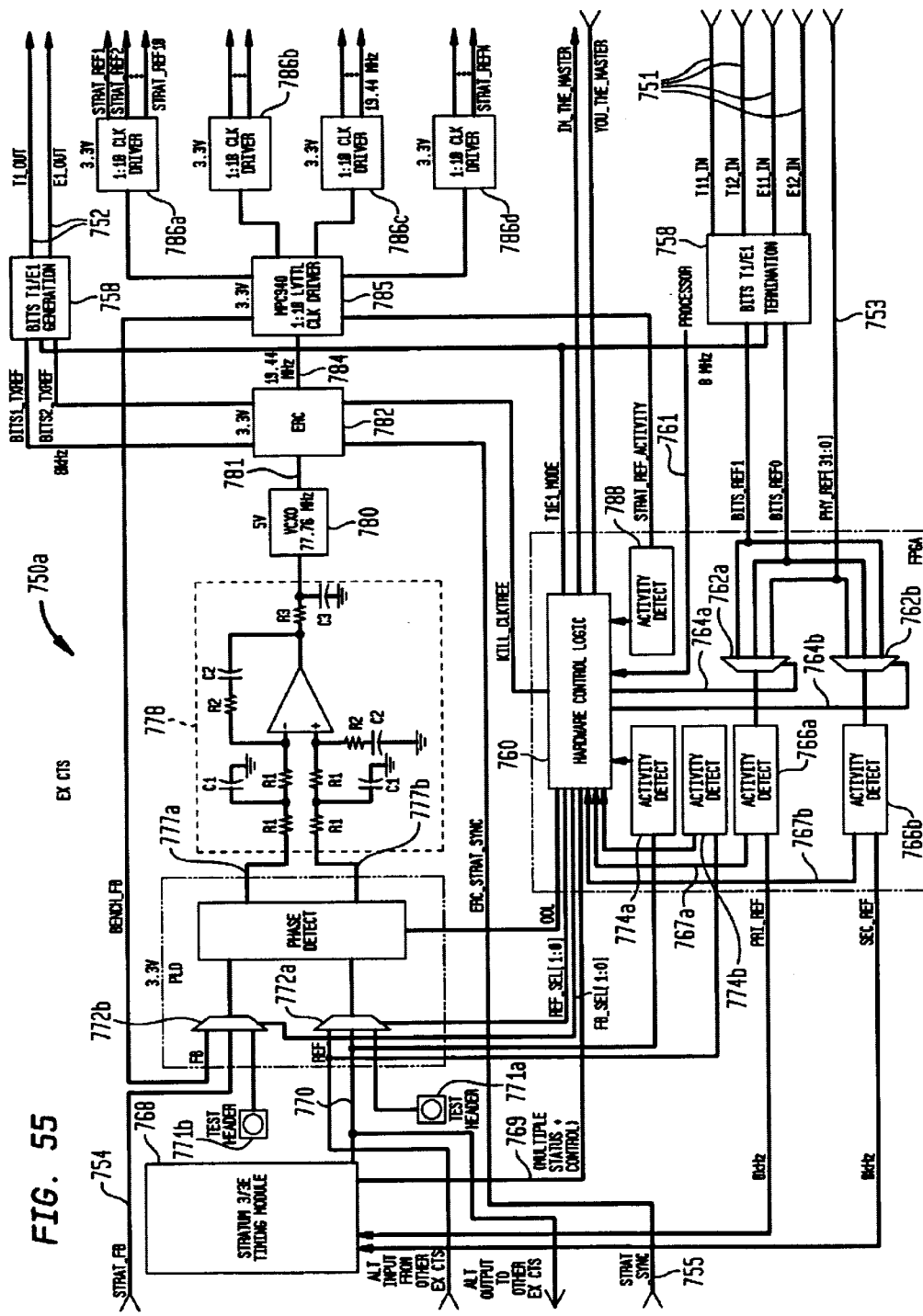
FIG. 55 is a block diagram of an external central timing subsystem.

External Central Timing Subsystem (EX CTS) Alternate Embodiment:

Referring to FIG. 55, instead of using one of the STRAT_REF1-STRAT_REFN signals from the other EX CTS as an input to MUX 772*a*, the output 770 (marked "Alt. Output to other EX CTS") of timing module 768 may be provided to the other EX CTS and received as input 838 (marked "Alt. Input from other EX CTS"). The PLL circuit, including MUXs 772*a* and 772*b*, phase detector 776, discrete logic circuit 778 and VCXO 780, is necessary to synchronize the output of the VCXO with either output 770 of the timing module or a signal from the other EX CTS. However, PLL circuits may introduce jitter into their output signals (e.g., output 781), and passing the PLL output signal 781 via one of the STRAT_REF1-STRAT_REFN signals from one EX CTS into the PLL of the other EX CTS—that is, PLL to PLL—may introduce additional jitter into output signal 781. Since accurate timing signals are critical for proper data transfer with other network devices and SONET standards specifically set maximum allowable jitter transmission at interfaces (Bellcore GR-253-CORE and SONET Transport Systems Common Carrier Criteria), jitter should be minimized. Passing the output 770 of the timing module within the EX CTS to the input 838 of the other EX CTS avoids passing the output of one PLL to the input of the second PLL and thereby reduces the potential introduction of jitter.

It is still necessary to send one of the STRAT_REF1-STRAT_REFN signals to the other EX CTS (received as STRAT_SYNC 755) in order to provide ERC 782 with a 19.44 MHz signal with an embedded 8 KHz clock for use when the EX CTS is a slave. The ERC circuit only uses ERC_STRAT_SYNC in this instance when the EX CTS is the slave.

It will be understood that variations and modifications of the above described methods and apparatuses will be apparent to those of ordinary skill in the art and may be made without departing from the inventive concepts described herein. Accordingly, the embodiments described herein are to be viewed merely as illustrative, and not limiting, and the inventions are to be limited solely by the scope and spirit of the appended claims.

What is claimed is:

1. A network device, comprising:

a first central timing subsystem providing at least one first timing reference signal and at least one first master control signal;

a second central timing subsystem providing at least one second timing reference signal and at least one second master control signal;

wherein the first central timing subsystem receives the second timing reference signal and the second master control signal and the second central timing subsystem receives the first timing reference signal and the first master control signal;

wherein the first central timing subsystem synchronizes the first timing reference signal to the second timing reference signal in accordance with the second master control signal and the second central timing subsystem synchronizes the second timing reference signal to the first timing reference signal in accordance with the first master control signal; and wherein the first central timing subsystem comprises:
   a voltage controlled timing circuit for generating the first timing reference signal;
   a constant master voltage signal connected to the voltage controlled timing circuit;
   a variable slave voltage signal connected to the voltage controlled timing circuit; and
   a control logic circuit connected to the voltage controlled timing circuit and the first and second master control signals, wherein the control logic circuit selects the constant master voltage signal for use by the voltage controlled timing circuit and generates a master state on the first master control signal when a slave state is detected on the second master control signal and wherein the control logic circuit selects the variable slave voltage signal for use by the voltage controlled timing circuit and generates the slave state on the first master control signal when the master state is detected on the second master control signal.

2. The network device of claim 1, wherein the master state comprises a logic one and the slave state comprises a logic zero.

3. The network device of claim 1, wherein the master state comprises a logic zero and the slave state comprises a logic one.

4. The network device of claim 1, wherein the voltage controlled timing circuit comprises a first voltage controlled timing circuit, the constant master voltage signal comprises a first constant master voltage signal, the variable slave voltage signal comprises a first variable slave voltage signal and the control logic circuit comprises a first control logic circuit and wherein the second central timing subsystem comprises:
   a second voltage controlled timing circuit for generating the second timing reference signal;
   a second constant master voltage signal connected to the second voltage controlled timing circuit;
   a second variable slave voltage signal connected to the second voltage controlled timing circuit; and
   a second control logic circuit connected to the second voltage controlled timing circuit and the first and second master control signals, wherein the second control logic circuit selects the second constant master voltage signal for use by the second voltage controlled timing circuit and generates the master state on the second master control signal when the slave state is detected on the first master control signal and wherein the second control logic circuit selects the second variable slave voltage signal for use by the second voltage controlled timing circuit and generates the slave state on the second master control signal when the master state is detected on the first master control signal.

5. The network device of claim 1, wherein the first central timing subsystem further receives a slot identification signal and wherein the control logic circuit causes the voltage controlled timing circuit to use one of the master and the slave voltage signals in accordance with the second master control signal and the slot identification signal.

6. The network device of claim 1, wherein the voltage controlled timing circuit comprises a voltage controlled crystal oscillator.

7. The network device of claim 6, wherein the voltage controlled timing circuit further comprises a multiplexor.

8. The network device of claim 1, wherein the first central timing subsystem further comprises:
   a constant voltage circuit for providing the constant master voltage signal.

9. The network device of claim 1, wherein the first central timing subsystem further comprises:
   a phase locked loop circuit coupled to the first and second timing reference signals for providing the variable slave voltage signal.

10. The network device of claim 9, wherein the phase locked loop circuit provides an out of lock signal to the control logic circuit and wherein the control logic circuit causes the voltage controlled timing circuit to use the variable slave voltage signal and the control logic circuit provides the slave state on the first master control signal when the out of lock signal indicates that the first and second timing reference signals are out of lock.

11. The network device of claim 1, wherein the first central timing subsystem further comprises:
   a status detector for receiving the second timing reference signal and for providing a signal to the control logic circuit indicating a status of the second timing reference signal; and
   wherein the control logic circuit causes the voltage controlled timing circuit to use the constant master voltage signal and the control logic circuit provides the master state on the first master control signal when the signal indicates an invalid status for the second timing reference signal.

12. The network device of claim 11, wherein the status detector comprises an activity detector for providing a n activity signal.

13. The network device of claim 11, wherein the control logic circuit causes the voltage controlled timing circuit to use the constant master voltage signal without software interaction.

14. The network device of claim 1, wherein the first central timing subsystem further comprises:
   a status detector for receiving the first timing reference signal and for providing a signal to the control logic circuit indicating a status of the first timing reference signal; and
   wherein the control logic circuit causes the voltage controlled timing circuit to use the variable slave voltage signal and the control logic circuit provides the slave state on the first master control signal when the signal indicates an invalid status for the first timing reference signal.

15. The network device of claim 14, wherein the status detector comprises an activity detector for providing an activity signal.

16. The network device of claim 14, wherein the control logic circuit causes the voltage controlled timing circuit to use the variable slave voltage signal without software interaction.

17. The network device of claim 1, wherein the control logic is further coupled with a processor and wherein the processor is capable of controlling the control logic circuit to cause the control logic circuit to cause the voltage controlled timing circuit to use the constant master voltage signal and provide the master state on the first master control signal, and cause the voltage controlled timing circuit to use the variable slave voltage signal and provide the master state on the first master control signal.

18. A method of operating a network device, comprising:

providing a first timing reference signal from a first voltage controlled timing circuit connected to a first constant master voltage signal and a first variable slave voltage signal within a first central timing subsystem;

providing a first master control signal from a first control logic circuit connected to the first voltage controlled timing circuit within the first central timing subsystem;

providing a second timing reference signal from a second voltage controlled timing circuit connected to a second constant master voltage signal and a second variable slave voltage signal within a second central timing subsystem;

providing a second master control signal from a second control logic circuit connected to the second voltage controlled timing circuit within the second central timing subsystem;

synchronizing the second timing reference signal to the first timing reference signal in accordance with the first master control signal; and synchronizing the first timing reference signal to the second timing reference signal in accordance with the second master control signal.

19. The method of claim 18, further comprising:

detecting a slave status on the second master control signal;

selecting the second variable slave voltage signal for use by the second voltage controlled timing circuit;

selecting the first constant master voltage signal for use by first voltage controlled timing circuit; and generating a master status on the first master control signal.

20. The method of claim 18, further comprising:

detecting a master status on the second master control signal;

selecting the second constant master voltage signal for use by the second voltage controlled timing circuit;

selecting the first variable slave voltage signal for use by first voltage controlled timing circuit; and generating a slave status on the first master control signal.

21. The method of claim 18, wherein synchronizing the first timing reference signal to the second timing reference signal in accordance with the second master control signal comprises:

detecting a value on the second master control signal indicating that the second central timing subsystem is performing as a slave central timing subsystem; and selecting the first constant master voltage signal as an input to first voltage controlled timing circuit.

22. The method of claim 21, further comprising:

selecting the second variable slave voltage signal as an input to the second voltage controlled timing circuit.

23. The method of claim 21, further comprising:

selecting the second constant master voltage signal as an input to second voltage controlled timing circuit.

24. The method of claim 18, wherein synchronizing the first timing reference signal to the second timing reference signal comprises:

detecting a value on the second master control signal indicating that the second central timing subsystem is performing as a master central timing subsystem; and selecting the variable slave voltage signal as an input to the first voltage controlled timing circuit.

25. The method of claim 18, further comprising:

providing a first slot identifier;

providing a second slot identifier;

wherein synchronizing the second timing reference signal to the first timing reference signal is further in accordance with the second slot value; and wherein synchronizing the first timing reference signal to the second timing reference signal is further in accordance with the first, slot value.

26. The method of claim 18, further comprising:

monitoring a status of the first timing reference signal; and synchronizing the first timing reference signal to the second timing reference signal when the status indicates invalidity.

27. The method of claim 26, further comprising:

providing a constant logic state on the first timing reference signal when the status indicates invalidity.

28. The method of claim 18, further comprising:

removing the first central timing subsystem from the network device;

detecting inactivity on the first timing reference signal; and providing the second constant master voltage signal to the second voltage controlled timing circuit.

29. The method of claim 28, further comprising:

replacing the first central timing subsystem within the network device;

detecting activity on the first timing reference signal; and continuing to provide the second constant master voltage signal to the second voltage controlled timing circuit.

30. The method of claim 28, further comprising: replacing the first central timing subsystem within the network device;

detecting activity on the first timing reference signal;

providing the first constant master voltage signal to the first voltage controlled timing circuit; and providing the second variable slave voltage signal to the second voltage controlled timing circuit.

* * * * *